United States Patent
Nishiyama et al.

(10) Patent No.: US 7,418,772 B2
(45) Date of Patent: Sep. 2, 2008

(54) METHOD FOR MANUFACTURING A SURFACE ACOUSTIC WAVE

(75) Inventors: Kenji Nishiyama, Nagaokakyo (JP); Takeshi Nakao, Nagaokakyo (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/743,793

(22) Filed: May 3, 2007

(65) Prior Publication Data

US 2007/0214622 A1    Sep. 20, 2007

Related U.S. Application Data

(62) Division of application No. 10/448,061, filed on May 30, 2003, now Pat. No. 7,230,365.

(30) Foreign Application Priority Data

Jul. 24, 2002    (JP)    ............... 2002-215614
Feb. 19, 2003   (JP)    ............... 2003-041480

(51) Int. Cl.
*H01L 41/22* (2006.01)
*H01L 41/00* (2006.01)

(52) U.S. Cl. .................. 29/25.35; 29/600; 29/832; 29/835; 29/846; 310/313 R

(58) Field of Classification Search ............... 29/25.35, 29/831, 832, 835, 846, 600, 601, 847; 310/311, 310/317, 313 A, 313 R, 313 B, 323.06; 250/288, 250/287; 204/192.34, 192; 216/66; 333/193
See application file for complete search history.

(56) References Cited

U.S. PATENT DOCUMENTS 3,965,444 A    6/1976    Willingham et al.
4,243,960 A    1/1981    White et al.
4,527,082 A    7/1985    Cline
5,390,401 A *  2/1995    Shikata et al. ............. 29/25.35
5,844,347 A    12/1998   Takayama et al.
5,909,156 A    6/1999    Nishihara
5,920,142 A *  7/1999    Onishi et al. ............ 310/313 R
5,923,231 A *  7/1999    Ohkubo et al. .............. 333/193
5,996,199 A    12/1999   Ichikawa
6,046,656 A    4/2000    Mishima
6,336,717 B1 * 1/2002    Shimada et al. ............... 347/71
6,580,198 B2   6/2003    Nakano et al.
6,657,366 B2   12/2003   Watanabe et al.
6,774,542 B2   8/2004    Anasako
6,861,786 B2   3/2005    Hakamada

FOREIGN PATENT DOCUMENTS

EP    920 129    6/1999

(Continued)

OTHER PUBLICATIONS

Schmidt et al.; "Investigation of SAW-Induced Acoustomigration Effects in CU- and Al-Based Metallizations" 2001 IEEE Ultrasonics Symposium Proceedings; Vp; 2 of 2; pp. 97-100.

(Continued)

*Primary Examiner*—Peter Vo
*Assistant Examiner*—Tai Nguyen
(74) *Attorney, Agent, or Firm*—Keating & Bennett, LLP

(57) ABSTRACT

In a manufacturing method for a SAW apparatus a first insulating layer is formed on the entire surface of a piezoelectric LiTaO₃ substrate. By using a resist pattern used for forming an IDT electrode, the first insulating layer in which the IDT electrode is to be formed is removed. An electrode film made of a metal having a density higher than Al or an alloy primarily including such a metal is disposed in the area in which the first insulating layer is removed so as to form the IDT electrode. The resist pattern remaining on the first insulating layer is removed. A second insulating layer is formed to cover the first insulating layer and the IDT electrode.

3 Claims, 110 Drawing Sheets

FOREIGN PATENT DOCUMENTS

| | | |
|---|---|---|
| JP | 58-56514 | 4/1983 |
| JP | 61-136312 | 6/1986 |
| JP | 01-233816 | 9/1989 |
| JP | 02-295212 | 12/1990 |
| JP | 05-022067 | 1/1993 |
| JP | 06-103819 | 4/1994 |
| JP | 06-164306 | 6/1994 |
| JP | 09-167936 | 6/1997 |
| JP | 09-223944 | 8/1997 |
| JP | 11-186866 | 7/1999 |
| JP | 2000-269771 | 9/2000 |
| JP | 2001-77662 | 3/2001 |
| JP | 2001-148618 | 5/2001 |
| WO | 98/51011 | 11/1998 |
| WO | 02/19522 | 3/2002 |

OTHER PUBLICATIONS

Jin Yong Kim et al.; "Passivation Layer Effects on Power Durability of SAW Duplexer"; Ultrasonics Symposium; Oct. 1999; pp. 39-42.

Takayama et al.; "High Power Durable Electrodes for GHz band SAW Duplexers"; IEEE Ultrasonics Symposium; vol. 1; Oct. 2000; pp. 9-14.

Official Communication dated Dec. 26, 2005 issued in the counterpart Korean Application No. 10-2003-0034334.2

J. Koskela et al.; "Suppression of the Leaky Saw Attenuation With Heavy Mechanical Loading"; IEEE Transactions on Ultrasonics, Ferroelectrics and Frequency Control; IEEE Inc.; New York, U.S.; vol. 45; No. 2; Mar. 1, 1998; pp. 439-449.

O. Kawachi et al.; "Optimal Cut for Leaky Saw on LiTaO3 for High Performance Resonators and Filters"; IEEE Transactions on Ultrasonics, Ferroelectrics and Frequency Control; Sep. 2001; IEEE; USA; vol. 48; No. 5; pp. 1442-1448.

* cited by examiner

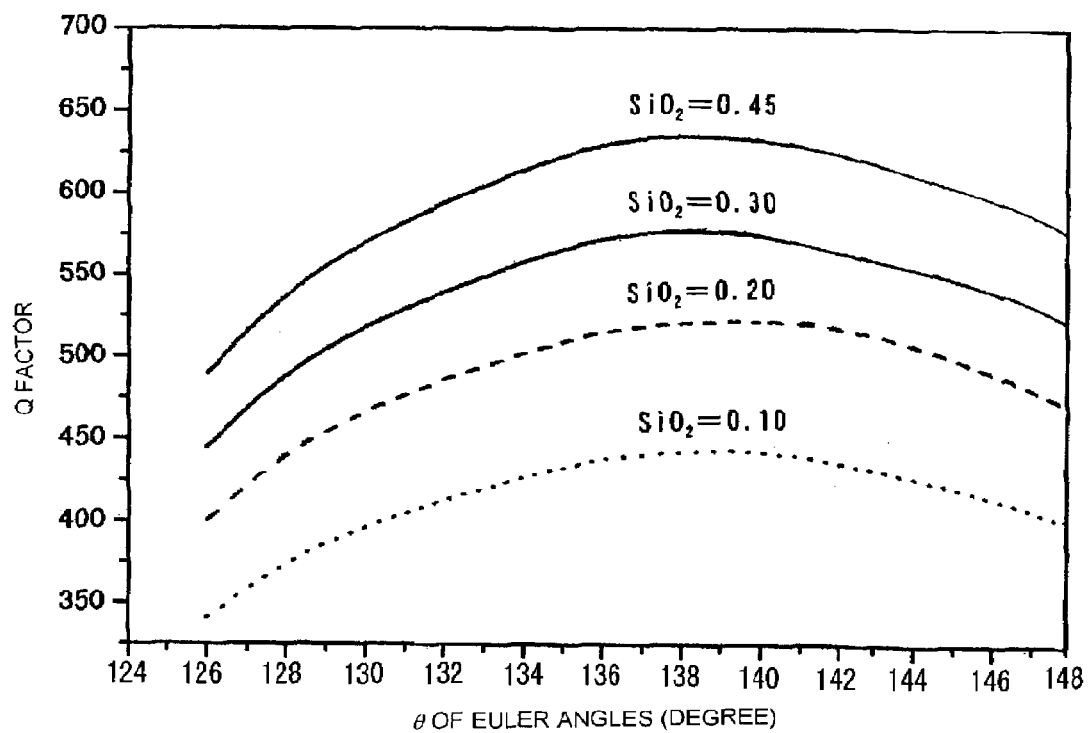

FIG. 102A
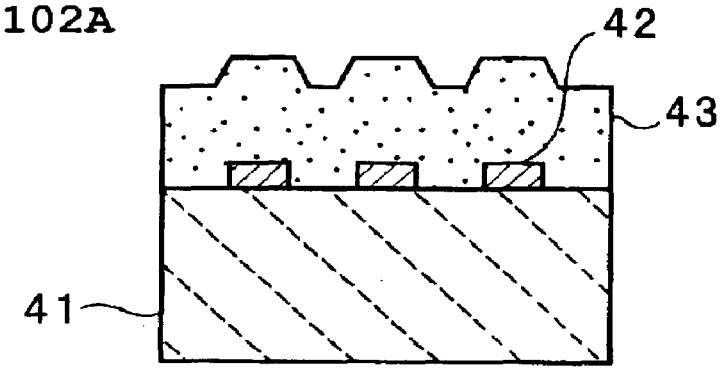
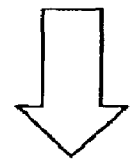
FIG. 102B
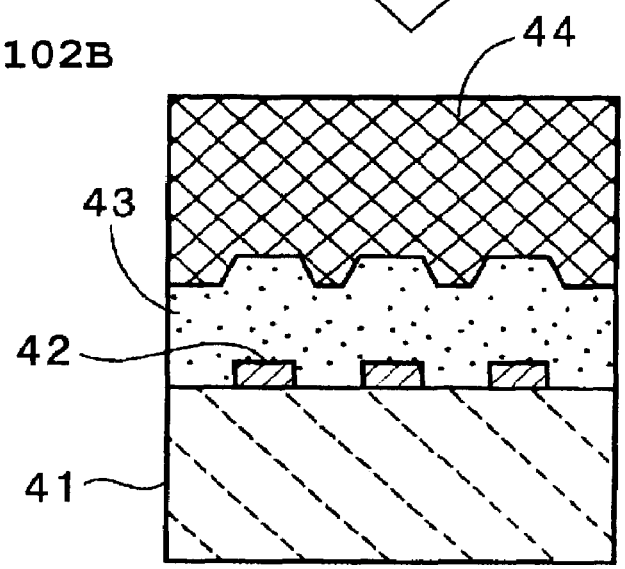
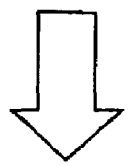
FIG. 102C
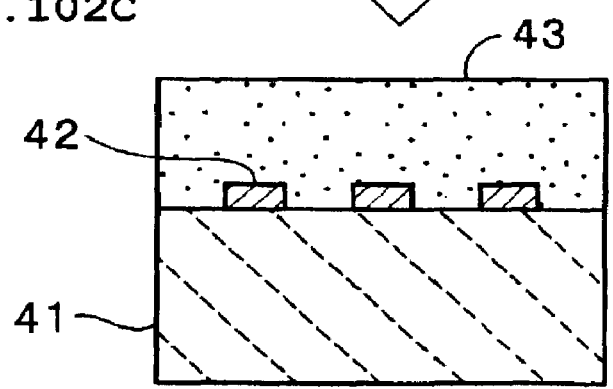

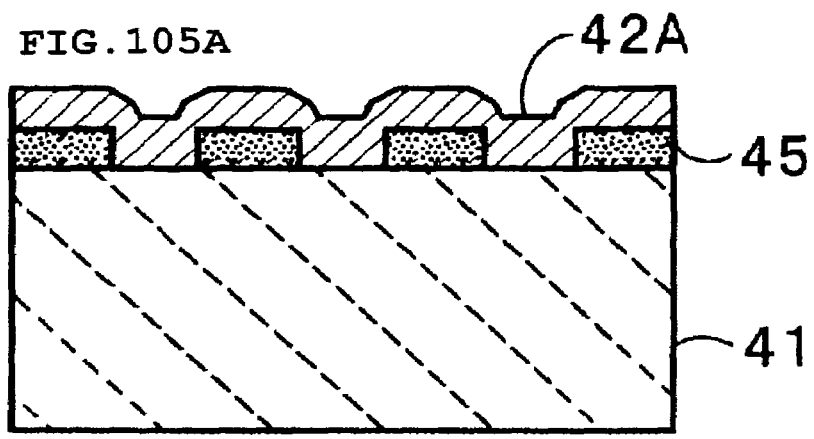
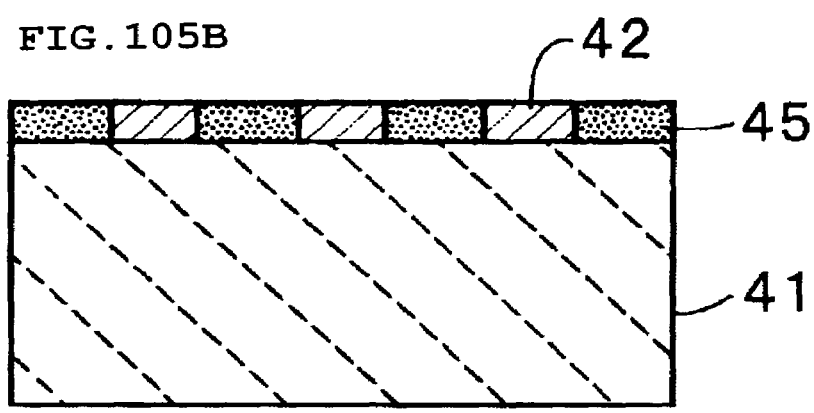
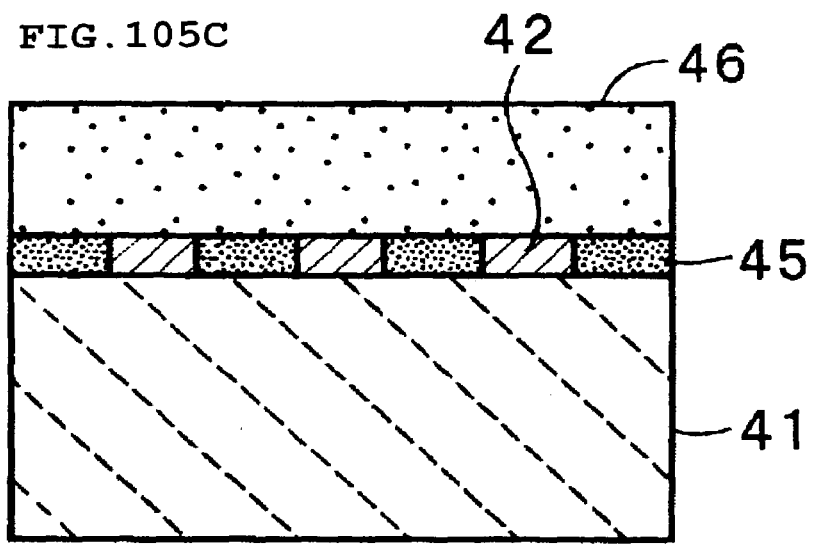

METHOD FOR MANUFACTURING A SURFACE ACOUSTIC WAVE

BACKGROUND OF THE INVENTION

1. Field of the Invention

The present invention relates to a surface acoustic wave (SAW) apparatus used in, for example, resonators and bandpass filters and also to a manufacturing method for this type of SAW apparatus. More specifically, the invention relates to a SAW apparatus having a structure in which an insulating layer is disposed to cover an interdigital (IDT) electrode and also to a manufacturing method for this type of SAW apparatus.

2. Description of the Related Art

DPX or RF filters used in mobile communication systems need to satisfy wide-band and good temperature characteristics. In known SAW apparatuses used in DPX or RF filters, piezoelectric substrates formed of 36°-50°-rotated Y-plate X-propagating $LiTaO_3$ are used. This type of piezoelectric substrate has a temperature coefficient of frequency (TCF) of about −40 to −30 ppm/° C. In order to improve the temperature characteristic, it is known that a $SiO_2$ film having a positive TCF is formed to cover an IDT electrode on a piezoelectric substrate. An example of a manufacturing method for this type of SAW apparatus is shown in FIGS. 109A through 109D.

As shown in FIG. 109A, a resist pattern 52 is formed on a piezoelectric substrate 51 except for an area in which an IDT electrode is to be formed. Then, as shown in FIG. 109B, an electrode film 53, which serves as an IDT electrode, is formed on the entire surface of the piezoelectric substrate 51. Subsequently, by using a resist stripper, the resist pattern 52 and a metallic film attached to the resist pattern 52 are removed, thereby forming an IDT electrode 53A, as shown in FIG. 109C. Then, as shown in FIG. 109D, a $SiO_2$ film 54 is formed to cover the IDT electrode 53A.

For achieving an object other than the improvement of the TCF, another manufacturing method for a SAW apparatus in which an insulating or non-conductive protective film is formed to cover an IDT electrode is disclosed in Japanese Unexamined Patent Application Publication No. 11-186866. FIG. 110 is a schematic sectional view illustrating a SAW apparatus 61 taught in JP 11-186866. In the SAW apparatus 61, an IDT electrode 63 made of Al or an alloy primarily including Al is disposed on an insulating substrate 62. In an area other than an area in which the IDT electrode 63 is disposed, an insulating or non-conductive inter-electrode-finger film 64 is disposed. An insulating or non-conductive protective film 65 is also disposed to cover the IDT electrode 63 and the inter-electrode-finger film 64. In the SAW apparatus 61 disclosed in JP 11-186866, the inter-electrode-finger film 64 and the protective film 65 are made of an insulating material, for example, $SiO_2$, or a non-conductive material, for example, silicone. By forming the inter-electrode-finger film 64, discharging between the electrode fingers caused by a pyroelectric property unique to the piezoelectric substrate 62 can be suppressed.

Japanese Unexamined Patent Application Publication No. 61-136312 teaches the following type of one-port SAW resonator. An electrode made of a metal, such as aluminum or gold, is disposed on a piezoelectric substrate made of quartz or lithium niobate. Then, after a $SiO_2$ film is formed, it is planarized. In this type of resonator, good resonance characteristics can be achieved by planarizing the $SiO_2$ film.

As shown in FIGS. 109A through 109D, in the manufacturing method for SAW apparatuses in which the $SiO_2$ film 54 is formed for improving the TCF, the height of the $SiO_2$ film 54 is different between a portion with the IDT electrode 53A and a portion without the IDT electrode 53A. Because of the differences in the height of the $SiO_2$ film 54, the insertion loss is increased. These differences in height increase as the thickness of the IDT electrode 53A becomes larger. Thus, the thickness of the IDT electrode 53A cannot be increased.

In the SAW apparatus 61 taught in JP 11-186866, after the inter-electrode-finger film 64 is formed between the electrode fingers of the IDT electrode 63, the protective film 65 is formed. Accordingly, the height of the protective film 65 is uniform, unlike the SAW apparatus shown in FIGS. 109A through 109D.

In this configuration, because the inter-electrode-finger film 64 is formed in contact with the IDT electrode 63 which is made of Al or an alloy primarily including Al, a sufficient reflection coefficient is not obtained in the IDT electrode 63, thereby causing the generation of ripples in the resonance characteristics.

Also, in the manufacturing method taught in JP 11-186866, the resist formed on the inter-electrode-finger film 64 must be removed by a resist stripper before forming the protective film 65. In this case, the IDT electrode 63 may be disadvantageously eroded by the resist stripper. This requires the use of erosion-resistant metal for the IDT electrode 63, thereby decreasing flexibility in selecting the type of metal used in the IDT electrode 63.

In the one-port SAW resonator taught in JP 61-136312, quartz or lithium niobate is used for the piezoelectric substrate, and the electrode is made of aluminum or gold. In JP 61-136312, only the embodiment in which the electrode is made of Al and is disposed on a quartz substrate is taught, and no specific reference is made to a SAW apparatus using a substrate made of another type of material or an electrode made of another type of metal.

JP 61-136312 teaches that superior resonance characteristics are achieved by planarizing the $SiO_2$ film. Then, in order to obtain a wide-band filter, the present inventors formed a one-port SAW resonator having a structure similar to the structure taught in JP 61-136312, except that a $LiTaO_3$ substrate having a large electromechanical coupling coefficient was used as the piezoelectric substrate. The present inventors then examined the characteristics of the one-port SAW filter.

More specifically, an Al electrode was formed on the $LiTaO_3$ substrate, and then, a $SiO_2$ film was formed and the surface of the $SiO_2$ film was planarized. However, a considerable deterioration in the characteristics after the formation of the $SiO_2$ film was observed, and the present inventors found that this SAW resonator cannot be put to practical use.

By using a $LiTaO_3$ substrate or a $LiNbO_3$ substrate having a larger electromechanical coupling coefficient than quartz, the fractional bandwidth is increased considerably. However, the present inventors found that, after the formation of an Al electrode on a $LiTaO_3$ substrate and after the formation of a $SiO_2$ film, the reflection coefficient was sharply decreased to about 0.02, as shown in FIGS. 2 and 3, caused by the planarization of the $SiO_2$ film. FIGS. 2 and 3 illustrate the relationship between the reflection coefficient and the thickness $H/\lambda$ of the IDT electrodes when the IDTs are made of Al, Au, Pt, Cu, and Ag and the $SiO_2$ film were formed on a $LiTaO_3$ substrate having Euler angles (0°, 126°, 0°). The solid lines in FIGS. 2 and 3 represent a relationship between the reflection coefficient and the thickness $H/\lambda$ of the IDT electrodes when the surface of the $SiO_2$ film was not planarized. The broken lines indicate a relationship between the reflection coefficient and the thickness $H/\lambda$ of the IDT electrodes when the surface of the $SiO_2$ film was planarized.

FIGS. 2 and 3 show that, when the Al electrode was used, the reflection coefficient is decreased considerably to about 0.02 by the planarization of the surface of the $SiO_2$ film, regardless of the thickness of the IDT electrode. Accordingly, a sufficient stop band cannot be achieved, causing the generation of sharp ripples in the vicinity of the antiresonant frequency.

It is known that the reflection coefficient becomes larger as the thickness of an electrode is increased. As is seen from FIGS. 2 and 3, the reflection coefficient is not increased as the thickness of the Al electrode is increased when the surface of the $SiO_2$ film was planarized.

In contrast, as is seen from FIG. 2, the reflection coefficient is increased as the thickness of the Au or Pt electrode is increased even when the surface of the $SiO_2$ film was planarized.

SUMMARY OF THE INVENTION

Based on the above-described discovery and to overcome the problems described above, preferred embodiments of the present invention provide a SAW apparatus in which an insulating layer is formed between electrode fingers of an IDT electrode and on the IDT electrode in order to achieve a sufficiently large reflection coefficient of the IDT electrode and in order to suppress characteristic deterioration caused by ripples generated in the resonance characteristics, which results in superior resonance characteristics and superior filter characteristics. Another preferred embodiment of the present invention provides a manufacturing method for such a novel SAW apparatus.

Another preferred embodiment of the present invention provides a SAW apparatus that has superior characteristics, for example, a sufficiently large reflection coefficient of an IDT electrode and a high degree of flexibility in selecting the type of material forming the IDT electrode so as to decrease the possibility of erosion of the IDT electrode, and a manufacturing method for such a novel SAW apparatus.

Yet another preferred embodiment of the present invention provides a SAW apparatus that has superior characteristics, for example, a sufficiently large reflection coefficient of an IDT electrode, a decreased possibility of erosion of the IDT electrode, and a superior temperature coefficient of frequency (TCF), and a manufacturing method for such a novel SAW apparatus.

According to a first preferred embodiment of the present invention, a SAW apparatus includes a piezoelectric substrate, at least one electrode disposed on the piezoelectric substrate and including at least one of a metal having a density higher than Al and an alloy primarily including a metal having a density higher than Al, a first insulating layer provided on the piezoelectric substrate in an area other than an area in which the electrode is provided such that the first insulating layer has substantially the same thickness as the thickness of the electrode, and a second insulating layer arranged to cover the electrode and the first insulating layer. In the first preferred embodiment of the present invention, the density of the electrode is about 1.5 times or greater than the density of the first insulating layer.

With this configuration, a sufficient reflection coefficient of the electrode can be obtained. Thus, ripples generated in the resonance characteristic or the antiresonance characteristic are shifted outside the pass band, and the ripples themselves are suppressed. The TCF is also improved. Additionally, because the height of the electrode is substantially the same as that of the first insulating layer, the insertion loss can be minimized.

According to a second preferred embodiment of the present invention, a SAW apparatus includes a piezoelectric substrate, at least one electrode provided on the piezoelectric substrate, a protective metal film provided on the electrode and including a metal or an alloy having higher erosion-resistant characteristics than the metal or the alloy forming the electrode, a first insulating layer arranged on the piezoelectric substrate in an area other than an area in which the electrode is arranged so that the thickness of the first insulating layer is substantially the same as the total thickness of the electrode and the protective metal film, and a second insulating layer provided to cover the protective metal film and the first insulating layer.

With this configuration, because the electrode is covered with the protective metal film and the first insulating layer, the erosion of the electrode by a resist stripper when removing a resist pattern is suppressed.

In the second preferred embodiment of present invention, the average density of the laminated structure of the electrode and the protective metal film may be about 1.5 times or greater than the density of the first insulating layer. With this arrangement, unwanted ripples appearing in the resonance characteristic or the filter characteristic are shifted outside the pass band.

In the first or second preferred embodiment of the present invention, the first and second insulating layers may include $SiO_2$. Thus, a SAW apparatus having an improved TCF is provided.

In the first or second preferred embodiment of the present invention, the reflection of a SAW may be preferably utilized. The structure of a SAW apparatus utilizing the reflection of a SAW is not particularly restricted. and An end-surface-reflection-type SAW apparatus utilizing the reflection of two opposing side surfaces of a piezoelectric substrate or a SAW apparatus provided with reflectors disposed to sandwich an electrode therebetween in the SAW propagating direction may be used.

The SAW apparatus of the first or second preferred embodiment of the present invention can be used in various types of SAW resonators and SAW filters. The SAW resonator may be a one-port resonator or a two-port resonator, and the SAW filter may be a two-port resonator filter, a ladder filter, or a lattice filter.

In the first or second preferred embodiment of the present invention, the electrode may be an IDT electrode. The IDT electrode may be a unidirectional electrode in which the insertion loss can be reduced. Alternatively, the electrode may be a reflector.

In the first or second preferred embodiment of the present invention, the piezoelectric substrate may be a $LiTaO_3$ substrate having Euler angles of about (0±3°, 104°-140°, 0±3°), the first and second insulating layers may include a $SiO_2$ film, the normalized thickness Hs/λ may range from about 0.03 to about 0.45 where Hs is a total thickness of the $SiO_2$ film of the first and second insulating layers and λ is the wavelength of a SAW, and the normalized thickness H/λ of the electrode may satisfy the following equation (1):

$$0.005 \leq H/\lambda \leq 0.00025 \times \rho2 - 0.01056 \times \rho + 0.16473 \qquad \text{Equation (1)}$$

where H indicates the thickness of the electrode and ρ represents the average density of the electrode.

Au, Ag, Cu, W, Ta, Pt, Ni, or Mo may be used in forming the electrode.

In preferred embodiments of the present invention, the electrode may be made of one of the above-described metals or an alloy primarily including such a metal, or formed of a laminated film including a primary metallic film made of one of the above-described metals or an alloy including one of the above-described metals. According to the type of metal, the normalized thickness H/λ of the electrode, the Euler angles of the piezoelectric substrate, and the total normalized thickness Hs/λ of the first and second $SiO_2$ insulating layers are defined to be within specific ranges, thereby improving the electromechanical coupling coefficient, the reflection coefficient, and the TCF. The attenuation constant can also be reduced.

According to a third preferred embodiment of the present invention, a method of manufacturing the SAW apparatus according to the first preferred embodiment of the present invention includes preparing a piezoelectric substrate, forming a first insulating layer on the entirety of one surface of the piezoelectric substrate, removing, by using a resist pattern for forming an electrode pattern including at least one electrode, the at least a portion of the first insulating layer in an area in which the electrode is to be formed, and maintaining a laminated structure of the first insulating layer and the resist pattern in an area other than the area in which the electrode is to be formed; forming the at least one electrode by forming an electrode film including at least one of a metal having a density higher than Al, an alloy including a metal having a density higher than Al in an area of the portion of the first insulating layer which was removed so that the thickness of the electrode film becomes substantially the same as the thickness of the first insulating layer, removing the resist pattern on the first insulating layer, and forming a second insulating layer to cover the first insulating layer and the electrode.

With this configuration, because the second insulating layer is formed to cover the first insulating layer and the electrode, there is substantially no difference in the height of the top surface of the second insulating layer, thereby reducing the insertion loss. Additionally, because the electrode is made of a metal or an alloy having a density higher than Al, the reflection coefficient of the electrode can be improved, thereby suppressing characteristic deterioration caused by unwanted ripples.

In the manufacturing method of the third preferred embodiment of the present invention, the density of the metal or the alloy forming the electrode may be about 1.5 times or greater than that of the first insulating layer. With this arrangement, unwanted ripples appearing in the resonance characteristic or the filter characteristic are shifted outside the pass band.

According to a fourth preferred embodiment of the present invention, a method of manufacturing the SAW apparatus of the second preferred embodiment of the present invention includes preparing a piezoelectric substrate, forming a first insulating layer on the entirety of one surface of the piezoelectric substrate, removing a portion of the first insulating layer by using a resist pattern, maintaining a laminated structure of the first insulating layer and the resist pattern, forming at least one electrode by forming a metal or an alloy in an area of the portion of the first insulating layer which was removed, forming a protective metal film made of a metal or an alloy having higher erosion-resistant characteristics than the metal or the alloy of the at least one electrode on the entire surface of the at least one electrode so that the height of the protective metal film becomes substantially the same as the height of the first insulating layer, removing the resist pattern on the first insulating layer, and forming a second insulating layer to cover the protective metal film formed on the electrode and the first insulating layer.

With this configuration, in the step of removing the resist pattern, because the side surfaces of the electrode are covered with the first insulating layer and the top surface is covered with the protective metal film, the erosion of the electrode can be suppressed.

In the fourth preferred embodiment of the present invention, the metal or the alloy forming the electrode and the metal or the alloy forming the protective metal film may be selected so that the average density of the laminated structure of the electrode and the protective metal film is about 1.5 times or greater than the density of the first insulating layer. With this arrangement, unwanted ripples appearing in the resonance characteristic or the filter characteristic are shifted outside the pass band.

According to a fifth preferred embodiment of the present invention, a method of manufacturing a SAW apparatus includes preparing a piezoelectric substrate, forming an electrode on the piezoelectric substrate, forming an insulating layer to cover the electrode, and planarizing a difference of the height of the insulating layer. Accordingly, a characteristic deterioration caused by the differences in the height of the top surface of the insulating layer can be suppressed.

In the fifth preferred embodiment of the present invention, the planarizing step may preferably be performed by an etch back process, a reverse sputtering process, or a polishing process.

Other features, elements, characteristics and advantages of the present invention will become more apparent from the following detailed description of preferred embodiments thereof with reference to the attached drawings.

BRIEF DESCRIPTION OF THE DRAWINGS

FIG. 26 illustrates a change in the Q factor with respect to Θ of Euler angles (0°, Θ, 0°) when the normalized thickness of a $SiO_2$ film was changed;

FIGS. 102A through 102C are schematic sectional views illustrating an etch back process for planarizing the surface of an insulating layer;

FIGS. 105A through 105C are schematic sectional views illustrating still another process for planarizing the surface of an insulating layer;

DETAILED DESCRIPTION OF PREFERRED EMBODIMENTS

The present invention is described in detail below with reference to the accompanying drawings through illustration of preferred embodiments of the present invention.

A manufacturing method for a SAW apparatus according to a first preferred embodiment of the present invention is described below with reference to FIGS. 1A through 1G, and 6.

Figure 1A:
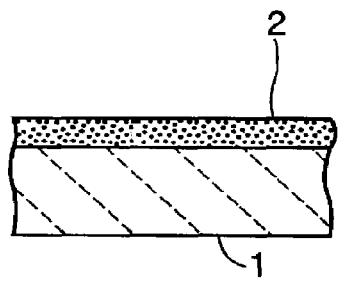
FIGS. 1A through 1G are partially cut sectional views schematically illustrating a manufacturing method for a SAW apparatus according to a first preferred embodiment of the present invention.

As shown in FIG. 1A, a LiTaO₃ substrate 1 is first prepared as a piezoelectric substrate. In the first preferred embodiment of the present invention, a 36°-rotated Y-plate X-propagating LiTaO₃ substrate having Euler angles (0°, 126°, 0°) is preferably used. As the piezoelectric substrate, a LiTaO3 substrate having different crystal orientations may be used, or a substrate made of another piezoelectric single crystal may be used. Alternatively, a piezoelectric substrate formed by laminating piezoelectric thin films on an insulating substrate may be used. Θ of the Euler angles (φ, Θ, ψ) can be expressed by Θ=cut angle+90°.

As shown in FIG. 1A, a first insulating layer 2 is formed on the entire surface of the LiTaO₃ substrate 1. In this preferred embodiment, the first insulating layer 2 is preferably formed of a SiO₂ film. The first insulating layer 2 is formed according to a suitable technique such as printing, deposition, or sputtering. The thickness of the first insulating layer 2 is preferably about equal to that of an IDT electrode, which is formed in a later step.

Figure 1B:
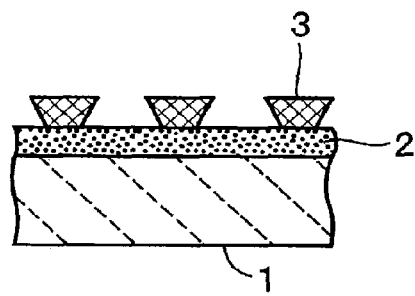

Then, as shown in FIG. 1B, a resist pattern 3 is formed according to a photolithographic technique in an area other than an area in which an IDT electrode is to be formed.

Figure 1C:
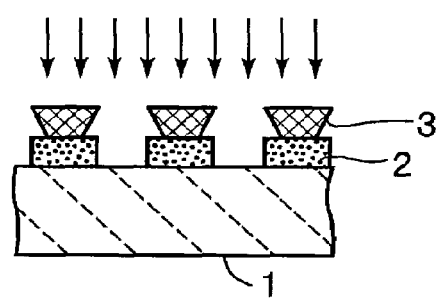

Subsequently, as indicated by the arrows in FIG. 1C, as a result of reactive ion etching (RIE) by applying ion beams, the first insulating layer 2 is removed, except for the portion disposed under the resist pattern 3.

When the SiO₂ film (first insulating layer 2) is etched by RIE using a fluorinated gas, a residue may be generated after polymerization. In this case, a buffered hydrofluoric acid (BHF) may be applied after performing RIE.

Figure 1D:
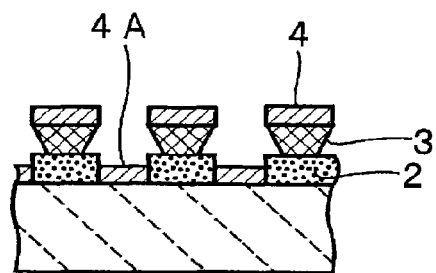
Figure 1E:
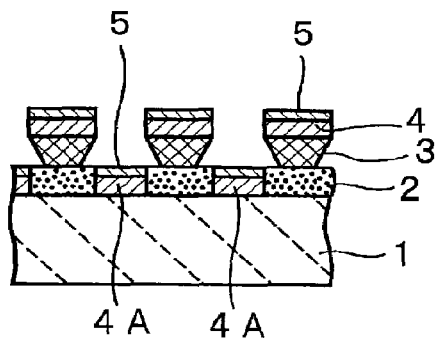

Thereafter, a Cu film and a Ti film are formed such that the thickness thereof is about equal to that of the first insulating layer 2. More specifically, as shown in FIG. 1D, a Cu film 4, which serves as an IDT electrode 4A, is formed on the area without the first insulating layer 2, and the Cu film 4 is also formed on the resist pattern 3. Then, as shown in FIG. 1E a Ti film 5 is formed as a protective metal film on the top surface of an IDT electrode 4A and on the Cu film 4 formed on the resist pattern 3. Accordingly, the side surfaces of the IDT electrode 4A are covered with the first insulating layer 2, and the top surface thereof is covered with the Ti film 5. As discussed above, the IDT electrode 4A and the protective metal film (Ti film 5) are formed such that the total thickness of the IDT electrode 4A and the Ti film 5 are about equal to the thickness of the first insulating layer 2.

Figure 1F:
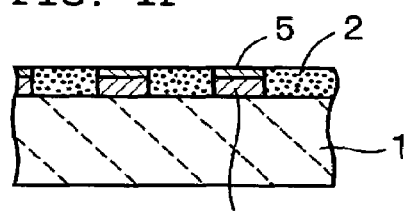

Subsequently, the resist pattern 3 is removed by using a resist stripper. Then, as shown in FIG. 1F, the IDT electrode 4A is disposed in an area other than the area in which the first insulating layer 2 is formed, and the top surface of the IDT electrode 4A is covered with the Ti film 5.

Figure 1G:
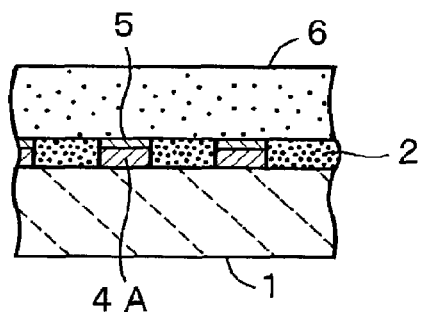
Figure 2:
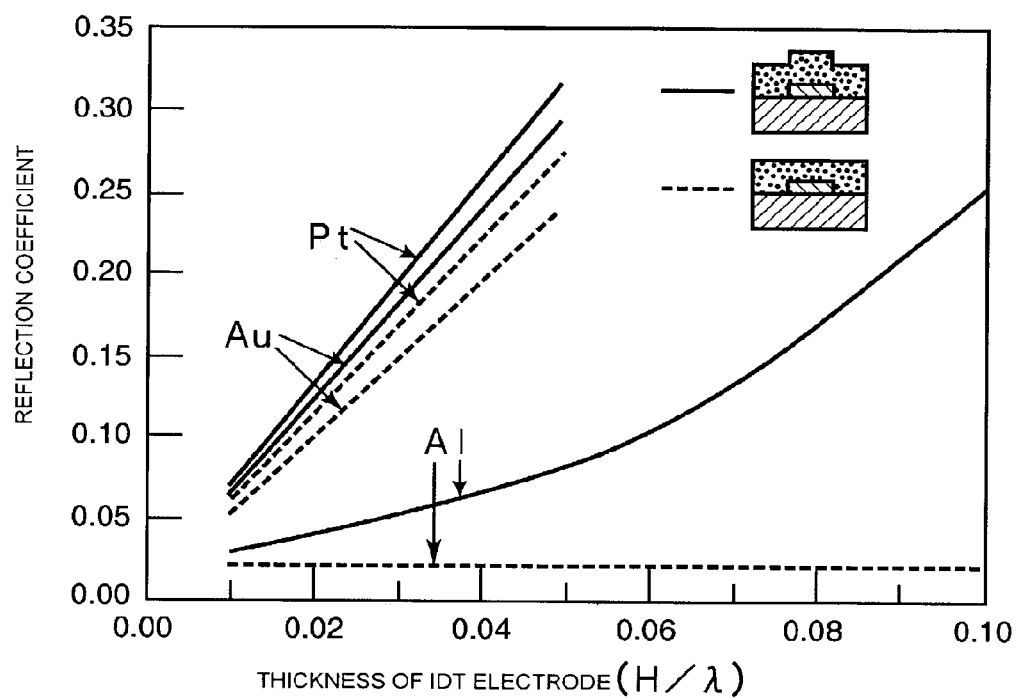
FIG. 2 illustrates the relationship between the reflection coefficient and the electrode thickness when the surface of a $SiO_2$ film is planarized and when the surface of the $SiO_2$ film is not planarized of a one-port SAW resonator in which IDT electrodes made of aluminum (Al), Gold (Au), or platinum (Pt) having various thickness values and the $SiO_2$ film having a normalized thickness of about 0.2 are formed on a $LiTaO_3$ substrate having Euler angles (0°, 126°, 0°)
Figure 3:
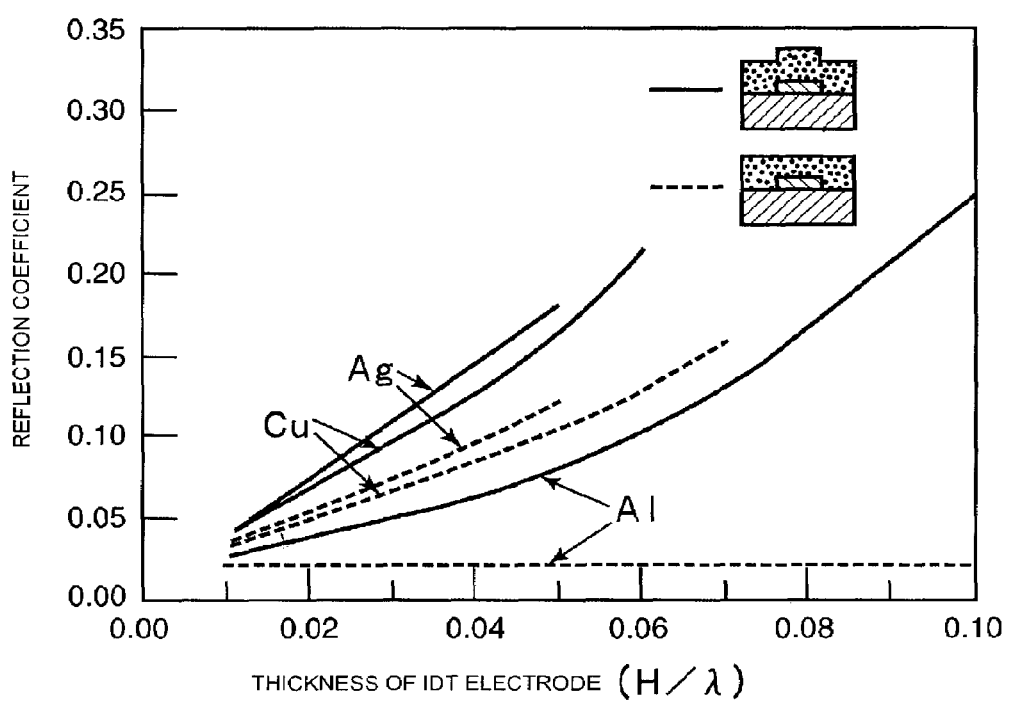
FIG. 3 illustrates the relationship between the reflection coefficient and the electrode thickness when the surface of a $SiO_2$ film is planarized and when the surface of the $SiO_2$ film is not planarized of a one-port SAW resonator in which IDT electrodes made of Al, copper (Cu), or silver (Ag) having various thickness values and the $SiO_2$ film having a normalized thickness of about 0.2 are formed on a $LiTaO_3$ substrate having Euler angles (0°, 126°, 0°)

Thereafter, as shown in FIG. 1G, a SiO₂ film, which serves as a second insulating layer 6, is formed on the entire surface of the SAW apparatus.

Figure 6:
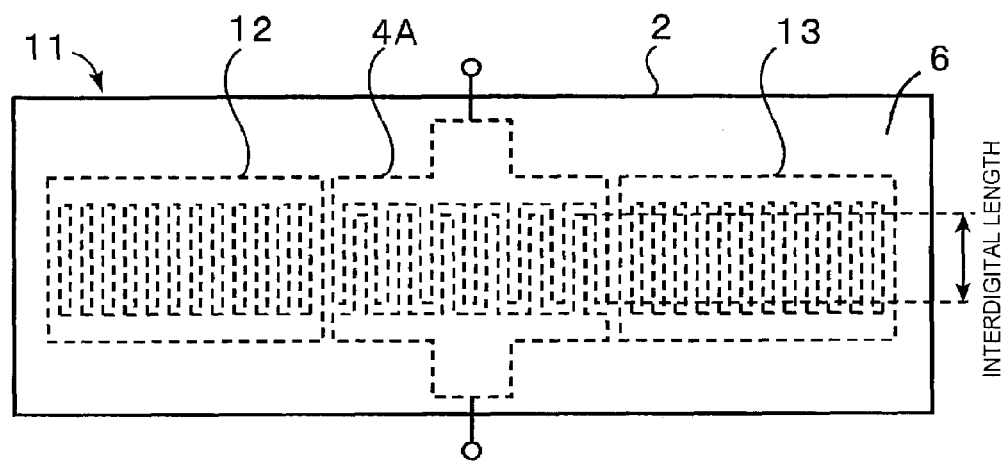
FIG. 6 is a schematic plan view illustrating a one-port SAW resonator obtained by the manufacturing method shown in FIGS. 1A through 1G.

A one-port SAW resonator 11 shown in FIG. 6 is fabricated.

In FIGS. 1A through 1G, only the portion in which the IDT electrode 4A is formed is shown. However, as shown in FIG. 6, the SAW resonator 11 is also provided with reflectors 12 and 13 in a SAW propagating direction such that they sandwich the IDT electrode 4A therebetween. The reflectors 12 and 13 are also formed in the same steps as those of the IDT electrodes 4A.

In the above-described first preferred embodiment of the present invention, because the one-port SAW resonator 11 is formed, only one IDT electrode 4A is formed on the $LiTaO_3$ substrate 1. However, a plurality of IDT electrodes may be formed according to the intended purpose of the SAW apparatus. Reflectors and an IDT electrode may be simultaneously formed. Alternatively, reflectors do not have to be formed.

Figure 4:
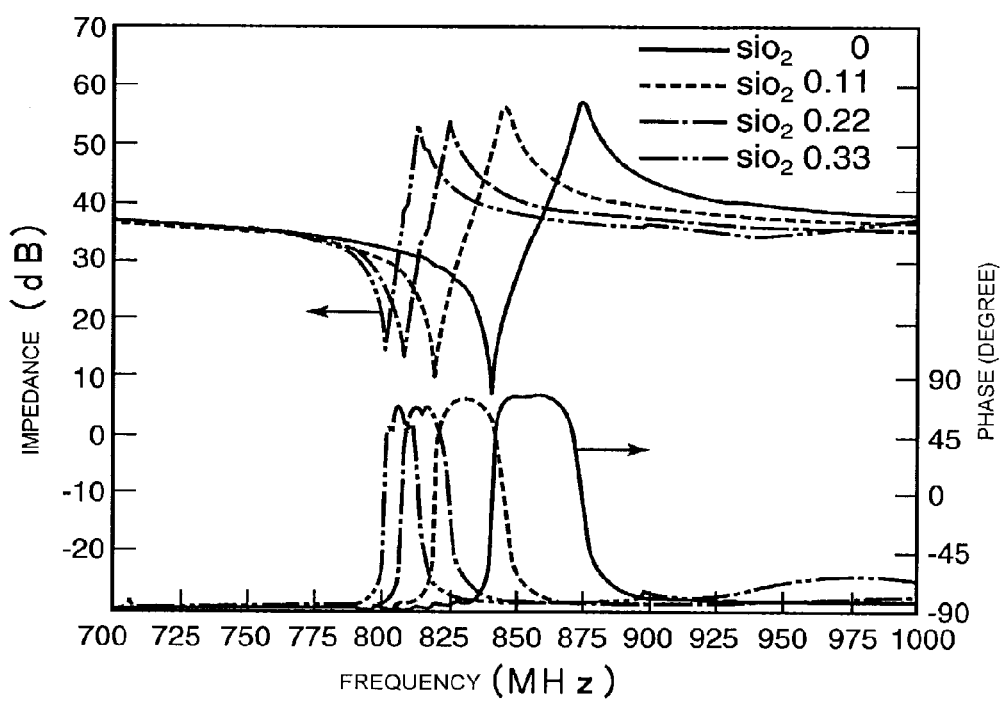
FIG. 4 illustrates the impedance and the phase with respect to the frequency when the $SiO_2$ film of a SAW resonator formed by a manufacturing method of a first comparative example was changed.

For comparison, a one-port SAW resonator was formed as a first comparative example according to the known manufacturing method shown in FIGS. 109A through 109D for a SAW apparatus with a $SiO_2$ film. As in the first preferred embodiment of the present invention, a 36°-rotated Y-plate X-propagating $LiTaO_3$ $LiTaO_3$ substrate having Euler angles (0°, 126°, 0°) was used. An IDT electrode was formed by using Cu. According to the manufacturing method shown in FIGS. 109A through 109D, because the $SiO_2$ film 54 is formed after the IDT electrode 53A, the height of the $SiO_2$ film 54 is not uniform. FIG. 4 shows the impedance and the phase of the first comparative example when the normalized thickness $h/\lambda$ (h represents the thickness of the IDT electrode 53A and $\lambda$ designates the SAW wavelength) of the IDT electrode 53A is 0.042 and when the normalized thickness $Hs/\lambda$ (Hs represents the thickness of the $SiO_2$ film 54) of the $SiO_2$ film 54 is 0.11, 0.22, and 0.33. FIG. 4 shows that the ratio of the impedance of the antiresonance point to the impedance of the resonance point, i.e., the impedance ratio, becomes smaller as the normalized thickness $Hs/\lambda$ of the $SiO_2$ film 54 is increased.

Figure 5:
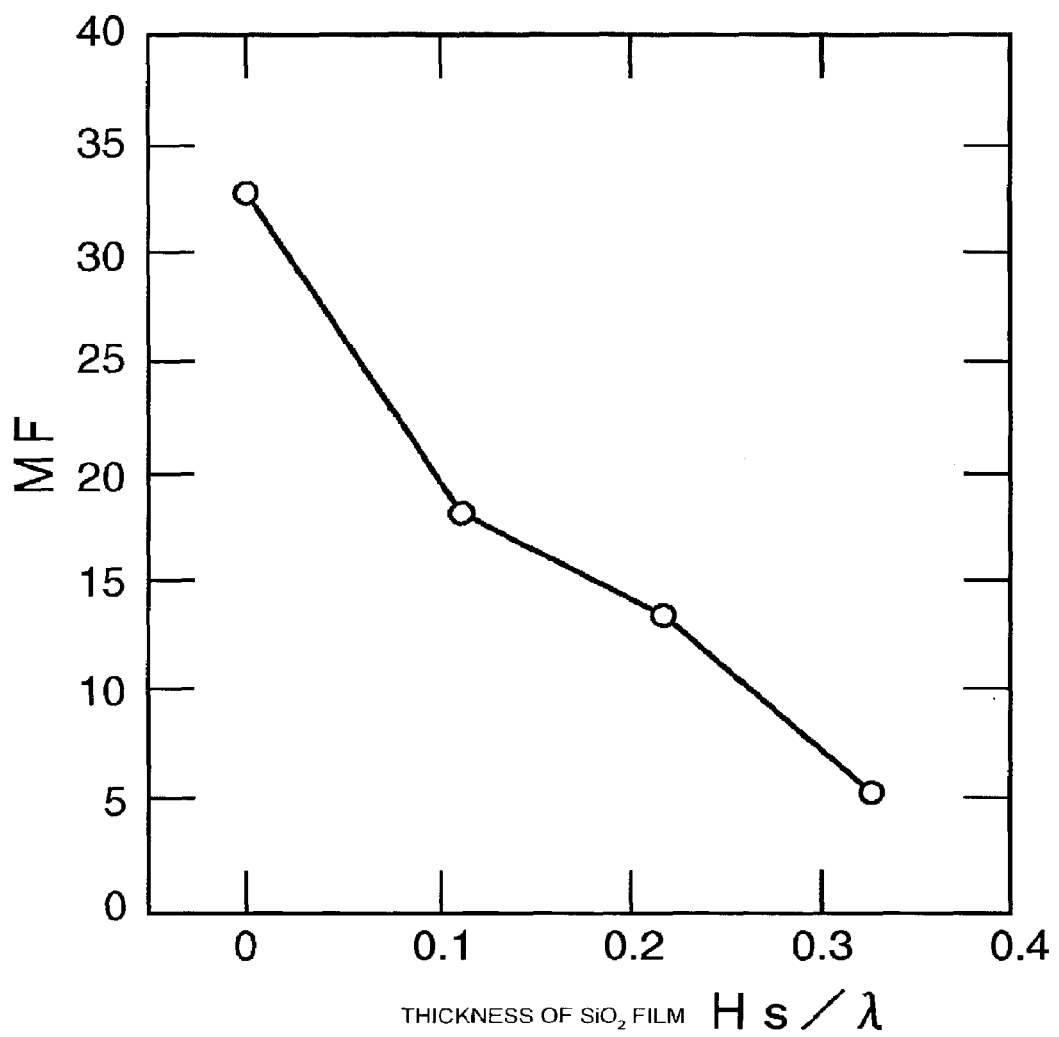
FIG. 5 illustrates the relationship between the Figure of Merit (MF) of the resonator and the thickness of the $SiO_2$ film of the SAW resonator of the first comparative example.

FIG. 5 illustrates the relationship between the normalized thickness $Hs/\lambda$ of the $SiO_2$ film 54 of the SAW resonator manufactured by the known method in the first comparative example and the Figure of Merit (MF) of the SAW resonator. FIG. 5 reveals that MF is decreased as the normalized thickness $Hs/\lambda$ of the $SiO_2$ film 54 becomes larger.

That is, in the first comparative example, the characteristics of the resonator is considerably decreased as the thickness of the $SiO_2$ film 54 is increased, even if the IDT electrode 53A is made of Cu. This is probably due to the difference of the surface height of the $SiO_2$ film 54.

Figure 7:
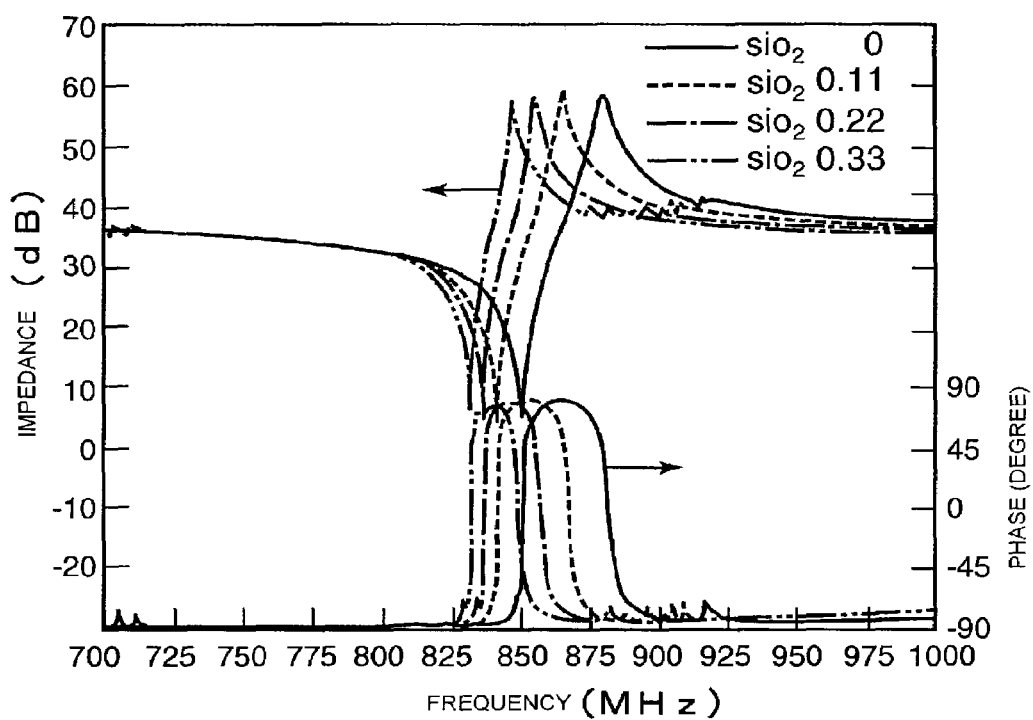
FIG. 7 illustrates the impedance and the phase with respect to the frequency when the $SiO_2$ film of the SAW resonator obtained by the manufacturing method of the first preferred embodiment of the present invention was changed.
Figure 8:
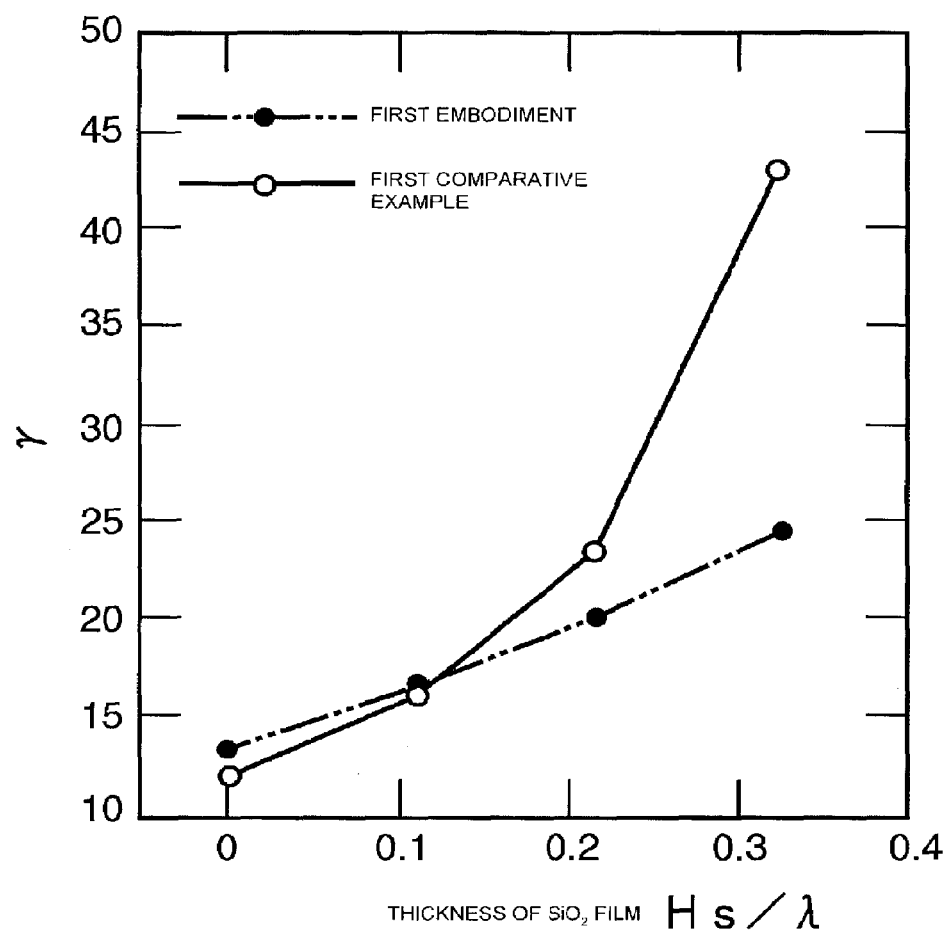
FIG. 8 illustrates the relationship of γ of the SAW resonator obtained by the manufacturing method of the first preferred embodiment of the present invention and that of the first comparative example to the thickness of the $SiO_2$ film.
Figure 9:
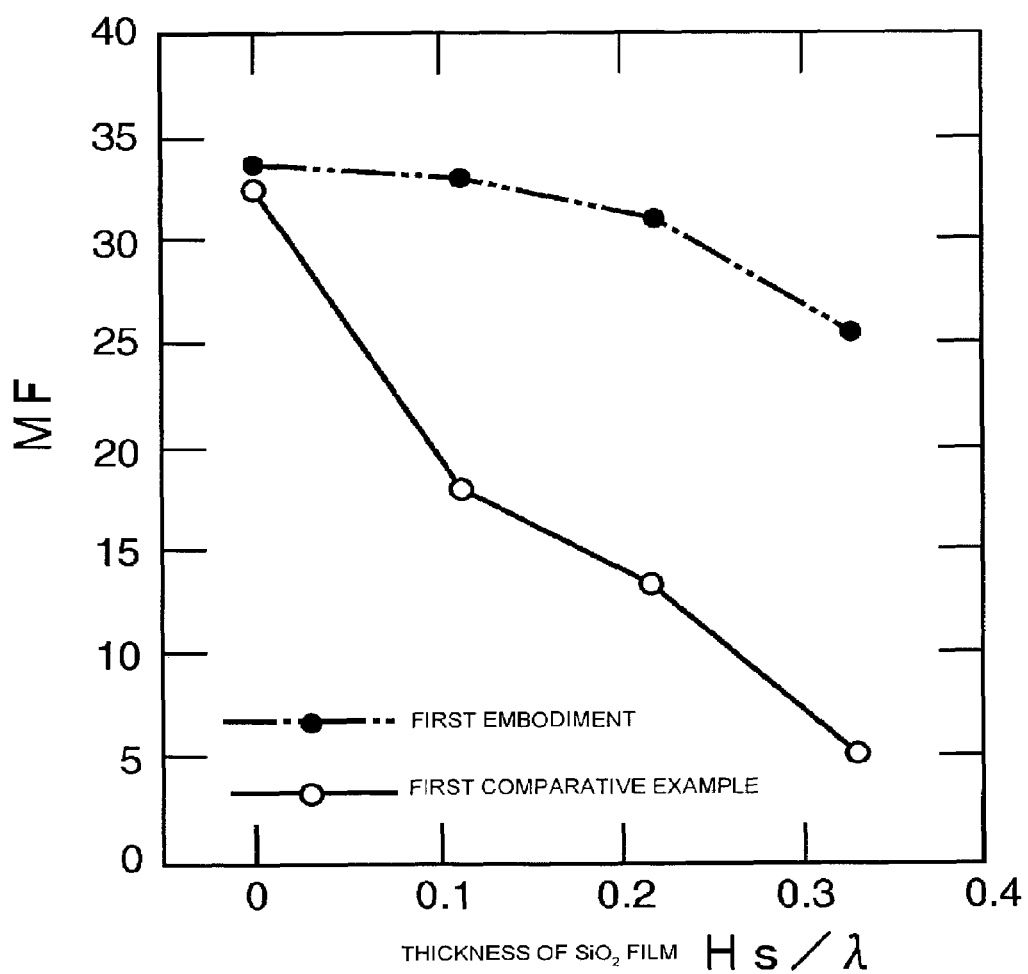
FIG. 9 illustrates the relationship of the MF of the SAW resonator obtained by the manufacturing method of the first preferred embodiment of the present invention and that of the first comparative example to the thickness of the $SiO_2$ film.

The characteristics of the SAW resonator 11 manufactured according to the first preferred embodiment of the present invention are shown in FIGS. 7 through 9.

FIG. 7 illustrates a change in the impedance and a change in the phase of the SAW resonator 11 manufactured according to the method of the above-described first preferred embodiment of the present invention when the thickness of the $SiO_2$ film, the second insulating layer 6, is changed. The two-dot-chain lines in FIGS. 8 and 9 indicate a change in $\gamma$ and a change in MF of the SAW resonator 11, respectively, when the normalized thickness $Hs/\lambda$ of the $SiO_2$ film is varied. For comparison, the corresponding characteristics of the known resonator manufactured in the first comparative example are also indicated by the solid lines in FIGS. 8 and 9.

By comparing the characteristics of FIG. 7 with those of FIG. 4, it is seen that a decrease in the impedance is small even though the normalized thickness $Hs/\lambda$ of the $SiO_2$ film is increased.

FIGS. 8 and 9 also show that a characteristic deterioration of this preferred embodiment can be suppressed even though the normalized thickness $Hs/\lambda$ of the $SiO_2$ film is increased.

That is, according to the manufacturing method of the first preferred embodiment of the present invention, a decrease in the impedance ratio is small and a characteristic deterioration can be suppressed even though the thickness of the $SiO_2$ film is increased.

Figure 10:
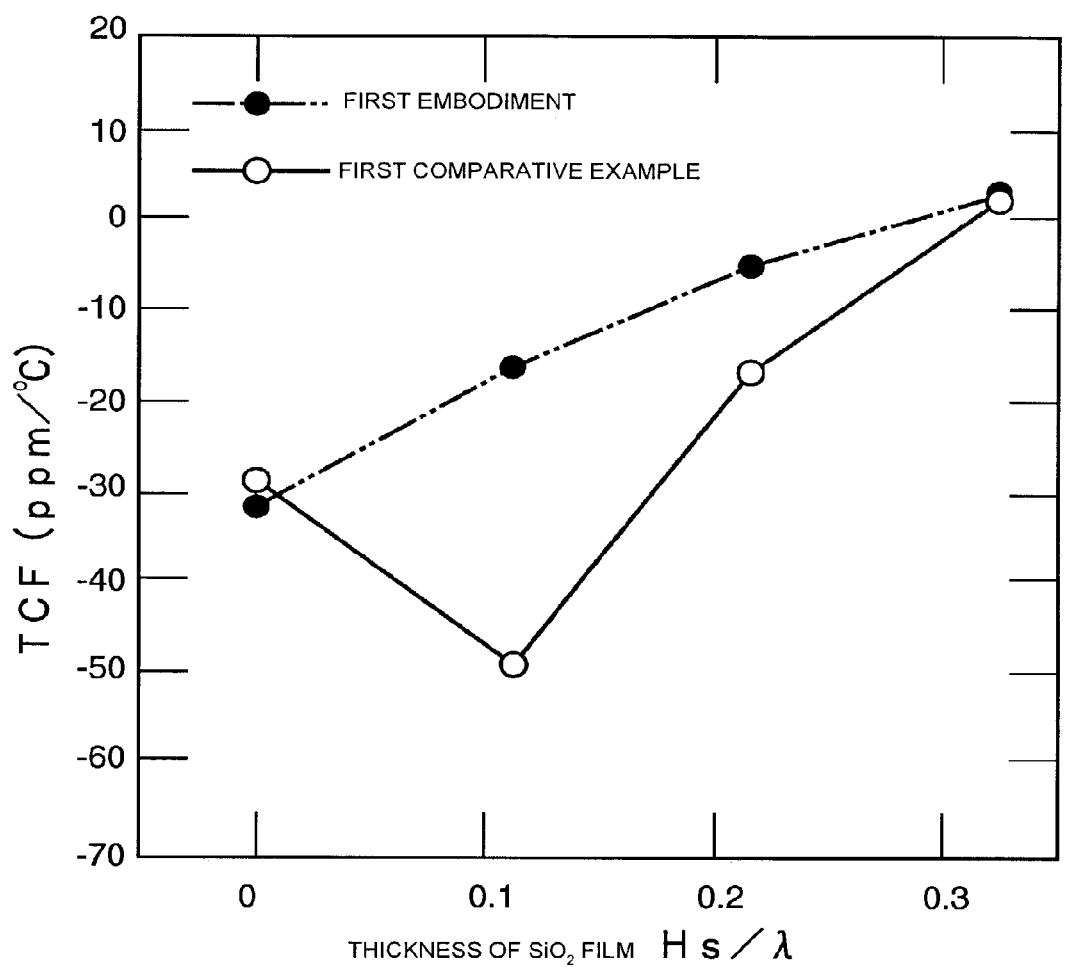
FIG. 10 illustrates the relationship between the temperature coefficient of frequency (TCF) and the thickness of the $SiO_2$ film of the SAW resonator obtained by the manufacturing method of the first preferred embodiment of the present invention and that of the first comparative example.

FIG. 10 illustrates the relationship between the temperature coefficient of frequency (TCF) of the SAW resonator of the first preferred embodiment of the present invention and that of the first comparative example and the thickness of the $SiO_2$ film. In FIG. 10, the solid line indicates the first comparative example, and the two-dot-chain line indicates the first preferred embodiment of the present invention.

FIG. 10 indicates that the TCF can be ideally improved by increasing the thickness of the $SiO_2$ film according to the manufacturing method of the first preferred embodiment of the present invention.

Thus, according to the manufacturing method of the first preferred embodiment of the present invention, it is possible to provide a SAW resonator in which the characteristic deterioration can be suppressed and the TCF can be effectively improved.

Additionally, according to the manufacturing method of the first preferred embodiment of the present invention, because the IDT electrode 4A is made of Cu, which has a density higher than Al, it has a sufficient reflection coefficient, thereby suppressing the generation of undesirable ripples in the resonance characteristic. This is described in detail below.

For comparison, a SAW resonator was formed as a second comparative example in a manner similar to the first preferred embodiment of the present invention, except that Al was used for the IDT electrode instead of Cu and the normalized thickness $Hs/\lambda$ of the $SiO_2$ film, the first insulating layer, was about 0.08. The impedance and the phase of the SAW resonator of the second comparative example are indicated by the solid lines of FIG. 11.

Figure 11:
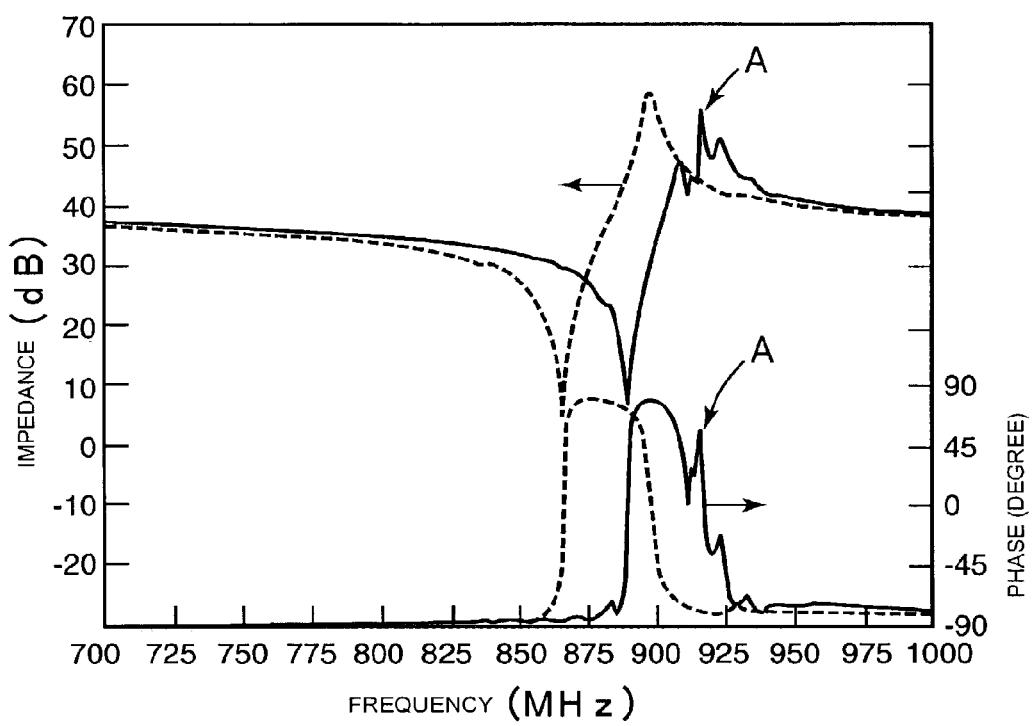
FIG. 11 illustrates the impedance and the phase with respect to the frequency of a SAW resonator with a $SiO_2$ film and a SAW resonator without a $SiO_2$ $SiO_2$ film manufactured by a second comparative example.

The impedance and the phase of the SAW resonator formed in a manner similar to the second comparative example, except that a $SiO_2$ film was not formed, are indicated by the broken lines in FIG. 11.

The solid lines of FIG. 11 indicate that large ripples (indicated by the arrows A) are generated between the resonance point and the antiresonance point when the IDT electrode was formed of Al and the $SiO_2$ film was formed in the second comparative example. In contrast, the broken lines of FIG. 11 indicate that such ripples are not generated in the SAW resonator without the $SiO_2$ film.

Accordingly, even though the $SiO_2$ film was formed to improve the TCF, the above-described ripples A are generated if the IDT electrode is formed by using Al, resulting in a characteristic deterioration. After further studying this point, the present inventors discovered that the reflection coefficient of the IDT electrode can be increased by using a metal having a density higher than Al for the IDT electrode so as to suppress the above-described ripples A.

Then, a SAW resonator was formed in a manner similar to the above-described first preferred embodiment of the present invention, except that the density of the metal for the IDT electrode was varied. The impedances of the SAW resonators using metals with different densities are shown in FIGS. 12A through 12E. FIGS. 12A through 12E illustrate the impedances when the ratio $\rho 1/\rho 2$ of the average density $\rho 1$ of the laminated structure including the IDT electrode and the protective metal film to the density $\rho 2$ of the first insulating layer is about 2.5, 2.0, 1.5, 1.2, and 1.0, respectively.

Figure 12A:
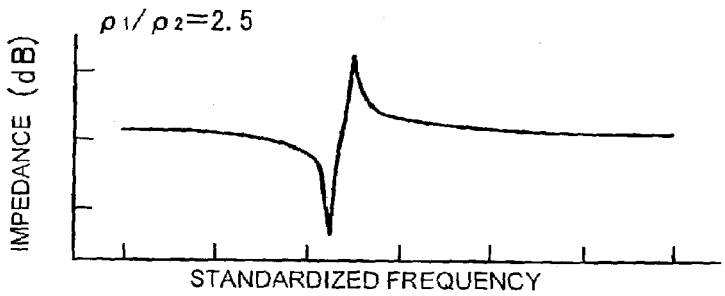
FIGS. 12A through 12E illustrate the impedance with respect to the frequency when the ratio of the average density of the IDT electrode and the protective metal film to the density of the first insulating layer was changed.
Figure 12B:
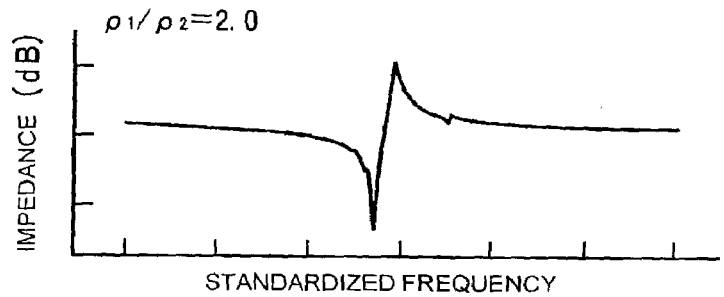
Figure 12C:
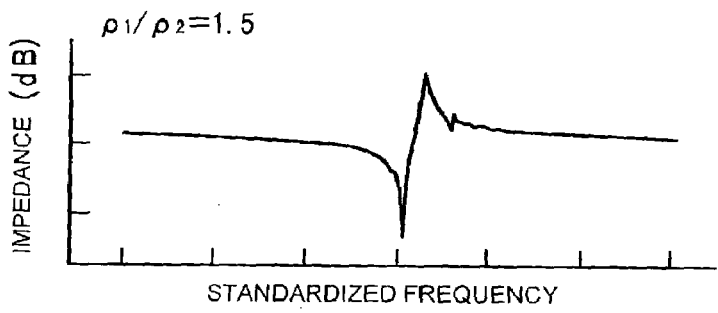
Figure 12D:
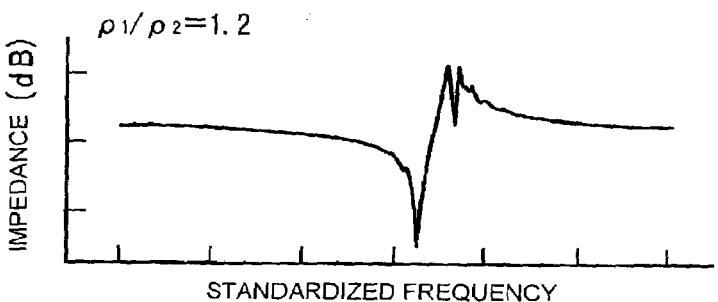
Figure 12E:
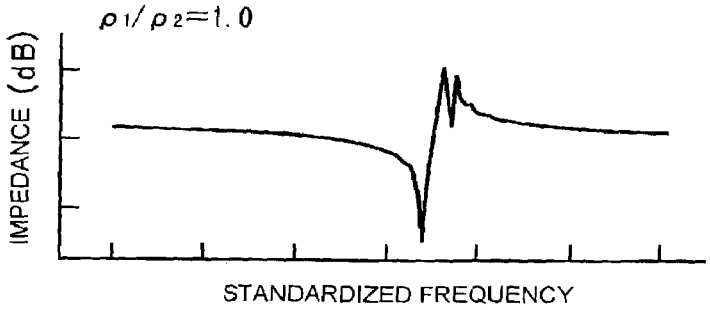

FIGS. 12A through 12C show that the ripples A are shifted to the range outside the pass band, and more particularly, FIG. 12A shows that the ripples A are considerably suppressed.

Accordingly, as is seen from FIGS. 12A through 12E, the ripples A can be shifted to the range outside the band pass between the resonant frequency and the antiresonant frequency when the density ratio of the laminated structure including the IDT electrode and the protective metal film to the first insulating layer is about 1.5 or greater, thereby having improved characteristics. When the density ratio is about 2.5 or greater, the ripples can be considerably suppressed.

In the examples of FIGS. 12A through 12E, because the Ti film is laminated on the IDT electrode 4A, the average density was calculated. However, in the preferred embodiments of the present invention, the provision of the protective metal film on an IDT is not essential. In this case, the thickness of the IDT electrode is preferably about equal to that of the first insulating layer, and the ratio of the density of the IDT electrode to that of the first insulating layer is preferably about 1.5 or greater, and more preferably, about 2.5 or greater. Then, advantages similar to those obtained by the above-described example can be achieved.

Accordingly, in a SAW resonator in which a $SiO_2$ film is formed to cover an IDT electrode, the reflection coefficient of the IDT electrode can be increased if the density of the IDT electrode, or the average density of a laminated structure including the IDT electrode and a protective metal film, is preferably greater than the density of a first insulating layer disposed along the side surfaces of the IDT electrode, thereby suppressing the generation of ripples between the resonance point and the antiresonance point.

A metal or an alloy having a higher density than Al includes, not only Cu, but also Ag or Au or an alloy essentially consisting of Ag or Au.

As in the first preferred embodiment of the invention, a protective metal film is preferably disposed on the IDT electrode. Then, according to the manufacturing method shown in FIGS. 1A through 1G, when the resist pattern 3 is removed, the erosion of the IDT electrode 4A can be prevented because the side surfaces of the IDT electrode 4A are covered with the first insulating layer 2 and the top surface thereof is covered with the protective metal film 5. It is thus possible to provide a SAW resonator having superior characteristics.

The first and second insulating layers may be formed by an insulating material other than $SiO_2$, such as SiOxNy, which contributes to an improvement in the temperature characteristics. The first and second insulating layers may be made of the same insulating materials, as the first preferred embodiment of the present invention, or they may be formed of different insulating materials.

Figure 13:
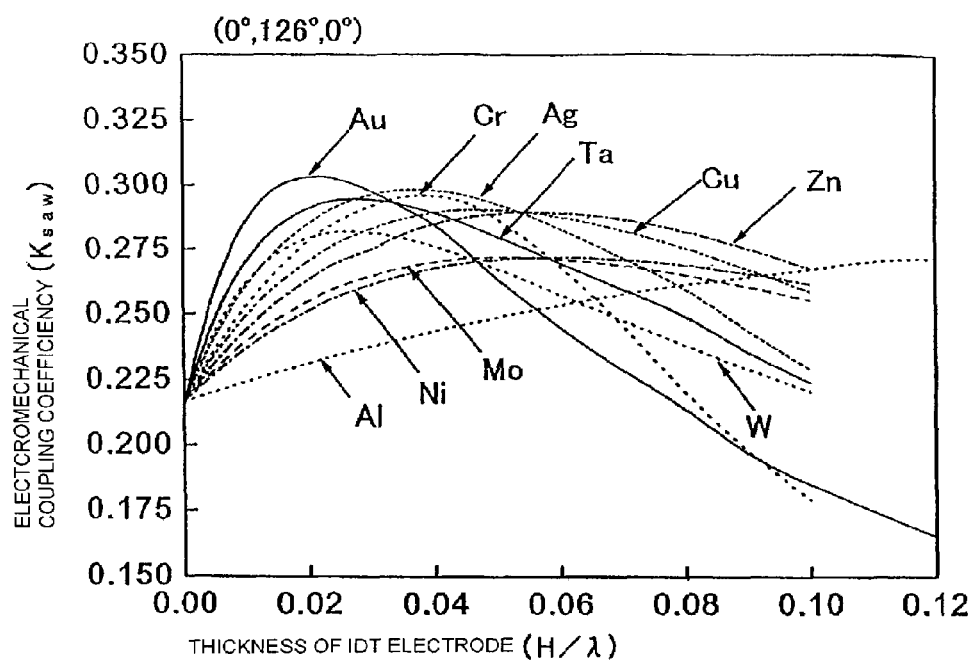
FIG. 13 illustrates a change in the electromechanical coupling coefficient when IDT electrodes made of various metals having various thickness values were formed on a $LiTaO_3$ substrate having Euler angles (0°, 126°, 0°)

FIG. 13 illustrates the relationship between the electromechanical coupling coefficient and the normalized thickness $H/\lambda$ of IDT electrodes made of various metals and having various thickness values on a $LiTaO_3$ substrate having Euler angles (0°, 126°, 0°).

Figure 14:
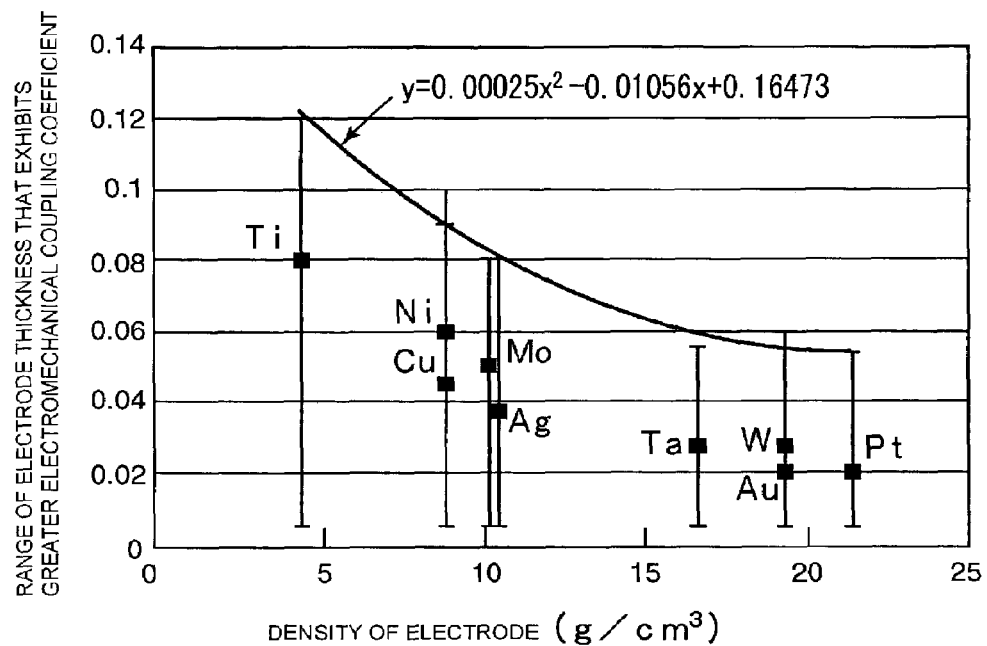
FIG. 14 illustrates the relationship of the range of the electrode thickness that exhibits greater electromechanical coupling coefficients than Al to the density of the corresponding electrode when IDTs made of various metals were formed on a $LiTaO_3$ substrate.

The types of metals having larger electromechanical coefficients than Al were extracted from FIG. 13, and the normalized thickness values of such metals are shown in FIG. 14. That is, FIG. 14 illustrates the electrode thickness range that exhibits greater electromechanical coefficients than Al.

In FIG. 14, the upper limit of the thickness range of the IDT electrodes indicates the threshold for having a greater electromechanical coupling coefficient than Al, and the lower limit of the thickness range represents the thickness of the IDT electrode that can be manufactured. By approximating the upper limit to a quadratic expression when the electrode thickness range having greater electromechanical coupling coefficients is y and the density is x, the equation y=0.00025x2−0.01056x+0.16473 can be found.

Accordingly, as is seen from subsequent preferred embodiments in which SAW resonators are formed by specifying electrode materials, it is now assumed that an IDT electrode is formed on a 14°-50°-rotated Y-plate X-propagating $LiTaO_3$ piezoelectric substrate having Euler angles (0°, 104°-140°, 0°), and the normalized thickness $Hs/\lambda$ of a $SiO_2$ film ranges from about 0.03 to about 0.45. In this case, the electromechanical coupling coefficient can be increased, as shown in FIG. 14, when the normalized thickness $H/\lambda$ of the IDT electrode satisfies the following expression (1):

$$0.005 \leq H/\lambda \leq 0.00025 \times \rho2 - 0.01056 \times \rho + 0.16473 \qquad (1)$$

wherein ρ represents the average density of the IDT electrode.

In preferred embodiments of the present invention, a metal having a higher density than Al is preferably used for the IDT electrode. In this case, the IDT electrode may be made of a metal having a higher density than Al or an alloy primarily including a metal having a higher density than Al. Alternatively, the IDT electrode may be formed of a laminated structure including a primary metallic film made of a metal having a higher density than Al or an alloy primarily including a metal having a higher density than Al and a secondary metallic film made of a metal different from that of the primary metallic film. In this case, the average density of the laminated film preferably satisfies the expression represented by $\rho0 \times 0.7 \leq \rho \leq \rho0 \times 1.3$ where ρ indicates the average density of the IDT electrode and $\rho0$ designates the density of the primary metallic film.

In preferred embodiments of the present invention, as described above, the surface of the second insulating layer is planarized. However, the height of the second insulating film may be different within a range of about 30% or smaller of the thickness of the IDT electrode. If this height difference exceeds about 30%, the advantage achieved by the planarized level of the second insulating layer cannot be sufficiently obtained.

The second insulating layer can be planarized by various techniques, such as by performing an etch back process, by utilizing an oblique incidence effect by means of reverse sputtering, by polishing the surface of the insulating layer, and by polishing the electrode. The planarization of the second insulating layer may be performed by a combination of two or more types of the above-described techniques. Details of such techniques are discussed below with reference to FIGS. 102A through 105C.

FIGS. 102A through 102C are schematic sectional views illustrating a planarization technique for the surface of the insulating layer according to an etch back process. As shown in FIG. 102A, an electrode 42 is first formed on a piezoelectric substrate 41, and then, an insulating layer 43 is formed of, for example, $SiO_2$. As shown in FIG. 102B, a resist pattern 44 is formed on the insulating layer 43 by, for example, spin coating. In this case, the surface of the resist pattern 44 is flat. Thus, by etching the resist pattern 44 according to RIE, i.e., by an etch back process, the surface of the insulating layer 43 can be planarized, as shown in FIG. 102C.

Figure 103A:
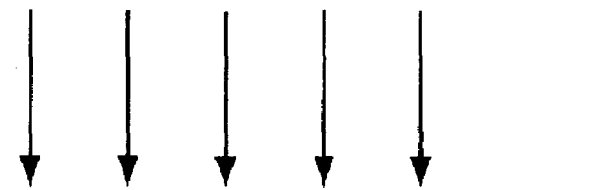
FIGS. 103A through 103D are schematic sectional views illustrating a reverse sputtering process for planarizing the surface of an insulating layer.
Figure 103B:
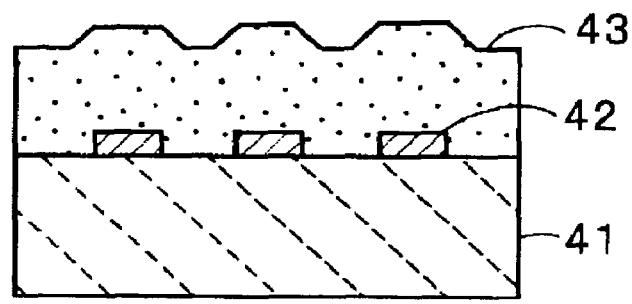
Figure 103C:
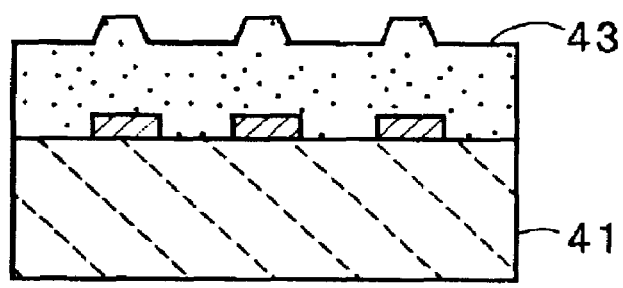
Figure 103D:
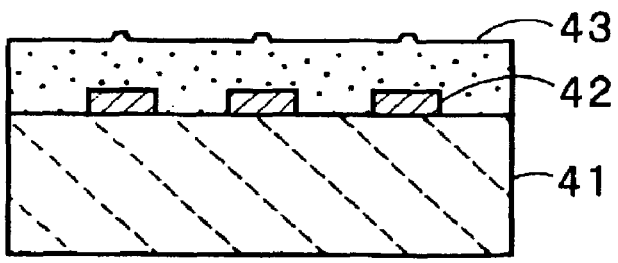

FIGS. 103A through 103D are schematic sectional views illustrating the reverse sputtering process. The electrode 42 is first formed on the piezoelectric substrate 41, and then, the insulating layer 43 is formed. Then, argon ions, which are used for sputtering the substrate 41, are applied onto the surface of the insulating layer 43 by sputtering. When sputtering is performed by ion bombardment on the surface of the substrate, a greater sputtering effect is produced if ions are applied onto an oblique surface rather than a flat surface. This is known as the "oblique incidence effect". Due to this effect, the insulating layer 43 is planarized as the sputtering proceeds, as shown in FIGS. 103B through 103D.

Figures 104A, 104B:
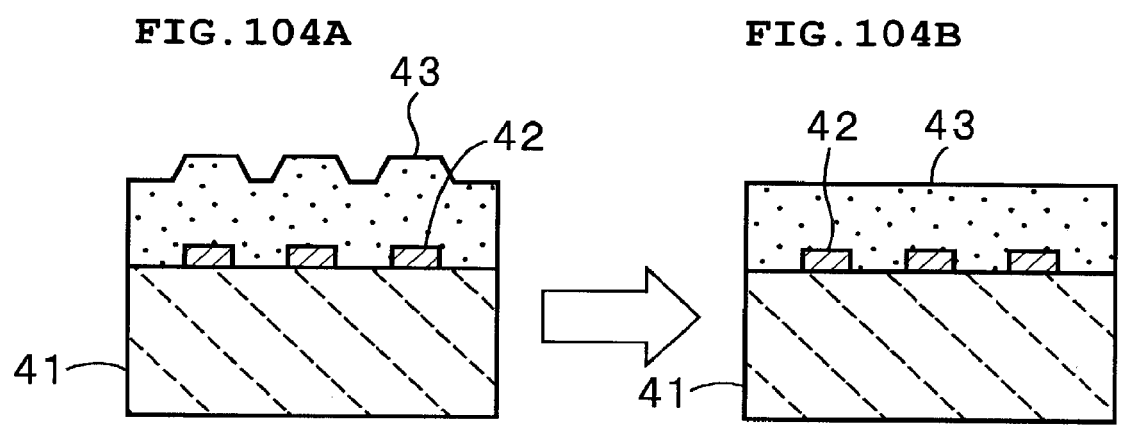
FIGS. 104A and 104B are schematic sectional views illustrating another process for planarizing the surface of an insulating layer.

FIGS. 104A and 104B are schematic sectional views illustrating a planarization technique by polishing the insulating layer. As shown in FIG. 104A, after the electrode 42 and the insulating layer 43 are formed on the substrate 41, the insulating layer 43 is mechanically or chemically polished so as to be planarized.

FIGS. 105A through 105C are schematic sectional views illustrating a planarization technique by polishing the electrode. As shown in FIG. 105A, a first insulating layer 45 is formed on the substrate 41, and a metallic film 42A, which is made of an electrode material, is formed on the entire surface by deposition. Then, as shown in FIG. 105B, by mechanically or chemically polishing the metallic film 42A, the electrode 42 and the first insulating layer 45, which is disposed around the electrode 42, are formed. Thus, the first insulating layer 45 and the electrode 42 are planarized so that they are flush with each other. Thereafter, as shown in FIG. 105C, a second insulating layer 46 is formed. According to this technique, the surface of the insulating layer is planarized.

Figure 106A:
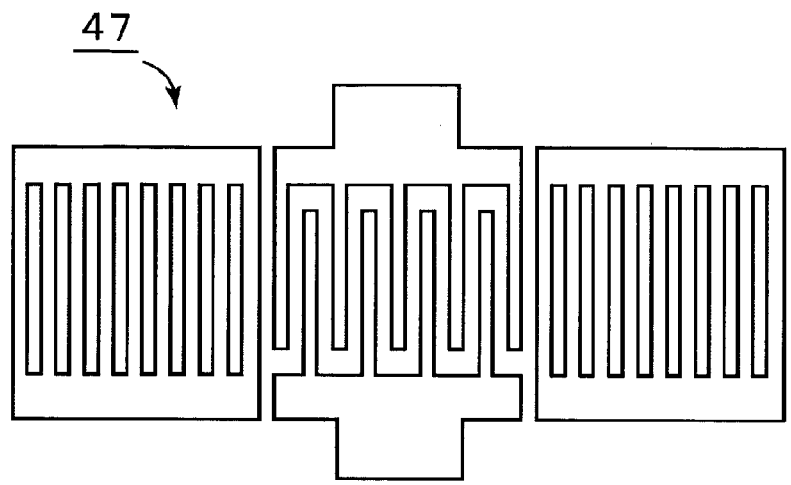
FIGS. 106A and 106B are schematic plan views illustrating a one-port SAW resonator and a two-port SAW resonator, respectively, to which the present invention is applied.
Figure 106B:
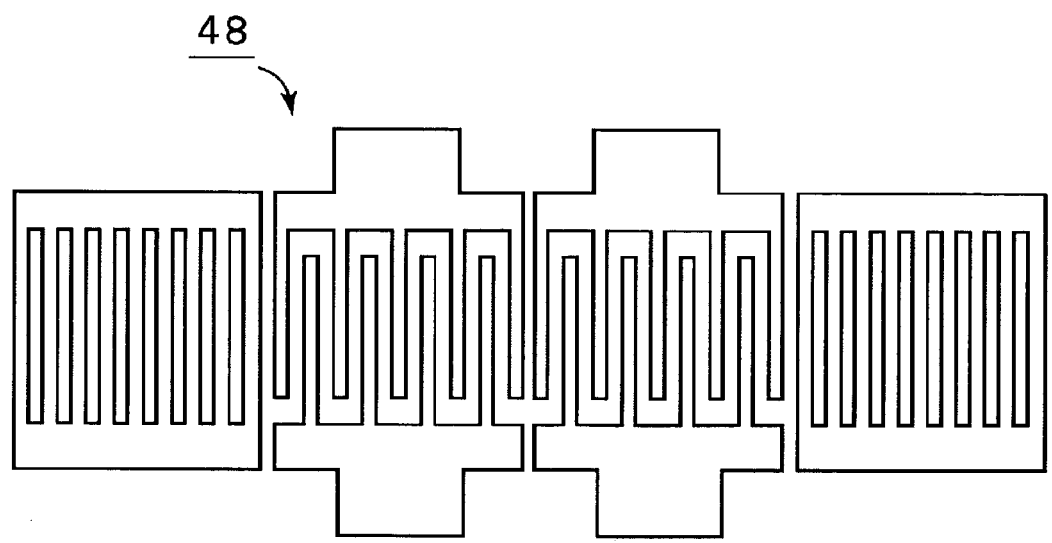

The present invention is applicable to various types of SAW apparatuses. Examples of such SAW apparatuses are shown in FIGS. 106A through 108. FIGS. 106A and 106B are schematic plan views illustrating a one-port SAW resonator 47 and a two-port SAW resonator 48, respectively. By using the same electrode structure as that of the two-port SAW resonator 48 shown in FIG. 106B, a two-port SAW resonator filter may be formed.

Figure 107:
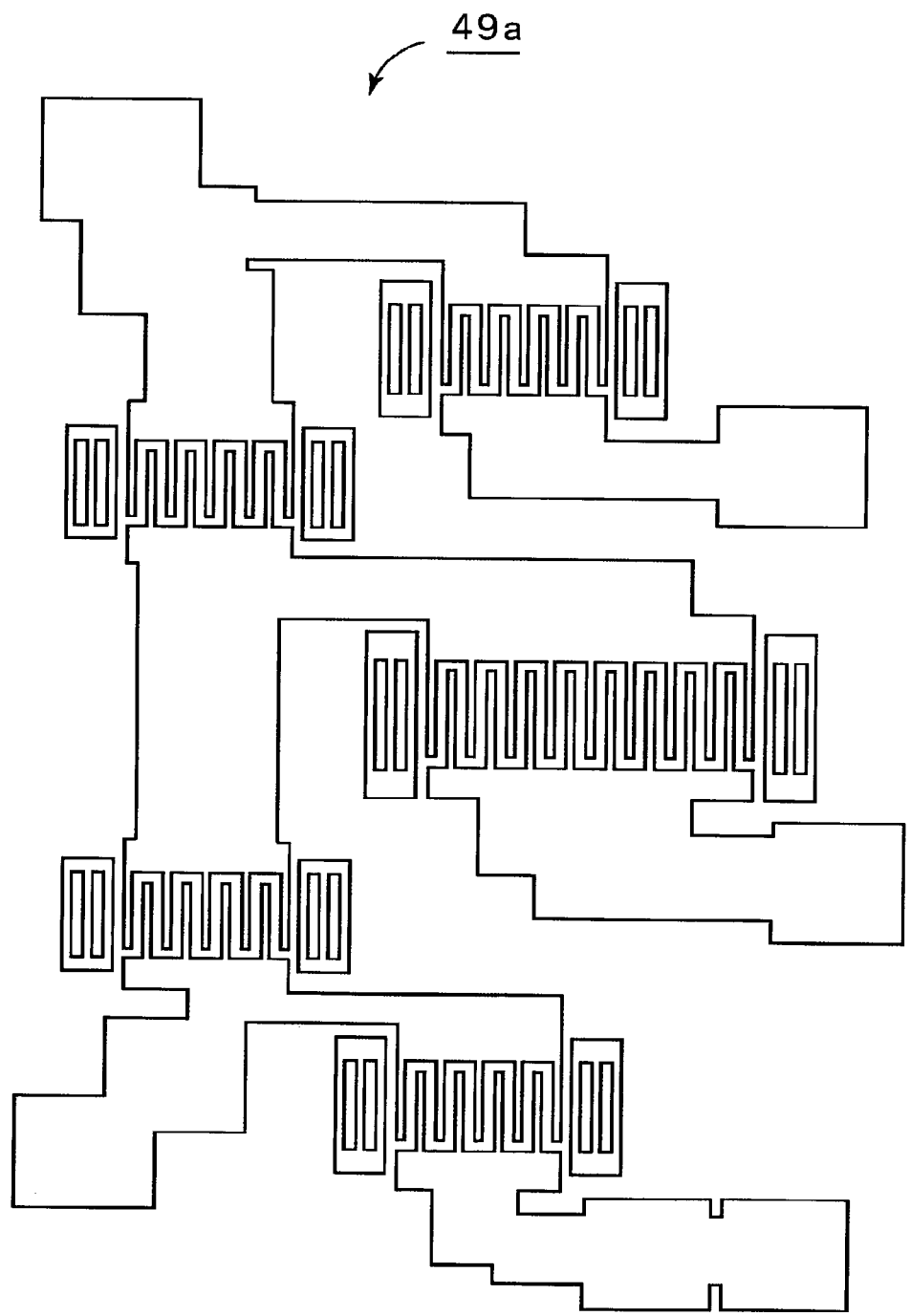
FIG. 107 is a schematic plan view illustrating a ladder filter to which the present invention is applied.
Figure 108:
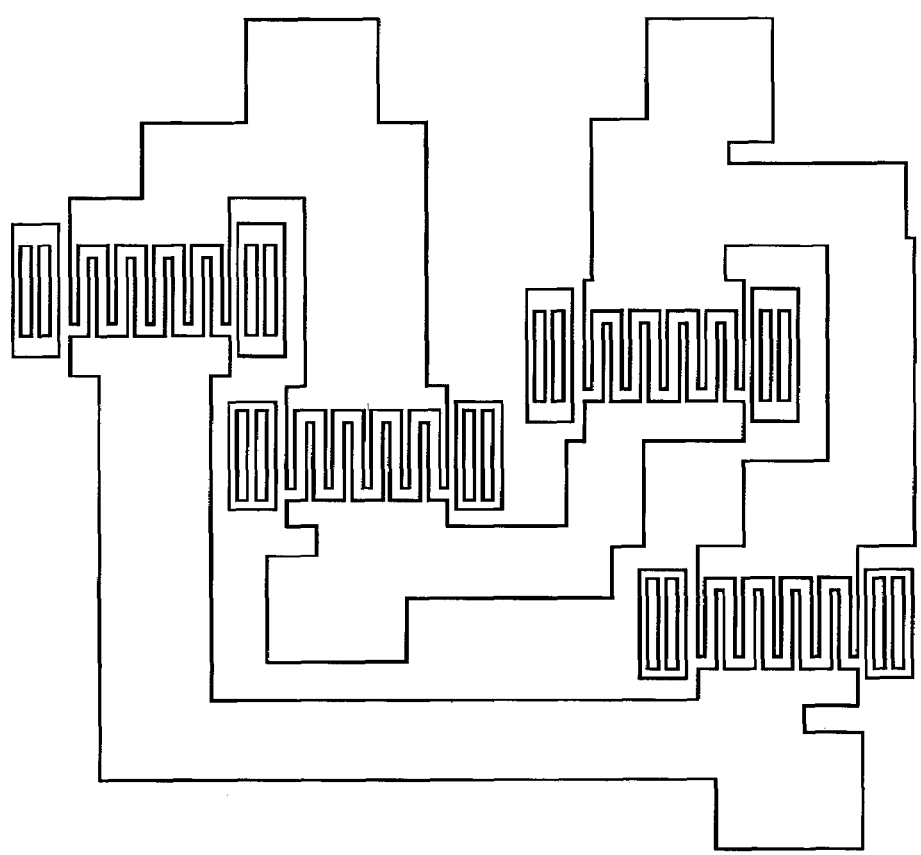
FIG. 108 is a schematic plan view illustrating a lattice filter to which the present invention is applied.
Figure 109A:
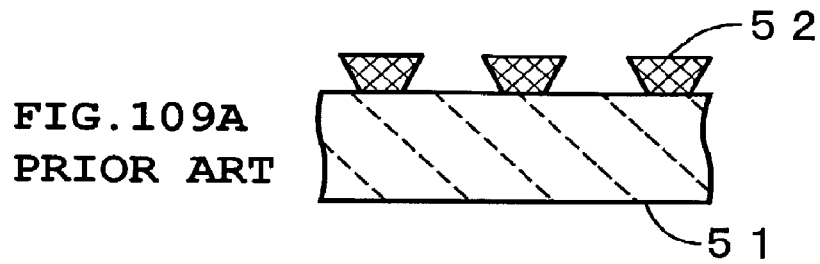
FIGS. 109A through 109D are schematic sectional views illustrating one example of a known manufacturing method for a SAW apparatus.
Figure 109B:
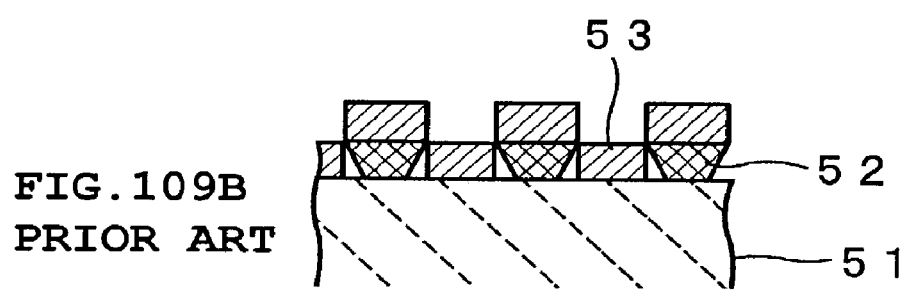
Figure 109C:
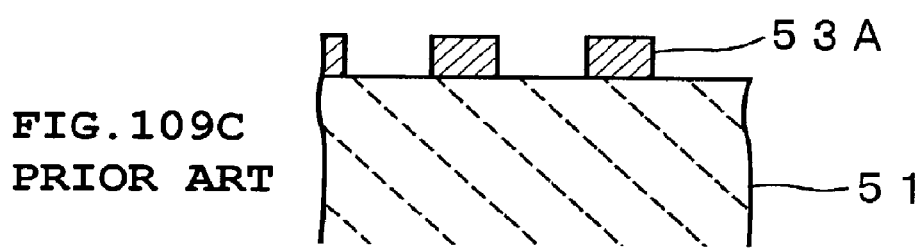
Figure 109D:
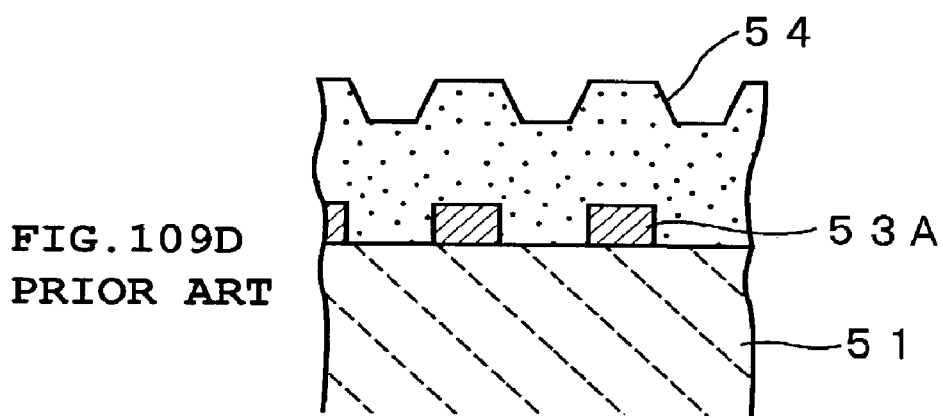
Figure 110:
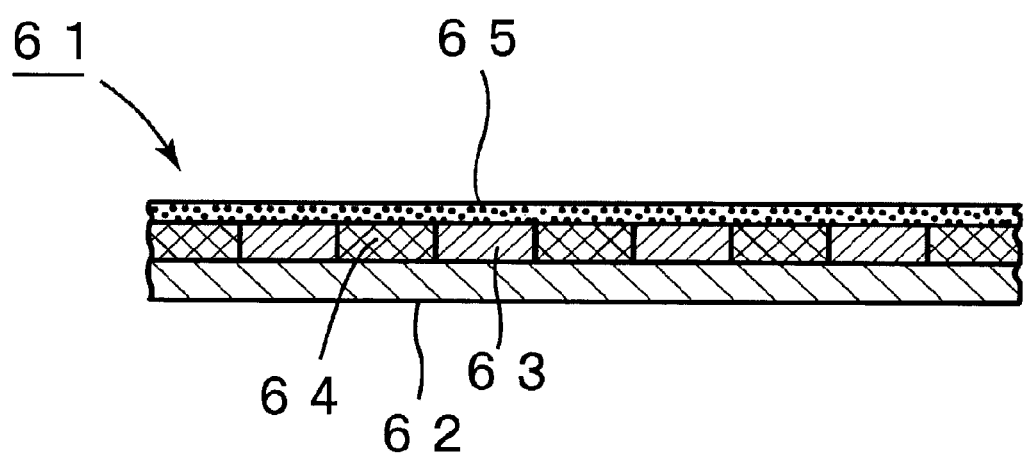
FIG. 110 illustrates a schematic sectional view illustrating another example of a known manufacturing method for a SAW apparatus.

FIGS. 107 and 108 are schematic plan views illustrating the electrode structures of a ladder filter 49a and a lattice filter 49b, respectively. By forming the electrode structure of the ladder filter 49a and the lattice filter 49b on the piezoelectric substrate, a ladder filter and a lattice filter can be formed according to the present invention.

The present invention is not restricted to the SAW apparatuses having the electrode structures shown in FIGS. 106A, 106B, and 107, and may be used in various types of SAW apparatuses.

In preferred embodiments of the present invention, preferably, a SAW apparatus using a leaky SAW is manufactured. Japanese Unexamined Patent Application Publication No. 6-164306 discloses a SAW apparatus having an electrode made of a heavy metal, such as Au, and utilizing the Love wave, which is free from the propagation attenuation. In this SAW apparatus, by using a heavy metal for the electrode, the acoustic velocity of a propagating SAW becomes lower than that of a transversal bulk wave in the substrate so as to eliminate leaky components. In this manner, the Love wave is utilized as a non-leaky SAW.

In the Love wave, however, because the acoustic velocity inevitably becomes low, and accordingly, the IDT pitch must be decreased. This increases the difficulty in processing the SAW apparatus, thereby decreasing the processing precision. Additionally, the linewidth of the IDT becomes smaller, and the loss caused by the resistance is increased.

In preferred embodiments of the present invention, unlike the above-described SAW apparatus utilizing the Love wave, even though the electrode made of a metal heavier than Al is used, a leaky SAW having a high acoustic velocity can be effectively utilized, thereby achieving a reduction in the propagation loss. It is thus possible to provide a low-insertion SAW apparatus.

Based on the above-described results, electrodes were formed by using different metals having a higher density than Al.

Metals having a higher density than Al used in preferred embodiments the present invention include, for example:

(1) a metal having a density of 15000 to 23000 kg/m3 and a Young's modulus of $0.5 \times 10^{11}$ to $1.0 \times 10^{11} N/m^2$ or having a transversal-wave acoustic velocity of 1000 to 2000 m/s, for example, Au;

(2) a metal having a density of 5000 to 15000 kg/m3 and a Young's modulus of $0.5 \times 10^{11}$ to $1.0 \times 10^{11} N/m^2$ or having a transversal-wave acoustic velocity of 1000 to 2000 m/s, for example, Ag;

(3) a metal having a density of 5000 to 15000 kg/m3 and a Young's modulus of $1.0 \times 10^{11}$ to $2.05 \times 10^{11} N/m^2$ or having a transversal-wave acoustic velocity of 2000 to 2800 m/s, for example, Cu;

(4) a metal having a density of 15000 to 23000 kg/m3 and a Young's modulus of $2.0 \times 10^{11}$ to $4.5 \times 10^{11} N/m^2$ or having a transversal-wave acoustic velocity of 2800 to 3500 m/s, for example, tungsten;

(5) a metal having a density of 15000 to 23000 kg/m3 and a Young's modulus of $1.0 \times 10^{11}$ to $2.0 \times 10^{11} N/m^2$ or having a transversal-wave acoustic velocity of 2000 to 2800 m/s, for example, tantalum;

(6) a metal having a density of 15000 to 23000 kg/m3 and a Young's modulus of $1.0 \times 10^{11}$ to $2.0 \times 10^{11} N/m^2$ or having a transversal-wave acoustic velocity of 1000 to 2000 m/s, for example, platinum; and (7) a metal having a density of 5000 to 15000 kg/m3 and a Young's modulus of $2.0 \times 10^{11}$ to $4.5 \times 10^{11} N/m^2$ or having a transversal-wave acoustic velocity of 2800 to 3500 m/s, for example, Ni and Mo.

Figure 15:
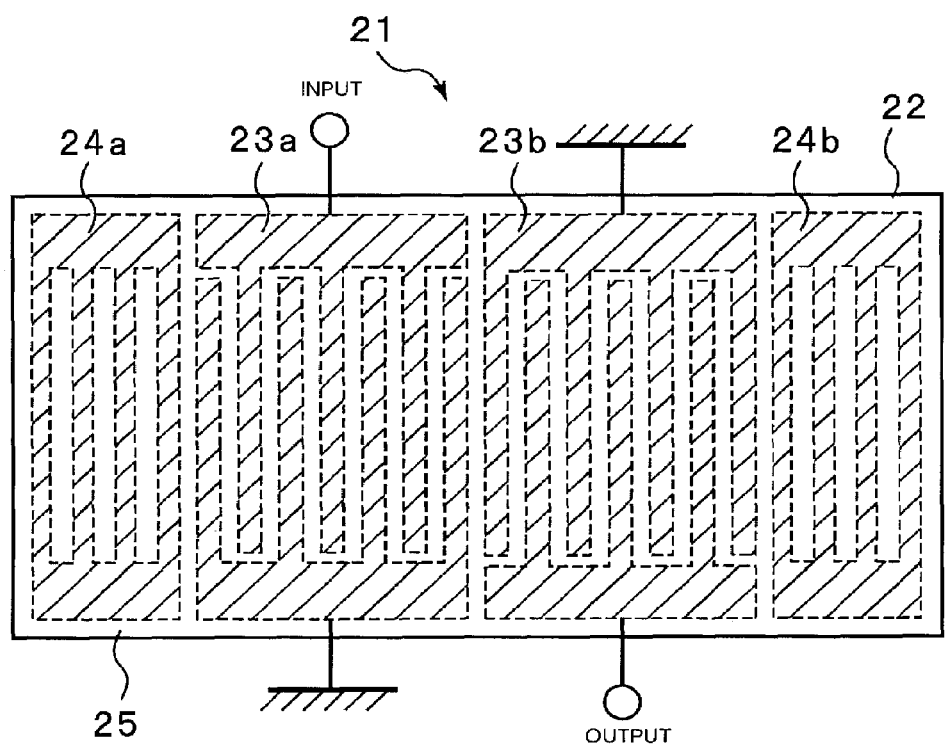
FIG. 15 is a plan view illustrating a SAW apparatus according to a second preferred embodiment of the present invention.

FIG. 15 is a plan view illustrating a longitudinally coupled resonator filter as a SAW apparatus 21 according to a second preferred embodiment of the present invention. In the second preferred embodiment of the present invention, Au is preferably used for electrodes.

In the SAW apparatus 21, IDTs 23a and 23b and reflectors 24a and 24b are formed on the top surface of a $LiTaO_3$ substrate 22. A $SiO_2$ film 25 is formed to cover the IDTs 23a and 23b and the reflectors 24a and 24b. As the $LiTaO_3$ substrate 22, a 25°-58°-rotated Y-plate X-propagating $LiTaO_3$ substrate having Euler angles (0°, 115°-148°, 0°) is preferably used. If a Y-plate X-propagating $LiTaO_3$ substrate having a cut angle other than the above range is used, the attenuation constant is increased, and the TCF is deteriorated.

The IDTs 23a and 23b and the reflectors 24a and 24b are made of a metal having a density higher than Al. At least one metal selected from the group including Au, Pt, W, Ta, Ag, Mo, Cu, Ni, Co, Cr, Fe, Mn, Zn, and Ti, or an alloy primarily including at least one metal of the above-described group may be used as the metal having a density higher than Al.

Figure 16:
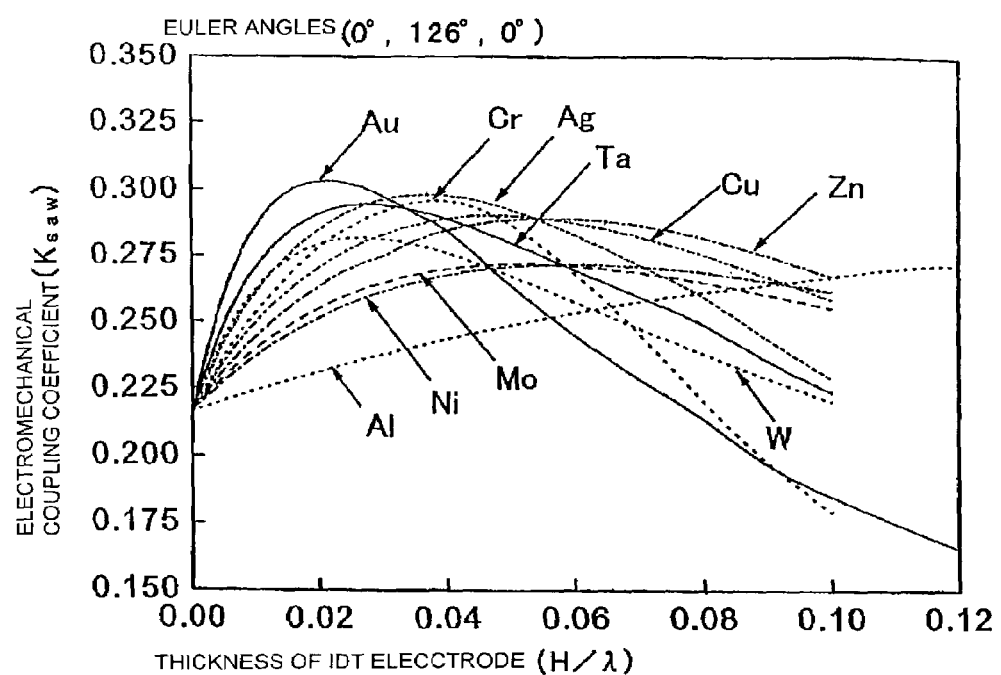
FIG. 16 illustrates the relationship between the electromechanical coupling coefficient and the normalized thickness of IDTs when the IDTs made of Au, Ta, Ag, Cr, W, Cu, Zn, Mo, Ni, and Al were formed on a 36°-rotated Y-plate X-propagating $LiTaO_3$ substrate having Euler angles (0°, 126°, 0°)
Figure 17:
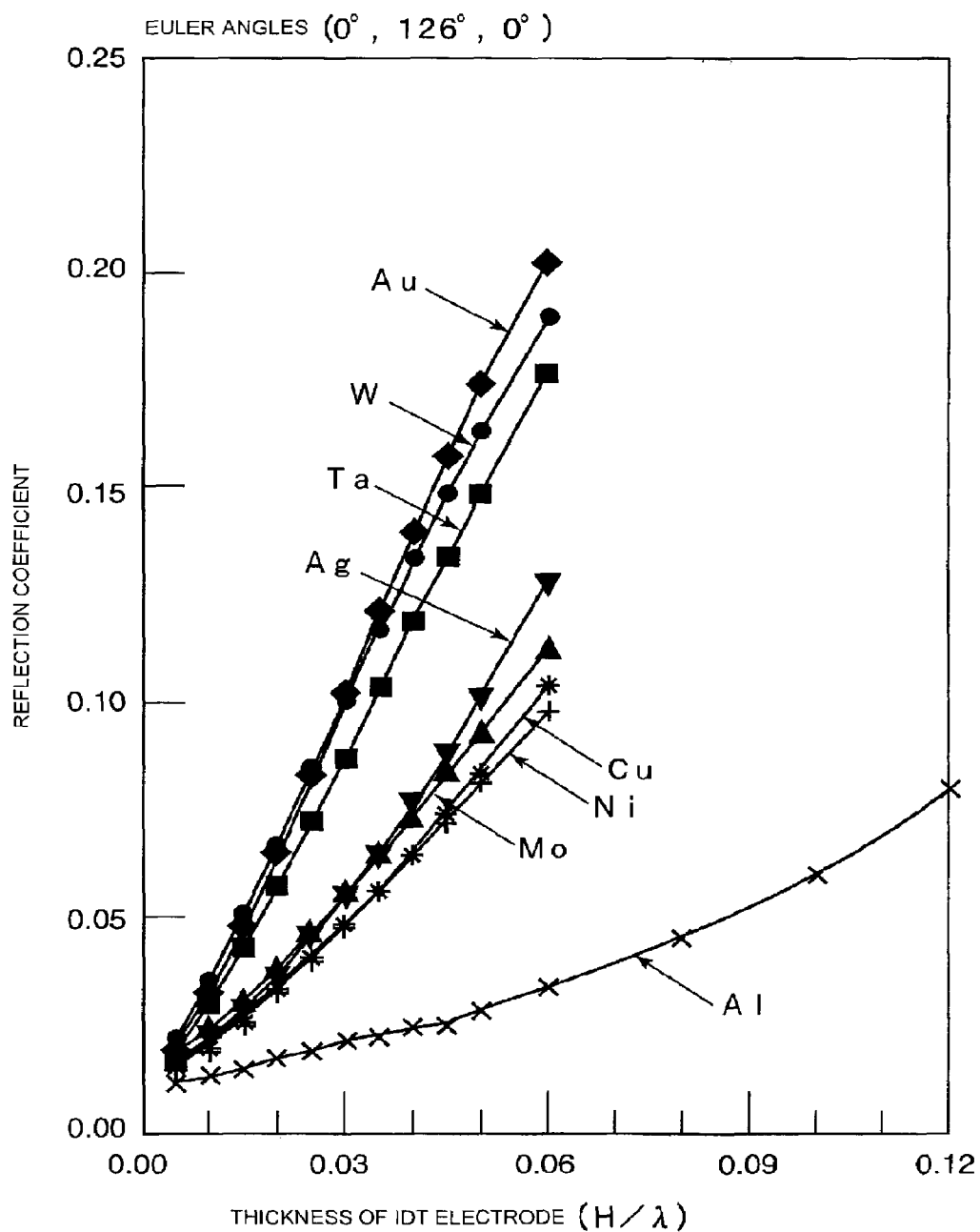
FIG. 17 illustrates the relationship between the reflection coefficient of a single electrode finger of IDTs made of various electrode materials on a 36°-rotated Y-plate X-propagating $LiTaO_3$ substrate having Euler angles (0°, 126°, 0°) and the thickness of the IDTs.

As described above, because the IDTs 23a and 23b and the reflectors 24a and 24b are made of a metal having a density higher than Al, the electromechanical coupling coefficient and the reflection coefficient are improved, as shown in FIGS. 16 and 17, respectively, even when the thickness of the IDTs 23a and 23b and that of the reflectors 24a and 24b are formed to be smaller compared to the IDTs and the reflectors made of Al.

The thickness of the electrodes can be decreased, as stated above. The thickness of the $SiO_2$ film 25 is preferably determined so that the thickness Hs/λ standardized by the SAW wavelength λ ranges from about 0.03 to about 0.45, which can be clearly seen in the subsequent examples. In this case, Hs indicates the total thickness of the first and the second $SiO_2$ insulating layers. With this range, the attenuation constant can be considerably decreased compared to a SAW apparatus without a SiO$_2$ film, thereby achieving a reduction in the loss.

The ideal thickness of the IDTs 23a and 23b standardized by the SAW wavelength is different according to the material forming the IDTs 23a and 23b. If the IDTs are made of Au, the normalized thickness of the IDTs 23a and 23b is preferably from about 0.013 to about 0.030. If the Au film is too thin, the IDTs 23a and 23b exhibit a resistance. Accordingly, the normalized thickness of the IDTs 23a and 23b is, more preferably, from about 0.021 to about 0.030.

According to the SAW apparatus of the second preferred embodiment of the present invention, the IDTs 23a and 23b are made of a metal having a density higher than Al on the LiTaO$_3$ substrate 22, and the thickness of the IDTs 23a and 23b can be decreased. Thus, the SAW apparatus exhibits improved characteristics and also improves the TCF by the formation of the SiO$_2$ film 25. This is described in greater detail by specific examples.

Figure 18:
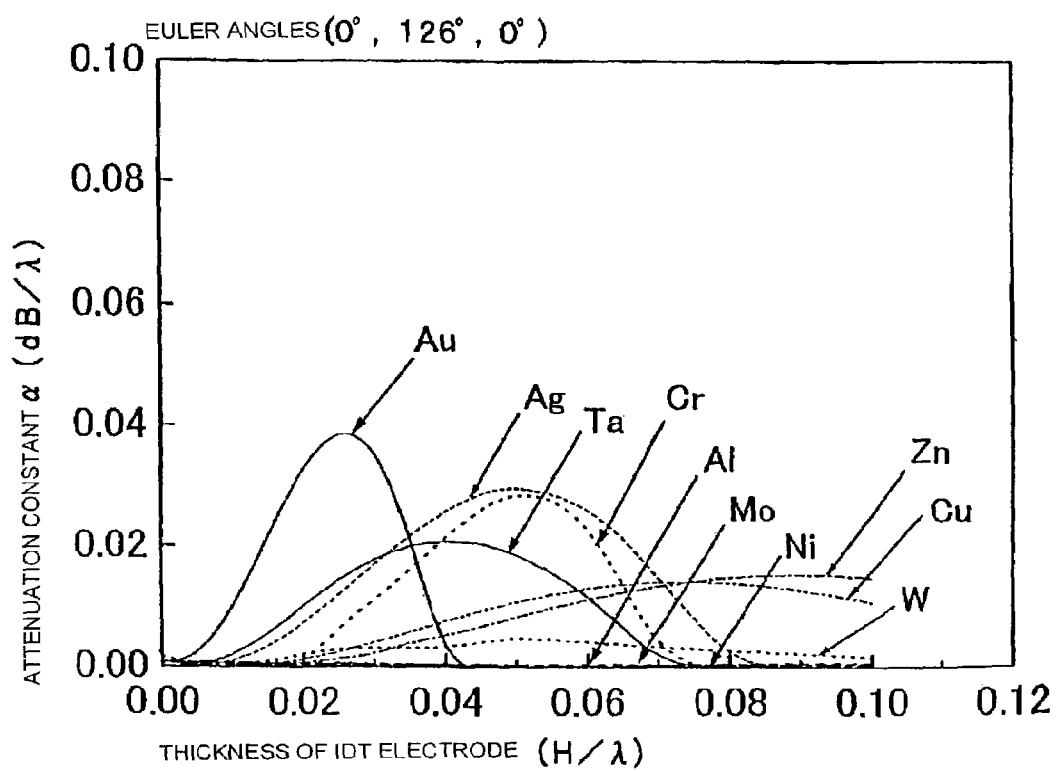
FIG. 18 illustrates the relationship between the attenuation constant α and the normalized thickness of IDTs when the IDTs made of Au, Ta, Ag, Cr, W, Cu, Zn, Mo, Ni, and Al were formed on a 36°-rotated Y-plate X-propagating $LiTaO_3$ substrate having Euler angles (0°, 126°, 0°)

The electromechanical coupling coefficient KSAW, the reflection coefficient |refl, and the attenuation constant ($\alpha$) with respect to the normalized thickness of IDTs when the IDTs were made of Al, Au, Ta, Ag, Cr, W, Cu, Zn, Mo, and Ni on a 36°-rotated Y-plate X-propagating LiTaO$_3$ substrate having Euler angles (0°, 126°, 0°) are shown in FIGS. 16, 17, and 18, respectively. It should be noted that calculations were made according to the method indicated in J. J. Chambell and W. R. Jones: IEEE Trans. Sonic & Ultrason. SU-15. p 209 (1968), assuming that the electrodes were uniformly formed.

FIG. 16 shows that, in the IDT made of Al, the electromechanical coupling coefficient KSAW is about 0.27 when the normalized thickness H/$\lambda$ (H represents the thickness of the IDT and $\lambda$ designates the wavelength) is about 0.10. In contrast, in the IDTs made of Au, Ta, Ag, Cr, W, Cu, Zn, Mo, and Ni, higher electromechanical coupling coefficients KSAW are achieved when H/$\lambda$ ranges from about 0.013 to about 0.035. FIG. 18 reveals that, however, in the IDTs made of Au, Ta, Ag, Cr, W, Cu, Zn, Mo, and Ni, the attenuation constants $\alpha$ become very large, while, in the IDT made of Al, the attenuation constant $\alpha$ is substantially 0 regardless of the normalized thickness H/$\lambda$.

Figure 25:
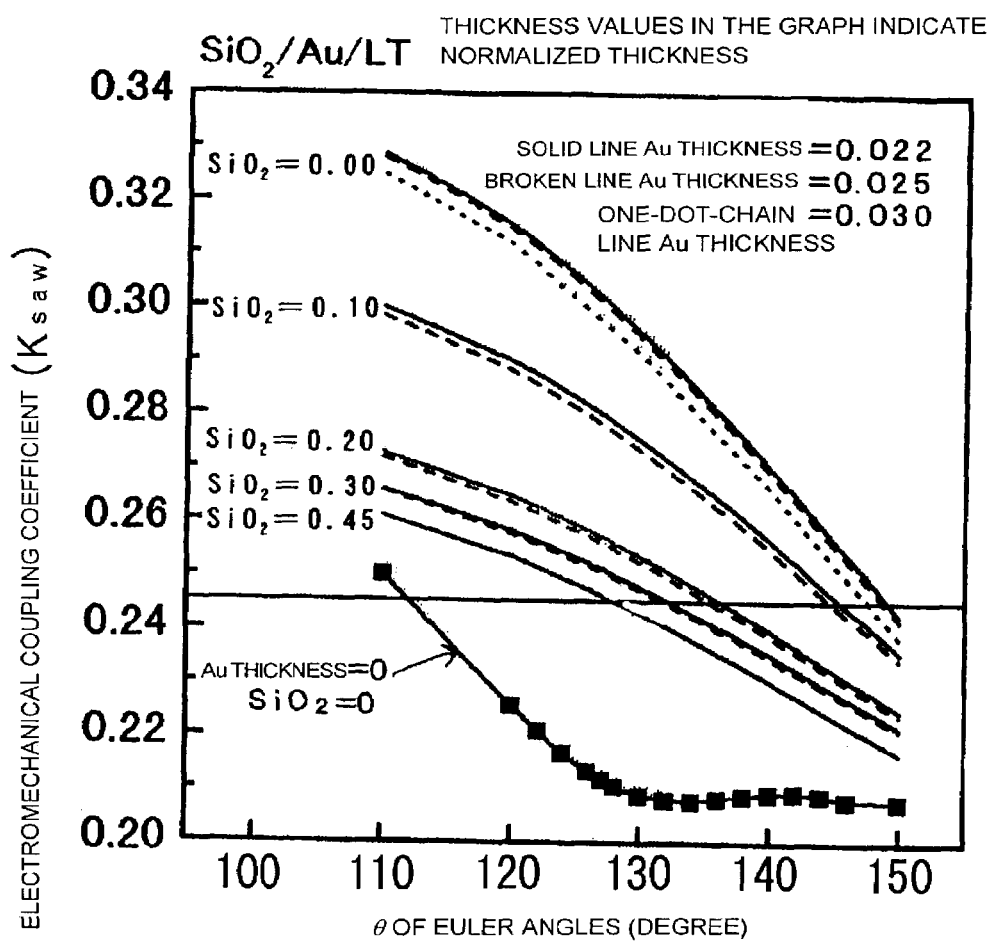
FIG. 25 illustrates a change in the electromechanical coupling coefficient with respect to Θ of Euler angles (0°, Θ, 0°) when the normalized thickness of an Au IDT and the normalized thickness of a $SiO_2$ film were changed.

FIG. 25 illustrates the relationship between the electromechanical coupling coefficient and $\Theta$ of the Euler angles (0°, $\Theta$, 0°) when the Au IDT and the SiO$_2$ film are formed on a LiTaO$_3$ substrate having Euler angles (0°, $\Theta$, 0°). In this case, the normalized thickness of the IDT was changed to about 0.022, 0.025, and 0.030, and the normalized thickness Hs/$\lambda$ of the SiO$_2$ film was changed to about 0.00 (without SiO$_2$ film), 0.10, 0.20, 0.30, and 0.45.

FIG. 25 shows that the electromechanical coupling coefficient KSAW becomes smaller as the thickness of the SiO$_2$ film is increased. It is now assumed that the thickness of the IDT is decreased for suppressing a characteristic deterioration caused by the formation of SiO$_2$ film, which is described in detail below. FIG. 16 shows that the electromechanical coupling coefficient KSAW is decreased to about 0.245 when the normalized thickness of the Al IDT is reduced to about 0.04 without the formation of SiO$_2$ film. If the normalized thickness of the Al IDT is reduced to about 0.04 with the formation of a SiO$_2$ film, the electromechanical coupling coefficient KSAW becomes even smaller, which makes it difficult to achieve a wider band when the resulting SAW apparatus is put to practical use.

In contrast, as is seen from FIG. 25, when the IDT is formed of Au and a SiO$_2$ film is formed, the electromechanical coupling coefficient KSAW can be increased to about 0.245 or greater by setting $\Theta$ of the Euler angles to be about 128.5° or smaller even though the normalized thickness Hs/$\lambda$ of the SiO$_2$ film is about 0.45. When the normalized thickness of the SiO$_2$ SiO$_2$ SiO$_2$ film is about 0.30, the electromechanical coupling coefficient KSAW can be increased to about 0.245 or greater by setting $\Theta$ of the Euler angles to be about 132° or smaller. As discussed below, when $\Theta$ of the Euler angles is smaller than 115°, the attenuation constant is increased, which makes it difficult put the SAW apparatus to practical use. Thus, preferably, a 25°-42°-rotated Y-plate X-propagating LiTaO$_3$ substrate having Euler angles (0±3°, 115°-132°, 0±3°), and more preferably, a 25°-38.5°-rotated Y-plate X-propagating LiTaO$_3$ substrate having Euler angles (0±3°, 115°-128.5°, 0±3°) is used.

Figure 19:
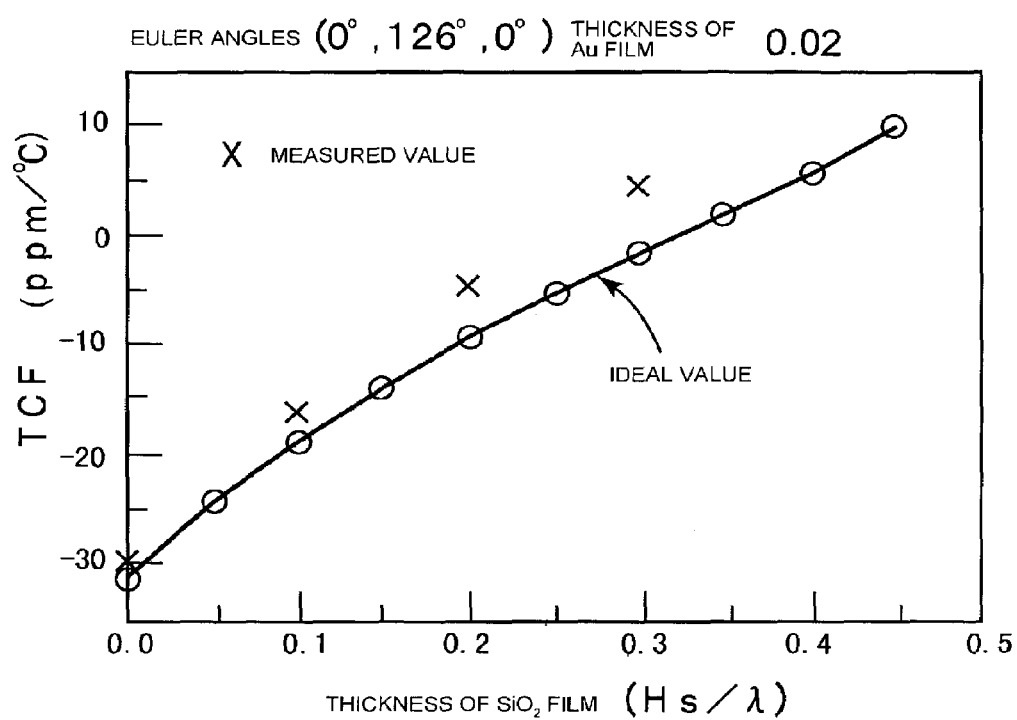
FIG. 19 illustrates a change in the TCF with respect to the normalized thickness of a $SiO_2$ film when an Au IDT having a normalized thickness of 0.02 was formed on a 36°-rotated Y-plate X-propagating $LiTaO_3$ substrate having Euler angles (0°, 126°, 0°)

The temperature coefficient of frequency (TCF) of a 36°-rotated Y-plate X-propagating LiTaO$_3$ substrate having Euler angles (0°, 126°, 0°) is −30 to −40 ppm/° C., which is not sufficient. In order to improve the TCF to be about ±20 ppm/° C., an Au IDT was formed on a 36°-rotated Y-plate X-propagating LiTaO$_3$ substrate having Euler angles (0°, 126°, 0°), and the thickness of the SiO$_2$ film was changed. In this case, the TCF with respect to the normalized thickness of the SiO$_2$ film is shown in FIG. 19. In FIG. 19, O indicates the ideal values, and × designates the values measured. In this case, the normalized thickness H/$\lambda$ of the Au IDT is about 0.020.

FIG. 19 shows that the formation of the SiO$_2$ film improves the TCF, and in particular, when the normalized thickness Hs/$\lambda$ of the SiO$_2$ film is about 0.25, the TCF becomes substantially zero.

Figure 20:
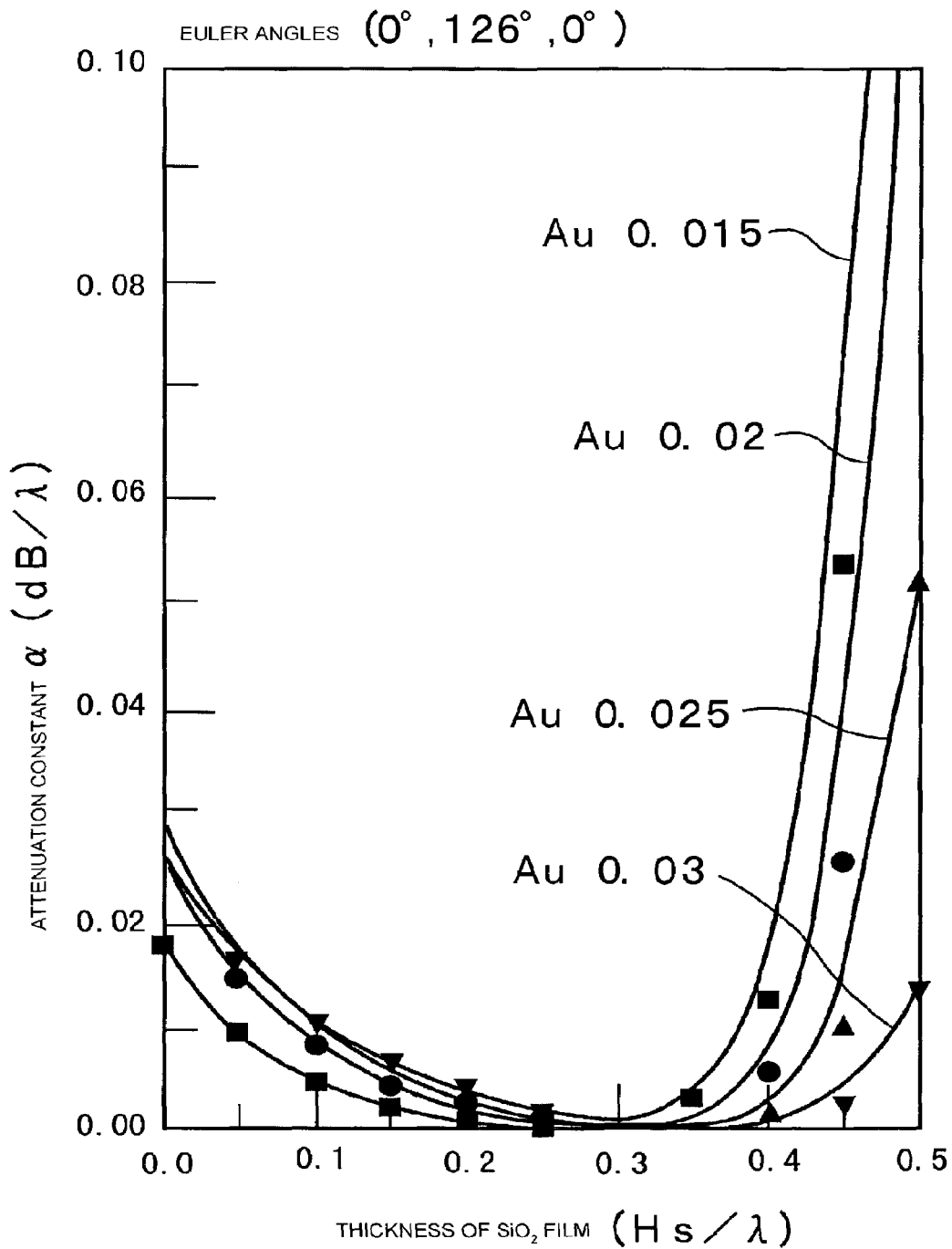
FIG. 20 illustrates a change in the attenuation constant α with respect to the normalized thickness of a $SiO_2$ film when Au IDTs having various thickness values were formed on a 36°-rotated Y-plate X-propagating $LiTaO_3$ substrate having Euler angles (0°, 126°, 0°)
Figure 21:
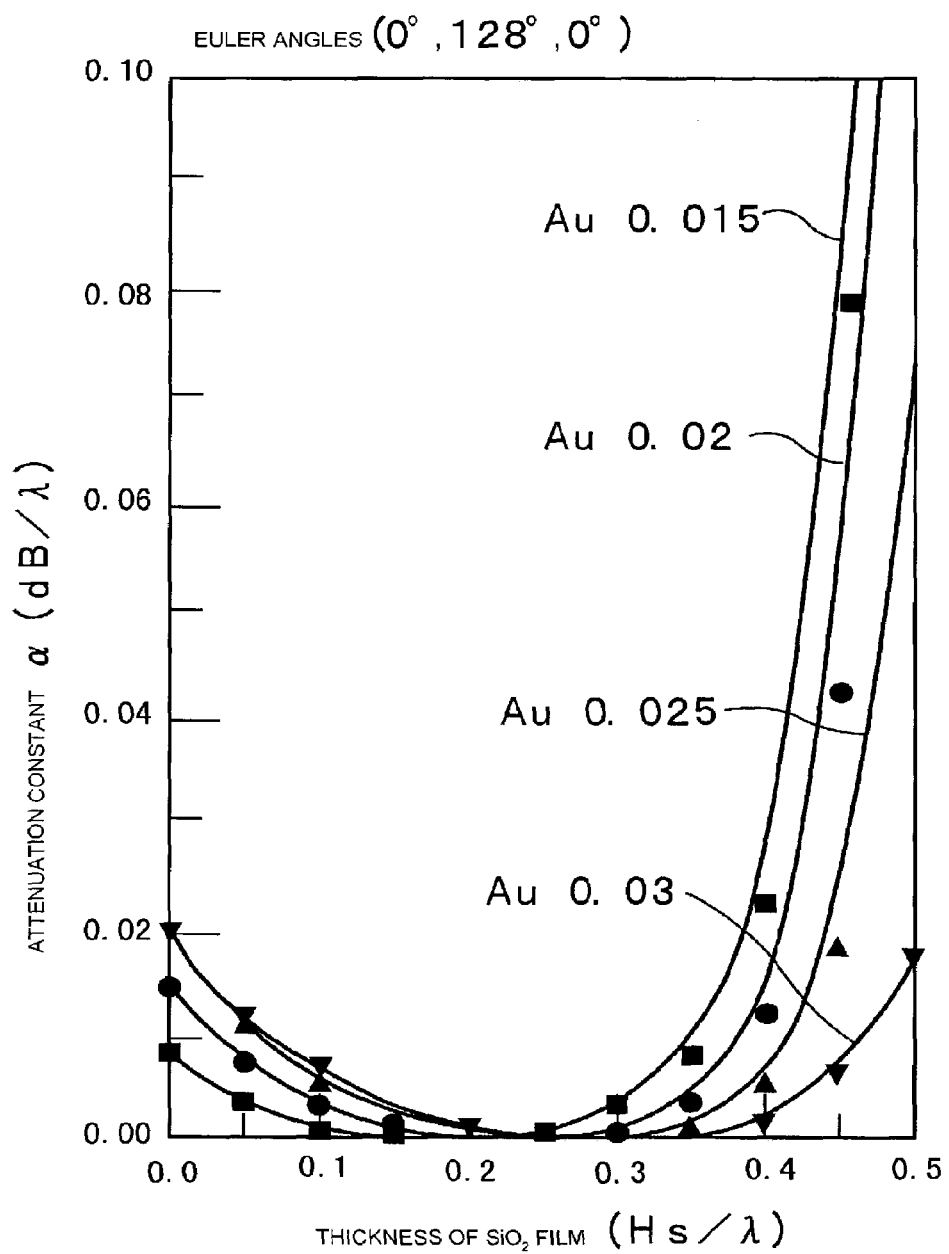
FIG. 21 illustrates a change in the attenuation constant α with respect to the normalized thickness of a $SiO_2$ film when Au IDTs having various thickness values were formed on a 38°-rotated Y-plate X-propagating $LiTaO_3$ substrate having Euler angles (0°, 128°, 0°)

Also, by using two types of rotated Y-plate X-propagating LiTaO$_3$ substrates, i.e., a substrate having a cut angle of 36° (Euler angles (0°, 126°, 0°)), and a substrate having a cut angle of 38° (Euler angles (0°, 128°, 0°)), the normalized thickness H/$\lambda$ of an Au IDT and the normalized thickness Hs/$\lambda$ of a SiO$_2$ film were changed. The attenuation constants $\alpha$ with respect to the normalized thickness of the SiO$_2$ film are shown in FIGS. 20 and 21. FIGS. 20 and 21 show that the attenuation constant $\alpha$ can be made smaller if the thickness of the SiO$_2$ film is suitably selected regardless of the thickness of the IDT. More specifically, as is seen from FIGS. 20 and 21, if the normalized thickness Hs/$\lambda$ of the SiO$_2$ film ranges from about 0.03 to about 0.45, and more preferably, from about 0.10 to about 0.35, the attenuation constant $\alpha$ can be reduced to a minimal level regardless of the above-described two types of Euler angles of the LiTaO$_3$ substrate and the thickness of the Au IDT.

FIG. 17 shows that the use of an Au IDT achieves a sufficiently large reflection coefficient even with a small thickness of the IDT compared to an Al IDT.

Thus, according to the results of FIGS. 16 through 21, when an Au IDT having a normalized thickness H/$\lambda$ of about 0.013 to about 0.030 is formed on a LiTaO$_3$ substrate, a large electromechanical coupling coefficient can be achieved, and also, the attenuation coefficient $\alpha$ can be reduced to a minimal level, and a sufficient reflection coefficient can be implemented if the normalized thickness Hs/$\lambda$ of the SiO$_2$ film is preferably within the range from about 0.03 to about 0.45.

In the second preferred embodiment of the present invention, the SAW apparatus 11 was manufactured by forming an Au IDT having a normalized thickness H/$\lambda$ of about 0.020 and a SiO$_2$ film having a normalized thickness Hs/$\lambda$ of about 0.1 on a LiTaO$_3$ substrate having a cut angle of 36° (Euler angles (0°, 126°, 0°)). The attenuation-vs.-frequency characteristic of the SAW apparatus 11 is indicated by the broken line of FIG. 22. For comparison, the attenuation-vs.-frequency characteristic of the SAW apparatus 11 before the formation of the SiO$_2$ film is also indicated by the solid line of FIG. 22.

Figure 22:
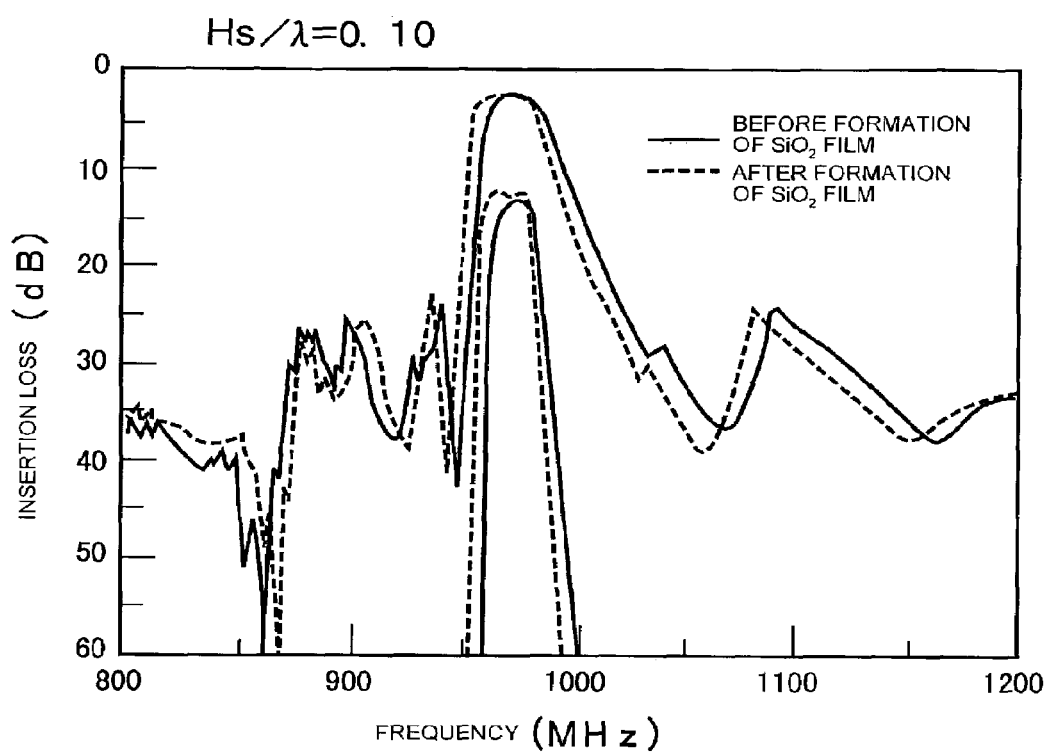
FIG. 22 illustrates the attenuation-vs.-frequency of the SAW apparatus of the first preferred embodiment of the present invention before and after a $SiO_2$ film was formed.

FIG. 22 shows that, because of the formation of the SiO₂ film, the insertion loss is decreased even though the electromechanical coupling coefficient is slightly reduced from about 0.30 to about 0.28. Accordingly, it has been proved that the attenuation constant α can be decreased if the thickness of the SiO₂ film is set to the above-described specific range.

After discovering the above-described fact, the present inventors formed one-port SAW resonators on an experimental basis by forming an Au IDT having a normalized thickness of about 0.02 and a SiO₂ film on rotated Y-plate X-propagating LiTaO₃ substrates having different Euler angles. In this case, the normalized thickness of the SiO₂ film was changed to about 0.10, 0.20, 0.30, and 0.45. The Q factors of the one-port SAW resonators are shown in FIG. 26.

Generally, as the Q factor of a resonator is increased, the sharpness of the filter characteristic of the resonator from the pass band to the attenuation range is increased. Accordingly, if a sharp filter characteristic is required, a greater Q factor is desirable. As is seen from FIG. 26, when the cut angle of the substrate is about 48° (Euler angles of about (0°, 138°, 0°)), the Q factor becomes maximum, and when the cut angle ranges from about 42° to about 58° (Euler angles of about of (0°, 132°-148°, 0°)), the Q factor becomes comparatively large regardless of the thickness of the SiO₂ film.

Accordingly, as is seen from FIG. 26, by forming a SAW resonator such that at least one IDT made of a metal having a density higher than Al is formed on a Y-plate LiTaO₃ substrate having a cut angle of about 42° to about 58° (Euler angles of about (0°, 132°-148°, 0°)), and a SiO₂ film is formed to cover the IDT on the LiTaO₃ substrate, a large Q factor can be obtained. It is preferable that the cut angle of the LiTaO₃ substrate is about 46.5° to about 53° (Euler angles of about (0°, 136.5°-143°, 0°)), as can be seen from FIG. 26.

Figure 27A:
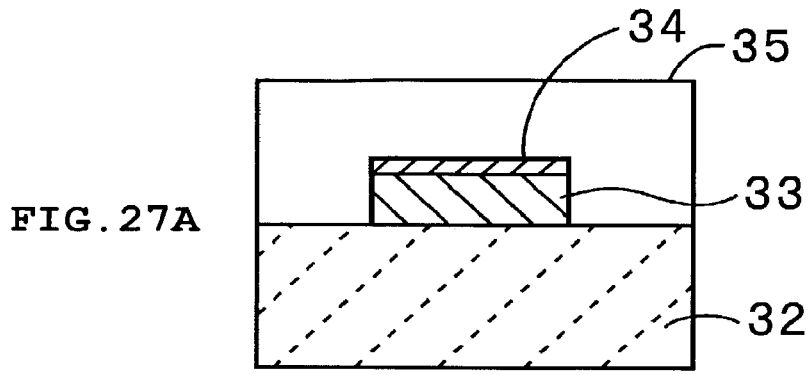
FIGS. 27A through 27C are schematic sectional views illustrating a SAW apparatus of a modified example of preferred embodiments of the present invention provided with a contact layer.

In preferred embodiments the present invention, a contact layer may be formed on the top surface of the IDT. More specifically, as shown in FIG. 27A, an IDT 33 is formed on a LiTaO₃ substrate 32, and a contact layer 34 may be formed on the top surface of the IDT 33. The contact layer 34 is disposed between the IDT 33 and a SiO₂ film 35, so that it increases the contact strength of the SiO₂ film 35 to the IDT 33. As the material for the contact layer 34, Pd or Al, or an alloy thereof may be suitably used. The contact layer 34 is not restricted to a metal, and a piezoelectric material, such as ZnO, or ceramics, such as Ta2O3 or Al2O3, may be used. The formation of the contact layer 34 increases the contact strength between the IDT 33 and the SiO₂ film 35, thereby preventing the SiO₂ film 35 from peeling off.

Figure 27B:
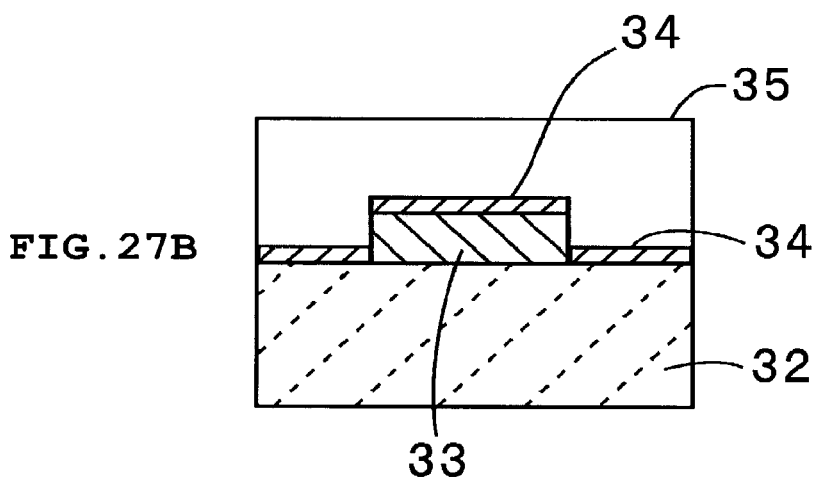
Figure 27C:
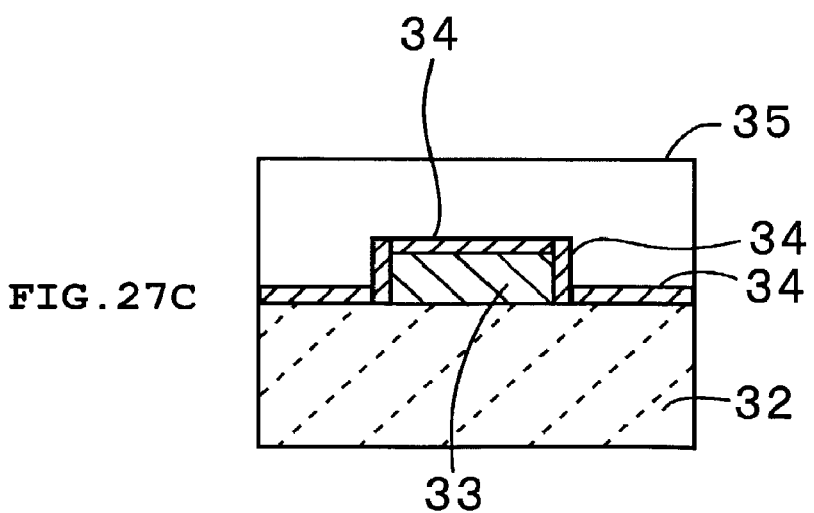
Figure 28:
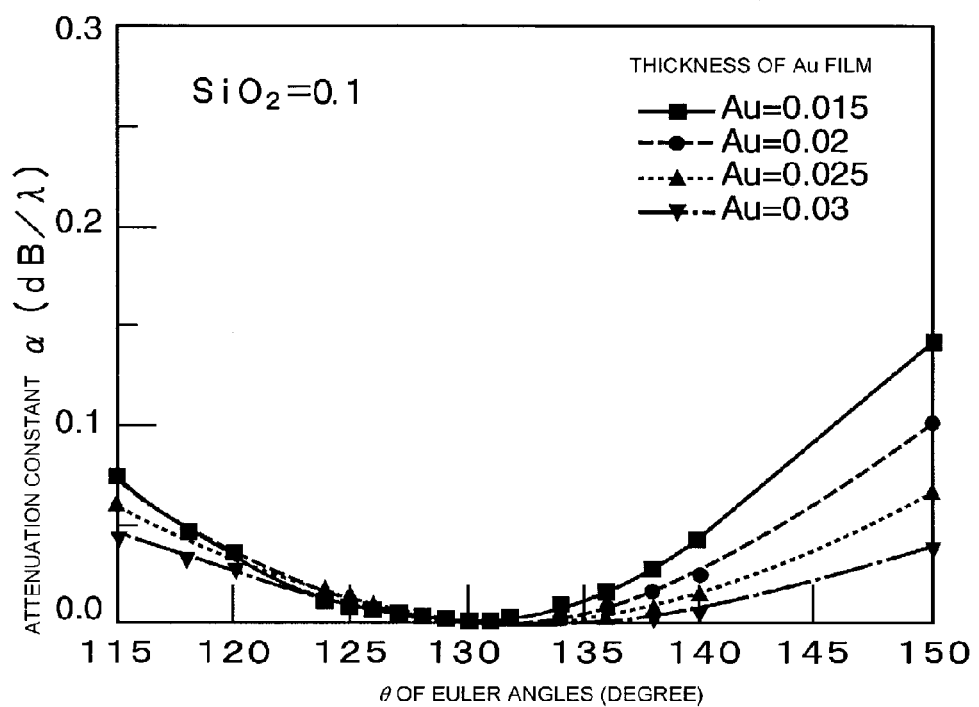
FIG. 28 illustrates a change in the attenuation constant α with respect to Θ of Euler angles (0°, Θ, 0°) when the normalized thickness of a $SiO_2$ film was about 0.1 and when Au electrodes having various thickness values were formed.
Figure 29:
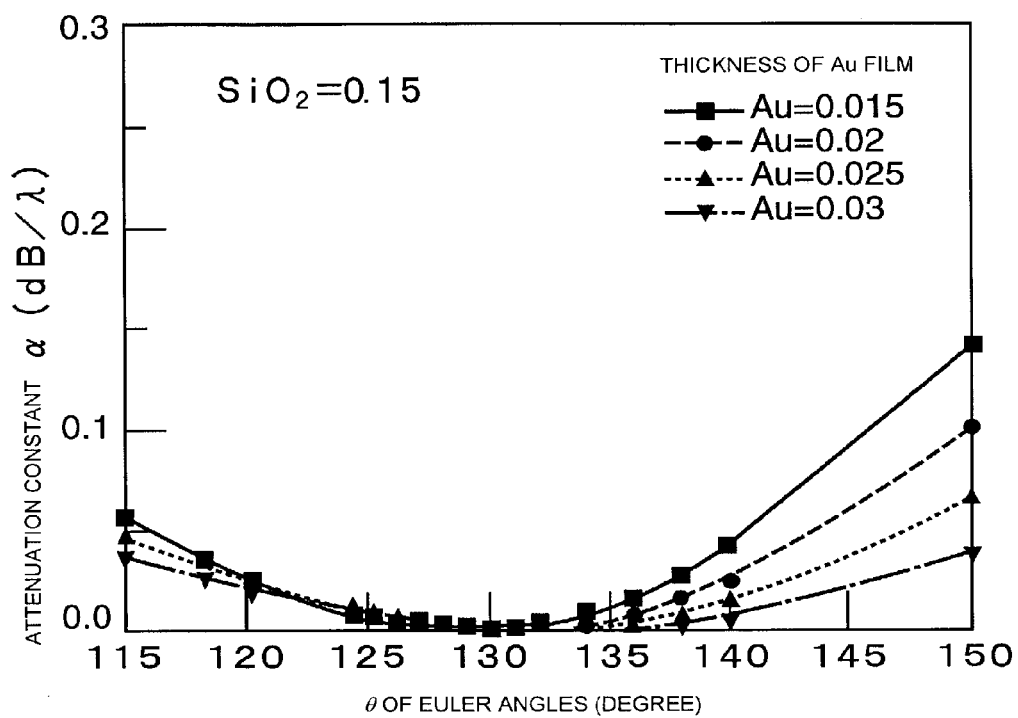
FIG. 29 illustrates a change in the attenuation constant α with respect to Θ of Euler angles (0°, Θ, 0°) when the normalized thickness of a $SiO_2$ film was about 0.15 and when Au electrodes having various thickness values were formed.
Figure 30:
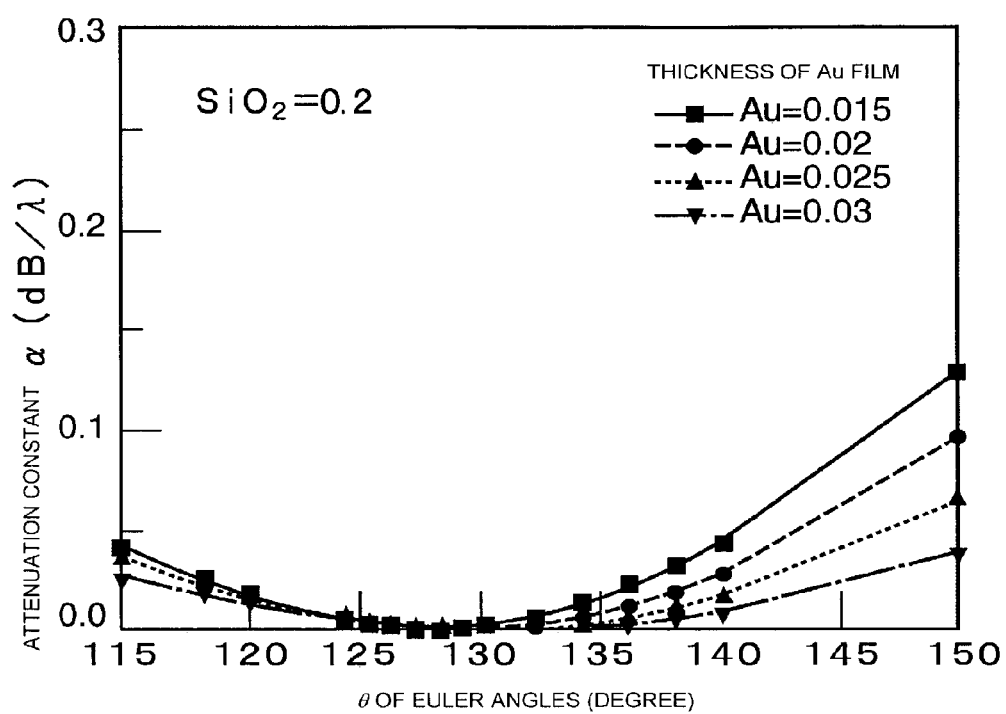
FIG. 30 illustrates a change in the attenuation constant α with respect to Θ of Euler angles (0°, Θ, 0°) when the normalized thickness of a $SiO_2$ film was about 0.12 and when Au electrodes having various thickness values are formed.
Figure 31:
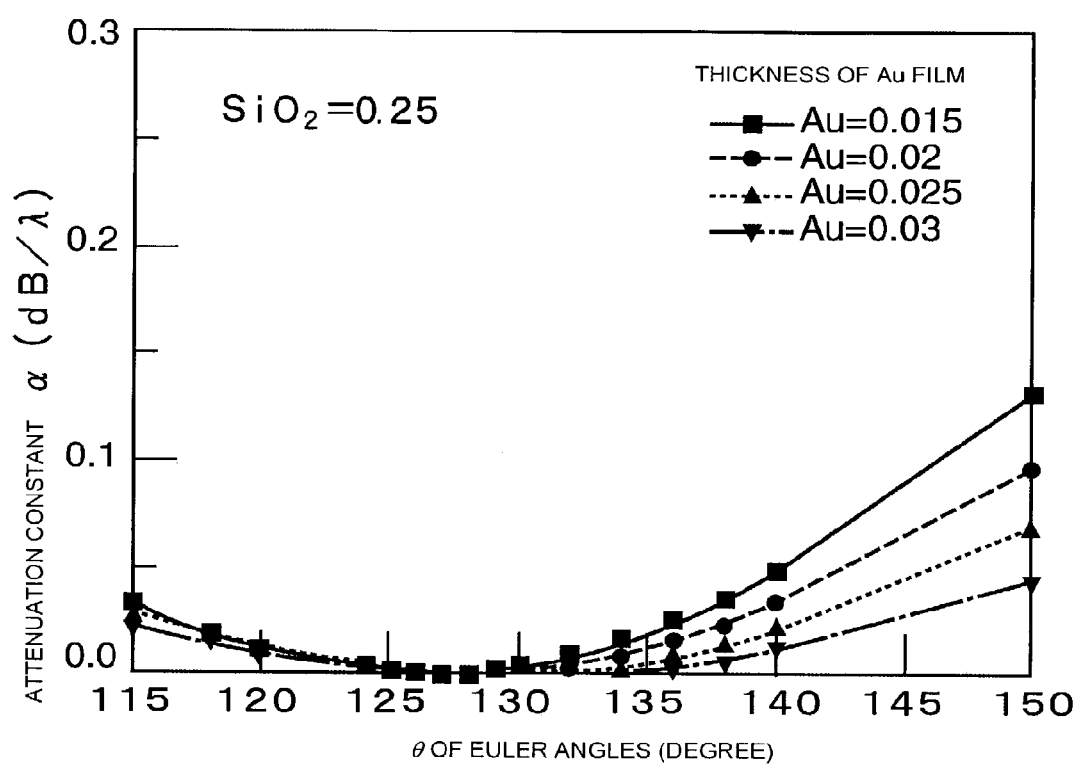
FIG. 31 illustrates a change in the attenuation constant α with respect to Θ of Euler angles (0°, Θ, 0°) when the normalized thickness of a $SiO_2$ film was about 0.25 and when Au electrodes having various thickness values were formed.
Figure 32:
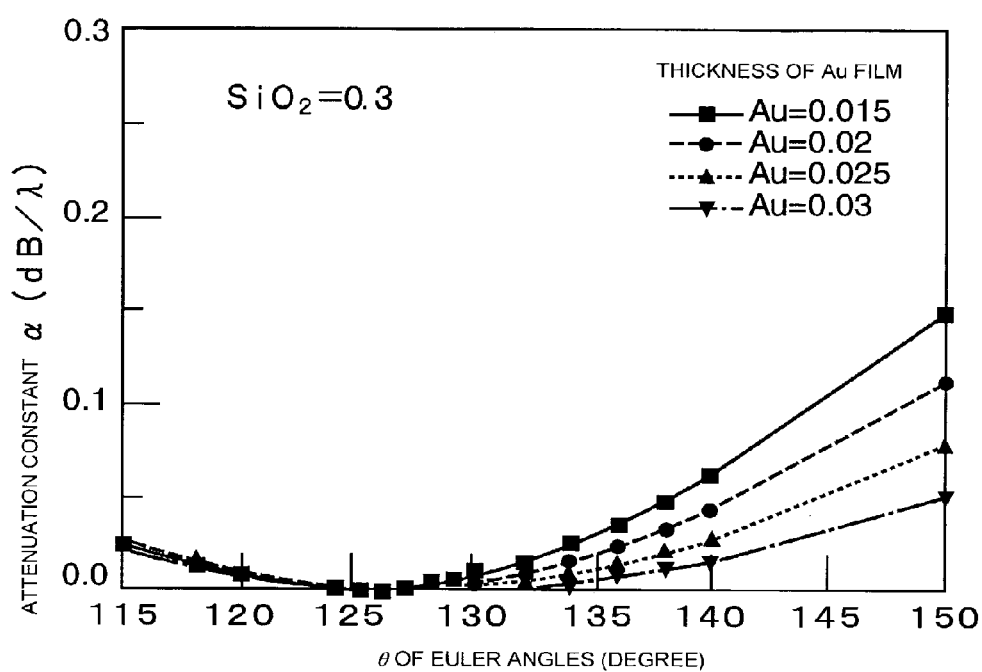
FIG. 32 illustrates a change in the attenuation constant α with respect to Θ of Euler angles (0°, Θ, 0°) when the normalized thickness of a $SiO_2$ film was about 0.3 and when Au electrodes having various thickness values were formed.
Figure 33:
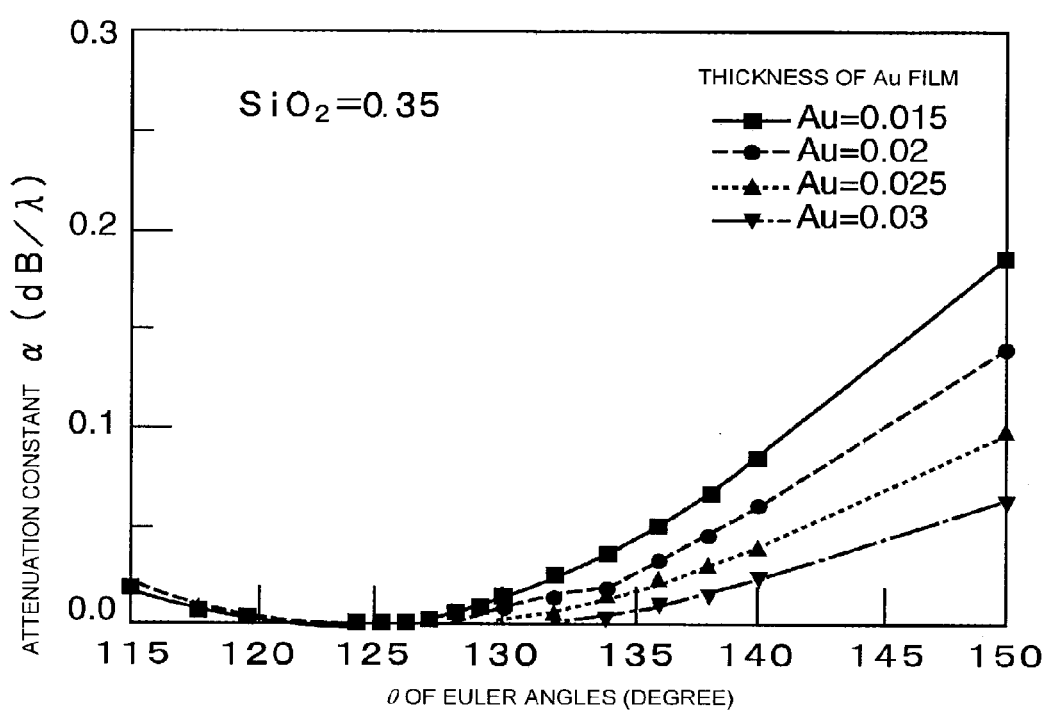
FIG. 33 illustrates a change in the attenuation constant α with respect to Θ of Euler angles (0°, Θ, 0°) when the normalized thickness of a $SiO_2$ film was about 0.35 and when Au electrodes having various thickness values were formed.
Figure 34:
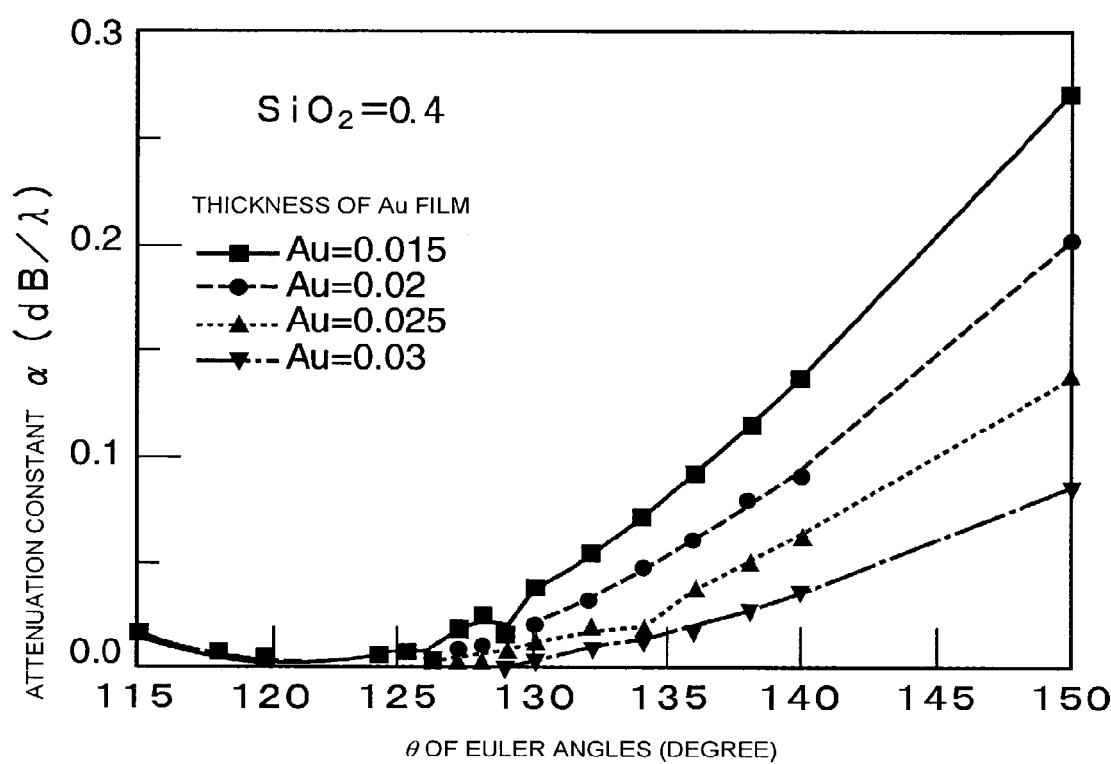
FIG. 34 illustrates a change in the attenuation constant α with respect to Θ of Euler angles (0°, Θ, 0°) when the normalized thickness of a $SiO_2$ film was about 0.40 and when Au electrodes having various thickness values were formed.
Figure 35:
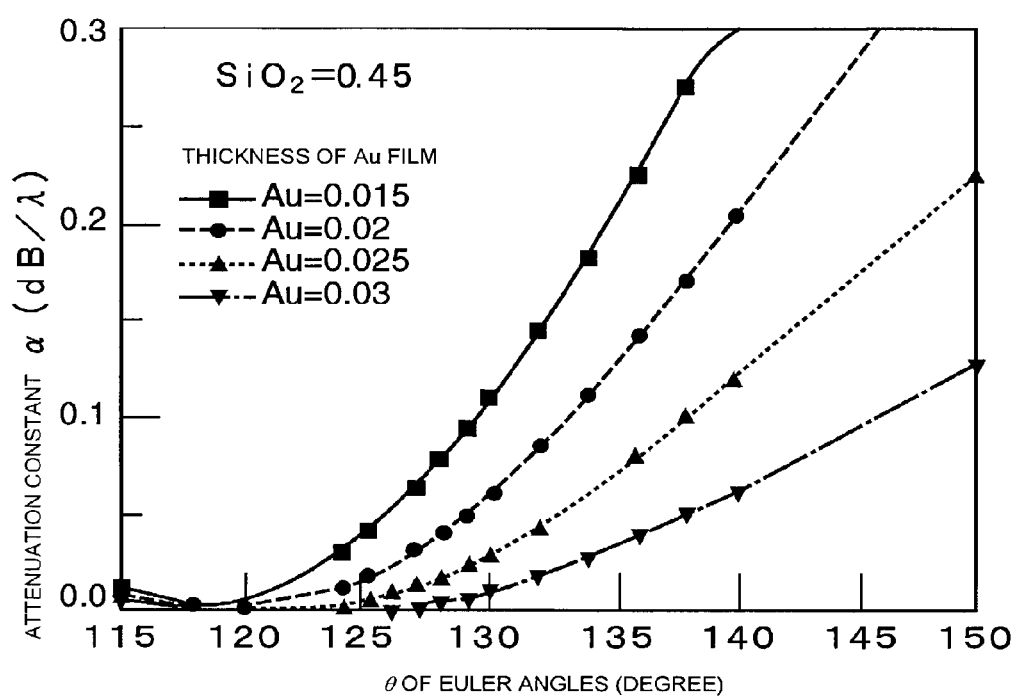
FIG. 35 illustrates a change in the attenuation constant α with respect to Θ of Euler angles (0°, Θ, 0°) when the normalized thickness of a $SiO_2$ film was about 0.45 and when Au electrodes having various thickness values were formed.

The thickness of the contact layer 34 is preferably about 1% or less of the SAW wavelength so as to minimize the influence on the SAW by the formation of the contact layer 34. Although the contact layer 34 is formed only on the top surface of the IDT 33 in FIG. 27A, it may also be formed at the interface between the LiTaO₃ substrate 33 and the SiO₂ film 35, as shown in FIG. 27B. Alternatively, as shown in FIG. 27C, the contact layer 34 may also be formed, not only on the top surface of the IDT 33, but also on the side surfaces of the IDT 33.

As another configuration for improving the contact strength of the SiO₂ film, a plurality of electrodes including bus bars and externally connecting pads other than IDTs may be laminated with an underlying metal layer formed of the same material as the IDT, and an upper metal layer made of Al or an Al alloy laminated with the underlying metal layer. For example, as an electrode film forming the reflectors 24a and 24b shown in FIG. 15, an underlying metal layer made of the same material as the IDTs 23a and 23b and an Al film may be laminated on the underlying metal layer. Accordingly, by providing an upper metal layer made of Al or an Al alloy, the contact strength of the SiO₂ $_{SiO2}$ film can be enhanced. Additionally, the cost of the electrode can be reduced, and the Al wedge bonding can also be enhanced.

The electrodes other than IDTs include, not only reflectors, bus bars, and externally connecting pads, but also wiring electrodes, which are formed if necessary. The Al alloy may include an Al—Ti alloy or an Al—Ni—Cr alloy by way of examples only.

The present inventors have confirmed that there is a certain range of thickness of the SiO₂ film that minimizes the attenuation constant α as long as an Au IDT is formed even when a Y-plate X-propagating LiTaO₃ substrate having Euler angles other than the above-described angles is used. That is, if the normalized thickness Hs/λ of the SiO₂ film is set to be a specific range, the attenuation constant α can be reduced, as in the above-described example. The relationship between the attenuation constant α and the Euler angle Θ when the normalized thickness Hs/λ of the SiO₂ film was about 0.1 to about 0.45 are shown in FIGS. 28 through 35. FIGS. 28 through 35 show that the Euler angle Θ that minimizes the attenuation constant α becomes smaller as the thickness of the SiO₂ film is increased. Accordingly, even when a Y-plate X-propagating LiTaO₃ substrate having Euler angles other than the above-described angles is used, it is possible to provide a SAW apparatus that exhibits a large electromechanical coupling coefficient and a large reflection coefficient and that reduces the TCF to one half of the known SAW apparatus if an Au IDT and a SiO₂ film are used. Preferable combinations of the Euler angles, the thickness of the Au IDT, and the thickness of the SiO₂ film that achieve the above-described advantages are shown in Table 1 and Table 2.

TABLE 1

| Θ of Euler angles (0 ± 3°, Θ, 0 ± 3°) | Au thickness H/λ | SiO₂ film thickness Hs/λ |
|---|---|---|
| 120.0° ≦ Θ < 123.0° | 0.013-0.018 | 0.15-0.45 |
| 123.0° ≦ Θ < 124.5° | 0.013-0.022 | 0.10-0.40 |
| 124.5° ≦ Θ < 125.5° | 0.013-0.025 | 0.07-0.40 |
| 125.5° ≦ Θ < 127.5° | 0.013-0.025 | 0.06-0.40 |
| 127.5° ≦ Θ < 129.0° | 0.013-0.028 | 0.04-0.40 |
| 129.0° ≦ Θ < 130.0° | 0.017-0.030 | 0.03-0.42 |
| 130.0° ≦ Θ < 131.5° | 0.017-0.030 | 0.03-0.42 |
| 131.5° ≦ Θ < 133.0° | 0.018-0.028 | 0.05-0.33 |
| 133.0° ≦ Θ < 135.0° | 0.018-0.030 | 0.05-0.30 |
| 135.0° ≦ Θ < 137.0° | 0.019-0.032 | 0.05-0.25 |
| 137.0° ≦ Θ ≦ 140.0° | 0.019-0.032 | 0.05-0.25 |

TABLE 2

| Θ of Euler angles (0 ± 3°, Θ, 0 ± 3°) | Au thickness H/λ | SiO₂ film thickness Hs/λ |
|---|---|---|
| 129.0° ≦ Θ < 130.0° | 0.022-0.028 | 0.04-0.40 |
| 130.0° ≦ Θ < 131.5° | 0.022-0.028 | 0.04-0.40 |
| 131.5° ≦ Θ < 133.0° | 0.022-0.028 | 0.05-0.33 |
| 133.0° ≦ Θ < 135.0° | 0.022-0.030 | 0.05-0.30 |
| 135.0° ≦ Θ < 137.0° | 0.022-0.032 | 0.05-0.25 |
| 137.0° ≦ Θ ≦ 140.0° | 0.022-0.032 | 0.05-0.25 |

Euler angle Θ may sometimes deviate from the desired angle by −2° to +4°. This deviation is caused by the fact that calculations were made in this preferred embodiment assuming that a metallic film was formed on the entire surface of the substrate, and there may be some errors within the above range in actual SAW apparatuses.

Figure 23:
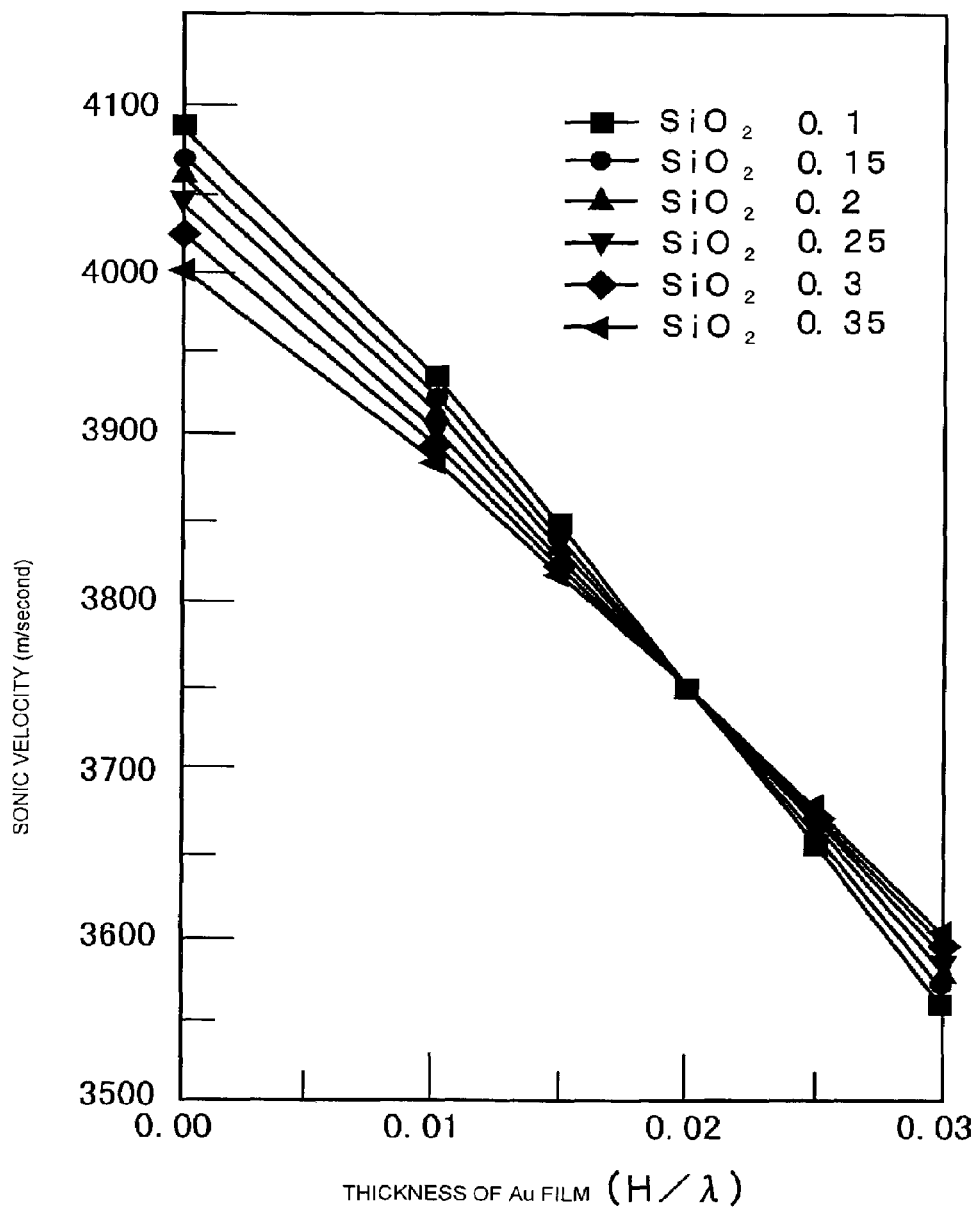
FIG. 23 illustrates a change in the acoustic velocity of a leaky SAW with respect to the thickness of an Au IDT when the Au IDT and $SiO_2$ films having various thickness values were formed on a 36°-rotated Y-plate X-propagating $LiTaO_3$ substrate having Euler angles (0°, 126°, 0°)
Figure 24:
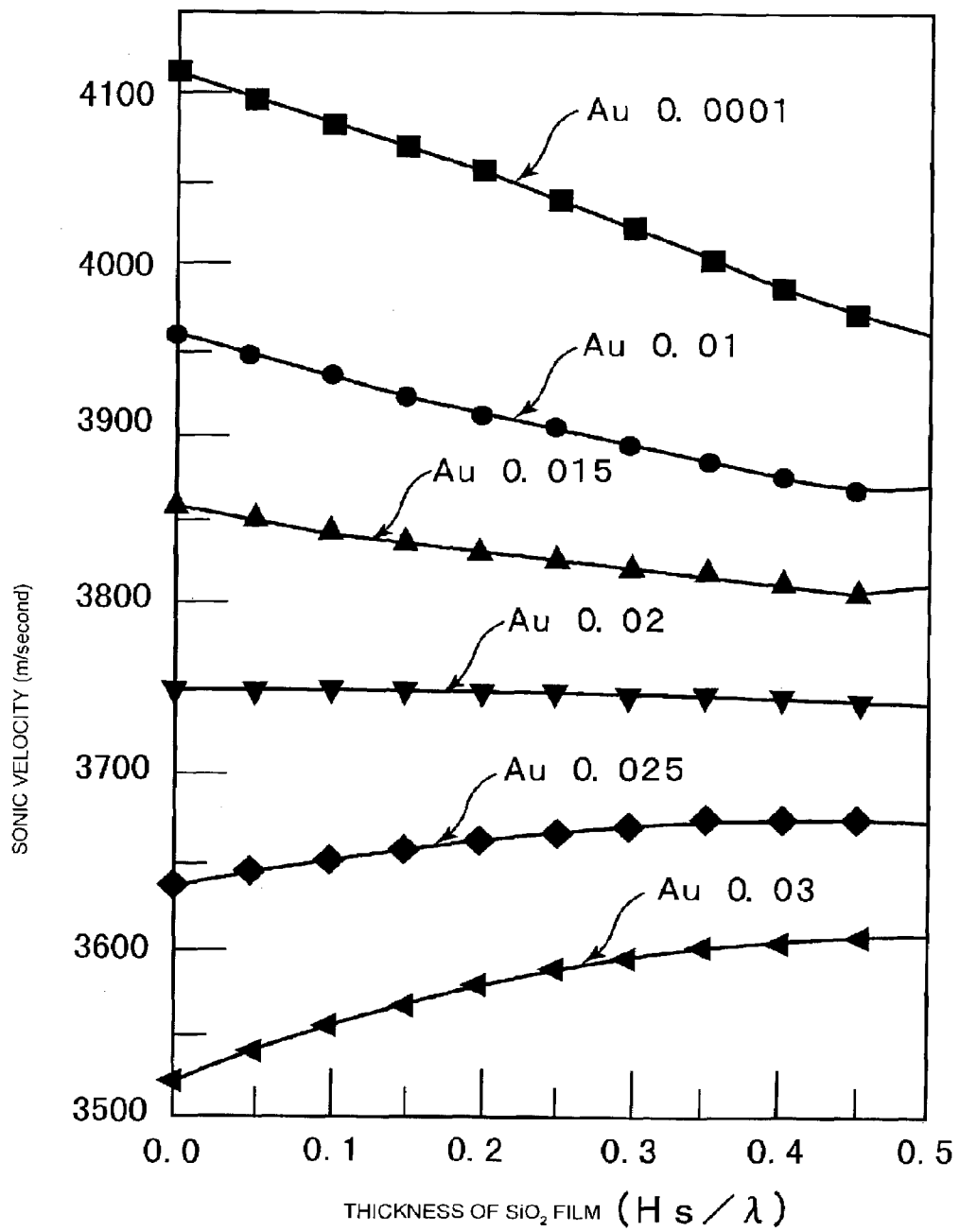
FIG. 24 illustrates a change in the acoustic velocity of a leaky SAW with respect to the thickness of a $SiO_2$ film when Au IDTs having various thickness values and the $SiO_2$ film were formed on a 36°-rotated Y-plate X-propagating $LiTaO_3$ substrate having Euler angles (0°, 126°, 0°)

When manufacturing the SAW apparatus according to the preferred embodiments of the present invention, it is preferable that an IDT primarily including Au is formed on a rotated Y-plate X-propagating LiTaO$_3$ substrate. In this state, the frequency of the SAW apparatus is adjusted. Then, a SiO$_2$ film, having a thickness reduces the attenuation constant α, is formed. This is explained below with reference to FIGS. 23 and 24. Au IDTs having different thickness values and SiO$_2$ films having different thickness values were formed on a 36°-rotated Y-plate X-propagating LiTaO$_3$ substrate (Euler angles (0°, 126°, 0°)). FIG. 23 illustrates a change in the acoustic velocity of a leaky SAW with respect to the thickness of the IDT. FIG. 24 illustrates a change in the acoustic velocity of a leaky SAW with respect to the thickness of the SiO$_2$ film. FIGS. 23 and 24 show that a change in the acoustic velocity of the SAW is much larger when the thickness of the IDT is varied than when the thickness of the SiO$_2$ film is varied. Accordingly, it is desirable that the frequency is adjusted before the formation of the SiO$_2$ film. For example, it is desirable that the frequency is adjusted after an Au IDT is formed by laser etching or ion etching. More preferably, the normalized thickness of the Au IDT ranges from about 0.015 to about 0.030. In this case, a change in the acoustic velocity by a variation of a SiO$_2$ film is reduced, and a frequency fluctuation due to a variation of the SiO$_2$ film is decreased.

Θ of the Euler angles may sometimes deviate from the desired angle by about −2° to about +4°. This deviation is caused by the fact that calculations were made in this preferred embodiment assuming that a metallic film was formed on the entire surface of the substrate, and there may be some errors within the above range in actual SAW apparatuses.

When manufacturing SAW apparatuses, although φ and ψ of the Euler angles deviate from 0° by ±3°, substantially the same characteristic as that when φ and ψ are 0° can be obtained.

A SAW apparatus of a third preferred embodiment of the present invention is described below. The SAW apparatus of the third preferred embodiment of the present invention is similar to the SAW apparatus 21 of the second preferred embodiment of the present invention shown in FIG. 15, except that the IDTs 23a and 23b are preferably made of Ag.

As stated below, when the IDTs 23a and 23b are made of Ag, the thickness H/λ of the IDTs 23a and 23b standardized by the SAW wavelength λ is preferably from about 0.01 to about 0.08.

According to the SAW apparatus of the third preferred embodiment of the present invention, the IDTs 23a and 23b are made of Ag on the LiTaO$_3$ substrate 22 and the thickness of the IDTs 23a and 23b can be decreased. Because the LiTaO$_3$ substrate is used, the attenuation constant can be considerably decreased, thereby achieving low insertion loss. By the formation of the SiO$_2$ film 25, a high level of temperature coefficient of frequency (TCP) is achieved. This is described in detail below by way of specific examples.

SAWs propagating in a LiTaO$_3$ substrate include, not only Rayleigh wave, but also leaky SAW (LSAW). Although the LSAW has a higher acoustic velocity and a greater electromechanical coupling coefficient than the Rayleigh wave, it propagates while radiating energy in the substrate. Accordingly, the LSAW causes attenuation which results in the insertion loss.

Figure 36:
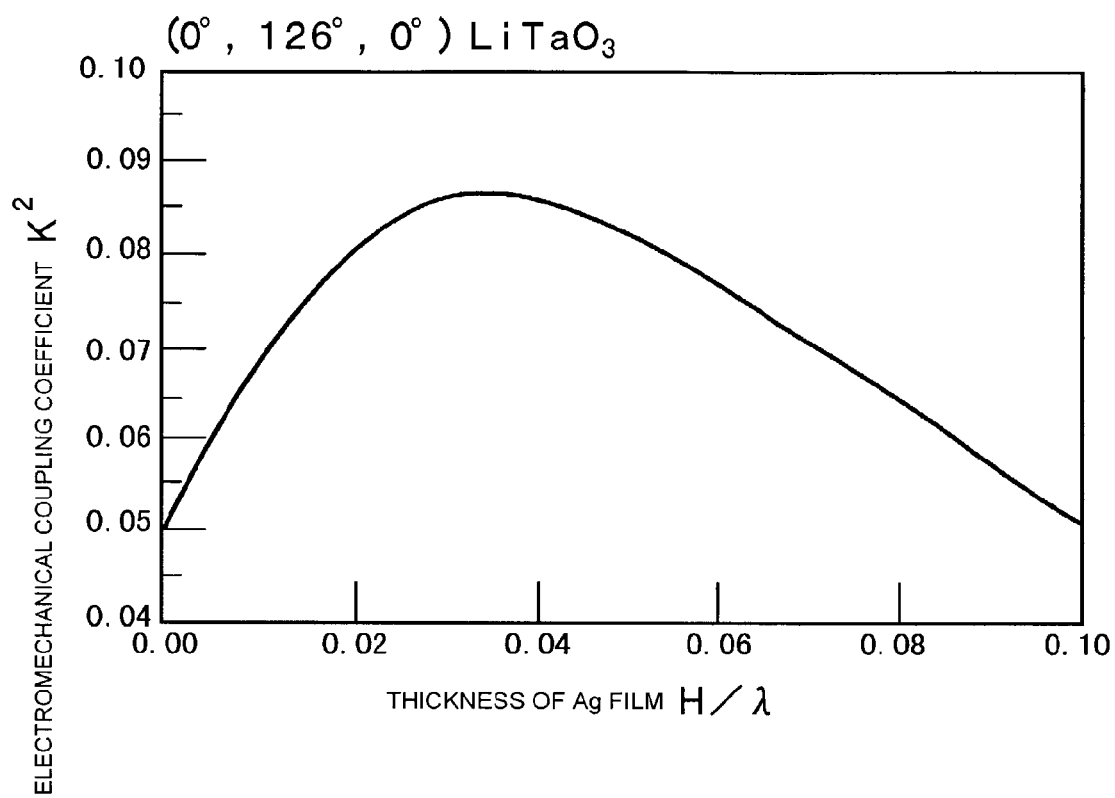
FIG. 36 illustrates the relationship between the electromechanical coupling coefficient and the normalized thickness of an Ag electrode formed on a $LiTaO_3$ substrate having Euler angles (0°, 126°, 0°) according to a third preferred embodiment of the present invention.

FIG. 36 illustrates the relationship between the electromechanical coupling coefficient KSAW and the normalized thickness H/λ of an Ag IDT on a 36°-rotated Y-plate X-propagating LiTaO$_3$ substrate (having Euler angles (0°, 126°, 0°)). It should be noted that λ represents the wavelength at the center frequency of the SAW apparatus.

FIG. 36 shows that, when the thickness H/λ of the Ag film ranges from about 0.01 to about 0.08, the electromechanical coupling coefficient KSAW becomes about 1.5 times or greater than the electromechanical coupling coefficient of a SAW apparatus without an Ag film (H/λ=0). When the thickness H/λ of the Ag film ranges from about 0.02 to about 0.06, the electromechanical coupling coefficient KSAW becomes about 1.7 times or greater than the electromechanical coupling coefficient of a SAW apparatus without an Ag film. When the thickness H/λ of the Ag film ranges from about 0.03 to about 0.05, the electromechanical coupling coefficient KSAW becomes about 1.8 times or greater than the electromechanical coupling coefficient of a SAW apparatus without an Ag film.

If the thickness H/λ of the Ag film exceeds about 0.08, it becomes difficult to form an Ag IDT. Accordingly, in order to obtain a large electromechanical coupling coefficient without a difficulty in forming an Ag IDT, the thickness of the Ag IDT is desirably from about 0.01 to about 0.08, and more preferably, from about 0.02 to about 0.06, and further preferably, about 0.03 to about 0.05.

Figure 37:
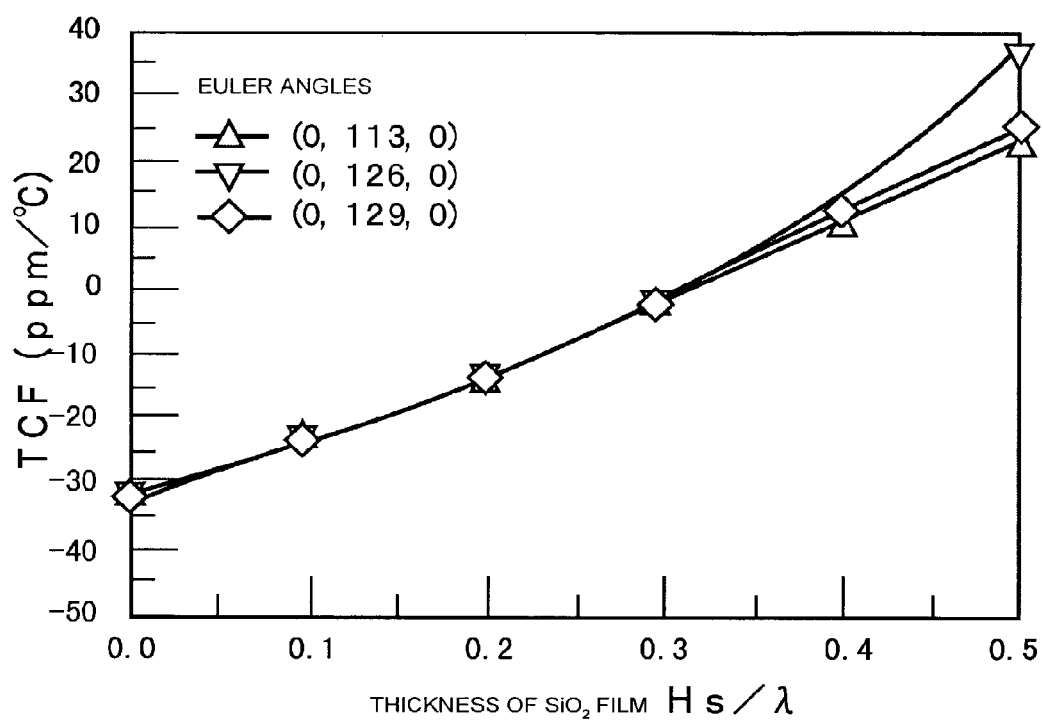
FIG. 37 illustrates the relationship between the TCF and the normalized thickness of $SiO_2$ films formed on three $LiTaO_3$ substrate having Euler angles (0°, 113°, 0°), (0°, 126°, 0°), and (0°, 129°, 0°)

The relationship between the TCF and the thickness Hs/λ of a SiO$_2$ film formed on a LiTaO$_3$ substrate is shown in FIG. 37. FIG. 37 shows the results obtained when three types of LiTaO$_3$ substrates having Euler angles (0°, 113°, 0°), (0°, 126°, 0°), (0°, 129°, 0°) were used. In this example, an electrode is not formed.

FIG. 37 reveals that the TCF ranges from about −20 to about +20 ppm/° C. when the thickness Hs/λ of the SiO$_2$ film is from about 0.15 to about 0.45, regardless of whether the angle Θ is 113°, 126°, or 129°. Because of the time it takes to form a SiO$_2$ film, the thickness Hs/λ of the SiO2 film is desirably about 0.15 to about 0.40.

Figure 38:
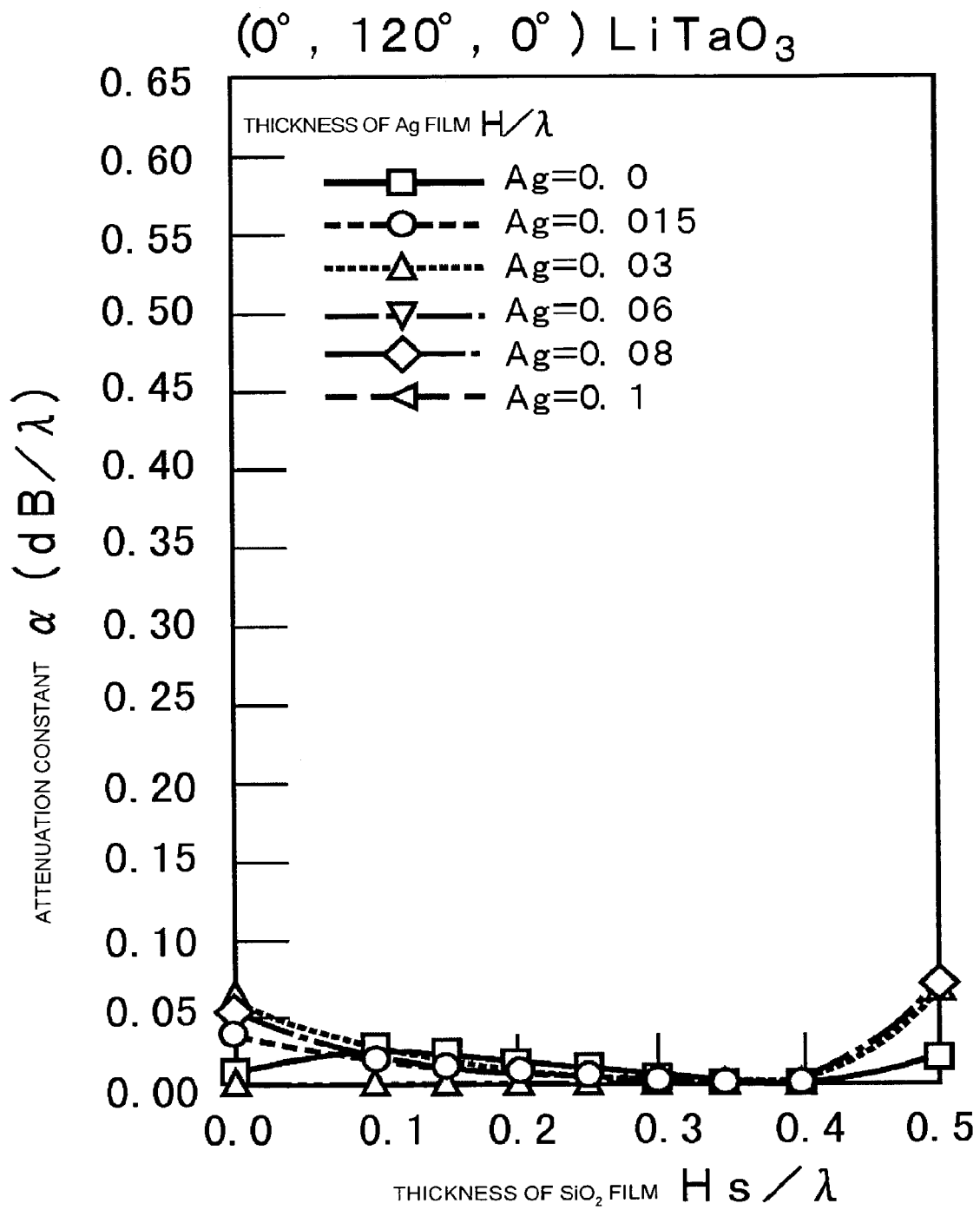
FIG. 38 illustrates a change in the attenuation constant α when Ag films having a normalized thickness of about 0.1 or smaller and $SiO_2$ films having a normalized thickness of 0 to about 0.5 were formed on a $LiTaO_3$ substrate having Euler angles (0°, 120°, 0°)

FIG. 38 illustrates a change in the attenuation constant α when Ag electrodes having a normalized thickness H/λ of about 0.10 or smaller and SiO$_2$ films having a normalized thickness Hs/λ of 0 to about 0.5 were formed on a LiTaO$_3$ substrate having Euler angles (0°, 120°, 0°). FIG. 38 shows that the attenuation constant α is small when the thickness Hs/λ of the SiO$_2$ film is about 0.2 to about 0.4, and when the thickness H/λ of the Ag film is about 0.01 to about 0.10.

Figure 39:
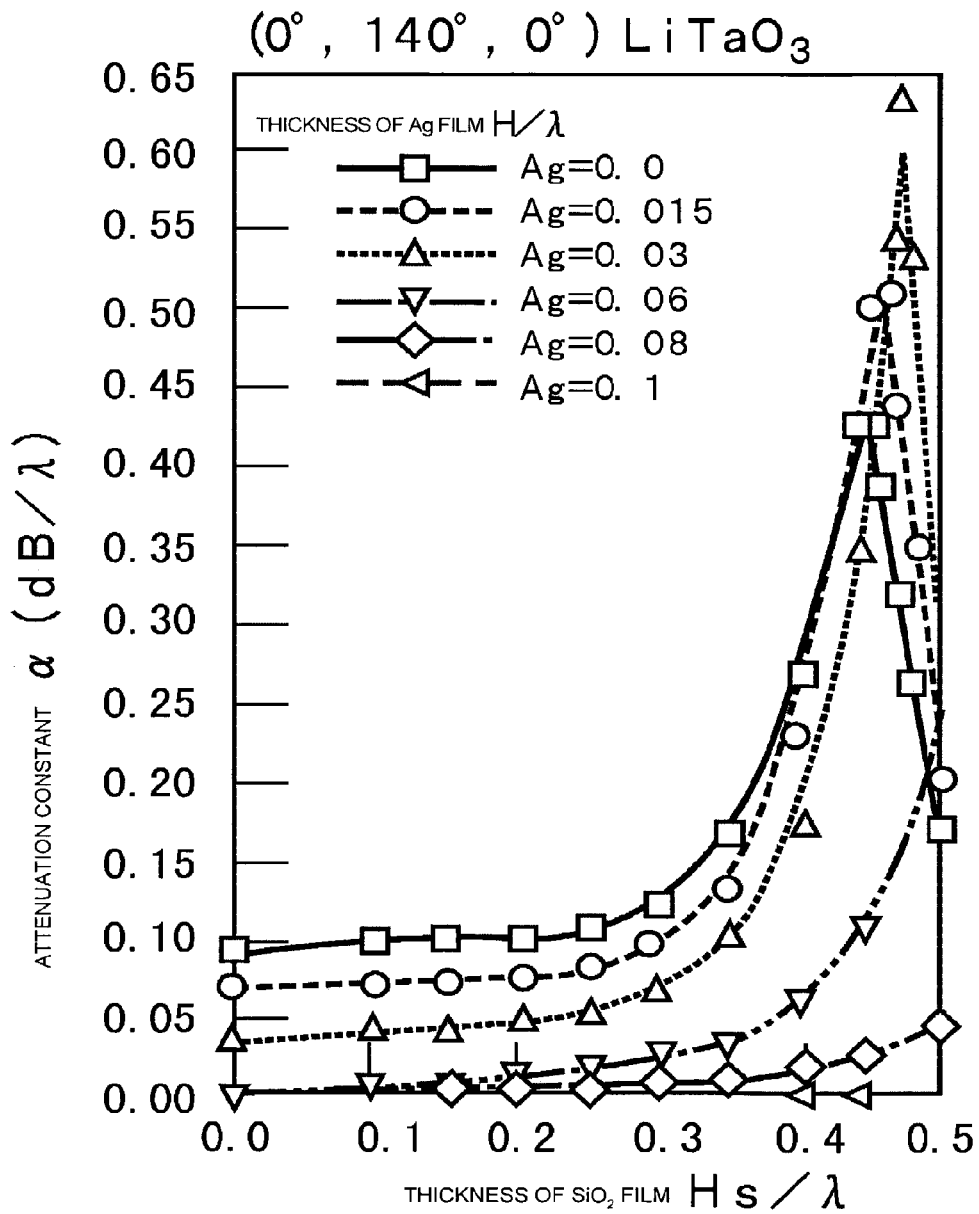
FIG. 39 illustrates a change in the attenuation constant α when Ag films having a normalized thickness of about 0.1 or smaller and SiO₂ films having a normalized thickness of 0 to about 0.5 were formed on a LiTaO₃ substrate having Euler angles (0°, 140°, 0°)
Figure 40:
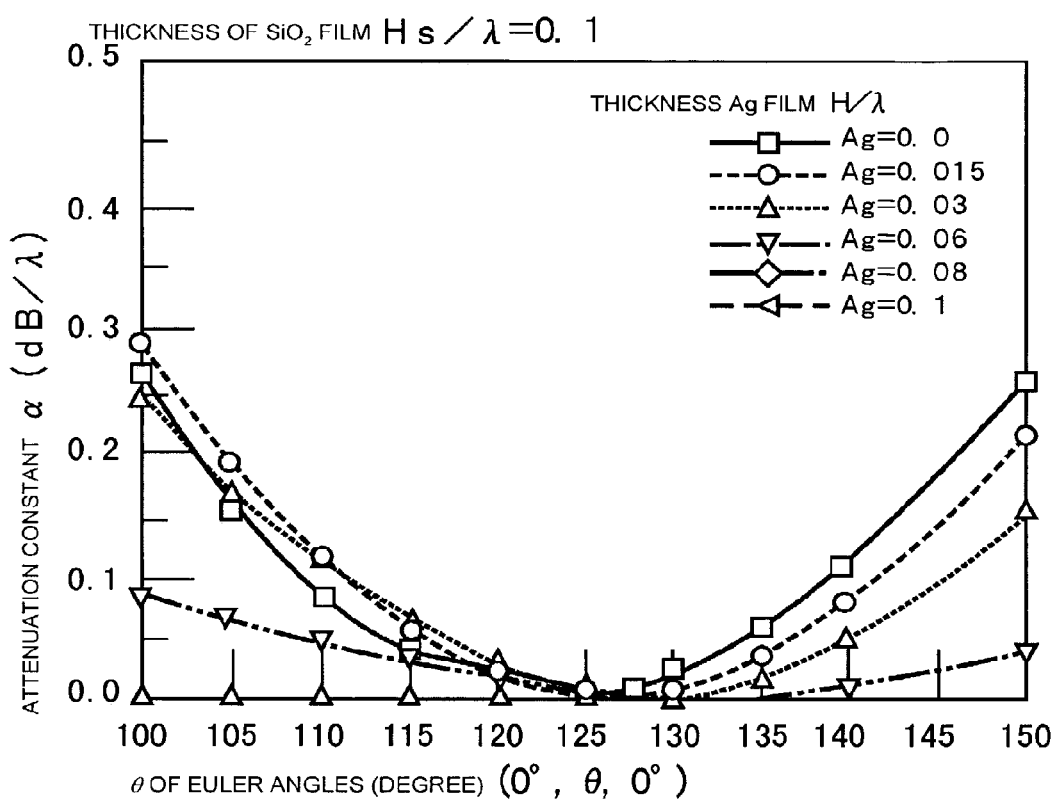
FIG. 40 illustrates a change in the attenuation constant α when Ag films having a normalized thickness of about 0.1 or smaller and a SiO₂ SiO₂ film having a normalized thickness of about 0.1 were formed on a LiTaO₃ substrate having Euler angles (0°, Θ, 0°)
Figure 41:
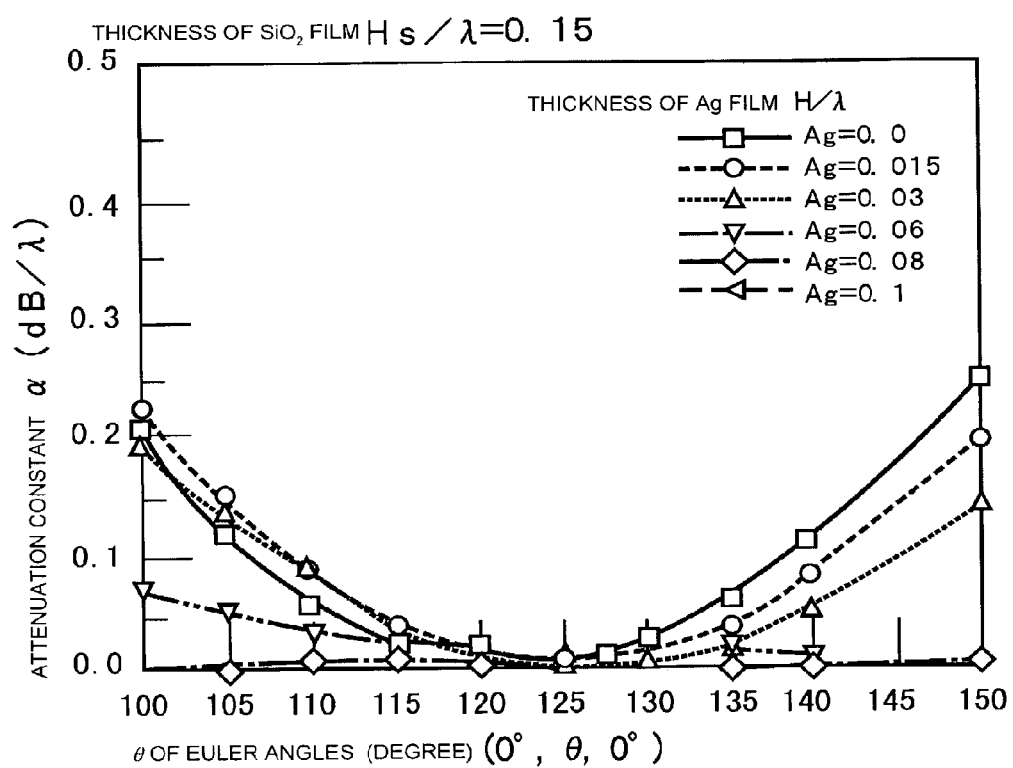
FIG. 41 illustrates a change in the attenuation constant α when Ag films having a normalized thickness of about 0.1 or smaller and a SiO₂ film having a normalized thickness of about 0.15 were formed on a LiTaO₃ LiTaO₃ substrate having Euler angles (0°, Θ, 0°)
Figure 42:
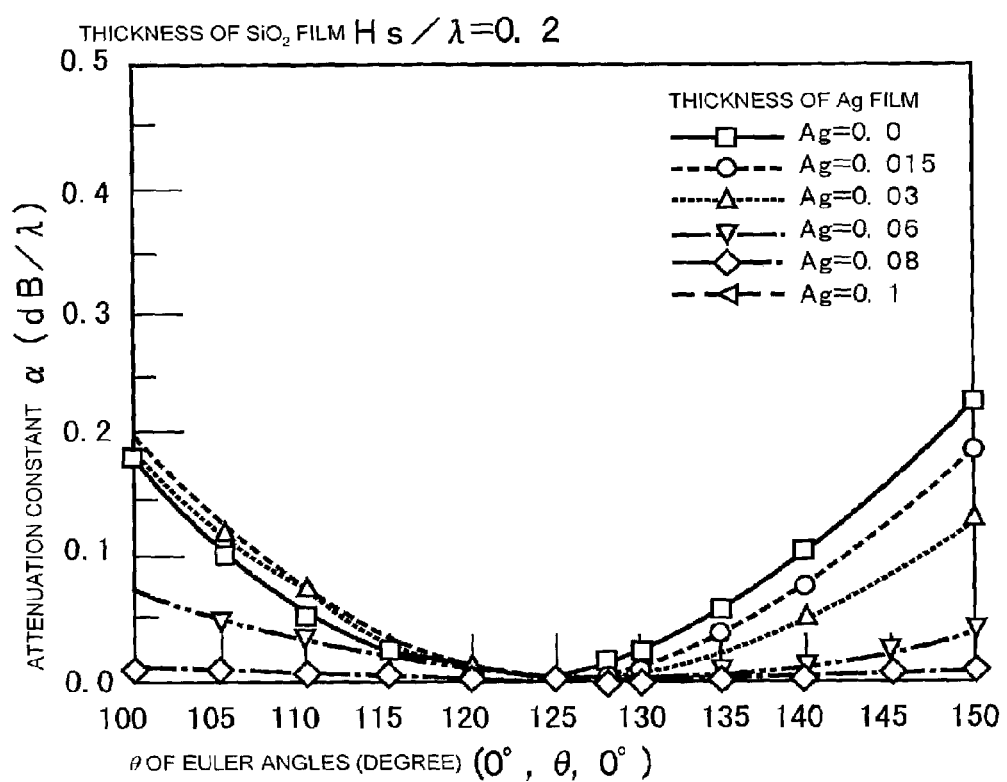
FIG. 42 illustrates a change in the attenuation constant α when Ag films having a normalized thickness of about 0.1 or smaller and a SiO₂ film having a normalized thickness of about 0.2 were formed on a LiTaO₃ substrate having Euler angles (0°, Θ, 0°)
Figure 43:
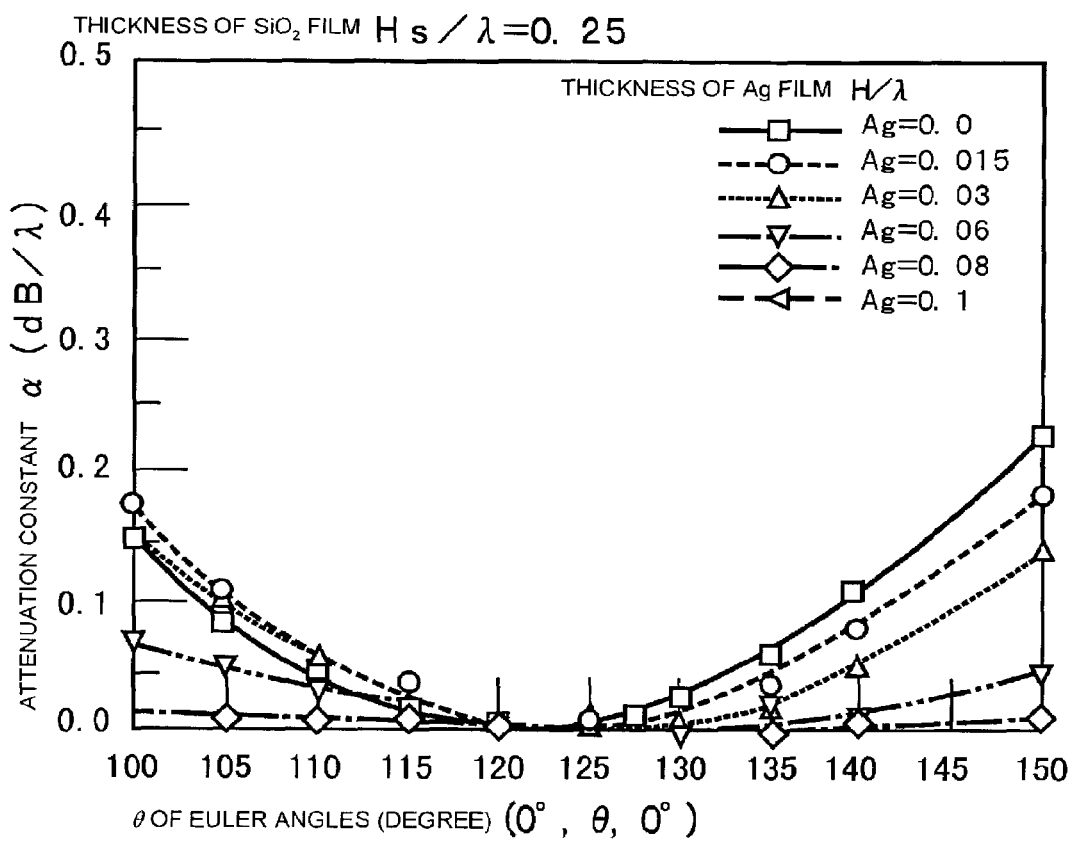
FIG. 43 illustrates a change in the attenuation constant α when Ag films having a normalized thickness of about 0.1 or smaller and a SiO₂ film having a normalized thickness of about 0.25 were formed on a LiTaO₃ substrate having Euler angles (0°, Θ, 0°)
Figure 44:
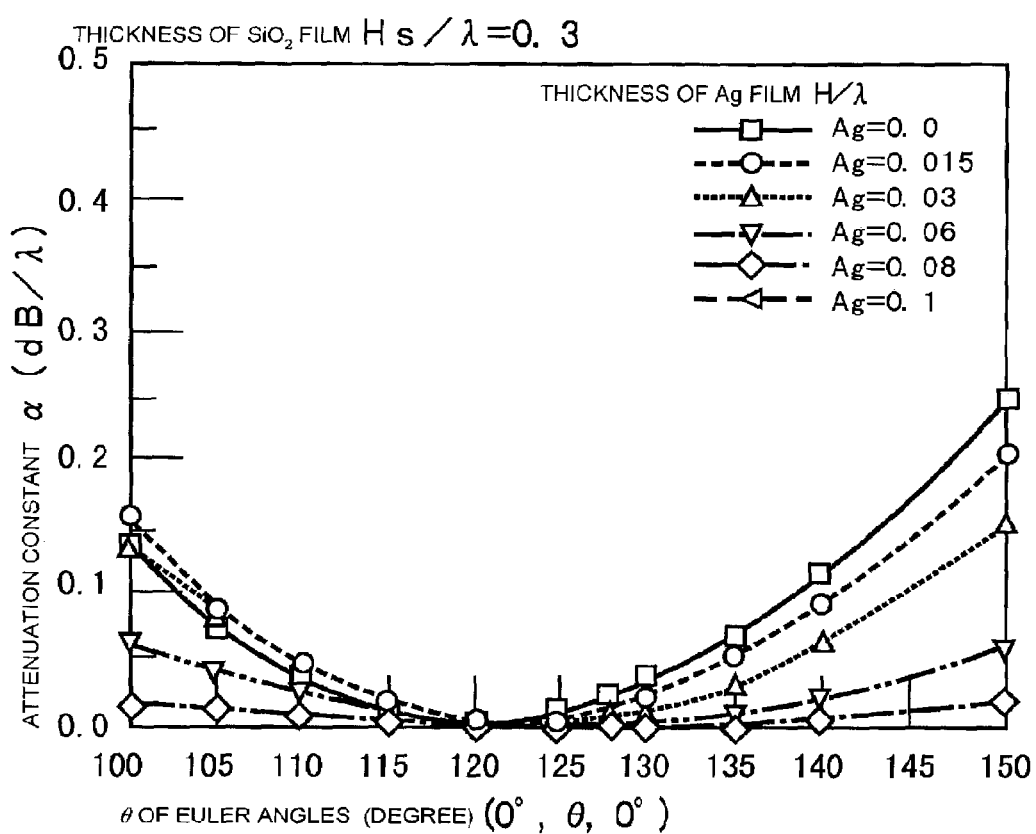
FIG. 44 illustrates a change in the attenuation constant α when Ag films having a normalized thickness of about 0.1 or smaller and a SiO₂ film having a normalized thickness of about 0.3 were formed on a LiTaO₃ substrate having Euler angles (0°, Θ, 0°)
Figure 45:
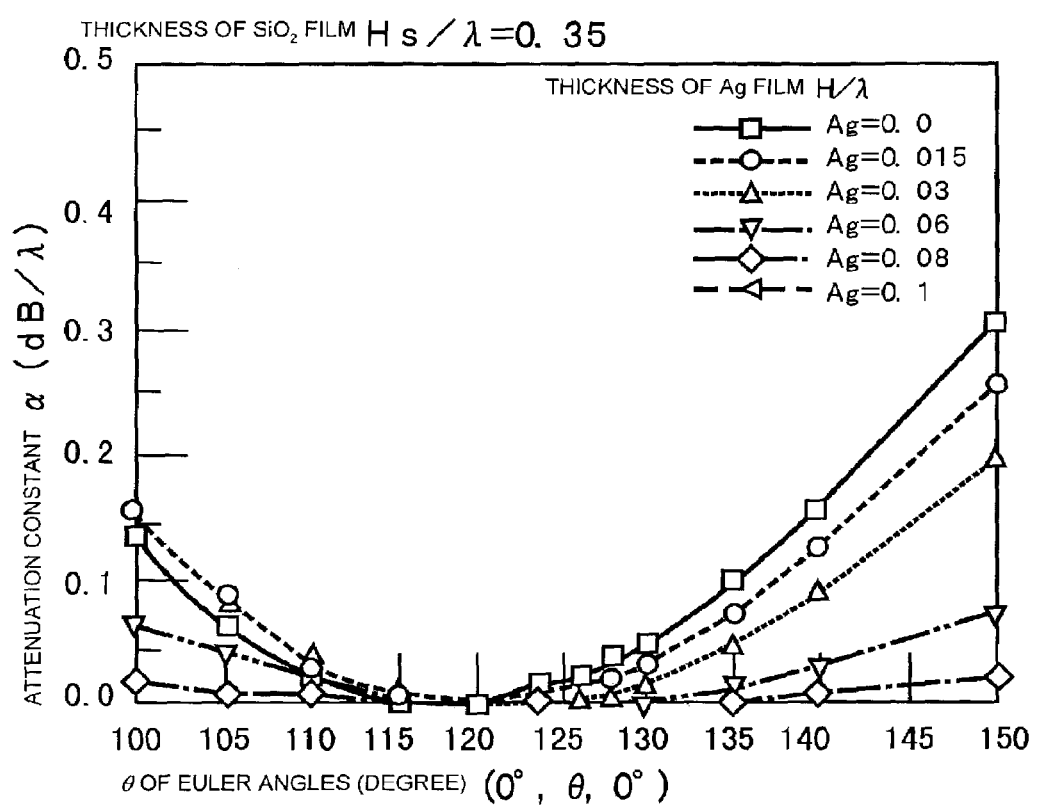
FIG. 45 illustrates a change in the attenuation constant α when Ag films having a normalized thickness of about 0.1 or smaller and a SiO₂ film having a normalized thickness of about 0.35 were formed on a LiTaO₃ substrate having Euler angles (0°, Θ, 0°)
Figure 46:
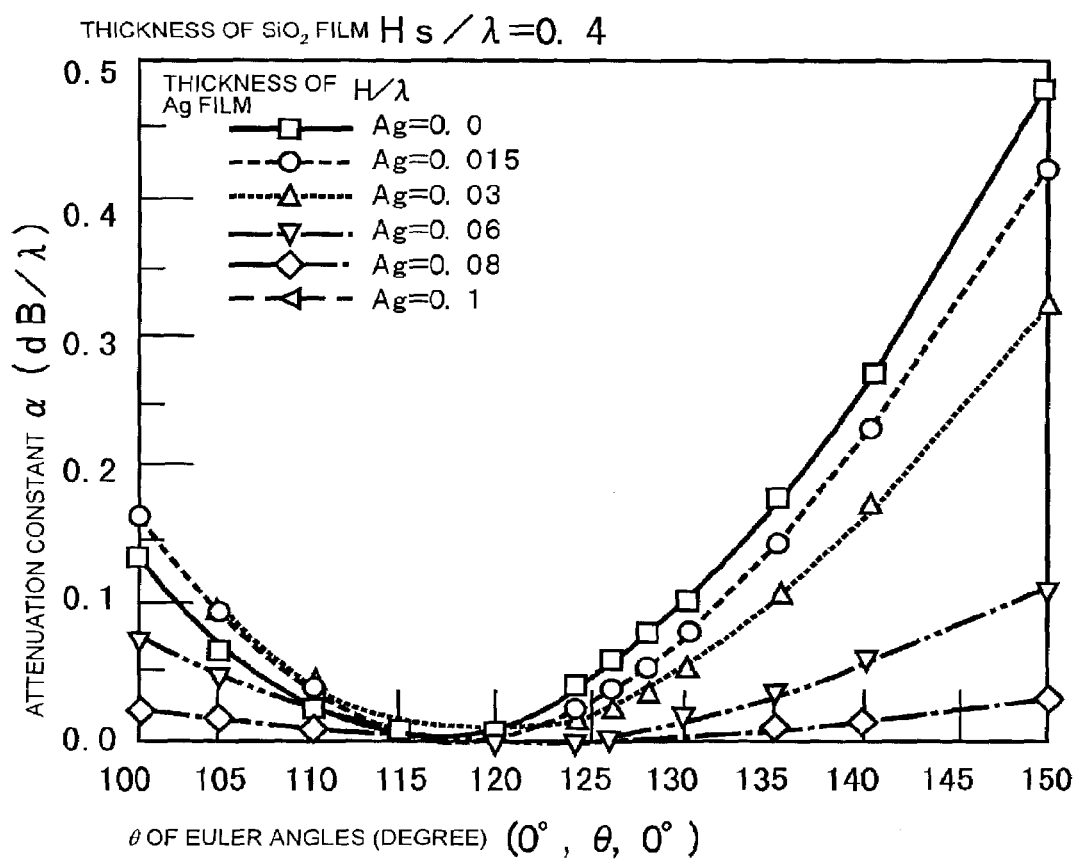
FIG. 46 illustrates a change in the attenuation constant α when Ag films having a normalized thickness of about 0.1 or smaller and a SiO₂ film having a normalized thickness of about 0.4 were formed on a LiTaO₃ substrate having Euler angles (0°, Θ, 0°)
Figure 47:
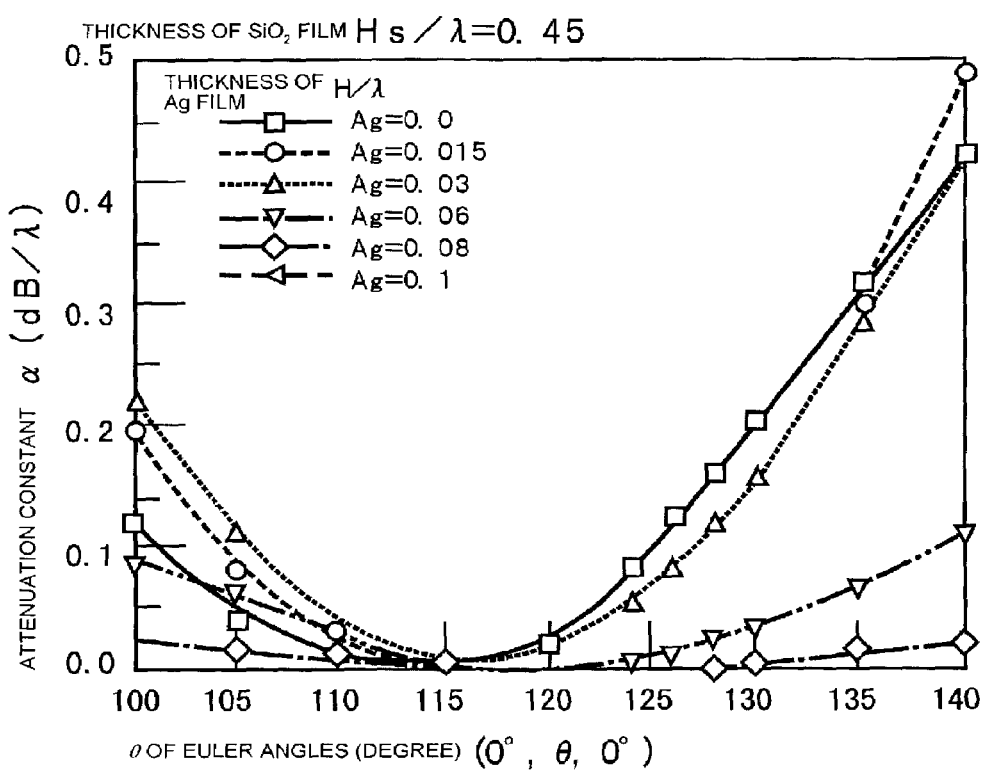
FIG. 47 illustrates a change in the attenuation constant α when Ag films having a normalized thickness of about 0.1 or smaller and a SiO₂ film having a normalized thickness of about 0.45 were formed on a LiTaO₃ substrate having Euler angles (0°, Θ, 0°)

FIG. 39 illustrates a change in the attenuation constant α when Ag electrodes having a normalized thickness H/λ of 0 to about 0.10 and SiO$_2$ films having a normalized thickness Hs/λ of 0 to about 0.5 were formed on a LiTaO$_3$ substrate having Euler angles (0°, 140°, 0°). As is seen from FIG. 39, when Θ is 140°, the attenuation constant α becomes larger as the thickness of the SiO$_2$ film is increases, as described above, and as the normalized thickness of the Ag film decreases, especially when the normalized thickness of the Ag film is about 0.06 or smaller.

That is, in order to achieve an improved TCF, a large electromechanical coupling coefficient, and a small attenuation constant, it is necessary to suitably combine the cut angle of a LiTaO$_3$ substrate, the thickness of a SiO$_2$ film, and the thickness of an Ag film.

FIGS. 40 through 47 illustrate the relationship between the attenuation constant α and Θ of the Euler angles when Ag films having a normalized thickness H/λ of about 0.1 or smaller were formed on a LiTaO$_3$ substrate and when the normalized thickness Hs/λ of the SiO$_2$ film was changed to about 0.1, 0.15, 0.2, 0.25, 0.3, 0.35, 0.4, and 0.45, respectively.

As is seen from FIGS. 40 through 47, by setting the thickness of the Ag film to be about 0.01 to about 0.08 and by selecting any of the following combinations of the SiO$_2$ film and Θ of the Euler angles shown in the center column of table Table 3, it is possible to implement a high level of TCF, a large electromechanical coupling coefficient, and a small attenuation constant α. It is more preferable that the Euler angles on the right side of table are selected. In which case, superior characteristics are obtained.

TABLE 3

Ag thickness H/λ: about 0.01 to about 0.08

| SiO$_2$ thickness Hs/λ | Euler angles of LiTaO$_3$ (°) | More preferable Euler angles (°) |
|---|---|---|
| 0.15-0.18 | 0 ± 3, 117-137, 0 ± 3 | 0 ± 3, 120-135, 0 ± 3 |
| 0.18-0.23 | 0 ± 3, 117-136, 0 ± 3 | 0 ± 3, 118-133, 0 ± 3 |
| 0.23-0.28 | 0 ± 3, 115-135, 0 ± 3 | 0 ± 3, 117-133, 0 ± 3 |
| 0.28-0.33 | 0 ± 3, 113-133, 0 ± 3 | 0 ± 3, 115-132, 0 ± 3 |
| 0.33-0.38 | 0 ± 3, 113-135, 0 ± 3 | 0 ± 3, 115-133, 0 ± 3 |
| 0.38-0.40 | 0 ± 3, 113-132, 0 ± 3 | 0 ± 3, 115-130, 0 ± 3 |

When the normalized thickness H/λ of the Ag film is about 0.02 to about 0.06, any of the following combinations shown in Table 4 of the normalized thickness of the SiO$_2$ film and Θ of the Euler angles in the center column, and more preferable Euler angles on the right side of Table 4, in which case superior characteristics are obtained, can be selected.

TABLE 4

Ag thickness H/λ: about 0.02 to about 0.06

| SiO$_2$ thickness (Hs/λ) | Euler angles of LiTaO$_3$ (°) | More preferable Euler angles (°) |
|---|---|---|
| 0.15-0.18 | 0 ± 3, 120-133, 0 ± 3 | 0 ± 3, 122-130, 0 ± 3 |
| 0.18-0.23 | 0 ± 3, 120-137, 0 ± 3 | 0 ± 3, 122-136, 0 ± 3 |
| 0.23-0.28 | 0 ± 3, 120-135, 0 ± 3 | 0 ± 3, 122-133, 0 ± 3 |
| 0.28-0.33 | 0 ± 3, 118-135, 0 ± 3 | 0 ± 3, 120-133, 0 ± 3 |
| 0.33-0.38 | 0 ± 3, 115-133, 0 ± 3 | 0 ± 3, 117-130, 0 ± 3 |
| 0.38-0.40 | 0 ± 3, 113-130, 0 ± 3 | 0 ± 3, 115-128, 0 ± 3 |

When the standard thickness H/λ of the Ag film is about 0.03 to about 0.05, any of the following combinations shown in Table 5 of the thickness of the SiO$_2$ film and Θ of the Euler angles in the center column, and more preferable Euler angles on the right side of Table 5, in which case superior results are obtained, can be selected.

TABLE 5

Ag thickness H/λ: about 0.03 to about 0.05

| SiO$_2$ thickness Hs/λ | Euler angles of LiTaO$_3$ (°) | More preferable Euler angles (°) |
|---|---|---|
| 0.15-0.18 | 0 ± 3, 122-142, 0 ± 3 | 0 ± 3, 123-140, 0 ± 3 |
| 0.18-0.23 | 0 ± 3, 120-140, 0 ± 3 | 0 ± 3, 122-137, 0 ± 3 |
| 0.23-0.28 | 0 ± 3, 117-138, 0 ± 3 | 0 ± 3, 120-135, 0 ± 3 |
| 0.28-0.33 | 0 ± 3, 116-136, 0 ± 3 | 0 ± 3, 118-134, 0 ± 3 |
| 0.33-0.38 | 0 ± 3, 114-135, 0 ± 3 | 0 ± 3, 117-133, 0 ± 3 |
| 0.38-0.40 | 0 ± 3, 113-130, 0 ± 3 | 0 ± 3, 115-128, 0 ± 3 |

In preferred embodiments of the present invention, the IDT may be made of only Ag. Alternatively, the IDT may be made of an Ag alloy or a laminated electrode of Ag and another metal, as long as such an alloy or a laminated electrode primarily comprises Ag. In this case, it is preferably that Ag constitutes about 80% by weight of the total IDT. Accordingly, an Al thin film or a Ti thin film may be formed as an underlying layer of the Ag IDT. In this case, it is preferable that Ag constitutes about 80% by weight of the total of the underlying layer and the IDT.

In the above-described example, a LiTaO$_3$ substrate having Euler angles (0°, Θ, 0°) was used, and normally, there is a variation of 0±3° in φ and ψ. However, even in a LiTaO$_3$ substrate having such a variation, i.e., (0±3°, 113°-142°, 0±3°), advantages of the preferred embodiments of the present invention can be achieved.

Euler angle Θ may sometimes deviate from the desired angle by about −2° to about +40°. This deviation is generated caused by the fact that calculations were made in this preferred embodiment assuming that a metallic film was formed on the entire surface of the substrate, and there may be some errors within the above range in actual SAW apparatuses.

A SAW apparatus of a fourth preferred embodiment of the present invention is described below. The SAW apparatus of the fourth preferred embodiment of the present invention is similar to the SAW apparatus 21 of the second preferred embodiment of the present invention shown in FIG. 15, except that the IDTs 23a and 23b are made of Cu. Because the electrodes are made of Cu having a higher density than Al, the electromechanical coupling coefficient and the reflection coefficient are improved.

Figure 58:
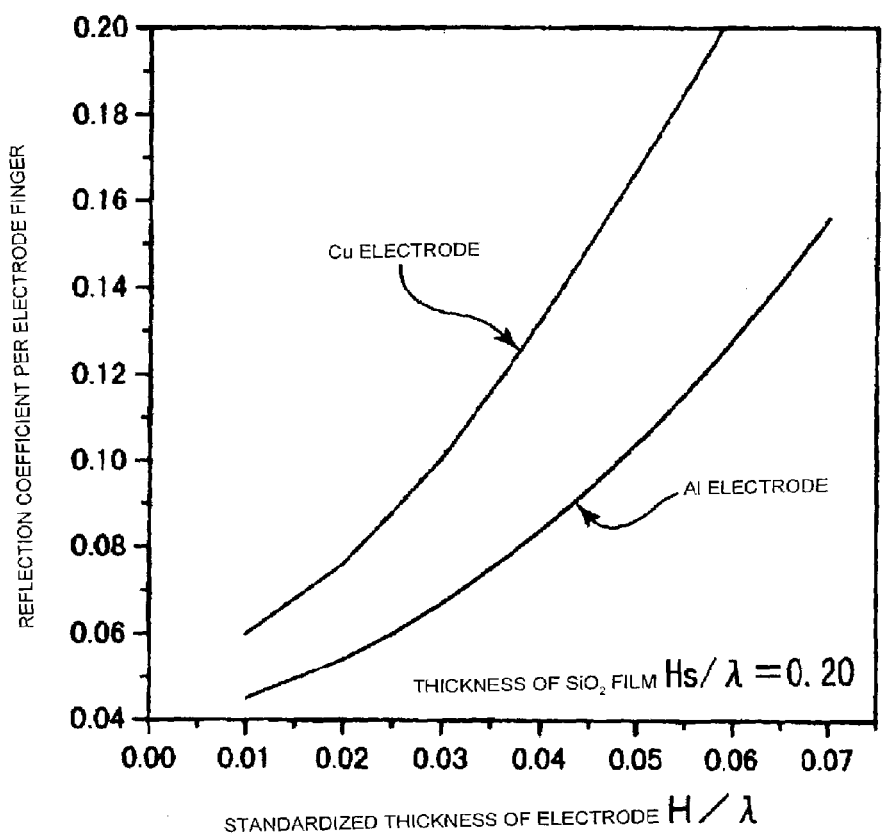
FIG. 58 illustrates the relationship between the reflection coefficient per electrode finger of an Al electrode and that of a Cu electrode and the normalized thickness of the corresponding electrode when the normalized thickness of a SiO₂ film was about 0.02.

FIG. 58 illustrates the relationship between the reflection coefficient of a Cu electrode and that of an Al electrode and the thickness of the corresponding electrode when the normalized thickness of a SiO$_2$ film is about 0.20.

FIG. 58 shows that the reflection coefficient per electrode finger can be increased when a Cu electrode was used rather than an Al electrode. In this case, the number of electrode fingers can be decreased. Thus, the size of the reflectors can be reduced, and accordingly, the overall size of the resulting SAW apparatus can be reduced.

As discussed below, the thickness H/λ of the IDTs 23a and 23b standardized by the wavelength λ is preferably from about 0.01 to about 0.08.

Figure 48:
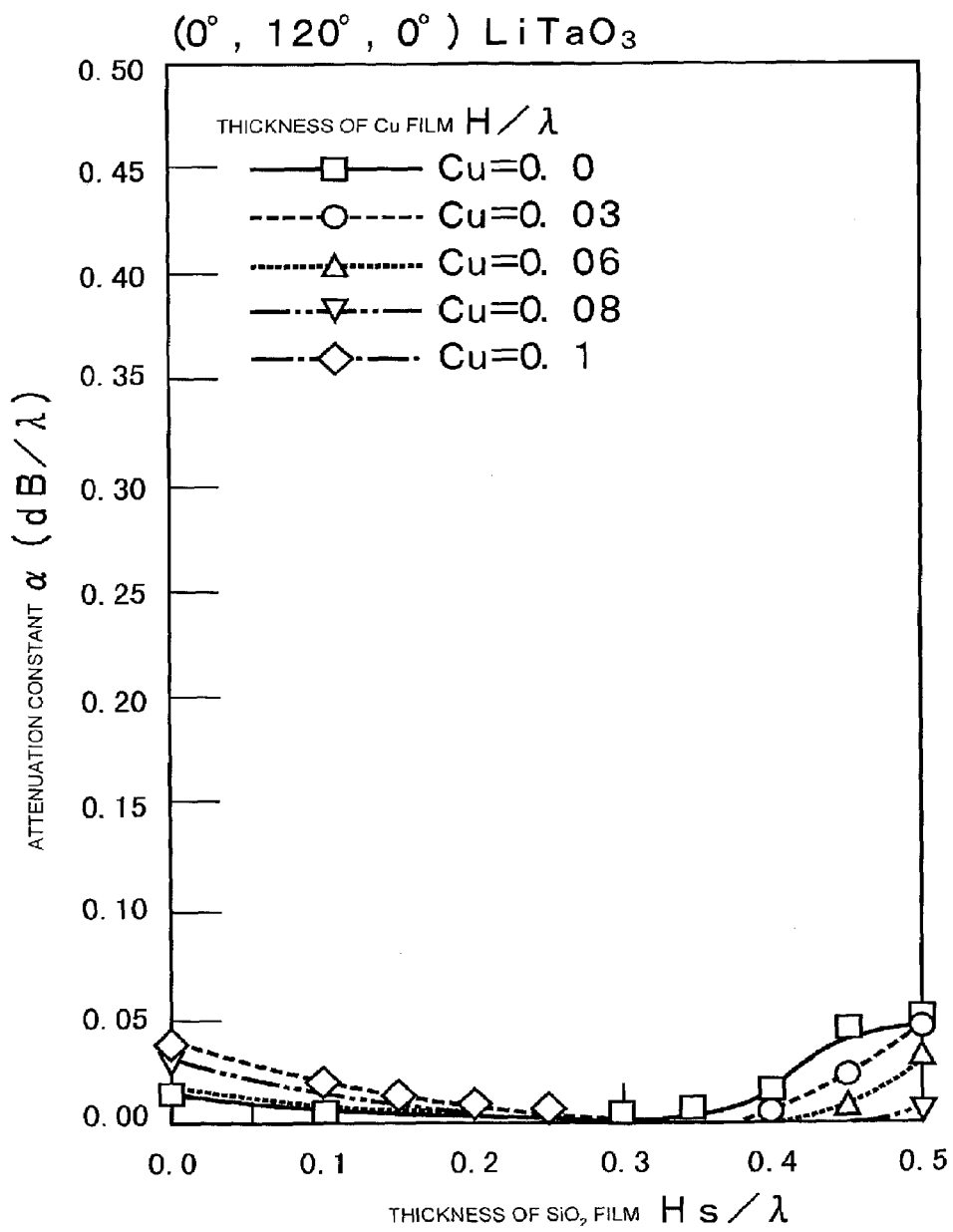
FIG. 48 illustrates a change in the attenuation constant α when Cu films having a normalized thickness of about 0.1 or smaller and SiO₂ films having a normalized thickness of 0 to about 0.5 were formed on a LiTaO₃ substrate having Euler angles (0°, 120°, 0°) according to a fourth preferred embodiment of the present invention.

FIG. 48 illustrates a change in the attenuation constant α when Cu electrodes having a normalized thickness of H/λ of about 0.10 or smaller and SiO$_2$ films having a normalized thickness Hs/λ of 0 to about 0.5 were formed on a LiTaO$_3$ substrate having Euler angles (0°, 120°, 0°). FIG. 48 shows that the attenuation constant α is small when the thickness Hs/λ of the SiO$_2$ film is about 0.2 to about 0.4 and when the thickness H/λ of the Cu film is about 0.01 to about 0.10.

Figure 49:
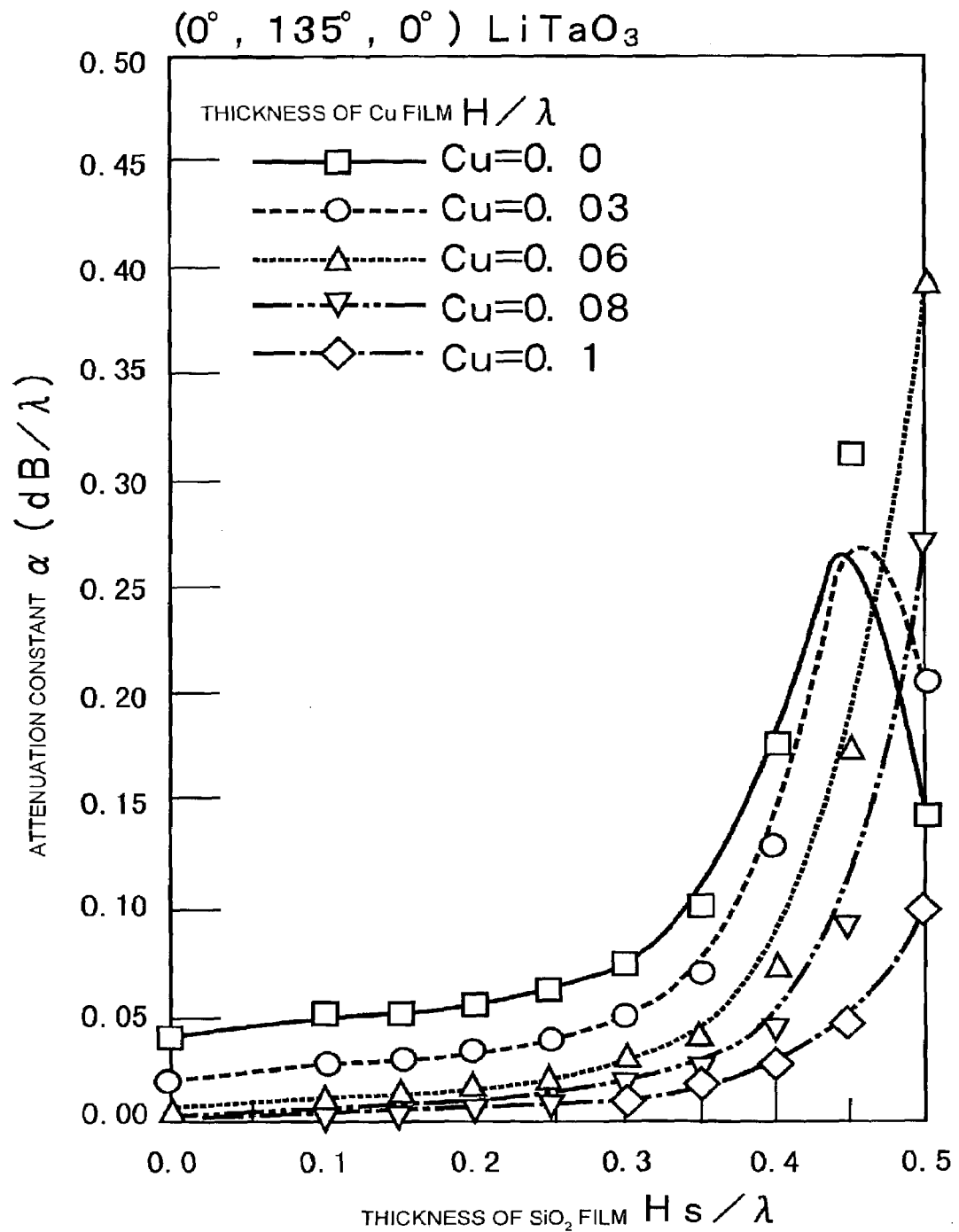
FIG. 49 illustrates a change in the attenuation constant α when Cu films having a normalized thickness of about 0.1 or smaller and SiO₂ films having a normalized thickness of 0 to about 0.5 were formed on a LiTaO₃ substrate having Euler angles (0°, 135°, 0°)
Figure 50:
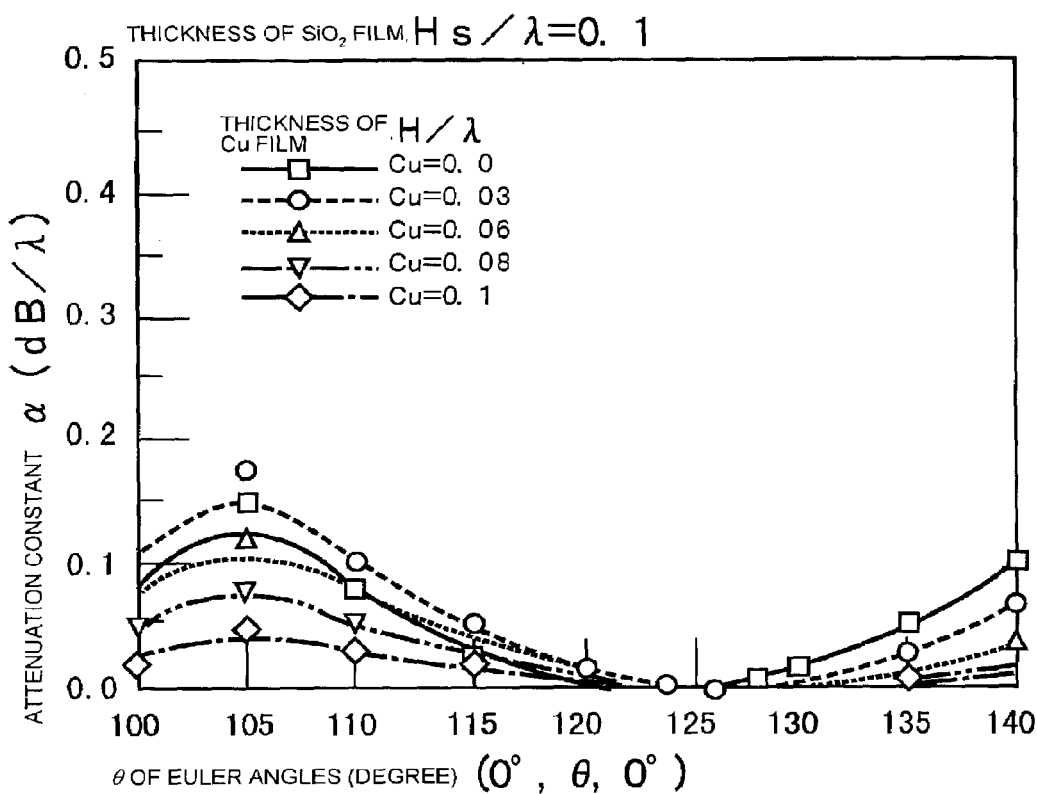
FIG. 50 illustrates a change in the attenuation constant α when Cu films having a normalized thickness of about 0.1 or smaller and a SiO₂ film having a normalized thickness of about 0.1 were formed on a LiTaO₃ substrate having Euler angles (0°, Θ, 0°)
Figure 51:
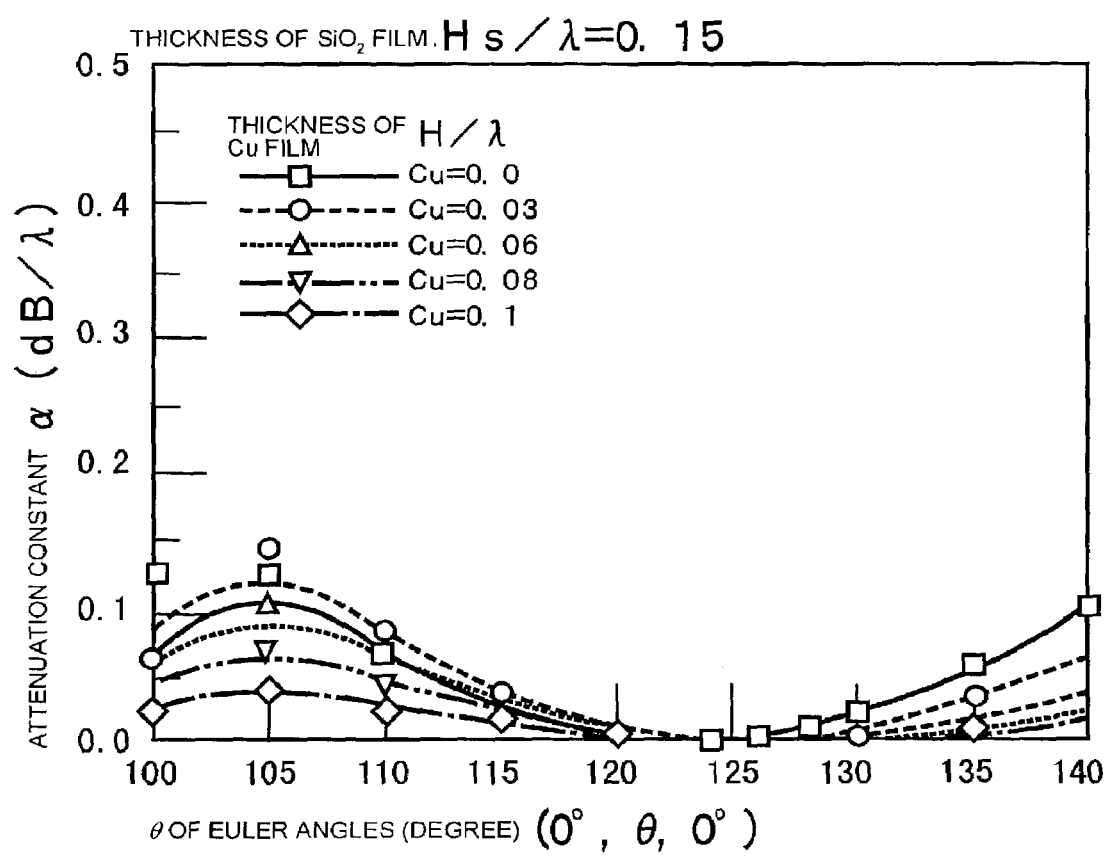
FIG. 51 illustrates a change in the attenuation constant α when Cu films having a normalized thickness of about 0.1 or smaller and a SiO₂ film having a normalized thickness of about 0.15 were formed on a LiTaO₃ substrate having Euler angles (0°, Θ, 0°)
Figure 52:
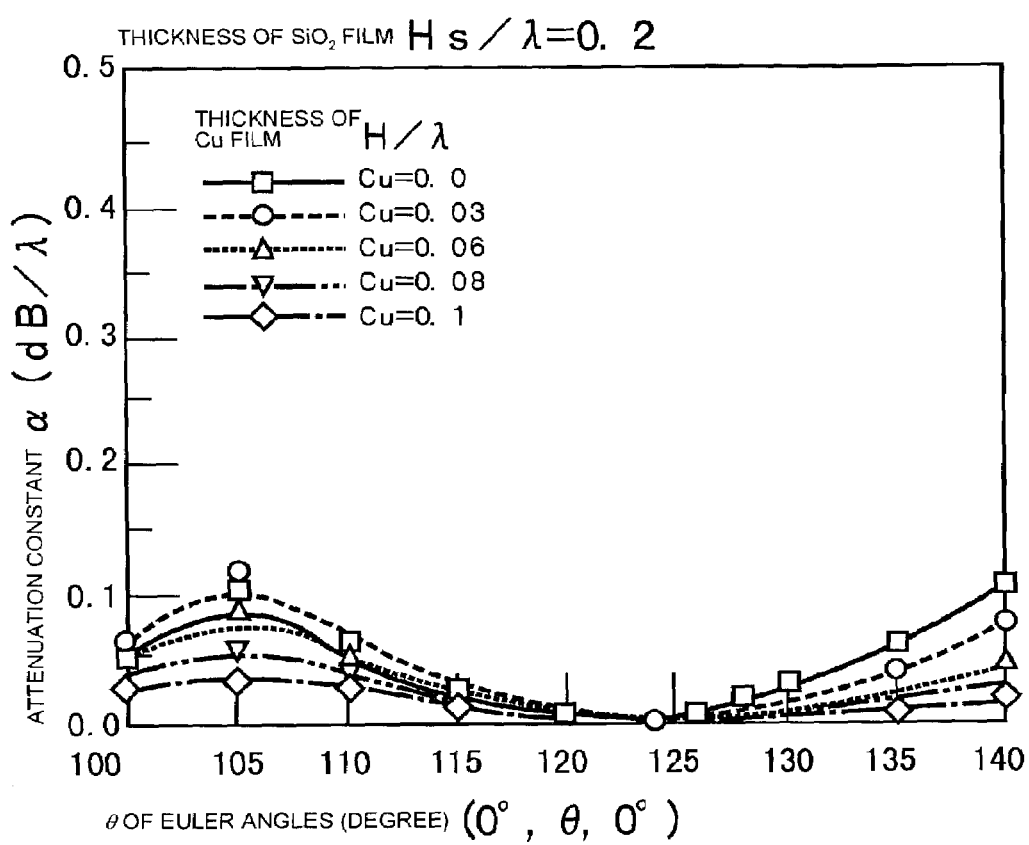
FIG. 52 illustrates a change in the attenuation constant α when Cu films having a normalized thickness of about 0.1 or smaller and a SiO₂ film having a normalized thickness of about 0.2 were formed on a LiTaO₃ substrate having Euler angles (0°, Θ, 0°)
Figure 53:
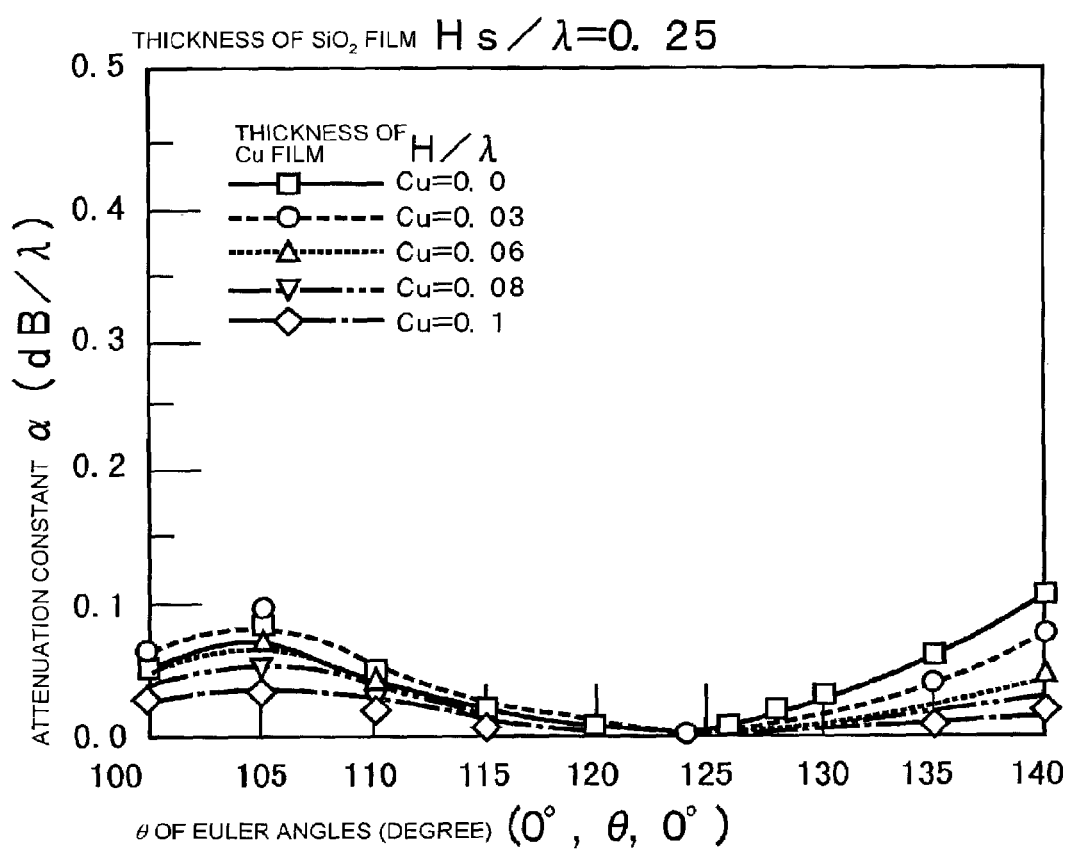
FIG. 53 illustrates a change in the attenuation constant α when Cu films having a normalized thickness of about 0.1 or smaller and a SiO₂ film having a normalized thickness of about 0.25 were formed on a LiTaO₃ substrate having Euler angles (0°, Θ, 0°)
Figure 54:
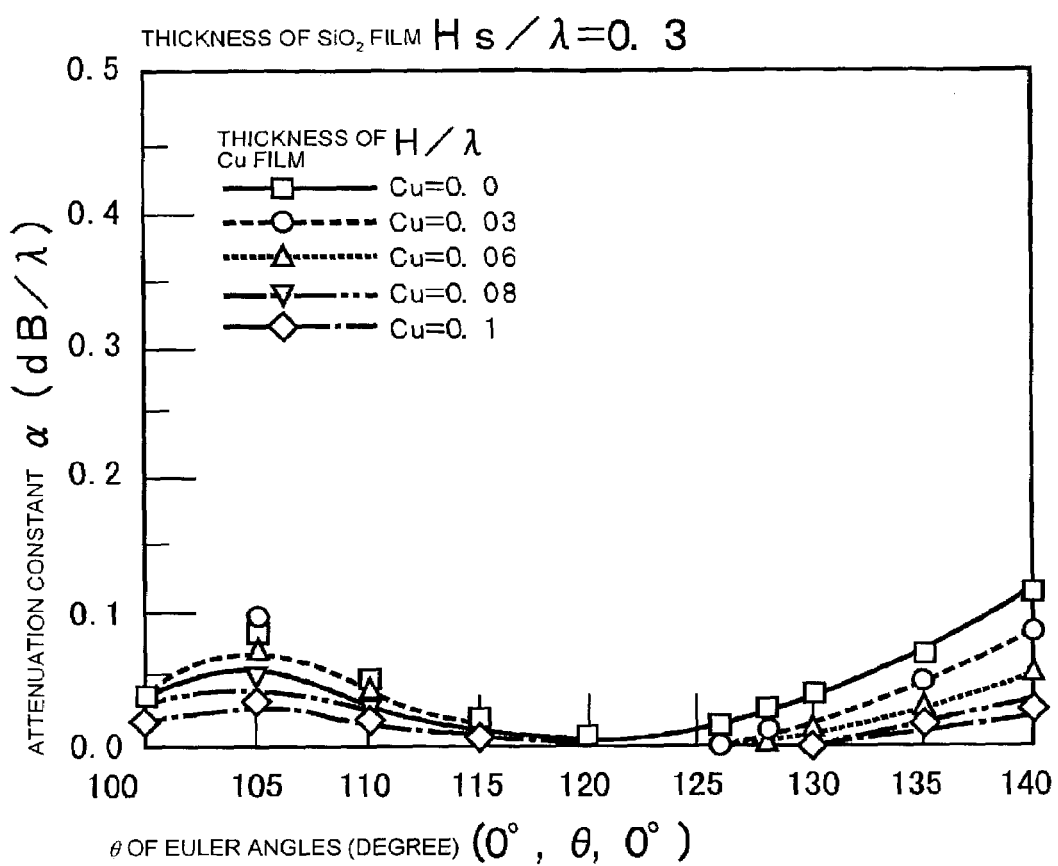
FIG. 54 illustrates a change in the attenuation constant α when Cu films having a normalized thickness of about 0.1 or smaller and a SiO₂ film having a normalized thickness of about 0.3 were formed on a LiTaO₃ substrate having Euler angles (0°, Θ, 0°)
Figure 55:
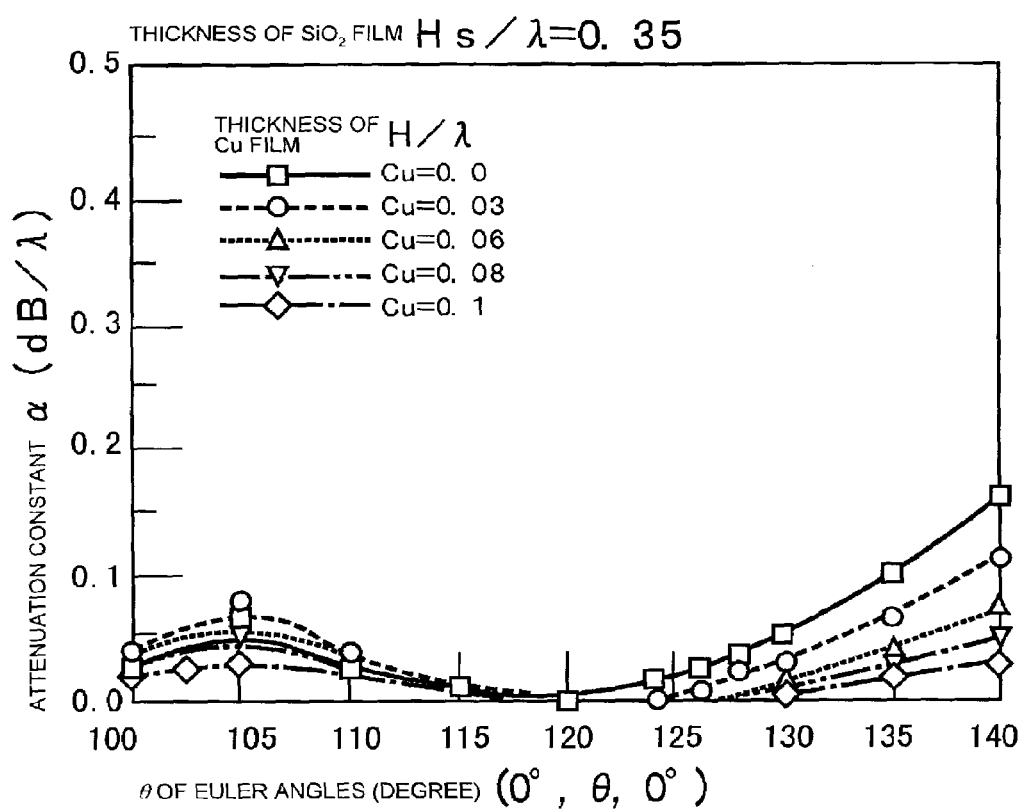
FIG. 55 illustrates a change in the attenuation constant α when Cu films having a normalized thickness of about 0.1 or smaller and a SiO2 film having a normalized thickness of about 0.35 were formed on a LiTaO₃ LiTaO₃ substrate having Euler angles (0°, Θ, 0°)
Figure 56:
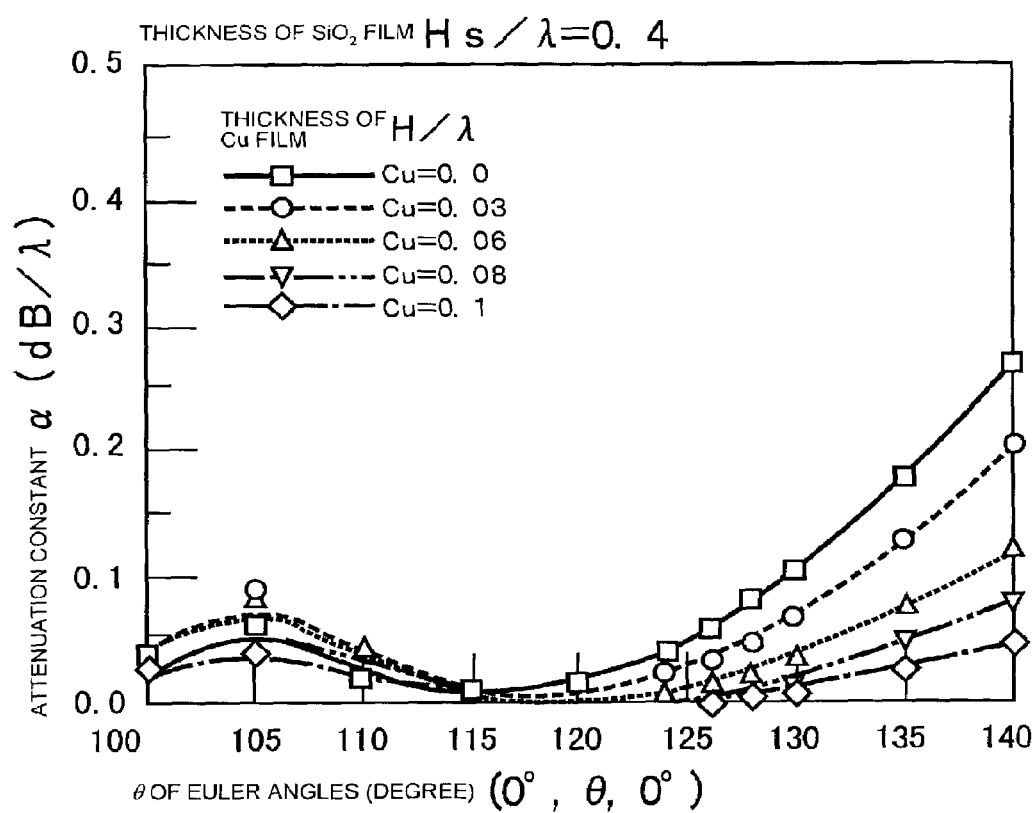
FIG. 56 illustrates a change in the attenuation constant α when Cu films having a normalized thickness of about 0.1 or smaller and a SiO₂ film having a normalized thickness of about 0.4 were formed on a LiTaO₃ substrate having Euler angles (0°, Θ, 0°)
Figure 57:
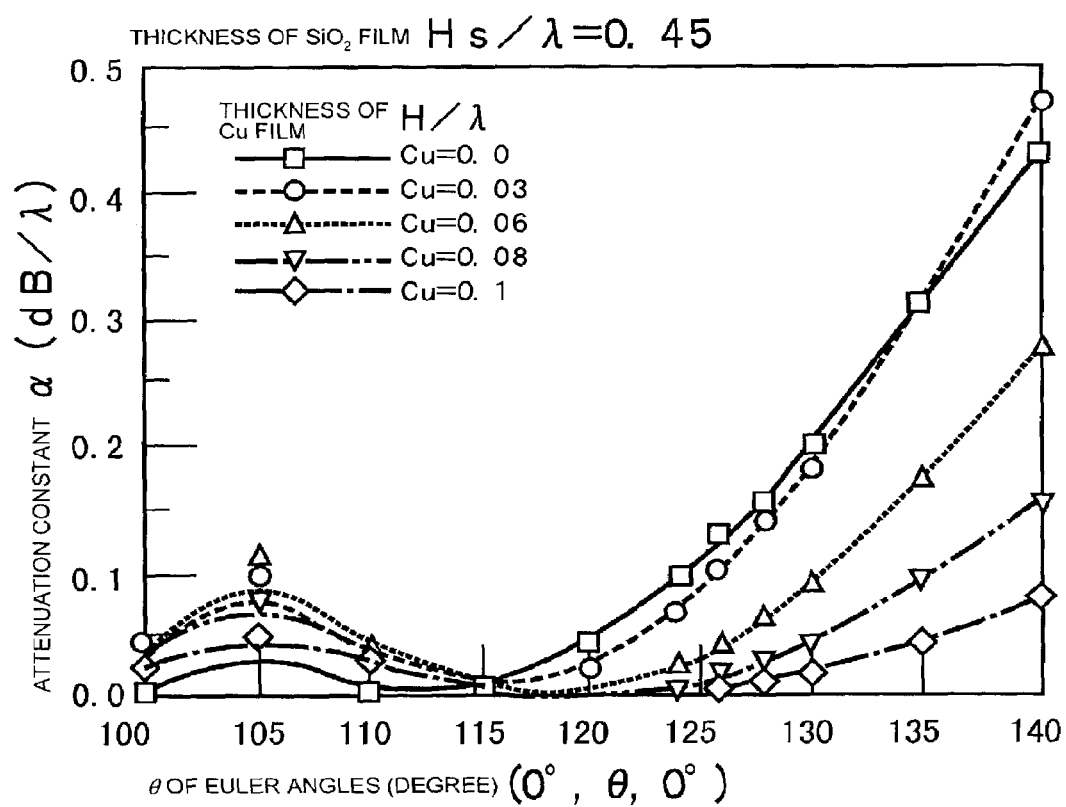
FIG. 57 illustrates a change in the attenuation constant α when Cu films having a normalized thickness of about 0.1 or smaller and a SiO₂ film having a normalized thickness of about 0.45 were formed on a LiTaO3 substrate having Euler angles (0°, Θ, 0°)

FIG. 49 illustrates a change in the attenuation constant α when Cu electrodes having a normalized thickness of H/λ of 0 to about 0.10 and SiO2 films having a normalized thickness Hs/λ of 0 to about 0.5 were formed on a LiTaO$_3$ substrate having Euler angles (0°, 135°, 0°). As is seen from FIG. 49, when Θ is 135°, the attenuation constant α becomes larger as the normalized thickness of the Cu film decreases and the normalized thickness of the SiO$_2$ film increases.

Accordingly, in order to achieve an improved TCF, a large electromechanical coupling coefficient, and a small attenuation constant, it is necessary to suitably combine the cut angles of a LiTaO$_3$ substrate, the thickness of a SiO$_2$ film, and the thickness of a Cu electrode.

FIGS. 50 through 57 illustrate the relationship between the attenuation constant α and Θ of the Euler angles when the Cu films having a normalized thickness H/λ of about 0.1 or smaller were formed on a LiTaO$_3$ substrate and when the normalized thickness Hs/λ of the SiO$_2$ SiO$_2$ film was changed to about 0.1, 0.15, 0.2, 0.25, 0.3, 0.35, 0.4, and 0.45, respectively.

As is seen from FIGS. 50 through 57, by setting the thickness H/λ of the Cu film to be about 0.01 to about 0.08 and by selecting any of the following combinations of the SiO₂ SiO₂ film and Θ of the Euler angles shown in the center column of Table 6, it is possible to implement an improved TCF (±20 ppm/° C.), a large electromechanical coupling coefficient, and a small attenuation constant α. More preferable, Euler angles shown on the right side of Table 6 are selected. In which case, superior characteristics are obtained.

TABLE 6

Ag thickness H/λ: about 0.02 to about 0.06

| SiO₂ thickness Hs/λ | Euler angles of LiTaO₃ (°) | More preferable Euler angles (°) |
|---|---|---|
| 0.15-0.18 | 0 ± 3, 117-137, 0 ± 3 | 0 ± 3, 120-135, 0 ± 3 |
| 0.18-0.23 | 0 ± 3, 117-136, 0 ± 3 | 0 ± 3, 118-133, 0 ± 3 |
| 0.23-0.28 | 0 ± 3, 115-135, 0 ± 3 | 0 ± 3, 117-133, 0 ± 3 |
| 0.28-0.33 | 0 ± 3, 113-133, 0 ± 3 | 0 ± 3, 115-132, 0 ± 3 |
| 0.33-0.38 | 0 ± 3, 113-135, 0 ± 3 | 0 ± 3, 115-133, 0 ± 3 |
| 0.38-0.40 | 0 ± 3, 113-132, 0 ± 3 | 0 ± 3, 115-130, 0 ± 3 |

As can be inferred from the electromechanical coupling coefficient $K_{SAW}$ when the Au electrode was used shown in FIG. 25, the electromechanical coupling coefficient $K_{SAW}$ is considerably increased when Θ of the Euler angle is about 125° or smaller. Accordingly, it is more preferable that the combinations of the normalized thickness Hs/λ of the SiO₂ film and the Euler angles shown in Table 7 are selected.

TABLE 7

| SiO₂ thickness Hs/λ | Euler angles of LiTaO₃ (°) |
|---|---|
| 0.15-0.18 | 0 ± 3, 117-125, 0 ± 3 |
| 0.18-0.23 | 0 ± 3, 117-125, 0 ± 3 |
| 0.23-0.28 | 0 ± 3, 115-125, 0 ± 3 |
| 0.28-0.33 | 0 ± 3, 113-125, 0 ± 3 |
| 0.33-0.38 | 0 ± 3, 113-125, 0 ± 3 |
| 0.38-0.40 | 0 ± 3, 113-125, 0 ± 3 |

The Euler angle Θmin that reduces the attenuation constant α to substantially 0 or minimizes the attenuation constant α with respect to the normalized thickness Hs/λ of the SiO₂ film and the normalized thickness H/λ of the Cu film was determined from the results of FIGS. 48 through 56. Such an Euler angle Θmin is shown in FIG. 59.

Figure 59:
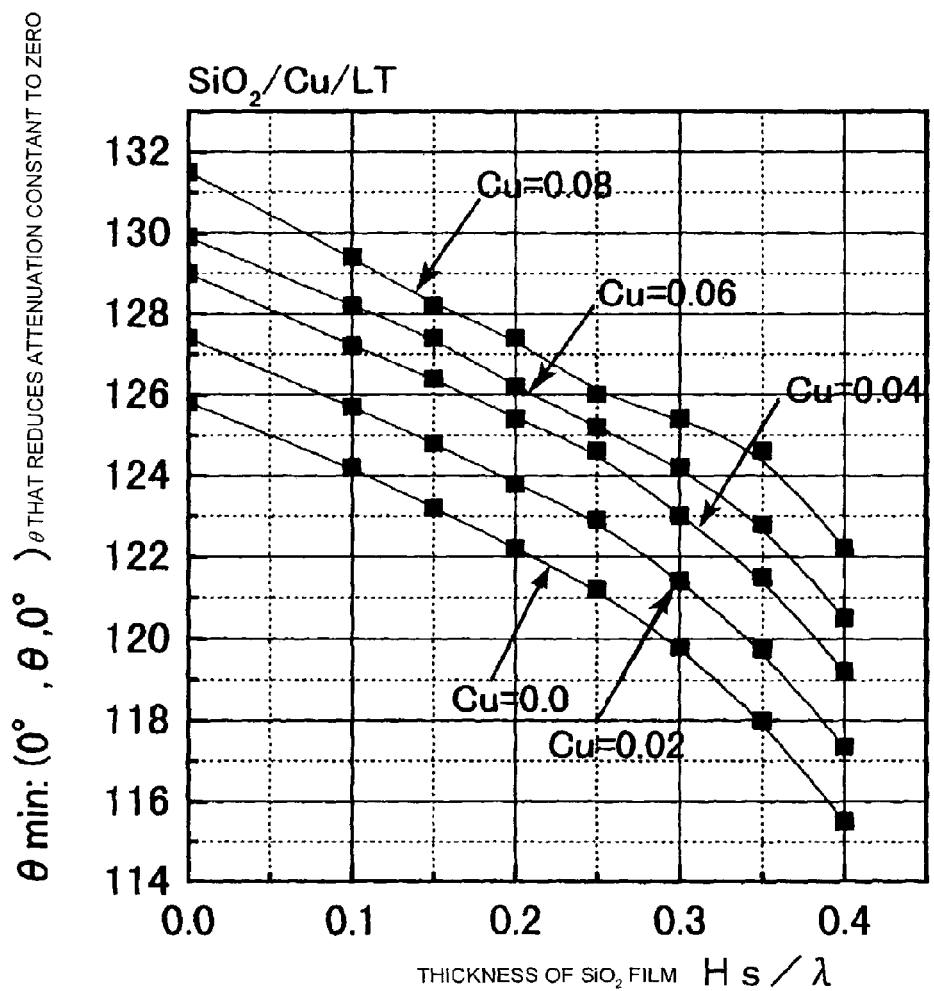
FIG. 59 illustrates the relationship between Θmin that reduces the attenuation constant α to 0 or minimizes the attenuation constant α and the normalized thickness of a SiO₂ film when the normalized thickness of a Cu film was changed.

By approximating the curves shown in FIG. 59 with a cubic polynomial when the normalized thickness H/λ of the Cu film is approximately 0, 0.02, 0.04, 0.06, and 0.08, the following equations A through E were found:

(a) When 0<H/λ≦0.01

$$\Theta_{min} = -139.713 \times Hs^3 + 43.07132 \times Hs^2 - 20.568011 \times Hs + 125.8314 \quad A$$

(b) When 0.01<H/λ≦0.03

$$\Theta_{min} = -139.660 \times Hs^3 + 46.02985 \times Hs^2 - 21.141500 \times Hs + 127.4181 \quad B$$

(c) When 0.03<H/λ≦0.05

$$\Theta_{min} = -139.607 \times Hs^3 + 48.98838 \times Hs^2 - 21.714900 \times Hs + 129.0048 \quad C$$

(d) When 0.05<H/λ≦0.07

$$\Theta_{min} = -112.068 \times Hs^3 + 39.60355 \times Hs^2 - 21.186000 \times Hs + 129.9397 \quad D$$

(e) When 0.07<H/λ≦0.09

$$\Theta_{min} = -126.954 \times Hs^3 + 67.40488 \times Hs^2 - 29.432000 \times Hs + 131.5686 \quad E$$

Accordingly, it is preferable that Θ of the Euler angles (0±3°, Θ, 0±3°) is Θmin determined by the above-described equations A through E. However, when Θmin−2°<Θ≦Θmin+2°, the attenuation constant can be effectively decreased.

In preferred embodiments of the present invention, the IDT may be made of only Cu. Alternatively, the IDT may be made of a Cu alloy or a laminated electrode of Cu and another metal, as long as such an alloy or a laminated electrode primarily comprises Cu. More specifically, the IDT primarily including Cu preferably satisfies the following condition when the average density of the electrode is indicated by ρ (average):

$$\rho(Cu) \times 0.7 \leq \rho(average) \leq \rho(Cu) \times 1.3,$$

i.e., 6.25 g/cm³≦ρ(average)≦11.6 g/cm³.

An upper layer or an underlying layer made of a metal having a density higher than Al, such as W, Ta, Au, Pt, Ag, or Cr, may be laminated on the Cu electrode so that ρ (average) satisfies the above-described condition. In this case, advantages similar to those obtained by a single Cu layer can be achieved.

Θ of the Euler angles may sometimes deviate from the desired angle by about −2° to about +4°. This deviation is caused by the fact that calculations were made in this preferred embodiment assuming that a metallic film was formed on the entire surface of the substrate, and there may be some errors within the above range in actual SAW apparatuses.

When manufacturing SAW apparatuses, there is a variation of about 0±3° in φ and ψ of the Euler angles. However, substantially the same characteristic as that when φ and ψ are 0° can be obtained.

A SAW apparatus of a fifth preferred embodiment of the present invention is described below. The SAW apparatus of the fifth preferred embodiment of the present invention is similar to the SAW apparatus 21 of the second preferred embodiment of the present invention shown in FIG. 15, except that the IDTs 23a and 23b and the reflectors 24a and 24b are made of tungsten (W). The normalized thickness H/λ of the IDTs is about 0.0025 to about 0.06.

As the piezoelectric substrate 22, a 22°-48°-rotated Y-plate X-propagating LiTaO₃ substrate having Euler angles (0°, 112°-138°, 0°) was used.

In the fifth preferred embodiment of the present invention, because the 22°-48°-rotated Y-plate X-propagating LiTaO₃ substrate 22, the IDTs 23a and 23b made of tungsten having a thickness H/λ of about 0.0025 to about 0.06, and the SiO₂ film 25 having a thickness Hs/λ of about 0.10 to about 0.40 were used, it is possible to provide a SAW apparatus that has an improved TCF, a large electromechanical coupling coefficient KSAW, and a small propagation loss. The fifth preferred embodiment of the present invention is described in detail below by way of a specific example.

Figure 60:
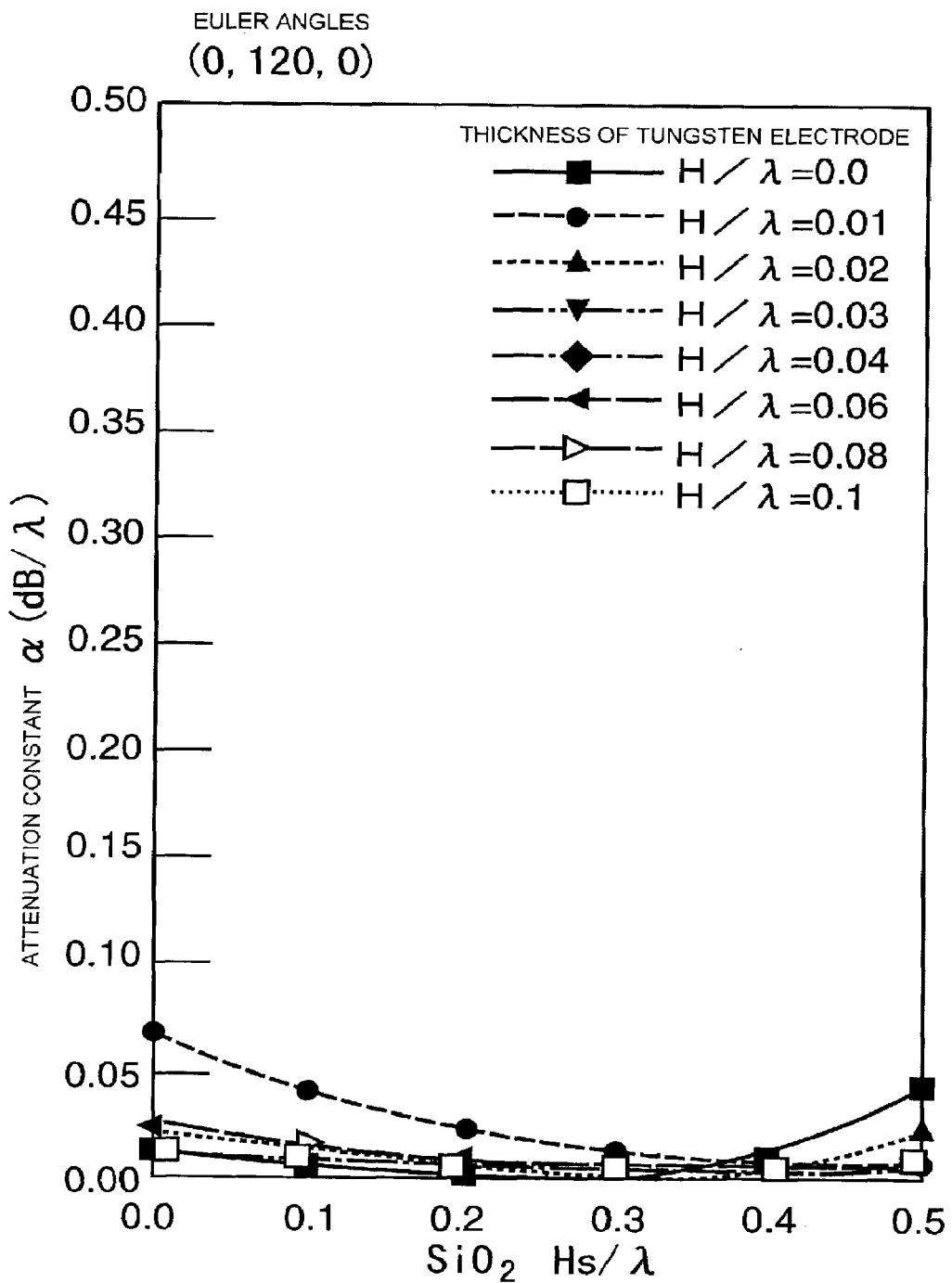
FIG. 60 illustrates a change in the attenuation constant α when SiO₂ films having various thickness values and tungsten IDTs having various thickness values were formed on a LiTaO₃ substrate (0°, 120°, 0°) according to a fifth preferred embodiment of the present invention.
Figure 61:
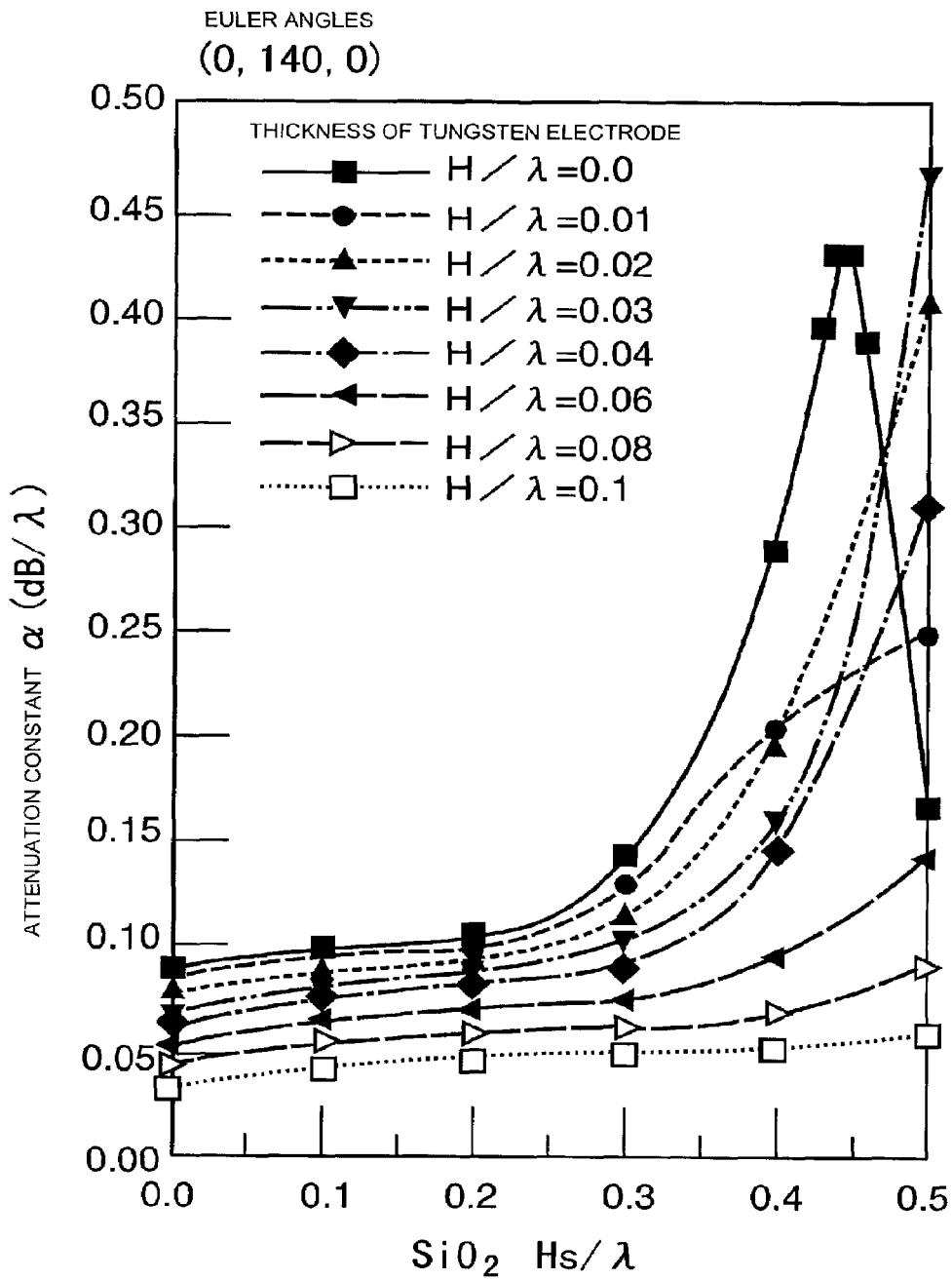
FIG. 61 illustrates a change in the attenuation constant α when SiO₂ films having various thickness values and tungsten IDTs having various thickness values were formed on a LiTaO₃ substrate (0°, 140°, 0°)
Figure 62:
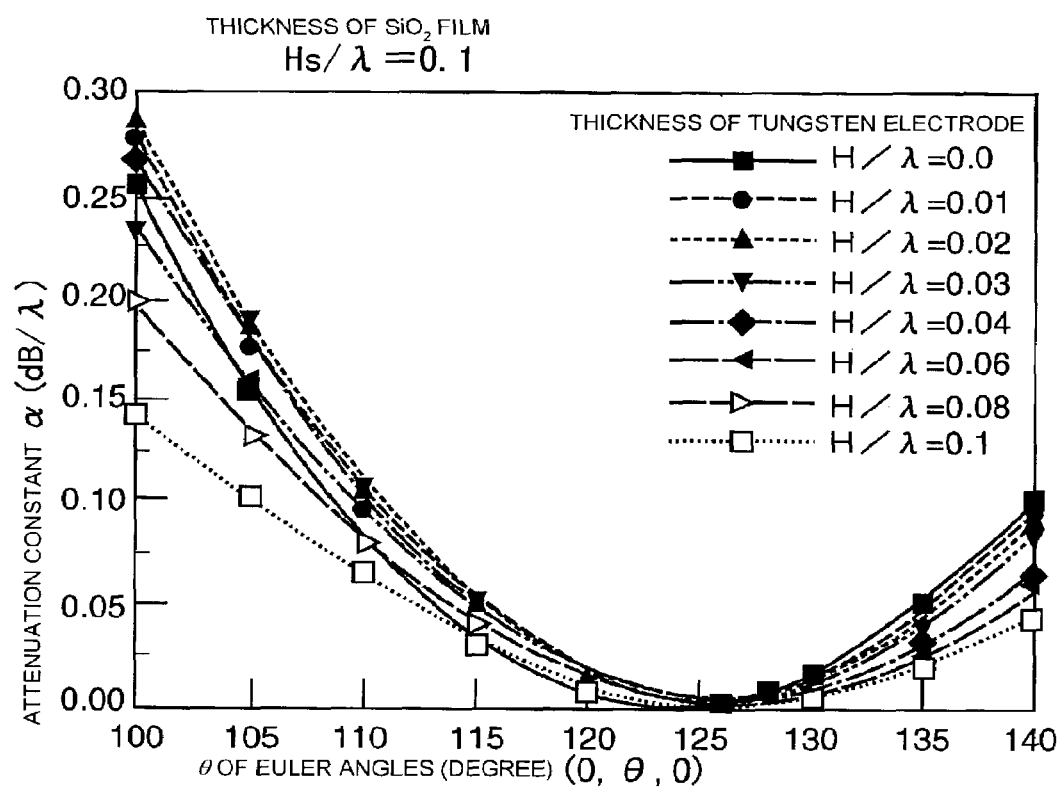
FIG. 62 illustrates the relationship of the attenuation constant α to Θ and the thickness of tungsten electrodes when the tungsten electrodes having various thickness values and a SiO₂ film having a normalized thickness of about 0.1 were formed on a LiTaO₃ substrate having Euler angles (0°, Θ, 0°)
Figure 63:
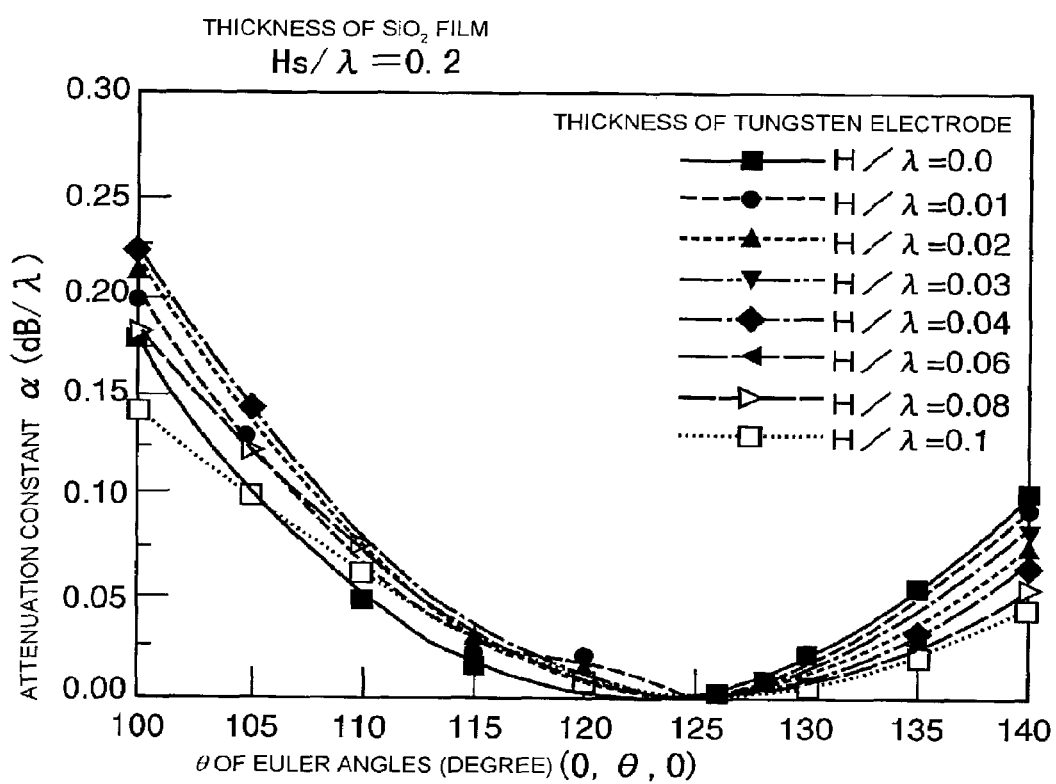
FIG. 63 illustrates the relationship of the attenuation constant α to Θ and the thickness of tungsten electrodes when the tungsten electrodes having various thickness values and a SiO₂ film having a normalized thickness of about 0.2 were formed on a LiTaO₃ substrate having Euler angles (0°, Θ, 0°)
Figure 64:
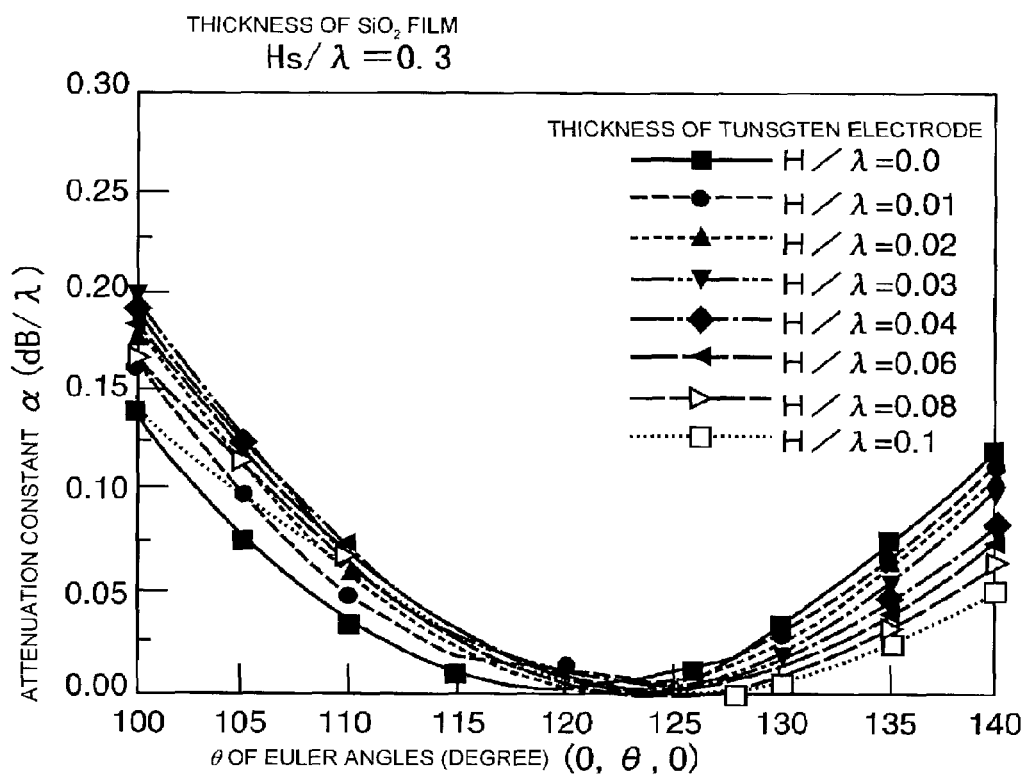
FIG. 64 illustrates the relationship of the attenuation constant α to Θ and the thickness of tungsten electrodes when the tungsten electrodes having various thickness values and a SiO₂ film having a normalized thickness of about 0.3 were formed on a LiTaO₃ substrate having Euler angles (0°, Θ, 0°)
Figure 65:
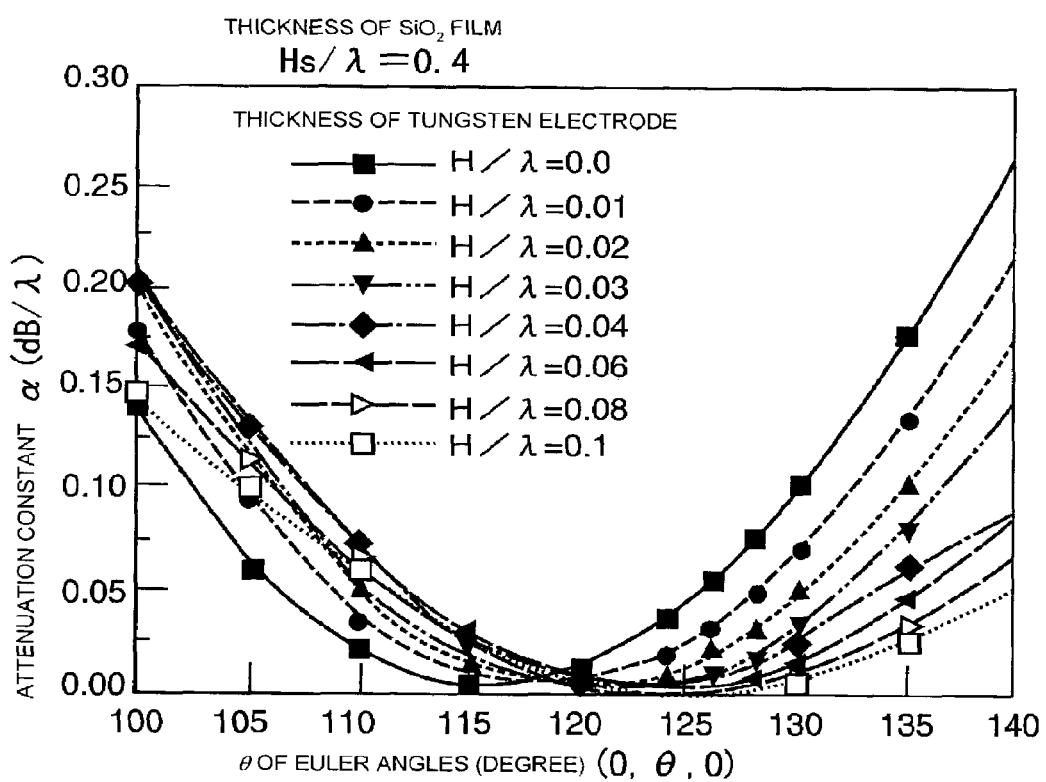
FIG. 65 illustrates the relationship of the attenuation constant α to Θ and the thickness of tungsten electrodes when the tungsten electrodes having various thickness values and a SiO₂ film having a normalized thickness of about 0.4 were formed on a LiTaO₃ substrate having Euler angles (0°, Θ, 0°)

FIGS. 60 and 61 illustrate a change in the attenuation constant α when tungsten IDTs having different thickness values and SiO₂ films having different thickness values were formed on a LiTaO₃ substrate having Euler angles (0°, 120°, 0°) and a LiTaO₃ substrate having Euler angles (0°, 140°, 0°), respectively.

As is seen from FIG. 60, when Θ is 120°, the attenuation constant α is small when the thickness Hs/λ of the SiO₂ film is about 0.1 to about 0.4 and the thickness H/λ of the tungsten electrode is about 0.0 to about 0.10. As is seen from FIG. 61, when Θ is 140°, the attenuation constant α increases as the thickness H/λ of the tungsten electrode changes from 0.0 to about 0.10, regardless of the thickness Hs/λ of the SiO$_2$ film.

In order to reduce the TCF to be between about −20 ppm/° C. and about +20 ppm/° C., to achieve a large electromechanical coupling coefficient, and to decrease the attenuation constant, the Euler angles of the LiTaO$_3$ substrate, the thickness of the SiO$_2$ film, and the thickness of the tungsten electrode, must be considered.

FIGS. 62 through 65 illustrate the relationship between the attenuation constant α and Θ of the Euler angles when the normalized thickness Hs/λ of the SiO$_2$ film and the normalized thickness H/λ of the tungsten electrode were changed.

As is seen from FIGS. 62 through 65, optimal combinations of the normalized thickness of the SiO$_2$ film and the Euler angle Θ, when the normalized thickness H/λ of the tungsten electrode is about 0.012 to about 0.053 and, more preferably, is about 0.015 to about 0.042, can be selected from the combinations shown in Table 8 and Table 9, respectively. Euler angle Θ shown in Table 8 and Table 9 may vary by about −2° to about +4° due to a variation in the electrode finger width of the tungsten electrode or a variation in the single crystal substrate. The thickness values which are not shown in FIGS. 62 through 65 are determined by the proportional distribution.

TABLE 8

Tungston thickness H/λ: about 0.012 to about 0.053

| SiO$_2$ thickness Hs/λ | Euler angles of LiTaO$_3$ (°) | More preferable Euler angles (°) |
| --- | --- | --- |
| 0.10-0.15 | 0 ± 3, 114.2-138.0, 0 ± 3 | 0 ± 3, 117.7-134.0, 0 ± 3 |
| 0.15-0.20 | 0 ± 3, 113.0-137.8, 0 ± 3 | 0 ± 3, 117.0-133.5, 0 ± 3 |
| 0.20-0.30 | 0 ± 3, 113.0-137.5, 0 ± 3 | 0 ± 3, 116.5-133.0, 0 ± 3 |
| 0.30-0.35 | 0 ± 3, 112.7-137.0, 0 ± 3 | 0 ± 3, 116.5-133.0, 0 ± 3 |
| 0.35-0.40 | 0 ± 3, 112.5-136.0, 0 ± 3 | 0 ± 3, 116.5-132.3, 0 ± 3 |

TABLE 9

Tungston thickness H/λ: about 0.015 to about 0.042

| SiO$_2$ thickness (Hs/λ) | Euler angles of LiTaO$_3$ (°) | More preferable Euler angles (°) |
| --- | --- | --- |
| 0.10-0.15 | 0 ± 3, 114.3-138.0, 0 ± 3 | 0 ± 3, 117.7-133.5, 0 ± 3 |
| 0.15-0.20 | 0 ± 3, 113.0-137.5, 0 ± 3 | 0 ± 3, 117.7-133.5, 0 ± 3 |
| 0.20-0.30 | 0 ± 3, 112.5-137.0, 0 ± 3 | 0 ± 3, 117.0-132.5, 0 ± 3 |
| 0.30-0.35 | 0 ± 3, 112.2-136.5, 0 ± 3 | 0 ± 3, 116.8-132.5, 0 ± 3 |
| 0.35-0.40 | 0 ± 3, 112.0-135.3, 0 ± 3 | 0 ± 3, 116.0-131.5, 0 ± 3 |

When the normalized thickness H/λ of the tungsten electrode is about 0.012 to about 0.053, as indicated in Table 8, the normalized thickness Hs/λ of the SiO$_2$ SiO$_2$ film is preferably about 0.1 to about 0.4 in order to set the range of the TCF to be between about −20 ppm/° C. and about +20 ppm/° C. In this case, Euler angle Θ of the LiTaO$_3$ substrate is preferably between about 112° and about 138° (corresponding to the rotation angle of about 20° to about 50°), More preferably, the Euler angles indicated on the right side of Table 8 are selected.

Similarly, when the normalized thickness H/λ of the tungsten electrode is about 0.015 to about 0.042, as indicated in Table 9, the normalized thickness Hs/λ of the SiO$_2$ film is preferably about 0.1 to about 0.4 in order to set the range of the TCF to be between about − and about +20 ppm/° C. In this case, Θ of the Euler angles of the LiTaO$_3$ substrate is preferably between about 112° and about 138°. More preferably, the Euler angles indicated on the right side of Table 9 are selected.

The Euler angles of LiTaO$_3$ shown in Table 8 and Table 9 were selected so that the attenuation constant becomes about 0.05 or lower. The more preferable Euler angles shown in Table 8 and Table 9 were selected so that the attenuation constant becomes about 0.025 or lower. The relationships between the Hs/λ of the SiO$_2$ film and the Euler angles shown in Table 8 and Table 9 when the thickness H/λ of the tungsten electrode is approximately 0.012, 0.015, 0.042, and 0.053 were determined in terms of the thickness H/λ of the tungsten electrode shown in FIGS. 62 through 65.

Figure 66:
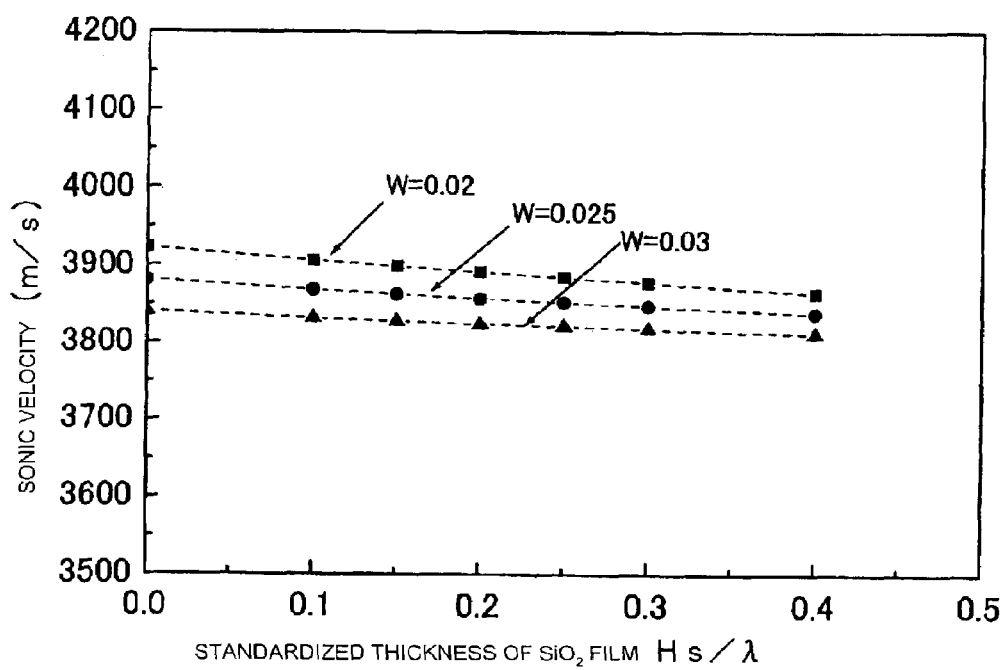
FIG. 66 illustrates the relationship between the acoustic velocity and the normalized thickness of SiO2 films when tungsten films having various thickness values and the SiO$_2$ films are formed on a LiTaO$_3$ substrate having Euler angles (0°, 126°, 0°)
Figure 67:
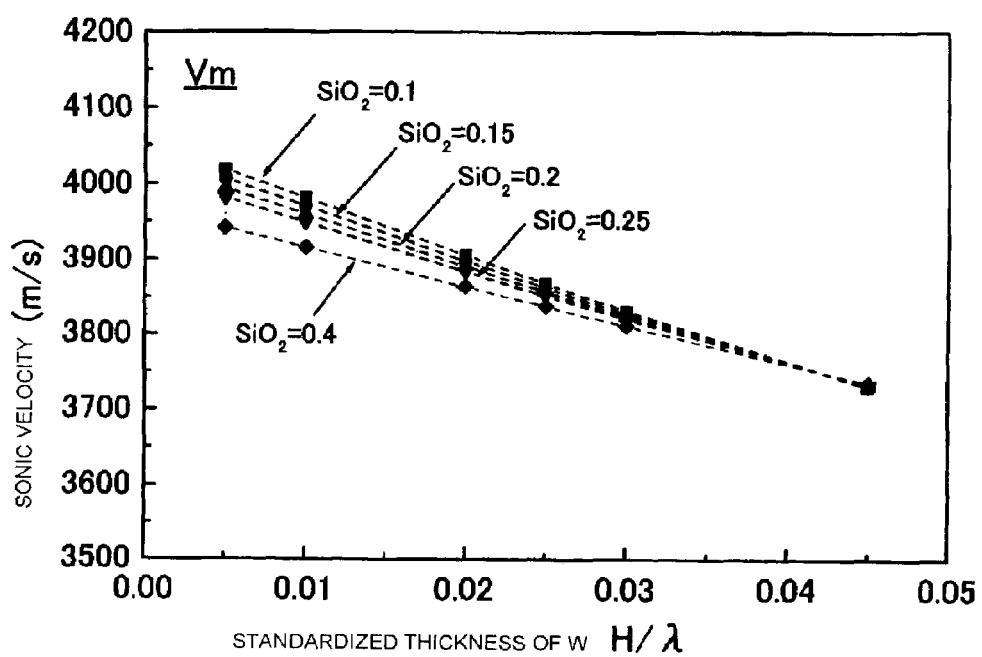
FIG. 67 illustrates the relationship between the acoustic velocity and the normalized thickness of tungsten films when the tungsten films and SiO$_2$ films having various thickness values were formed on a LiTaO$_3$ substrate having Euler angles (0°, 126°, 0°)

When manufacturing the SAW apparatus of this preferred embodiment, it is preferable that an IDT primarily including tungsten is formed on a rotated Y-plate X-propagating LiTaO$_3$ substrate. Then, the frequency is adjusted. Then, a SiO$_2$ film having a thickness that can reduce the attenuation constant α is formed. This is explained below with reference to FIGS. 66 and 67. Tungsten IDTs having different thickness values and SiO$_2$ films having different thickness values were formed on a rotated Y-plate X-propagating LiTaO$_3$ substrate (Euler angles (0°, 126°, 0°)). FIG. 66 illustrates a change in the acoustic velocity of a leaky SAW with respect to the thickness of the SiO$_2$ film. FIG. 67 illustrates a change in the acoustic velocity of a leaky SAW with respect to the thickness of the tungsten electrode. FIGS. 66 and 67 show that a change in the acoustic velocity of the SAW is much larger when the thickness of the tungsten IDT is varied than when the thickness of the SiO$_2$ film is varied. Accordingly, it is desirable that the frequency is adjusted before the formation of the SiO$_2$ film. It is desirable that the frequency is adjusted after a tungsten IDT is formed by laser etching or ion etching.

In this preferred embodiment, a 22°-48°-rotated Y-plate X-propagating LiTaO$_3$ substrate having Euler angles (0°, 112°-138°, 0°), a tungsten IDT having a thickness H/λ of about 0.0025 to about 0.06, and a SiO$_2$ film having a thickness Hs/λ of about 0.10 to about 0.40 are used. The number and the structure of IDTs are not particularly restricted. That is, the present invention can be applied to, not only the SAW apparatus shown in FIG. 15, but also various types of SAW resonators and SAW filters as long as the above-described conditions are satisfied.

Euler angles Θ may sometimes deviate from the desired angle by about −2° to about +4°. This deviation is caused by the fact that calculations were made in this embodiment assuming that a metallic film was formed on the entire surface of the substrate, and there may be some errors within the above range in actual SAW apparatuses.

When manufacturing SAW apparatuses, although φ and ψ of the Euler angles deviate from 0° by ±3°, substantially the same characteristic as that when φ and ψ are 0° can be obtained.

A SAW apparatus of a sixth preferred embodiment of the present invention is described below. The SAW apparatus of the sixth preferred embodiment of the present invention is similar to the SAW apparatus 21 of the second preferred embodiment of the present invention shown in FIG. 15. However, as the piezoelectric substrate 22, a 14°-58°-rotated Y-plate X-propagating LiTaO$_3$ substrate having Euler angles (0°, 104°-148°, 0°) was used, and IDTs made of tantalum (Ta) having the thickness H/λ of about 0.004 to about 0.055 were used.

In the sixth preferred embodiment, because a 14°-58°-rotated Y-plate X-propagating LiTaO$_3$ substrate 22 having Euler angles (0°, 104°-148°, 0°), IDTs 23a and 23b made of tantalum having a thickness H/λ of about 0.004 to about 0.055, and a SiO$_2$ film 25 having a thickness Hs/λ of about 0.10 to about 0.40 were used, it is possible to provide a SAW apparatus that has an improved TCF, a large electromechanical coupling coefficient KSAW, and a small propagation loss. The sixth preferred embodiment of the present invention is described in detail below by way of a specific example.

Figure 68:
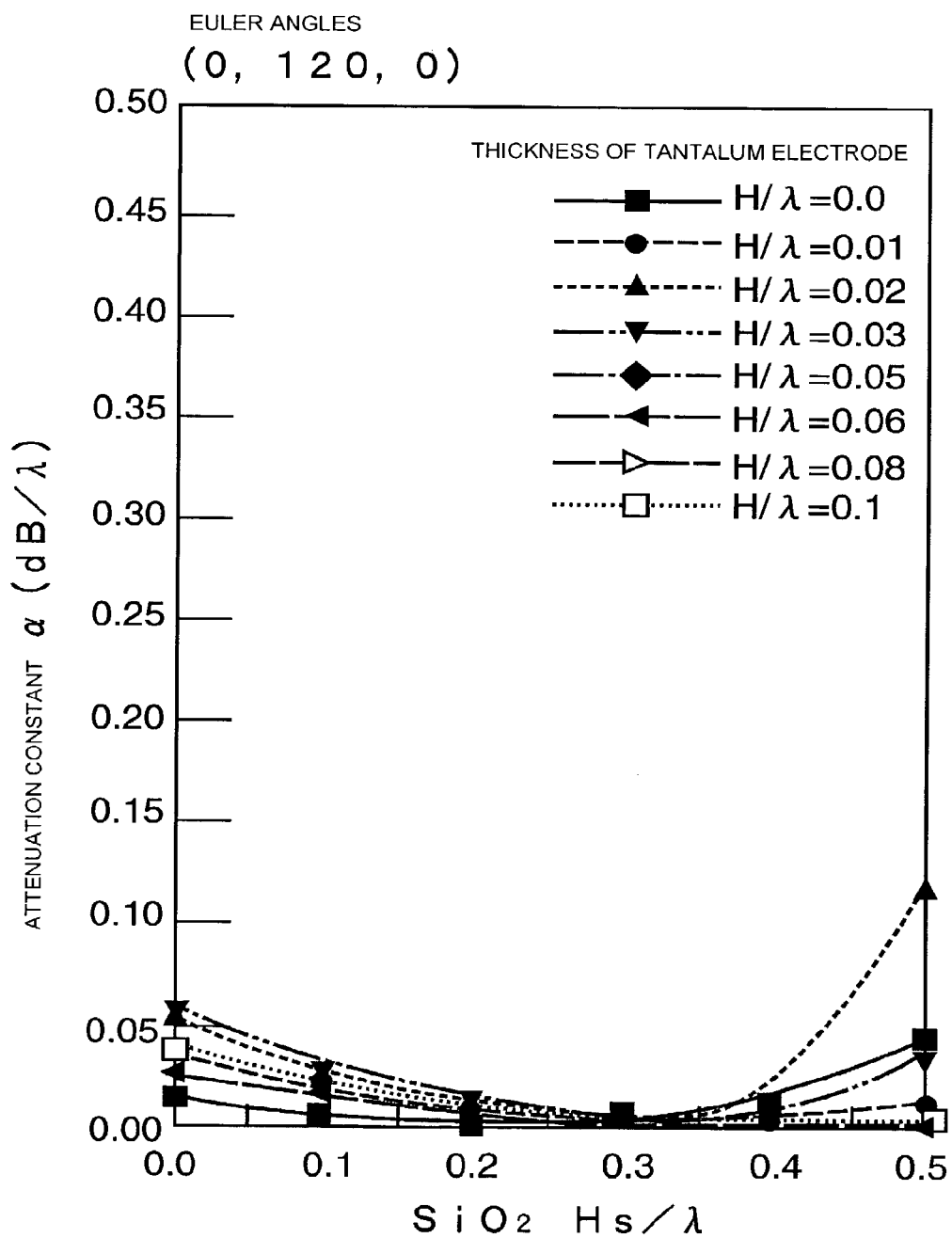
FIG. 68 illustrates a change in the attenuation constant α when tantalum IDTs having various thickness values and SiO$_2$ films having various thickness values were formed on a LiTaO$_3$ substrate having Euler angles (0°, 120°, 0°) according to a sixth preferred embodiment of the present invention.
Figure 69:
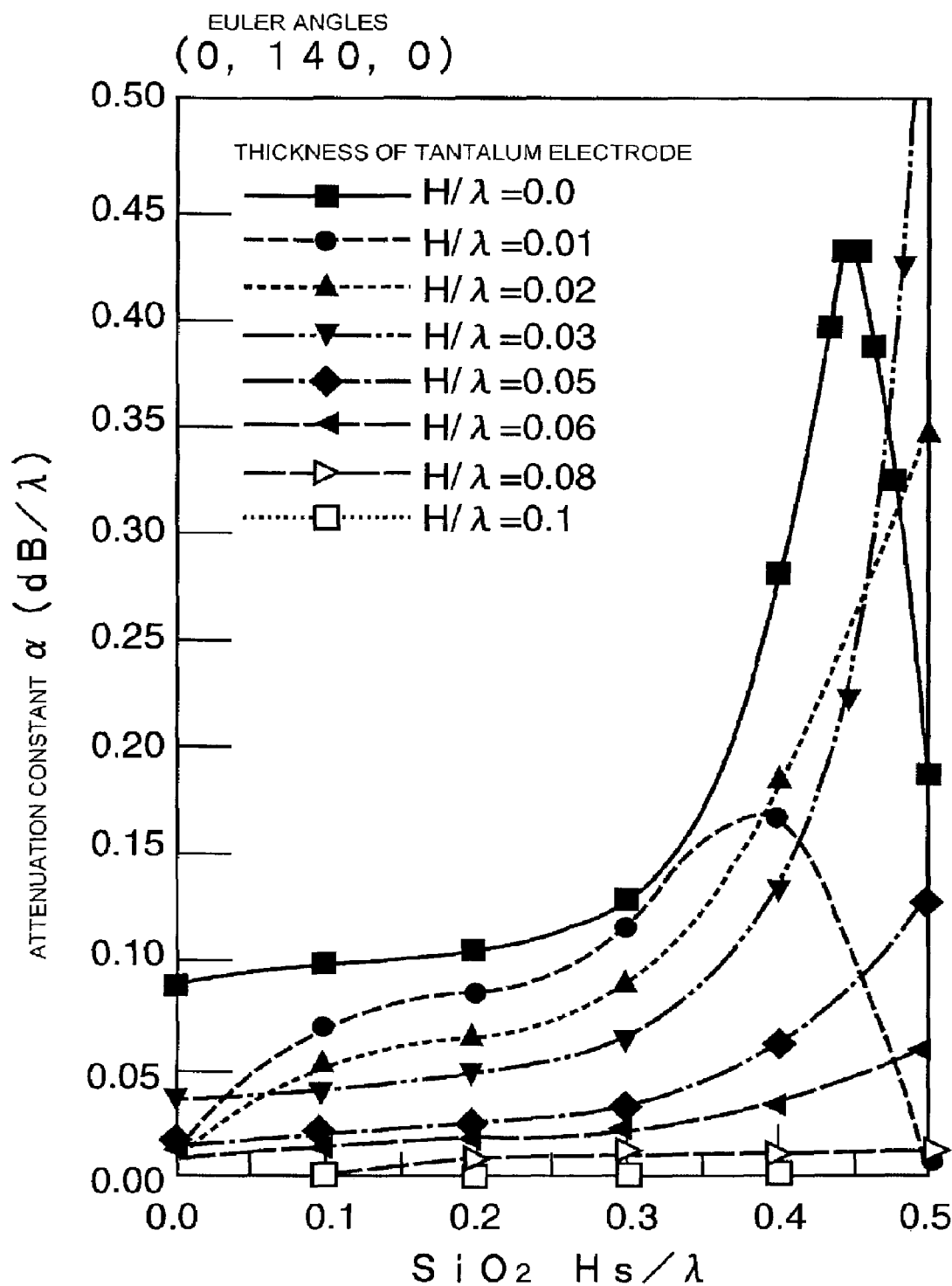
FIG. 69 illustrates a change in the attenuation constant α when tantalum IDTs having various thickness values and SiO$_2$ films having various thickness values were formed on a LiTaO$_3$ substrate having Euler angles (0°, 140°, 0°)

FIGS. 68 and 69 illustrate a change in the attenuation constant α when tantalum IDTs having different thickness values and SiO$_2$ films having different thickness values were formed on a LiTaO$_3$ substrate having Euler angles (0°, 120°, 0°) and a LiTaO$_3$ substrate having Euler angles (0°, 140°, 0°).

As is seen from FIG. 68, when Θ is 120°, the attenuation constant α is small when the thickness Hs/λ of the SiO$_2$ film is about 0.1 to about 0.4 and when the thickness H/λ of the tantalum electrode is about 0.0 to about 0.1. In contrast, as is seen from FIG. 69, when Θ is 140°, the attenuation constant α is large when the thickness H/λ of the tantalum electrode is about 0.0 to about 0.06 regardless of the thickness Hs/λ of the SiO$_2$ film.

In order to decrease the absolute value of the TCF, to achieve a large electromechanical coupling coefficient, and to decrease the attenuation constant, the Euler angles of the LiTaO$_3$ substrate, the thickness of the SiO$_2$ film, and the thickness of the tantalum electrode must be considered.

Figure 70:
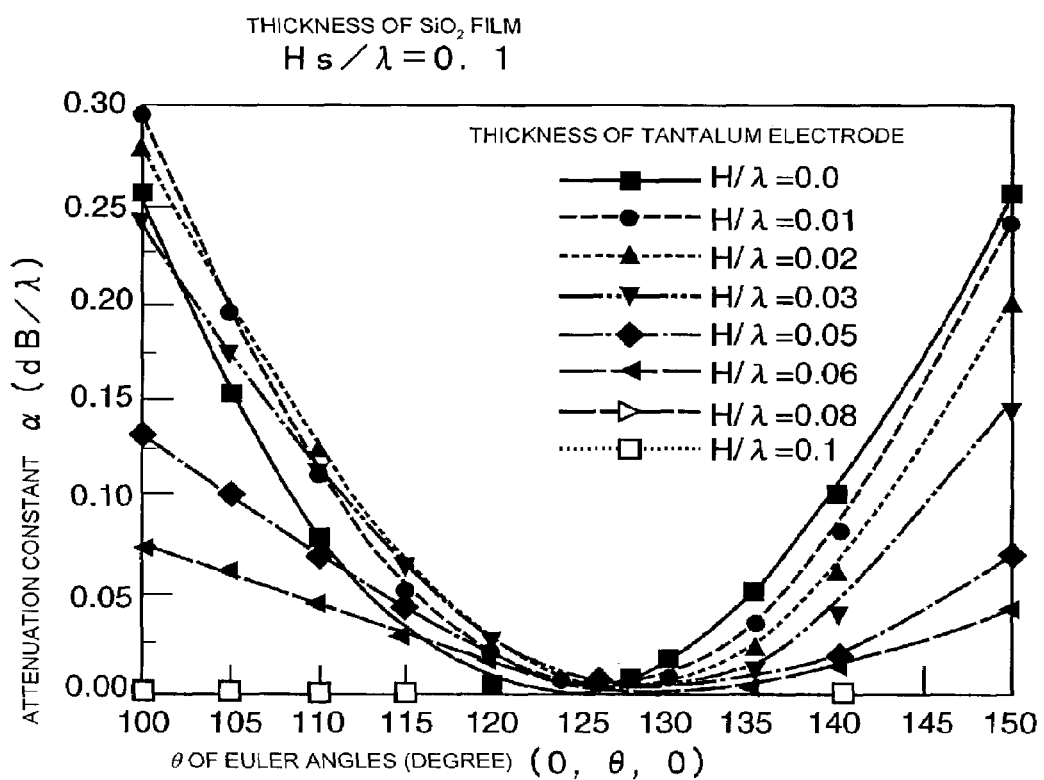
FIG. 70 illustrates the relationship between the attenuation constant α and Θ when tantalum electrode films having various thickness values and a SiO$_2$ film having a normalized thickness of about 0.1 were formed on a LiTaO$_3$ substrate having Euler angles (0°, Θ, 0°)
Figure 71:
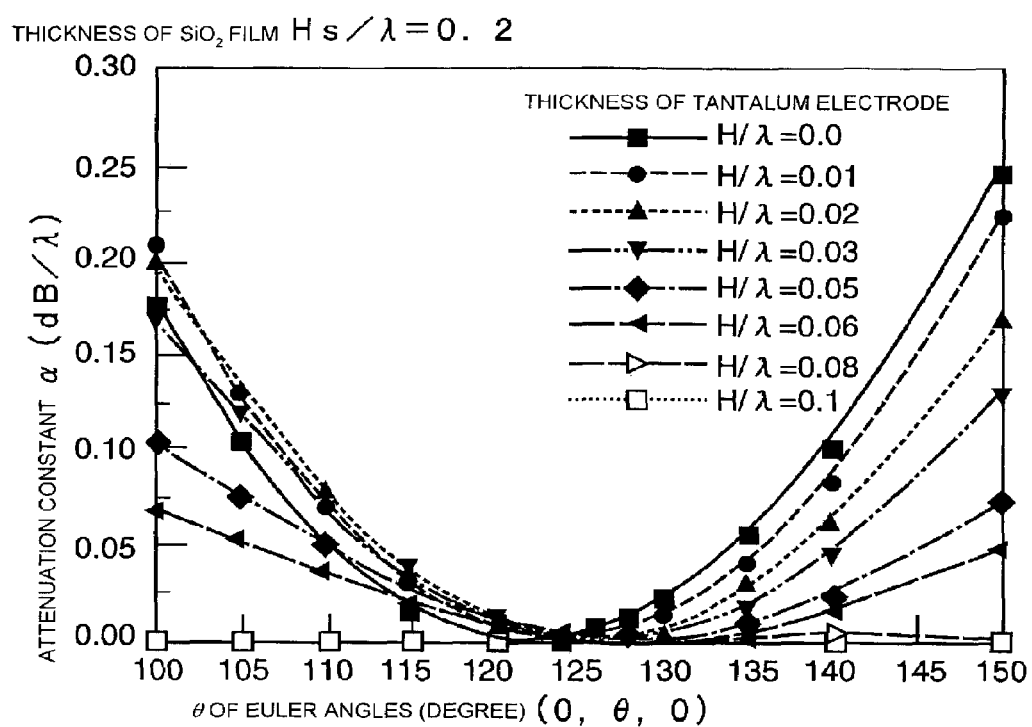
FIG. 71 illustrates the relationship between the attenuation constant α and Θ when tantalum electrode films having various thickness values and a SiO$_2$ film having a normalized thickness of about 0.2 were formed on a LiTaO$_3$ substrate having Euler angles (0°, Θ, 0°)
Figure 72:
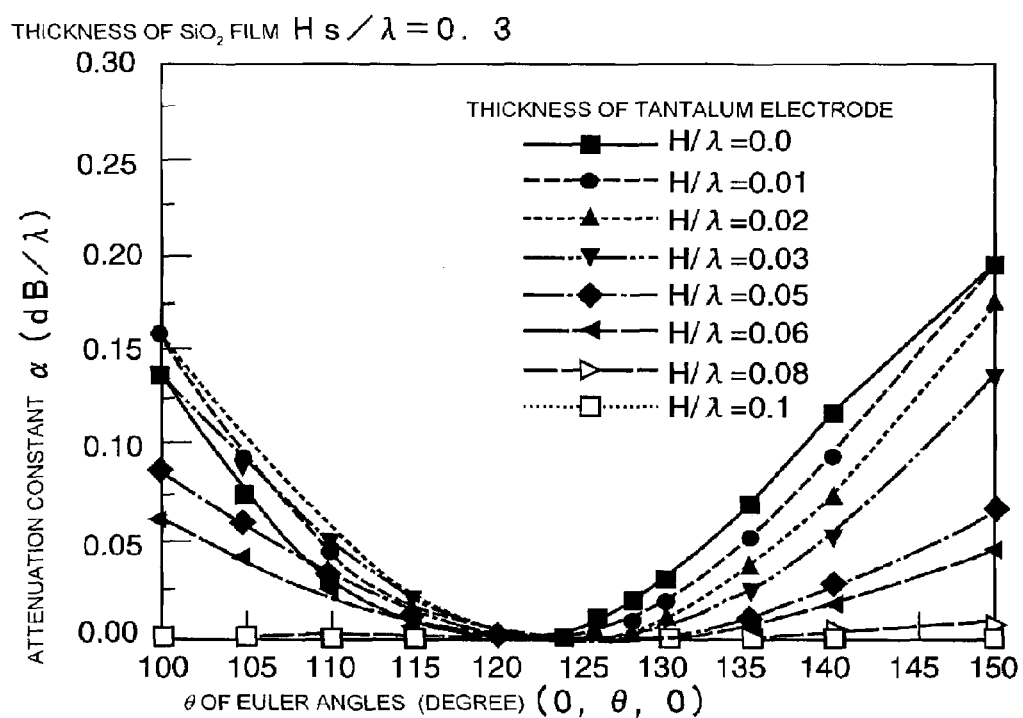
FIG. 72 illustrates the relationship between the attenuation constant α and Θ when tantalum electrode films having various thickness values and a SiO$_2$ film having a normalized thickness of about 0.3 were formed on a LiTaO$_3$ substrate having Euler angles (0°, Θ, 0°)
Figure 73:
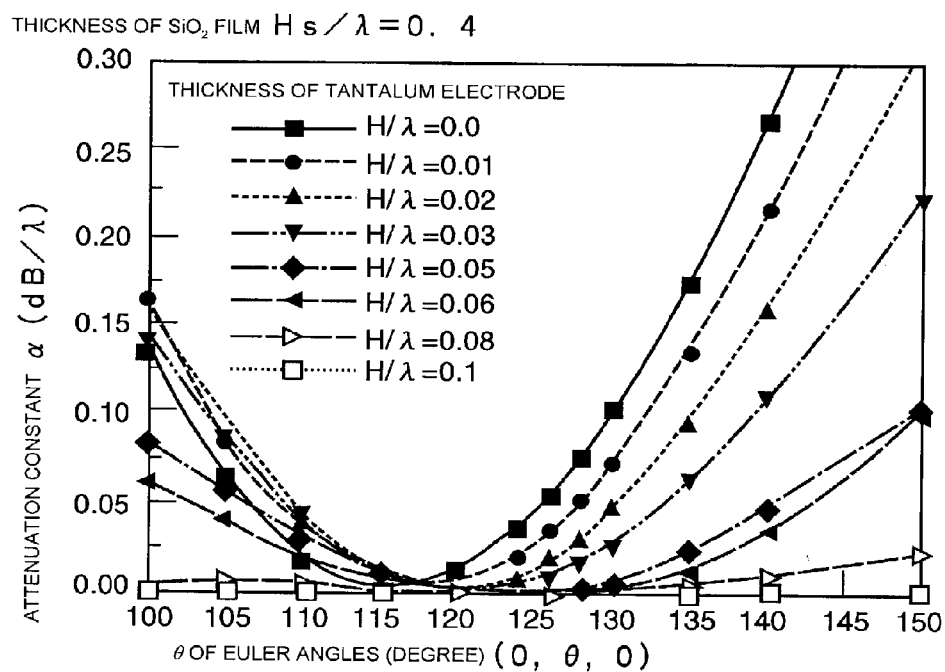
FIG. 73 illustrates the relationship between the attenuation constant α and Θ when tantalum electrode films having various thickness values and a SiO2 film having a normalized thickness of about 0.4 were formed on a LiTaO$_3$ substrate having Euler angles (0°, Θ, 0°)

FIGS. 70 and 73 illustrate relationships between the attenuation constant α and the Euler angle Θ when the normalized thickness Hs/λ of the SiO$_2$ film and the normalized thickness H/λ of the tantalum electrode were changed.

As is seen from FIGS. 70 through 73, optimal combinations of the normalized thickness Hs/λ of the SiO$_2$ film and the Euler angle Θ, when the thickness H/λ of the tantalum electrode is about 0.01 to about 0.055, more preferably between about 0.016 to about 0.045, can be selected from the combinations shown in Table 10 and Table 11, respectively. Euler angle Θ shown in Table 10 and Table 11 may vary by about −2° to about +4° because of a variation in the electrode finger width of the tantalum electrode or a variation in the single crystal substrate.

TABLE 10

Tantalum thickness H/λ: about 0.01 to about 0.055

| SiO$_2$ thickness Hs/λ | Euler angles of LiTaO$_3$ (°) | More preferable Euler angles (°) |
|---|---|---|
| 0.10-0.15 | 0 ± 3, 110.5-148.0, 0 ± 3 | 0 ± 3, 116.0-143.0, 0 ± 3 |
| 0.15-0.20 | 0 ± 3, 108.0-147.5, 0 ± 3 | 0 ± 3, 115.0-141.5, 0 ± 3 |
| 0.20-0.30 | 0 ± 3, 105.0-148.0, 0 ± 3 | 0 ± 3, 111.0-139.0, 0 ± 3 |
| 0.30-0.35 | 0 ± 3, 104.5-148.0, 0 ± 3 | 0 ± 3, 111.0-139.0, 0 ± 3 |
| 0.35-0.40 | 0 ± 3, 104.0-145.0, 0 ± 3 | 0 ± 3, 110.0-138.5, 0 ± 3 |

TABLE 11

Tantalum thickness H/λ: about 0.016 to about 0.045

| SiO$_2$ thickness (Hs/λ) | Euler angles of LiTaO$_3$ (°) | More preferable Euler angles (°) |
|---|---|---|
| 0.10-0.15 | 0 ± 3, 113.0-144.0, 0 ± 3 | 0 ± 3, 118.0-140.0, 0 ± 3 |
| 0.15-0.20 | 0 ± 3, 111.0-144.0, 0 ± 3 | 0 ± 3, 117.0-139.5, 0 ± 3 |
| 0.20-0.30 | 0 ± 3, 108.0-144.0, 0 ± 3 | 0 ± 3, 113.0-139.0, 0 ± 3 |
| 0.30-0.35 | 0 ± 3, 107.5-143.0, 0 ± 3 | 0 ± 3, 112.5-137.0, 0 ± 3 |
| 0.35-0.40 | 0 ± 3, 107.0-140.5, 0 ± 3 | 0 ± 3, 112.0-135.5, 0 ± 3 |

When the thickness H/λ of the tantalum electrode is about 0.01 to about 0.055, as indicated in Table 10, the thickness Hs/λ of the SiO$_2$ film is preferably about 0.1 to about 0.4 in order to set the range of the TCF to between about −20 ppm/°C. and about +20 ppm/°C. In this case, Euler angle Θ of the LiTaO$_3$ substrate are preferably between about 104° and about 148° (corresponding to the rotation angle of about 14° to about 58°), and more preferably, the Euler angles indicated on the right side of Table 10 are selected according to the thickness Hs/λ of the SiO$_2$ film.

Similarly, when the thickness H/λ of the tantalum electrode is about 0.016 to about 0.045, as indicated in Table 11, the thickness Hs/λ of the SiO$_2$ film is preferably about 0.1 to about 0.4 in order to improve the TCF. In this case, Euler angle Θ of the LiTaO$_3$ substrate is preferably between about 107° and about 144°, and more preferably, the Euler angles indicated on the right side of Table 11 are selected according to the thickness of the SiO$_2$ film.

The Euler angles of LiTaO$_3$ shown in Table 10 and Table 11 were selected so that the attenuation constant becomes about 0.05 or lower. The more preferable Euler angles shown in Table 10 and Table 11 were selected so that the attenuation constant becomes about 0.025 or lower. The relationships between the Hs/λ of the SiO$_2$ film and the Euler angles shown in Table 10 and Table 11 when the thickness H/λ of the tantalum electrode is about 0.012, 0.015, 0.042, and 0.053 were determined in terms of the thickness H/λ of the tantalum electrode shown in FIGS. 70 through 73.

Figure 74:
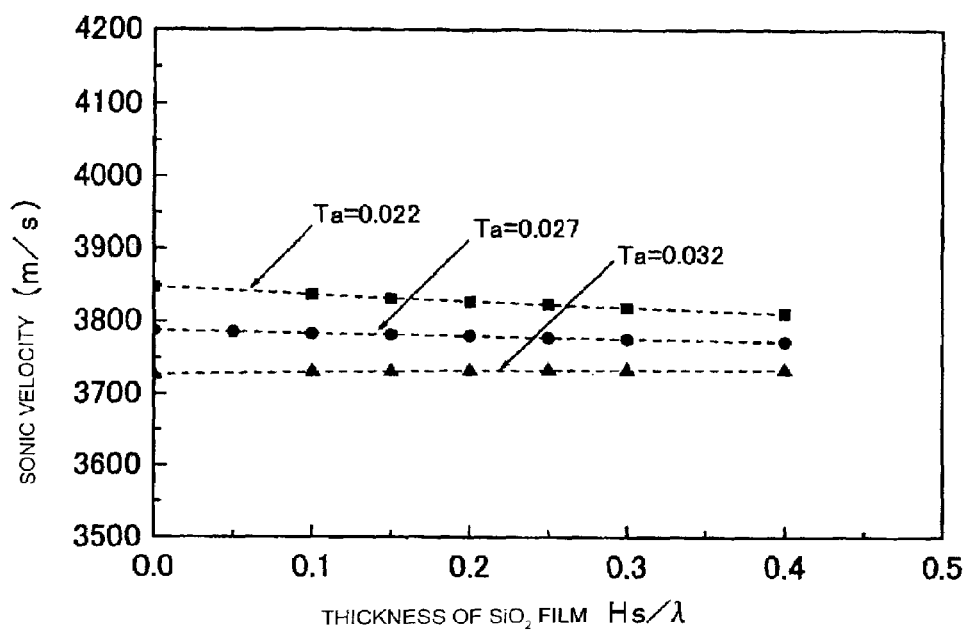
FIG. 74 illustrates the relationship between the acoustic velocity and the normalized thickness of SiO$_2$ films when tantalum IDTs having various thickness values and the SiO$_2$ films were formed on a LiTaO$_3$ substrate having Euler angles (0°, 126°, 0°)
Figure 75:
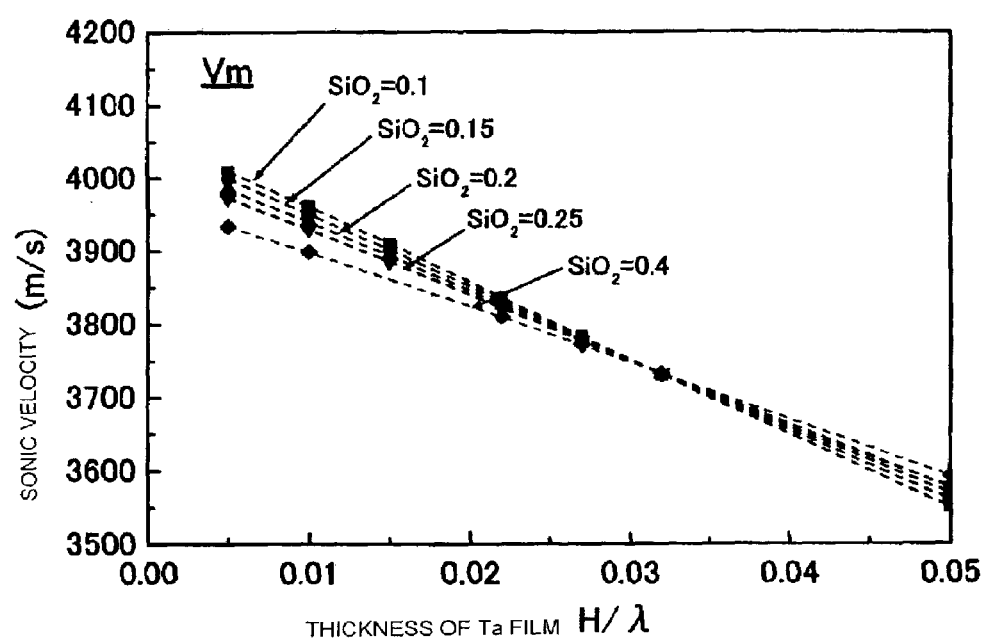
FIG. 75 illustrates the relationship between the acoustic velocity and the normalized thickness of tantalum IDTs when the tantalum IDTs and SiO$_2$ films having various thickness values were formed on a LiTaO3 substrate having Euler angles (0°, 126°, 0°)

When manufacturing the SAW apparatus of this preferred embodiment, it is preferable that an IDT primarily including tantalum is formed on a rotated Y-plate X-propagating LiTaO$_3$ substrate. Then, the frequency is adjusted Then, a SiO$_2$ film having a thickness that reduces the attenuation constant α is formed. This is explained below with reference to FIGS. 74 and 75. Tantalum IDTs having different thickness values and SiO$_2$ films having different thickness values were formed on a rotated Y-plate X-propagating LiTaO$_3$ substrate (Euler angles (0°, 126°, 0°). FIG. 74 illustrates a change in the acoustic velocity of a leaky SAW with respect to the thickness of the SiO$_2$ film. FIG. 75 illustrates a change in the acoustic velocity of a leaky SAW with respect to the thickness of the tantalum electrode. FIGS. 74 and 75 show that a change in the acoustic velocity of the SAW is much larger when the thickness of the tantalum IDT is varied than when the thickness of the SiO$_2$ film is varied. Accordingly, it is desirable that the frequency is adjusted before the formation of the SiO$_2$ film. It is desirable that the frequency is adjusted after a tantalum IDT is formed by laser etching or ion etching.

In this preferred embodiment, as described above, a 14°-58°-rotated Y-plate X-propagating LiTaO$_3$ substrate having Euler angles (0°, 104°-148°, 0°), a tantalum IDT having a thickness H/λ of about 0.004 to about 0.055, and a SiO$_2$ film having a thickness Hs/λ of about 0.10 to about 0.40 are used. The number and the structure of IDTs are not particularly restricted. That is, the present invention can be applied to, not only the SAW apparatus shown in FIG. 15, but also various types of SAW resonators and SAW filters as long as the above-described conditions are satisfied.

Euler angle Θ may sometimes deviate from the desired angle by about −2° to about +4°. This deviation is caused by the fact that calculations were made in this preferred embodiment assuming that a metallic film was formed on the entire surface of the substrate, and there may be some errors within the above range in actual SAW apparatuses.

When manufacturing SAW apparatuses, although φ and ψ of the Euler angles deviate from 0° by ±3°, substantially the same characteristic as that when φ and ψ are 0° can be obtained.

A SAW apparatus of a seventh preferred embodiment of the present invention is described below. The SAW apparatus of the seventh preferred embodiment of the present invention is similar to the SAW apparatus 21 of the second preferred embodiment of the present invention shown in FIG. 15. However, as the piezoelectric substrate 22, a 0°-79°-rotated Y-plate X-propagating LiTaO₃ substrate having Euler angles (0°, 90°-169°, 0°) was used, and IDTs made of platinum having a thickness H/λ of about 0.005 to about 0.054 were used.

In the seventh preferred embodiment, because the 0°-79°-rotated Y-plate X-propagating LiTaO₃ substrate 22 having Euler angles (0°, 90°-169°, 0°), the IDTs 23a and 23b made of platinum having a thickness H/λ of about 0.005 to about 0.054, and the SiO₂ film 25 having a thickness Hs/λ of about 0.10 to about 0.40 were used, it is possible to provide a SAW apparatus that has an improved TCF, a large electromechanical coupling coefficient KSAW, and a small propagation loss. The seventh preferred embodiment of the present invention is described in detail below by way of a specific example.

Figure 76:
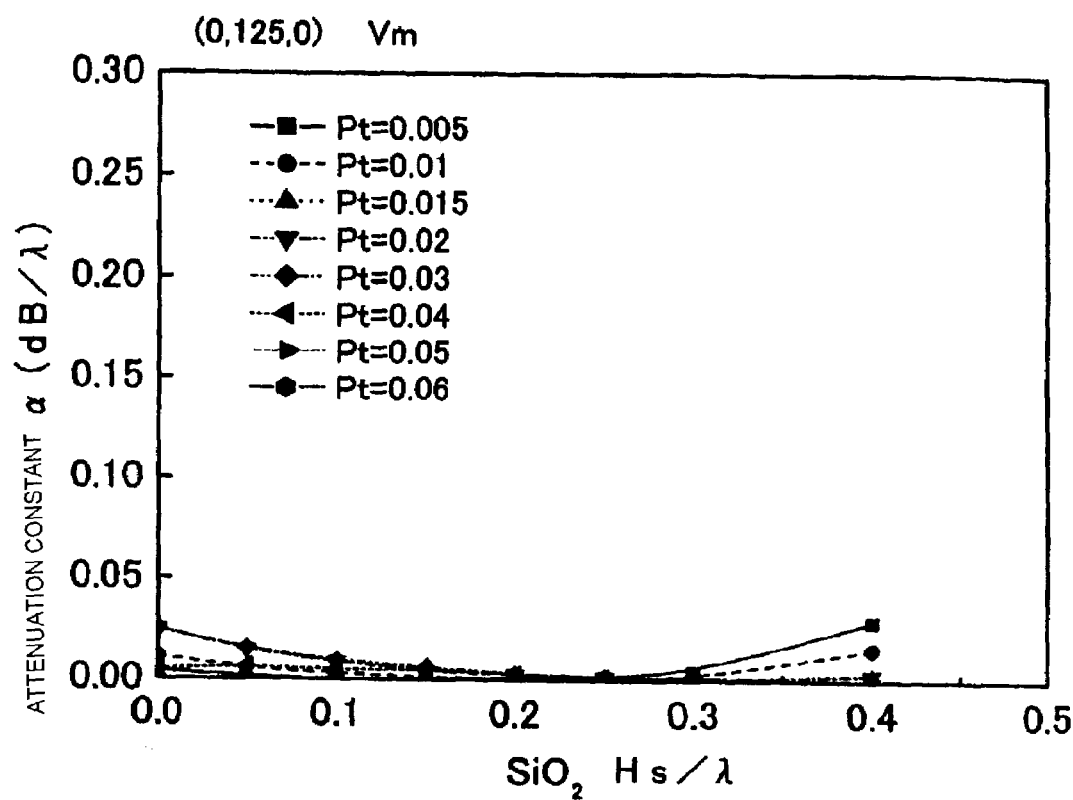
FIG. 76 illustrates a change in the attenuation constant α when platinum IDTs having various thickness values and SiO$_2$ films having various thickness values were formed on a LiTaO$_3$ substrate having Euler angles (0°, 125°, 0°) according to a seventh preferred embodiment of the present invention.
Figure 77:
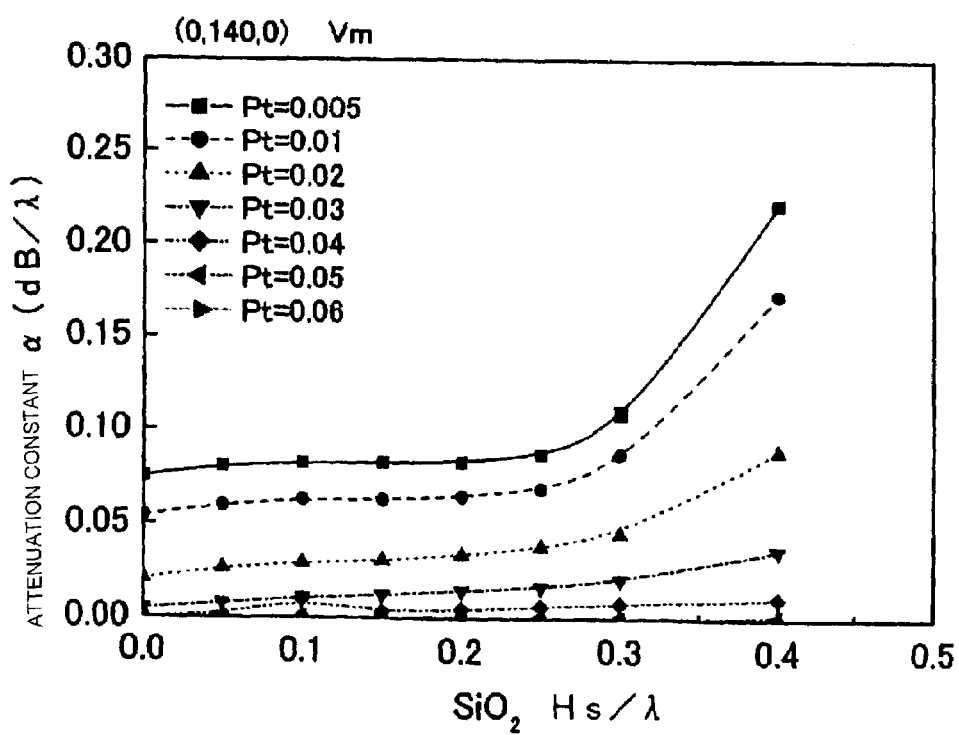
FIG. 77 illustrates a change in the attenuation constant α when platinum IDTs having various thickness values and SiO2 films having various thickness values are formed on a LiTaO$_3$ substrate having Euler angles (0°, 140°, 0°)

FIGS. 76 and 77 illustrate a change in the attenuation constant α when platinum IDTs having different thickness values and SiO₂ films having different thickness values were formed on a LiTaO₃ substrate having Euler angles (0°, 125°, 0°) and a LiTaO₃ substrate having Euler angles (0°, 140°, 0°).

As is seen from FIG. 76, when Euler angle Θ is 125°, the attenuation constant α is small when the normalized thickness Hs/λ of the SiO₂ film is about 0.1 to about 0.4 and when the normalized thickness H/λ of the platinum electrode is about 0.005 to about 0.06. In contrast, as is seen from FIG. 77, when Θ is 140°, the attenuation constant α is large when the normalized thickness H/λ of the platinum electrode is about 0.005 to about 0.06 regardless of the thickness Hs/λ of the SiO₂ film.

That is, in order to decrease the absolute value of the TCF, to achieve a large electromechanical coupling coefficient, and to decrease the attenuation constant, the Euler angles of the LiTaO₃ substrate, the thickness of the SiO₂ film, and the thickness of the platinum electrode must be considered.

Figure 78:
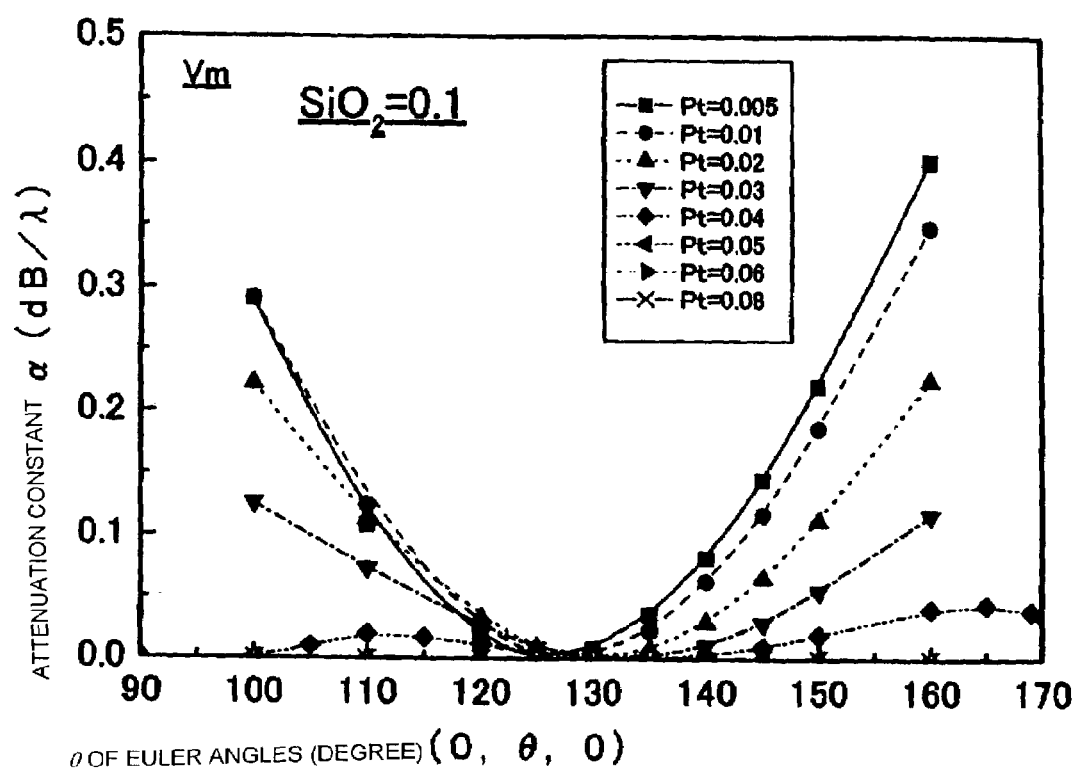
FIG. 78 illustrates the relationship between the attenuation constant α and Θ when platinum electrode films having various thickness values and a SiO$_2$ film having a normalized thickness of about 0.1 were formed on a LiTaO$_3$ substrate having Euler angles (0°, Θ, 0°)
Figure 79:
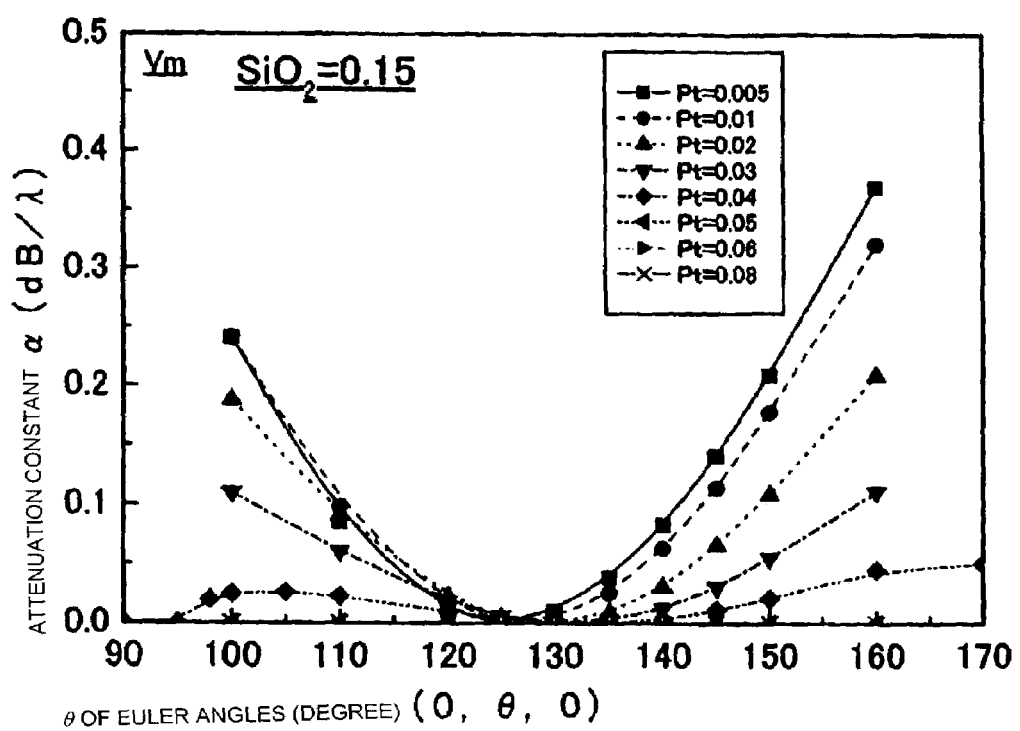
FIG. 79 illustrates the relationship between the attenuation constant α and Θ when platinum electrode films having various thickness values and a SiO$_2$ film having a normalized thickness of about 0.15 were formed on a LiTaO$_3$ substrate having Euler angles (0°, Θ, 0°)
Figure 80:
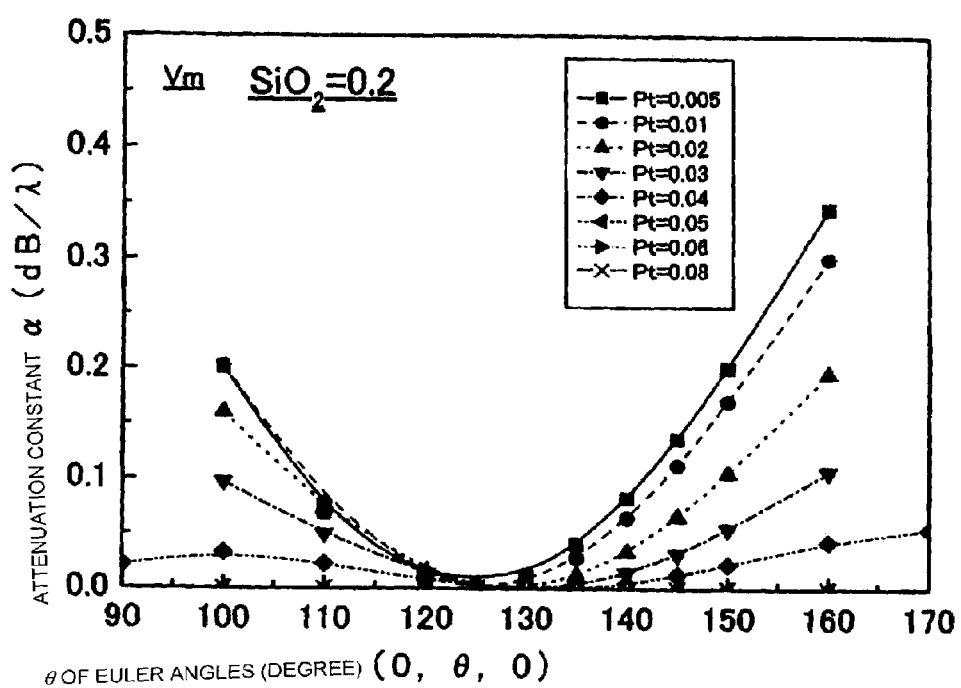
FIG. 80 illustrates the relationship between the attenuation constant α and Θ when platinum electrode films having various thickness values and a SiO$_2$ film having a normalized thickness of about 0.2 were formed on a LiTaO$_3$ substrate having Euler angles (0°, Θ, 0°)
Figure 81:
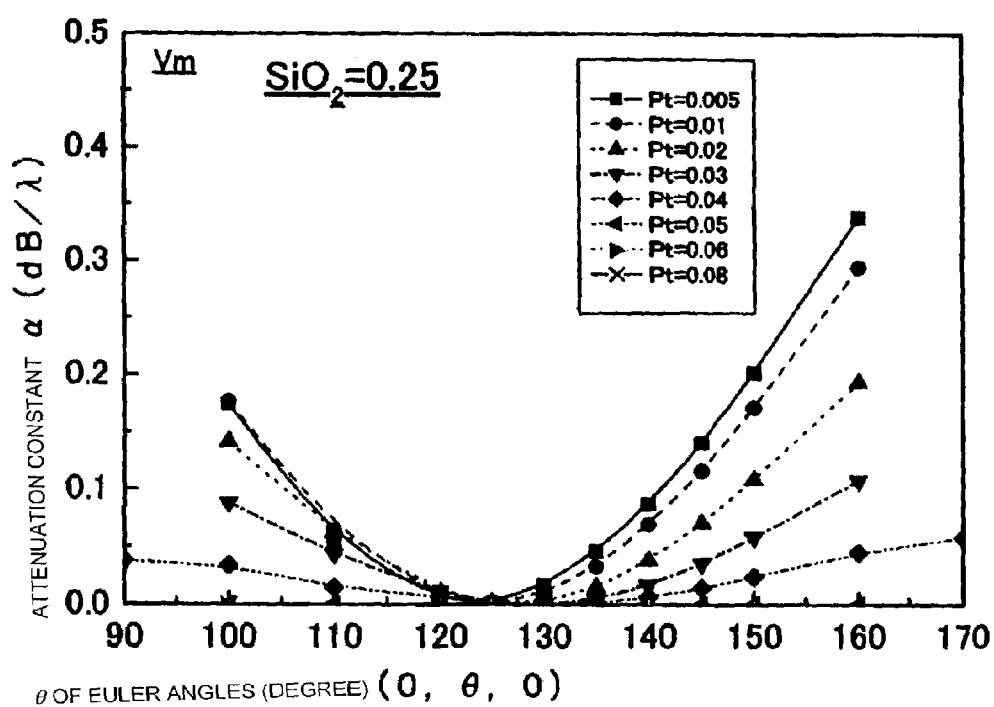
FIG. 81 illustrates the relationship between the attenuation constant α and Θ when platinum electrode films having various thickness values and a SiO$_2$ film having a normalized thickness of about 0.25 were formed on a LiTaO$_3$ substrate having Euler angles (0°, Θ, 0°)
Figure 82:
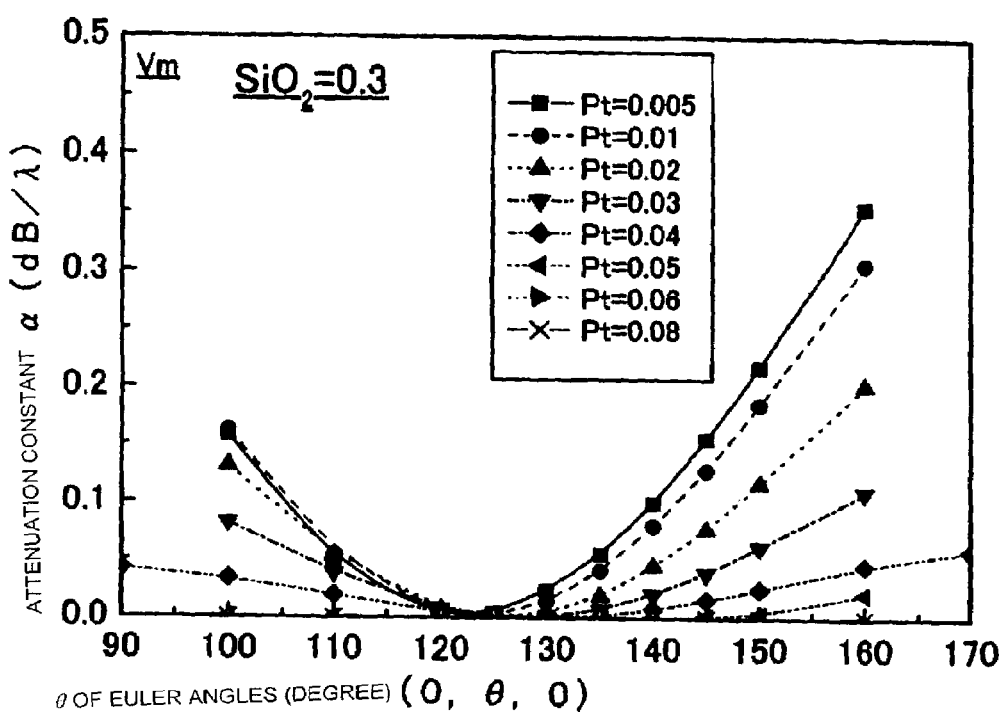
FIG. 82 illustrates the relationship between the attenuation constant α and Θ when platinum electrode films having various thickness values and a SiO2 film having a normalized thickness of about 0.3 were formed on a LiTaO3 substrate having Euler angles (0°, Θ, 0°)
Figure 83:
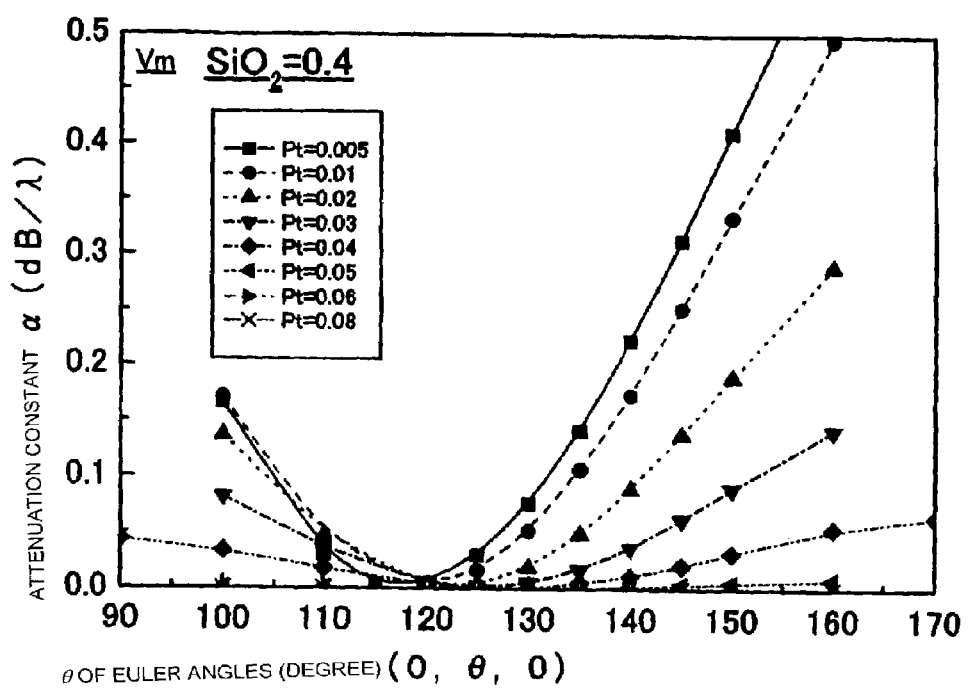
FIG. 83 illustrates the relationship between the attenuation constant α and Θ when platinum electrode films having various thickness values and a SiO2 film having a normalized thickness of about 0.4 were formed on a LiTaO$_3$ substrate having Euler angles (0°, Θ, 0°)

FIGS. 78 and 83 illustrate relationships between the attenuation constant α and Euler angle Θ when the normalized thickness Hs/λ of the SiO₂ film and the normalized thickness H/λ of the platinum electrode were changed.

As is seen from FIGS. 78 through 83, it is desirable that Θ is from 90° to 169° when the thickness H/λ of the platinum electrode is about 0.005 to about 0.054. Combinations of the normalized thickness Hs/λ of the SiO₂ film and Euler angle Θ that reduce the attenuation constant α when the normalized thickness H/λ of the platinum electrode is from about 0.01 to about 0.04, more preferably from about 0.013 to about 0.033, can be selected from the combinations shown in Table 12 and Table 13, respectively. The Euler angles of LiTaO₃ shown in Table 12 and Table 13 were selected so that the attenuation constant α becomes about 0.05 or lower. The more preferable Euler angles shown in Table 12 and Table 13 were selected so that the attenuation constant α becomes about 0.025 or lower. Euler angle Θ shown in Table 12 and Table 13 may vary by about −2° to +4° caused by a variation in the electrode finger width of the platinum electrode or a variation in the single crystal substrate.

When manufacturing SAW apparatuses, although φ and ψ of the Euler angles deviate from 0° by ±3°, substantially the same characteristic as that when φ and ψ are 0° can be obtained.

TABLE 12

Platinum thickness H/λ: about 0.01 to about 0.04

| SiO₂ thickness Hs/λ | Euler angles of LiTaO₃ (°) | More preferable Euler angles (°) |
|---|---|---|
| 0.10 ≤ Hs/λ < 0.15 | 0 ± 3, 90-169, 0 ± 3 | 0 ± 3, 105-153, 0 ± 3 |
| 0.15 ≤ Hs/λ < 0.20 | 0 ± 3, 90-167, 0 ± 3 | 0 ± 3, 105-152, 0 ± 3 |
| 0.20 ≤ Hs/λ < 0.25 | 0 ± 3, 90-167, 0 ± 3 | 0 ± 3, 107-152, 0 ± 3 |
| 0.25 ≤ Hs/λ < 0.30 | 0 ± 3, 90-164, 0 ± 3 | 0 ± 3, 104-151, 0 ± 3 |
| 0.30 ≤ Hs/λ < 0.40 | 0 ± 3, 90-163, 0 ± 3 | 0 ± 3, 105-150, 0 ± 3 |

TABLE 13

Platinum thickness H/λ: about 0.013 to about 0.033

| SiO₂ thickness Hs/λ | Euler angles of LiTaO₃ (°) | More preferable Euler angles (°) |
|---|---|---|
| 0.10 ≤ Hs/λ < 0.15 | 0 ± 3, 106-155, 0 ± 3 | 0 ± 3, 116.0-147.5, 0 ± 3 |
| 0.15 ≤ Hs/λ < 0.20 | 0 ± 3, 104-155, 0 ± 3 | 0 ± 3, 113.5-150.0, 0 ± 3 |
| 0.20 ≤ Hs/λ < 0.25 | 0 ± 3, 102-155, 0 ± 3 | 0 ± 3, 111.5-150.0, 0 ± 3 |
| 0.25 ≤ Hs/λ < 0.30 | 0 ± 3, 102-154, 0 ± 3 | 0 ± 3, 35 U.S.C. §112, .0-146.0, 0 ± 3 |
| 0.30 ≤ Hs/λ < 0.40 | 0 ± 3, 102-153, 0 ± 3 | 0 ± 3, 110.0-144.5, 0 ± 3 |

When the thickness H/λ of the platinum electrode is about 0.01 to about 0.04, as indicated in Table 12, the thickness Hs/λ of the SiO₂ film is preferably 0.1 to 0.4 in order to set the range of the TCF to be between about −20 ppm/° C. and about +20 ppm/° C. In this case, Euler angle Θ of the LiTaO₃ substrate is preferably 90° to 169° (corresponding to the rotation angle of 0° to 79°), and more preferably, the Euler angles indicated on the right side of Table 12 are selected according to the thickness Hs/λ of the SiO₂ film.

Similarly, when the thickness H/λ of the platinum electrode is about 0.013 to about 0.033, as indicated in Table 13, the thickness Hs/λ of the SiO₂ film is preferably about 0.1 to about 0.4 in order to set the range of the TCF to be between about −20 ppm/° C. and about +20 ppm/° C. In this case, Euler angle Θ of the LiTaO₃ substrate is preferably 102° to 155°, and more preferably, the Euler angles shown on the right side of Table 13 are selected according to the thickness of the SiO₂ film.

The relationships between the Hs/λ of the SiO₂ film and the Euler angles shown in Table 12 and Table 13 when the thickness H/λ of the platinum electrode is from about 0.013 to about 0.033 were determined in terms of the thickness H/λ of the platinum electrode shown in FIGS. 78 through 83.

Figure 84:
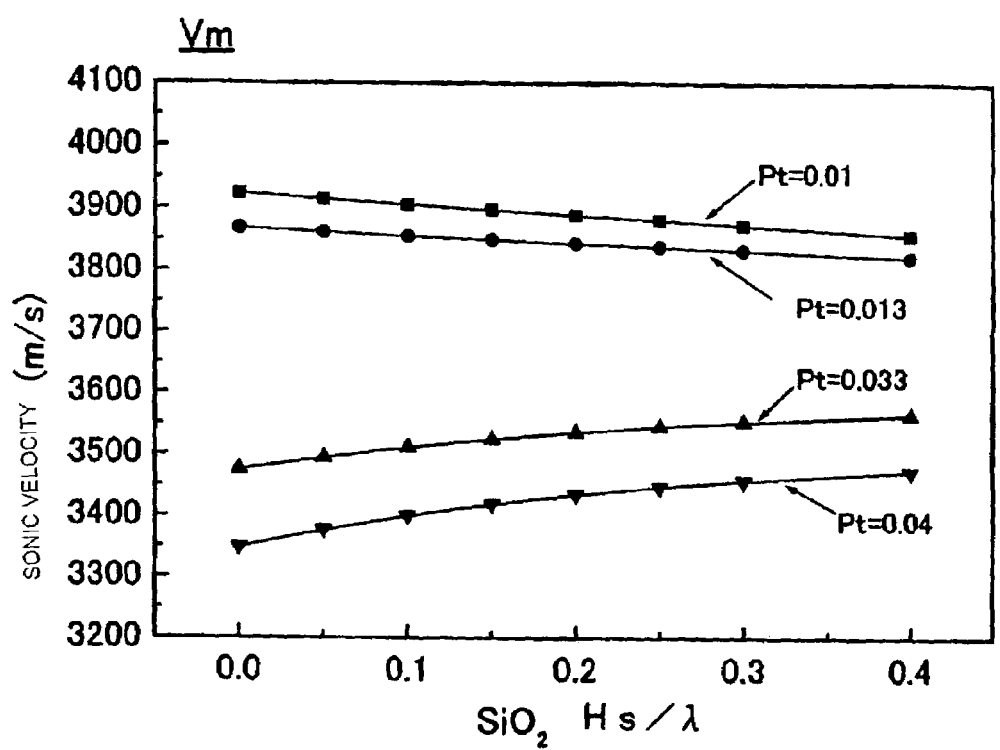
FIG. 84 illustrates the relationship between the acoustic velocity and the normalized thickness of SiO$_2$ films when platinum IDTs having various thickness values and the SiO$_2$ films were formed on a LiTaO$_3$ LiTaO$_3$ substrate having Euler angles (0°, 126°, 0°)
Figure 85:
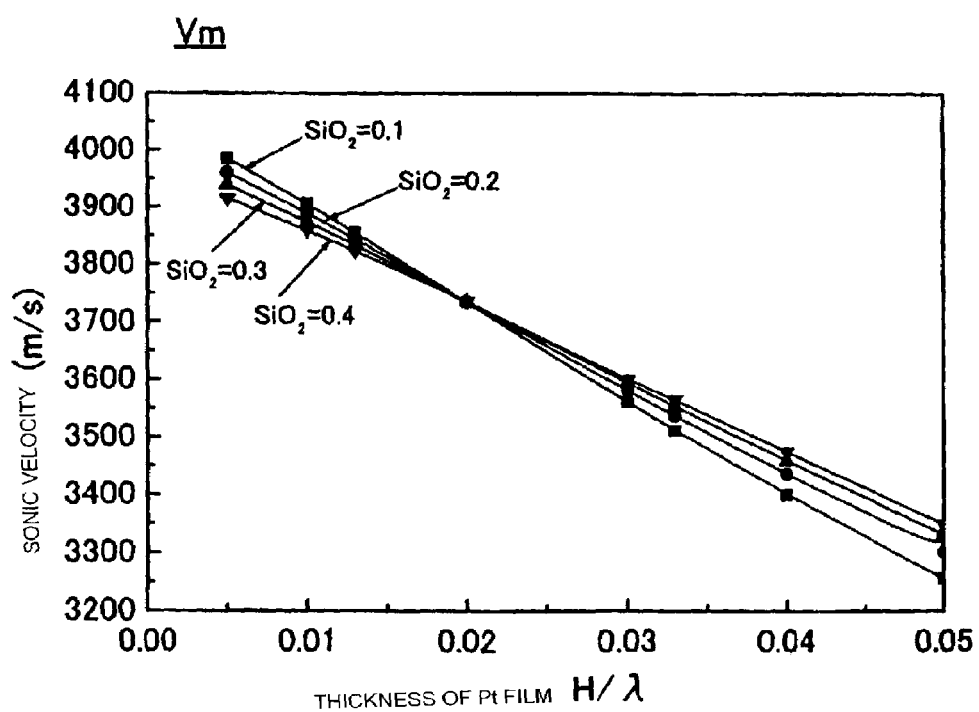
FIG. 85 illustrates the relationship between the acoustic velocity and the normalized thickness of platinum IDTs when the platinum IDTs and SiO$_2$ films having various thickness values were formed on a LiTaO$_3$ substrate having Euler angles (0°, 126°, 0)

When manufacturing the SAW apparatus of this preferred embodiment, it is preferable that an IDT primarily including platinum is formed on a rotated Y-plate X-propagating LiTaO₃ substrate. Then, the frequency is adjusted. Then, a SiO₂ film having a thickness that can reduce the attenuation constant α is formed. This is explained below with reference to FIGS. 84 and 85. Platinum IDTs having different thickness values and SiO₂ films having different thickness values were formed on a rotated Y-plate X-propagating LiTaO₃ substrate (Euler angles (0°, 126°, 0°)). FIG. 84 illustrates a change in the acoustic velocity of a leaky SAW with respect to the thickness of the SiO₂ film. FIG. 85 illustrates a change in the acoustic velocity of a leaky SAW with respect to the thickness of the platinum electrode. FIGS. 84 and 85 show that a change in the acoustic velocity of the SAW is much larger when the thickness of the platinum IDT is varied than when the thickness of the SiO₂ film is varied. Accordingly, it is desirable that the frequency is adjusted before the formation of the SiO₂ film. It is desirable that the frequency is adjusted after a platinum IDT is formed by laser etching or ion etching.

In this preferred embodiment, a 0°-79°-rotated Y-plate X-propagating LiTaO$_3$ substrate having Euler angles (0°, 90°-169°, 0°), a platinum IDT having a thickness H/λ of about 0.005 to about 0.054, and a SiO$_2$ film having a thickness Hs/λ of about 0.10 to about 0.40 are used. The number and the structure of IDTs are not particularly restricted. That is, the present invention can be applied to, not only the SAW apparatus shown in FIG. 15, but also various types of SAW resonators and SAW filters as long as the above-described conditions are satisfied.

A SAW apparatus of an eighth preferred embodiment of the present invention is described below. The SAW apparatus of the eighth preferred embodiment of the present invention is similar to the SAW apparatus 21 of the second preferred embodiment of the present invention shown in FIG. 15. However, as the piezoelectric substrate 22, a 14°-50°-rotated Y-plate X-propagating LiTaO$_3$ substrate having Euler angles (0°, 104°-140°, 0°) was used, and electrodes made of nickel (Ni) or molybdenum (Mo) were used.

The IDTs 23a and 23b and the reflectors 24a and 24b are made of a metal having a density of about 8700 to about 10300 kg/m3, a Young's modulus of about 1.8×1011 to about 4×1011N/m$^2$, and a transversal-wave acoustic velocity of about 3170 to about 3290 m/s. Such a metal includes nickel, molybdenum, or an alloy primarily including nickel or molybdenum. The normalized thickness H/λ of the IDTs 23a and 23b ranges from about 0.008 to about 0.06.

In the eighth preferred embodiment of the present invention, since the 14°-50°-rotated Y-plate X-propagating LiTaO$_3$ substrate 22 having Euler angles (0°, 104°-140°, 0°), the IDTs 23a and 23b made of the above-described type of metal having a normalized thickness H/λ of about 0.008 to about 0.06, and the SiO$_2$ film 25 having a normalized thickness Hs/λ of about 0.10 to about 0.40 were used, it is possible to provide a SAW apparatus that has an improved TCF, a large electromechanical coupling coefficient KSAW, and a small propagation loss. The eighth preferred embodiment of the present invention is described in detail below by way of a specific example.

Figure 86:
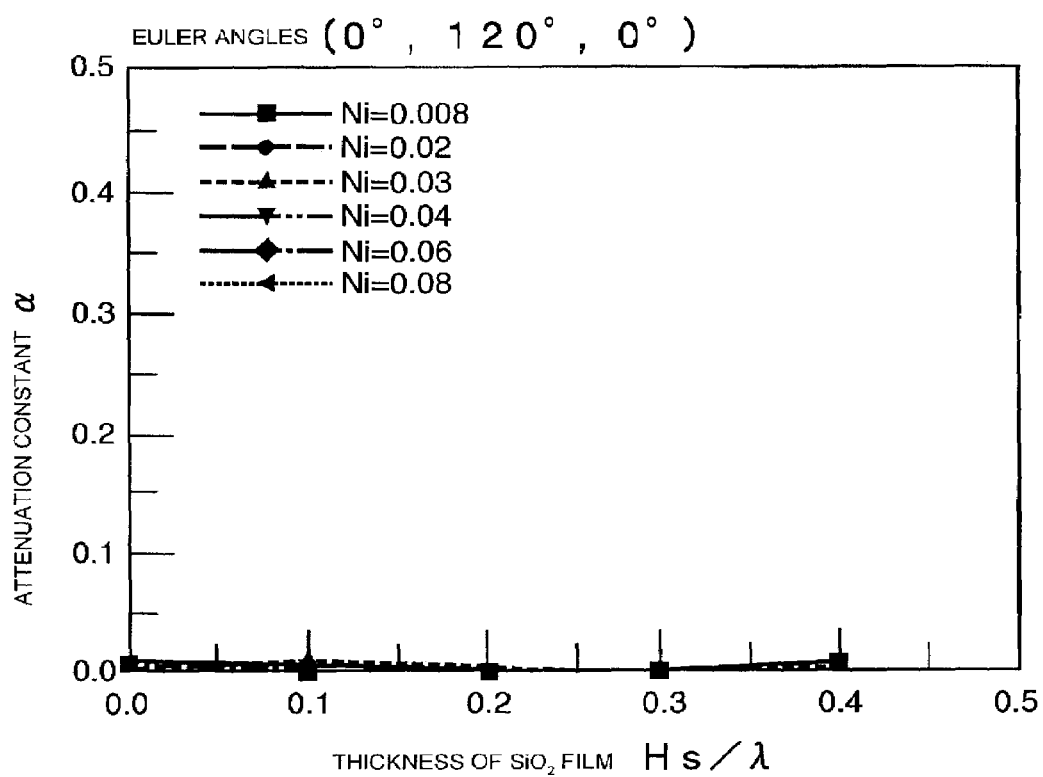
FIG. 86 illustrates a change in the attenuation constant α when nickel IDTs having various thickness values and SiO$_2$ films having various thickness values were formed on a LiTaO$_3$ substrate having Euler angles (0°, 120°, 0°) according to an eighth preferred embodiment of the present invention.
Figure 87:
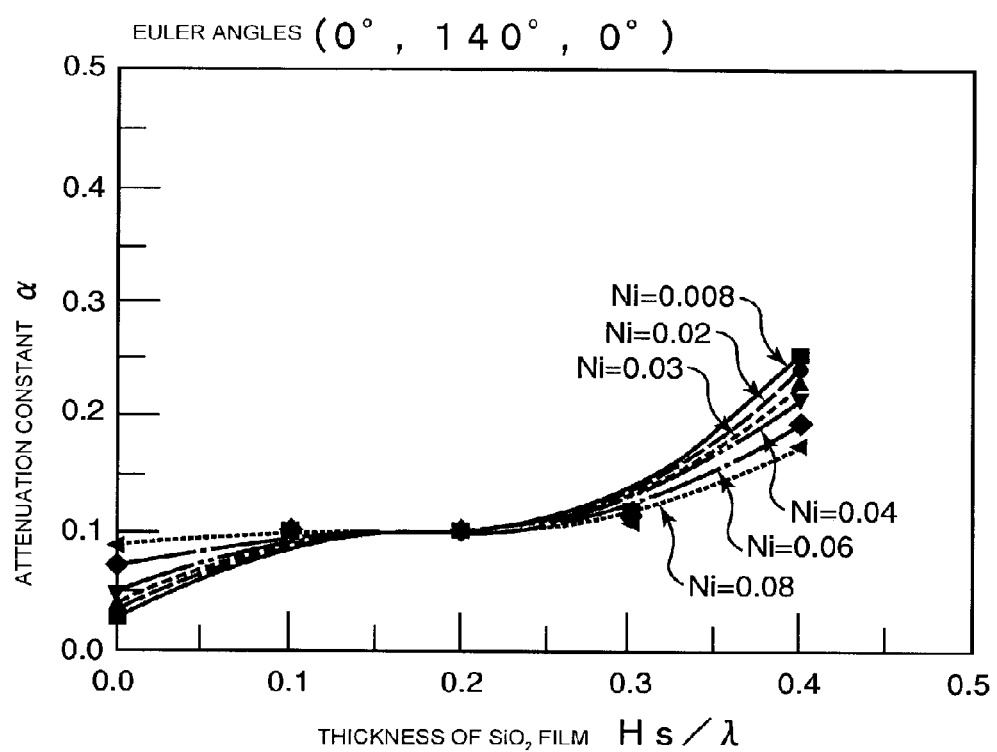
FIG. 87 illustrates a change in the attenuation constant α when nickel IDTs having various thickness values and SiO$_2$ films having various thickness values were formed on a LiTaO$_3$ substrate having Euler angles (0°, 140°, 0°)

FIGS. 86 and 87 illustrate a change in the attenuation constant α when nickel IDTs having different thickness values and SiO$_2$ films having different thickness values were formed on a LiTaO$_3$ substrate having Euler angles (0°, 120°, 0°) and a LiTaO$_3$ substrate having Euler angles (0°, 140°, 0°).

As is seen from FIG. 86, when Euler angle Θ is about 120°, the attenuation constant α is small when the normalized thickness Hs/λ of the SiO$_2$ film is about 0.1 to about 0.4 and when the normalized thickness H/λ of the nickel electrode is about 0.008 to about 0.08. In contrast, as is seen from FIG. 87, when Θ is about 140°, the attenuation constant α is large when the thickness H/λ of the nickel electrode is about 0.008 to about 0.08 regardless of the normalized thickness Hs/λ of the SiO$_2$ film.

Figure 88:
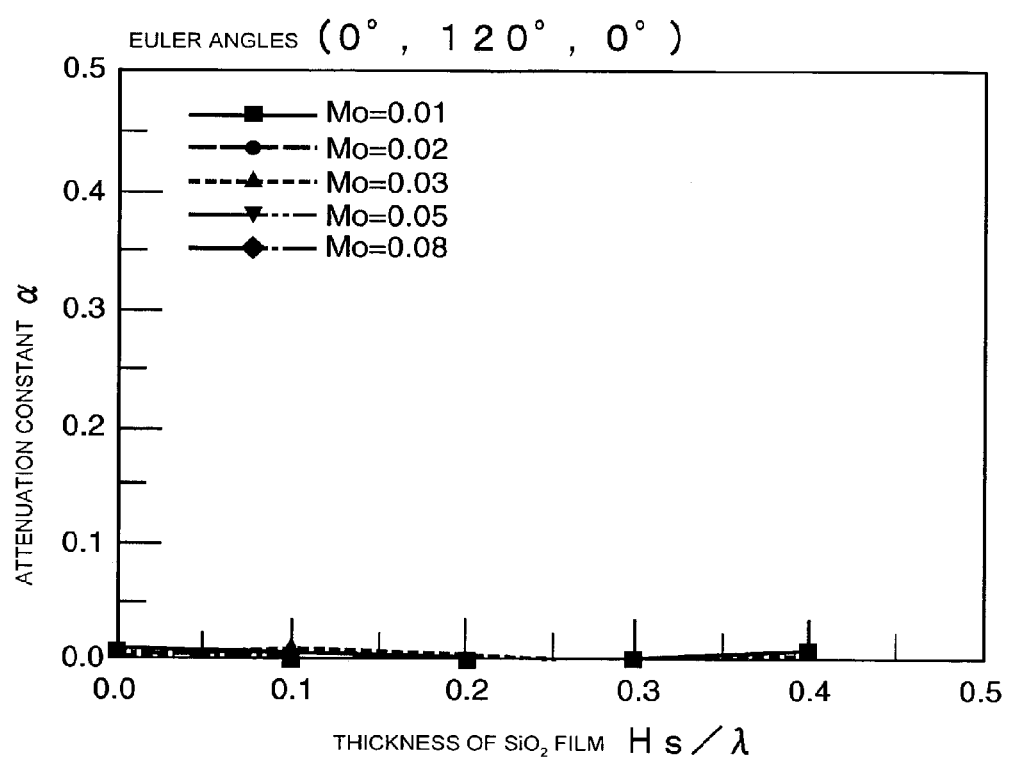
FIG. 88 illustrates a change in the attenuation constant α when molybdenum IDTs having various thickness values and SiO$_2$ films having various thickness values were formed on a LiTaO$_3$ substrate having Euler angles (0°, 120°, 0°)
Figure 89:
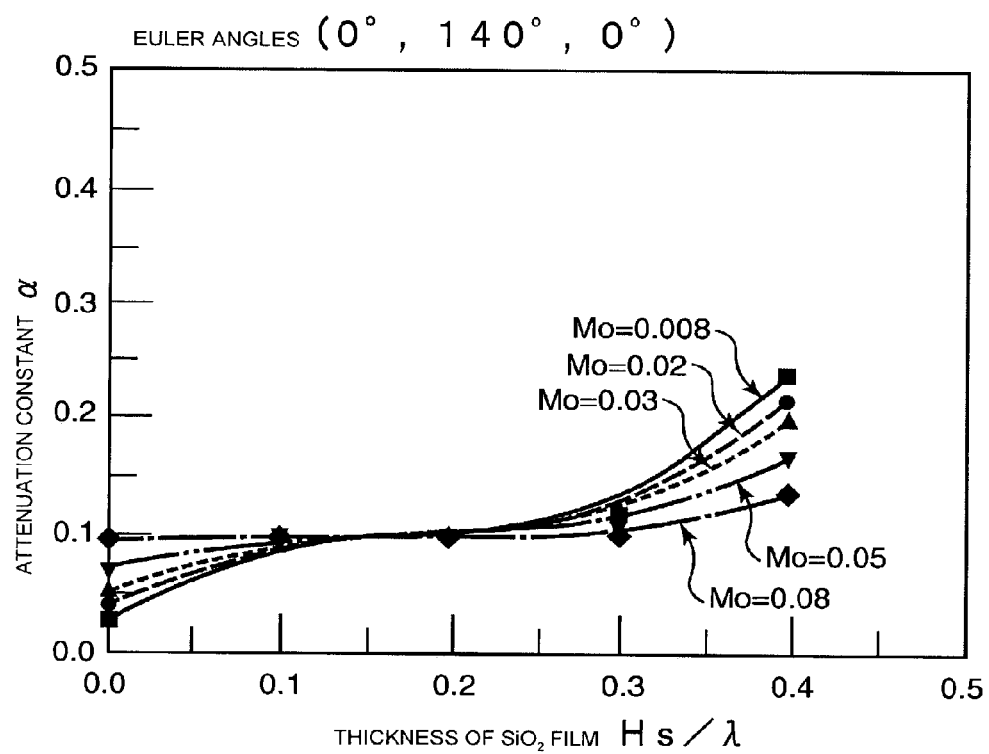
FIG. 89 illustrates a change in the attenuation constant α when molybdenum IDTs having various thickness values and SiO$_2$ films having various thickness values were formed on a LiTaO$_3$ substrate having Euler angles (0°, 140°, 0°)
Figure 90:
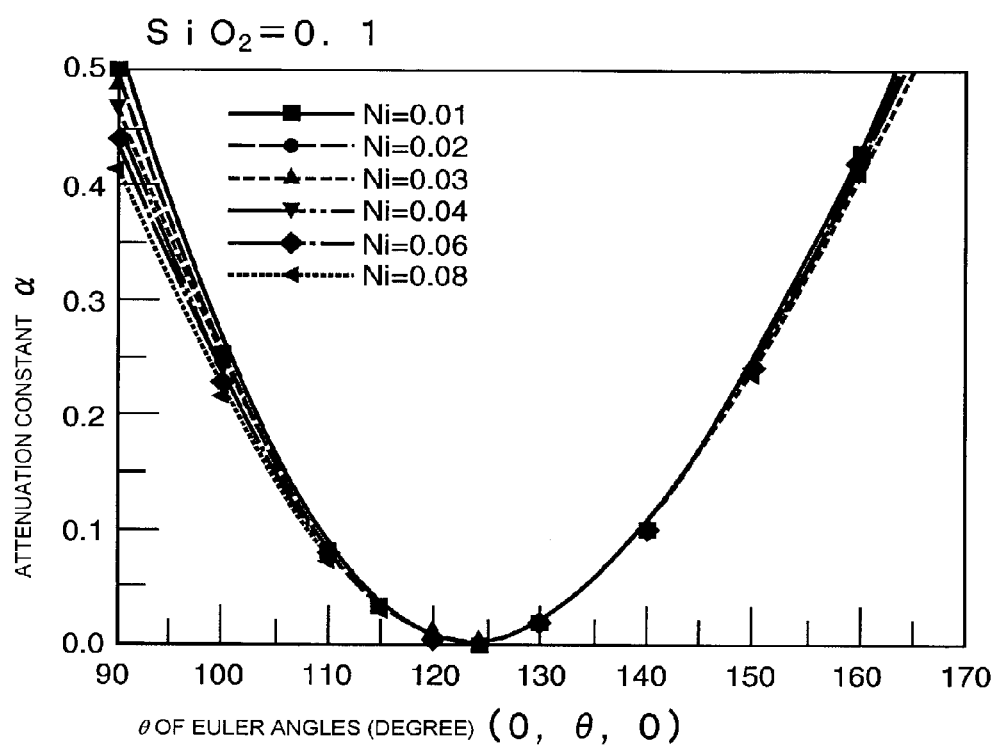
FIG. 90 illustrates the relationship between the attenuation constant α and Θ when nickel electrode films having various thickness values and a SiO$_2$ film having a normalized thickness of about 0.1 were formed on a LiTaO3 substrate having Euler angles (0°, Θ, 0°)
Figure 91:
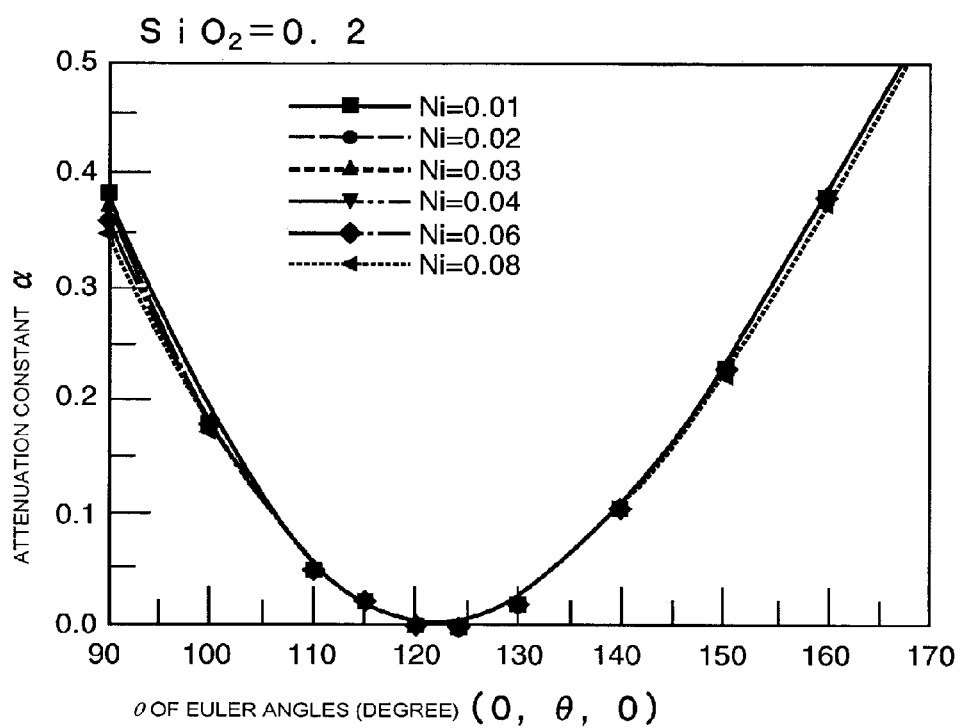
FIG. 91 illustrates the relationship between the attenuation constant α and Θ when nickel electrode films having various thickness values and a SiO$_2$ film having a normalized thickness of about 0.2 were formed on a LiTaO3 substrate having Euler angles (0°, Θ, 0°)
Figure 92:
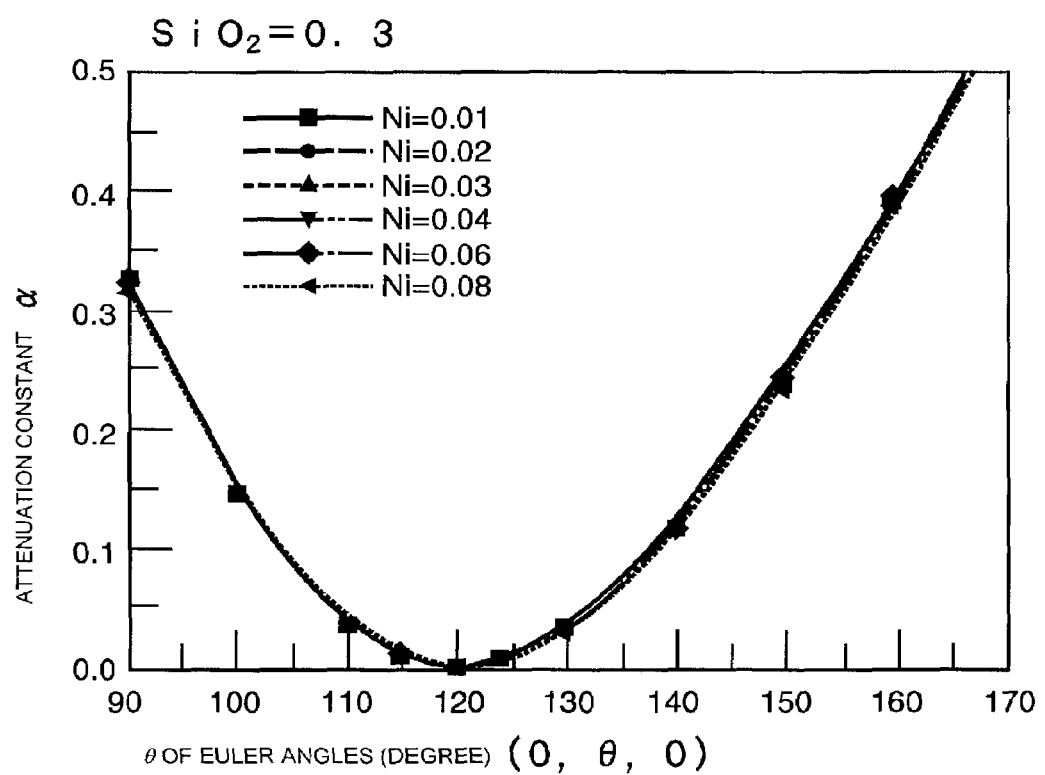
FIG. 92 illustrates the relationship between the attenuation constant α and Θ when nickel electrode films having various thickness values and a SiO$_2$ film having a normalized thickness of about 0.3 were formed on a LiTaO3 substrate having Euler angles (0°, Θ, 0°)
Figure 93:
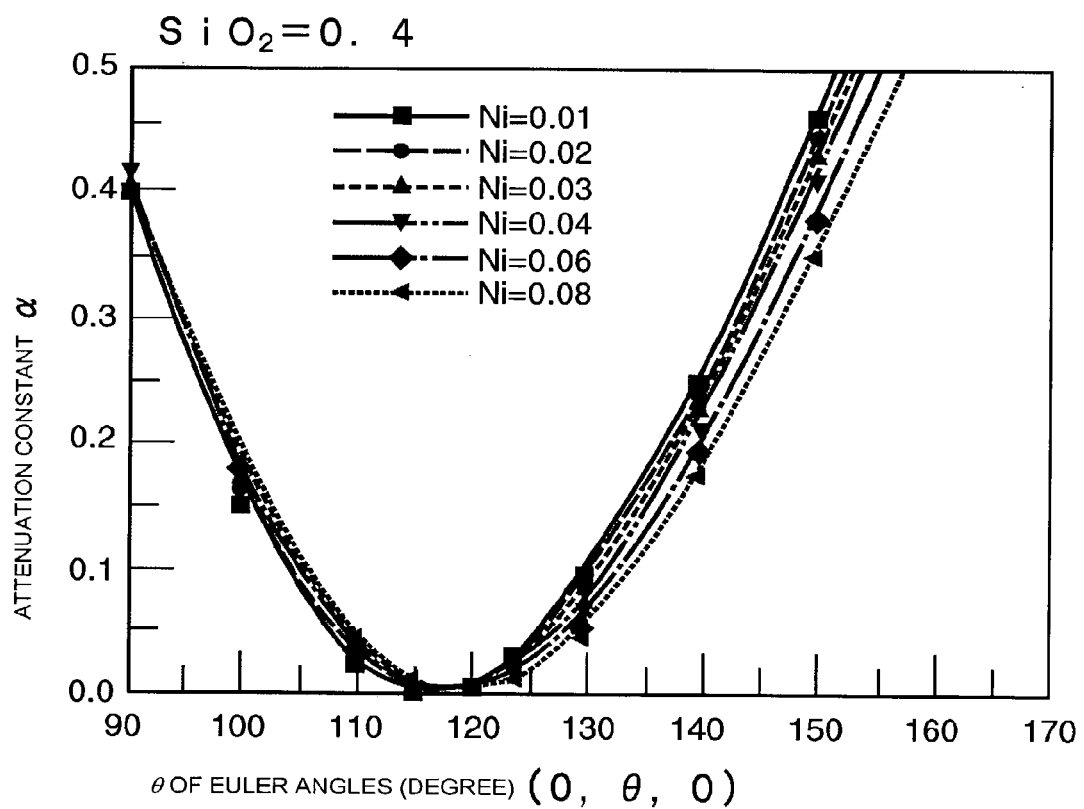
FIG. 93 illustrates the relationship between the attenuation constant α and Θ when nickel electrode films having various thickness values and a SiO₂ film having a normalized thickness of about 0.4 were formed on a LiTaO₃ substrate having Euler angles (0°, Θ, 0°)
Figure 94:
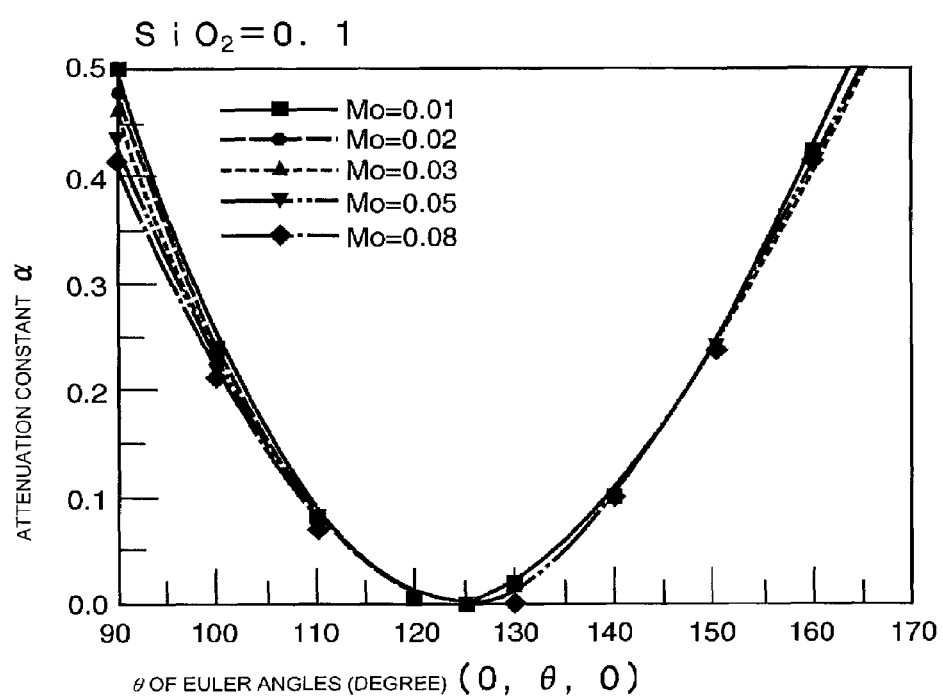
FIG. 94 illustrates the relationship between the attenuation constant α and Θ when molybdenum electrode films having various thickness values and a SiO₂ film having a normalized thickness of about 0.1 were formed on a LiTaO₃ substrate having Euler angles (0°, Θ, 0°)
Figure 95:
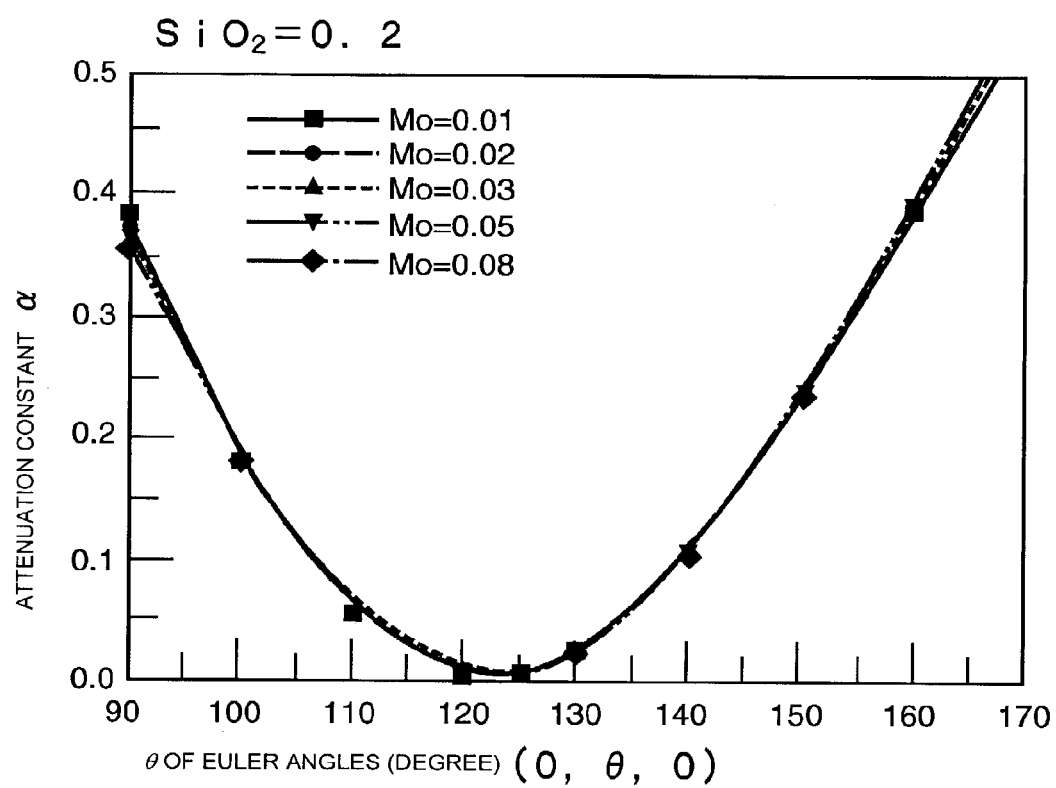
FIG. 95 illustrates the relationship between the attenuation constant α and Θ when molybdenum electrode films having various thickness values and a SiO₂ film having a normalized thickness of about 0.2 were formed on a LiTaO₃ substrate having Euler angles (0°, Θ, 0°)
Figure 96:
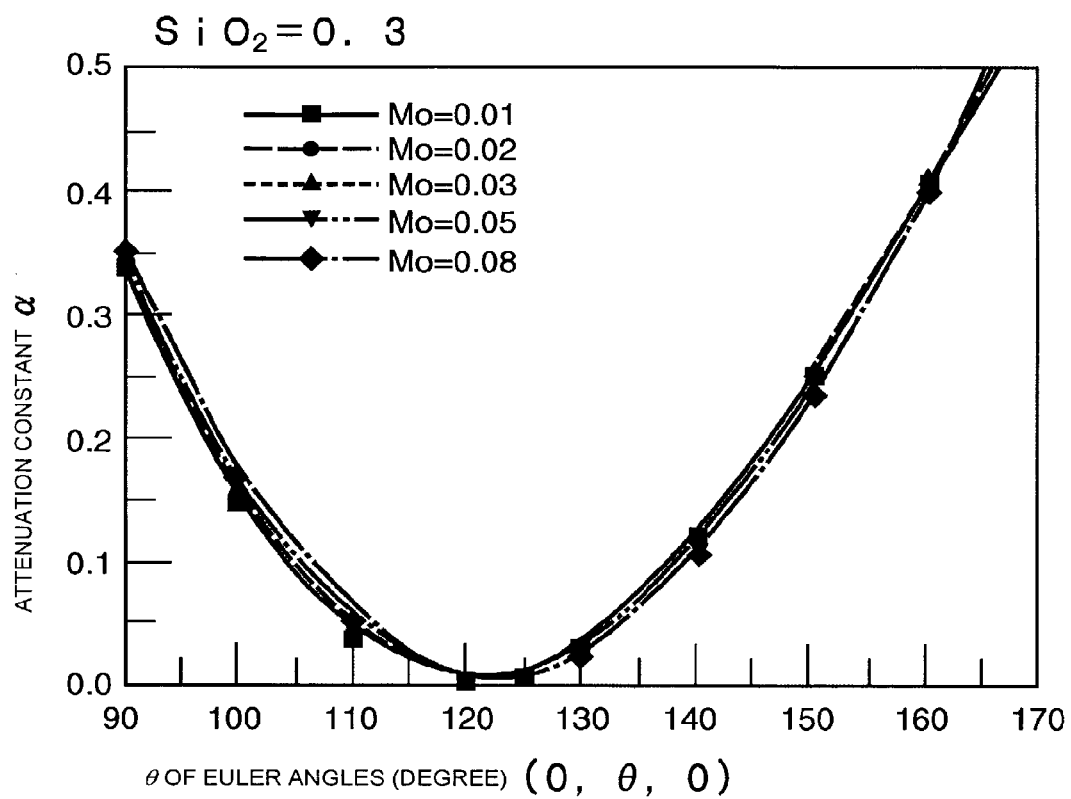
FIG. 96 illustrates the relationship between the attenuation constant α and Θ when molybdenum electrode films having various thickness values and a SiO₂ film having a normalized thickness of about 0.3 are formed on a LiTaO₃ substrate having Euler angles (0°, Θ, 0°)
Figure 97:
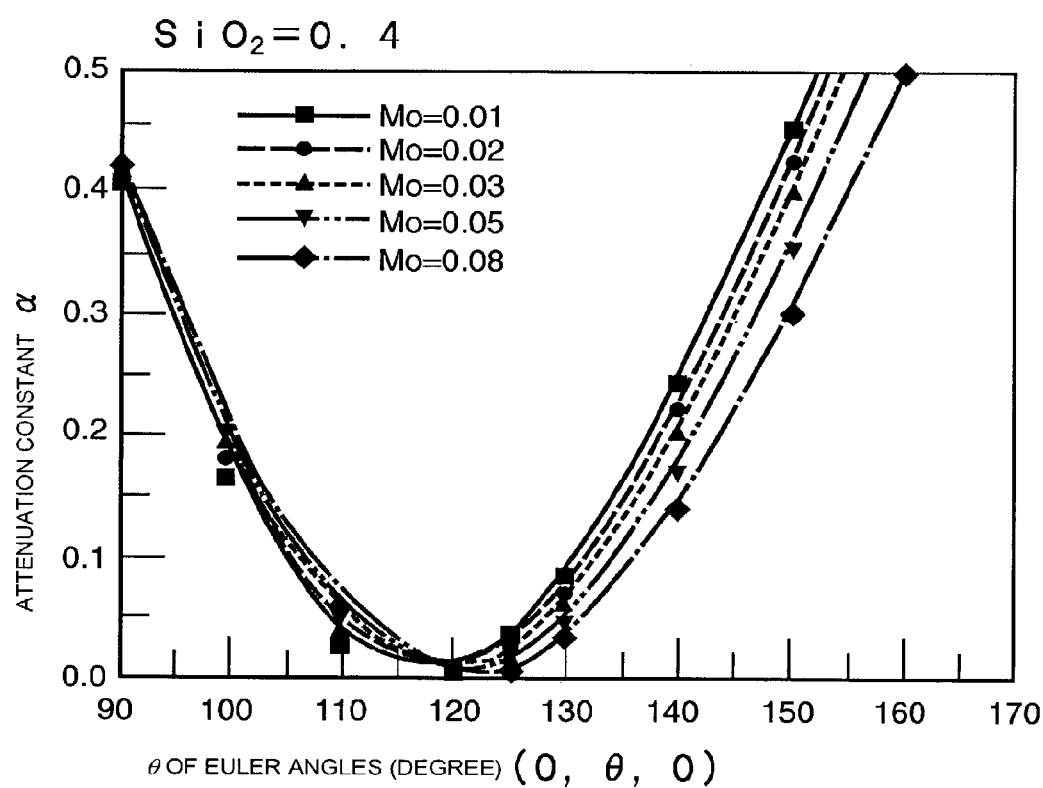
FIG. 97 illustrates the relationship between the attenuation constant α and Θ when molybdenum electrode films having various thickness values and a SiO2 film having a normalized thickness of about 0.4 were formed on a LiTaO₃ substrate having Euler angles (0°, Θ, 0°)

FIGS. 88 and 89 illustrate a change in the attenuation constant α when molybdenum IDTs having different thickness values and SiO$_2$ films having different thickness values were formed on a LiTaO$_3$ substrate having Euler angles (0°, 120°, 0°) and a LiTaO$_3$ substrate having Euler angles (0°, 140°, 0°).

As is seen from FIG. 88, when Euler angle Θ is about 120°, the attenuation constant α is small when the normalized thickness Hs/λ of the SiO$_2$ film is about 0.1 to about 0.4 and when the normalized thickness H/λ of the molybdenum electrode is about 0.008 to about 0.08. In contrast, as is seen from FIG. 89, when Euler angle Θ is about 140°, the attenuation constant α is large when the thickness H/λ of the molybdenum electrode is about 0.008 to about 0.08 regardless of the normalized thickness Hs/λ of the SiO$_2$ film.

That is, in order to decrease the absolute value of the TCF, to achieve a large electromechanical coupling coefficient, and to decrease the attenuation constant, the Euler angles of the LiTaO$_3$ substrate, the thickness of the SiO$_2$ film, and the thickness of a metal having the above-described density, the Young's modulus, and the transversal-wave acoustic velocity must be considered.

FIGS. 90 through 93 illustrate the relationships between the attenuation constant α and Euler angle Θ when the normalized thickness Hs/λ of the SiO$_2$ film and the normalized thickness H/λ of the nickel electrode are changed.

FIGS. 94 through 97 illustrate the relationships between the attenuation constant α and Euler angle Θ when the normalized thickness Hs/λ of the SiO$_2$ film and the normalized thickness H/λ of the molybdenum electrode are changed.

As is seen from FIGS. 90 through 97, optimal combinations of the normalized thickness Hs/λ of the SiO$_2$ film and Euler angle Θ when the normalized thickness H/λ of the nickel or molybdenum electrode is about 0.008 to about 0.06, about 0.017 to about 0.06, and about 0.023 to about 0.06 are shown in Table 14. Euler angle Θ shown in Table 14 may vary by about −2° to about +4° caused by a variation in the electrode finger width or a variation in the single crystal substrate.

When manufacturing SAW apparatuses, although φ and ψ of the Euler angles deviate from 0° by about ±3°, substantially the same characteristic as that when φ and ψ are 0° are obtained.

TABLE 14

| SiO$_2$ thickness Hs/λ | Euler angles of LiTaO$_3$ (°) | More preferable Euler angles (°) |
|---|---|---|
| 0.1-0.2 | 0 ± 3, 105-140, 0 ± 3 | 0 ± 3, 110-135, 0 ± 3 |
| 0.2-0.3 | 0 ± 3, 105-140, 0 ± 3 | 0 ± 3, 108-135, 0 ± 3 |
| 0.3-0.4 | 0 ± 3, 104-139, 0 ± 3 | 0 ± 3, 108-133, 0 ± 3 |

Optimal combinations of the normalized thickness Hs/λ of the SiO$_2$ film and Euler angle Θ when the normalized thickness H/λ of the nickel electrode is about 0.008 to about 0.06, about 0.02 to about 0.06, and about 0.027 to about 0.06 shown in FIGS. 90 through 93 are shown in Table 15.

TABLE 15

| SiO$_2$ thickness Hs/λ | Euler angles of LiTaO$_3$ (°) | More preferable Euler angles (°) |
|---|---|---|
| 0.1-0.2 | 0 ± 3, 106-140, 0 ± 3 | 0 ± 3, 110-135, 0 ± 3 |
| 0.2-0.3 | 0 ± 3, 105-137, 0 ± 3 | 0 ± 3, 108-134, 0 ± 3 |
| 0.3-0.4 | 0 ± 3, 104-133, 0 ± 3 | 0 ± 3, 108-132, 0 ± 3 |

Optimal combinations of the normalized thickness Hs/λ of the SiO$_2$ film and Euler angle Θ when the normalized thickness H/λ of the molybdenum electrode is about 0.008 to about 0.06, about 0.017 to about 0.06, and about 0.023 to about 0.06 shown in FIGS. 94 through 97 are shown in Table 16.

TABLE 16

| SiO$_2$ thickness Hs/λ | Euler angles of LiTaO$_3$ (°) | More preferable Euler angles (°) |
|---|---|---|
| 0.1-0.2 | 0 ± 3, 107-141, 0 ± 3 | 0 ± 3, 110-135, 0 ± 3 |
| 0.2-0.3 | 0 ± 3, 104-141, 0 ± 3 | 0 ± 3, 109-135, 0 ± 3 |
| 0.3-0.4 | 0 ± 3, 104-138, 0 ± 3 | 0 ± 3, 108-133, 0 ± 3 |

When the normalized thickness H/λ of the electrode made of a metal having the above-described density, Young's modulus, and transversal-wave sonic wave is about 0.008 to about 0.06, about 0.017 to about 0.06, and about 0.023 to about 0.06, as indicated in Table 14, the normalized thickness Hs/λ of the SiO$_2$ film is preferably about 0.1 to about 0.4 in order to set the range of the TCF to be between about −20 ppm/° C. and about +20 ppm/° C. In this case, Euler angle Θ of the LiTaO$_3$ substrate is preferably between about 104° to about 140° (corresponding to the rotation angle of about 14° to about 50°), and more preferably, the Euler angles shown on the right side of Table 14 are selected according to the normalized thickness Hs/λ of the SiO$_2$ film.

Similarly, when the normalized thickness H/λ of the nickel electrode is about 0.008 to about 0.06, about 0.02 to about 0.06, and about 0.027 to about 0.06, the normalized thickness Hs/λ of the SiO$_2$ film is preferably about 0.1 to about 0.4 in order to set the range of the TCF to be between about −20 ppm/° C. and about +20 ppm/° C. In this case, Euler angle Θ of the LiTaO$_3$ substrate is preferably between about 104° to about 140°, and more preferably, the Euler angles shown on the right side of Table 15 are selected according to the normalized thickness Hs/λ of the SiO$_2$ film.

Similarly, when the normalized thickness H/λ of the molybdenum electrode is about 0.008 to about 0.06, about 0.02 to about 0.06, and about 0.027 to about 0.06, the thickness Hs/λ of the SiO$_2$ film is preferably about 0.1 to about 0.4 in order to set the range of the TCF to be between about −20 ppm/° C. and about +20 ppm/° C. In this case, Euler angle Θ of the LiTaO$_3$ substrate preferably between about 104° to about 141°, and more preferably, the Euler angles shown on the right side of Table 16 are selected according to the normalized thickness of the SiO$_2$ film.

The Euler angles of LiTaO$_3$ shown in Table 14 through Table 16 were selected so that the attenuation constant becomes about 0.1 or lower. The more preferable Euler angles shown in Table 14 through Table 16 were selected so that the attenuation constant becomes about 0.05 or lower. The relationships between the Hs/λ of the SiO$_2$ film and the Euler angles shown in Table 14 through Table 16 when the normalized thickness H/λ of the electrode is from about 0.095, about 0.017, and about 0.023 were determined in terms of the normalized thickness H/λ of the nickel or molybdenum electrode shown in FIGS. 90 through 97.

Figure 98:
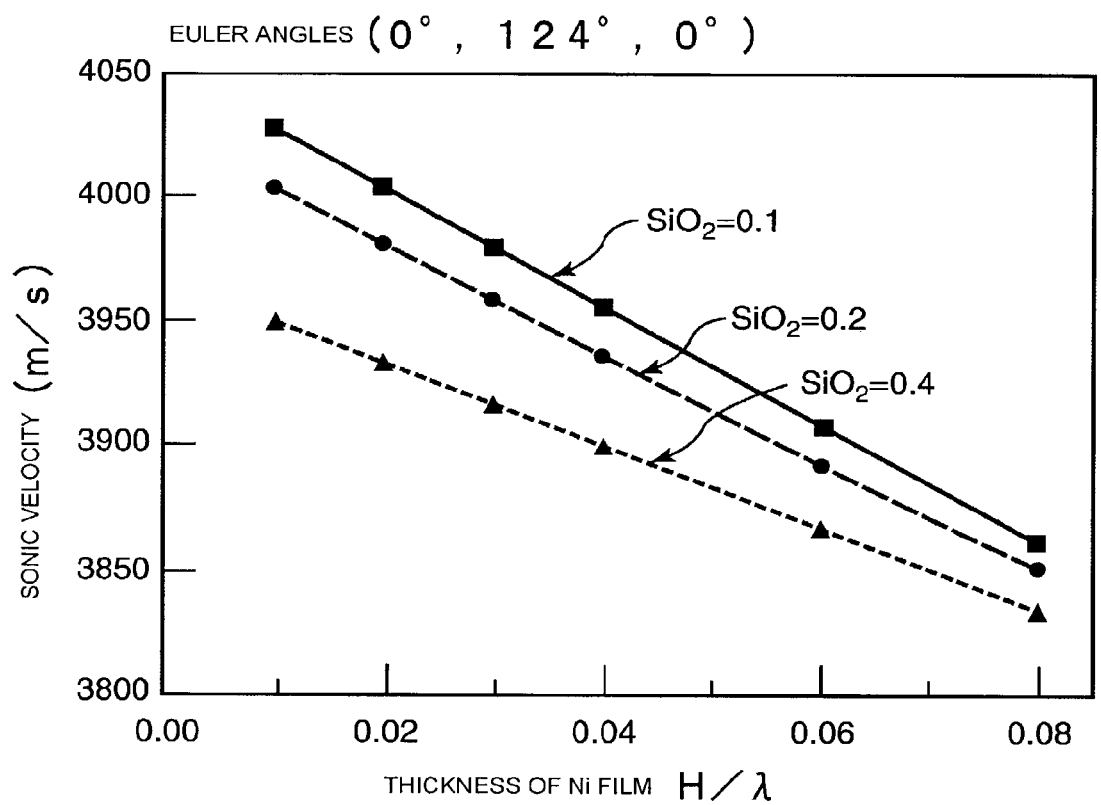
FIG. 98 illustrates the relationship between the acoustic velocity and the normalized thickness of nickel IDTs when the nickel IDTs and SiO₂ films having various thickness values were formed on a LiTaO₃ substrate having Euler angles (0°, 126°, 0°)
Figure 99:
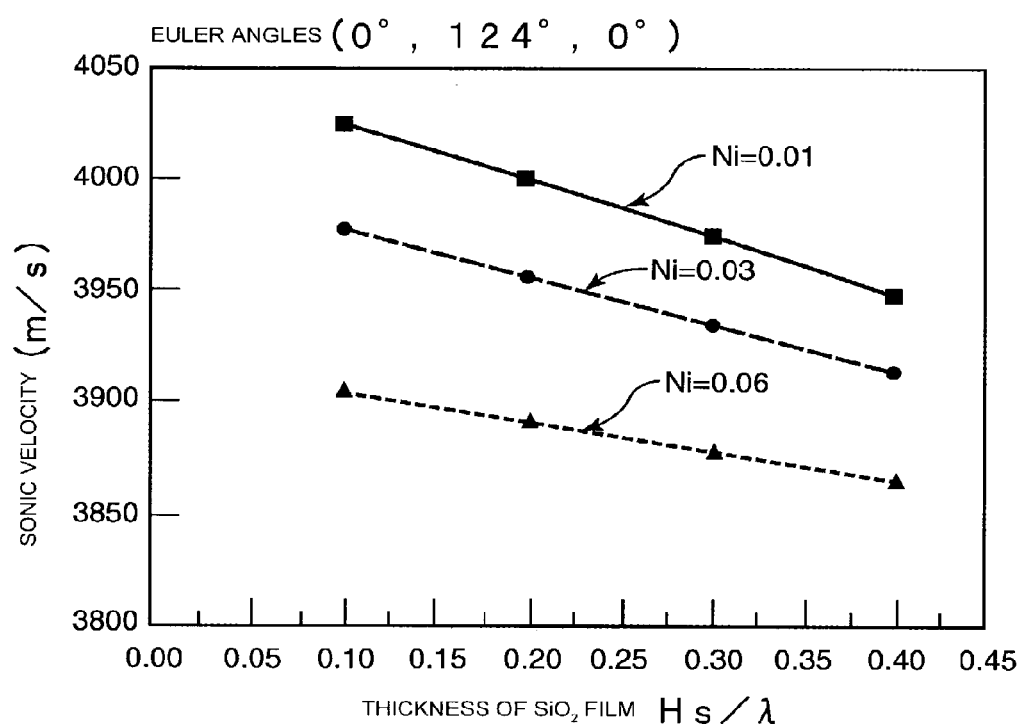
FIG. 99 illustrates the relationship between the acoustic velocity and the normalized thickness of SiO₂ films when nickel IDTs having various thickness values and the SiO₂ films were formed on a LiTaO₃ substrate having Euler angles (0°, 126°, 0°)
Figure 100:
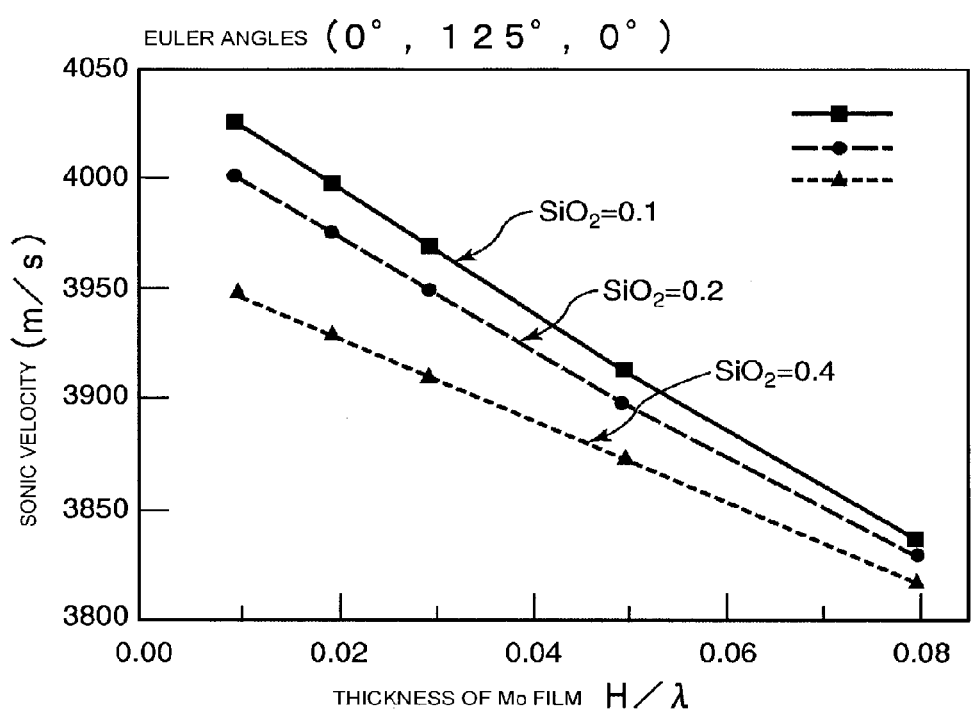
FIG. 100 illustrates the relationship between the acoustic velocity and the normalized thickness of molybdenum IDTs when the molybdenum IDTs and SiO₂ films having various thickness values were formed on a LiTaO₃ substrate having Euler angles (0°, 126°, 0°)
Figure 101:
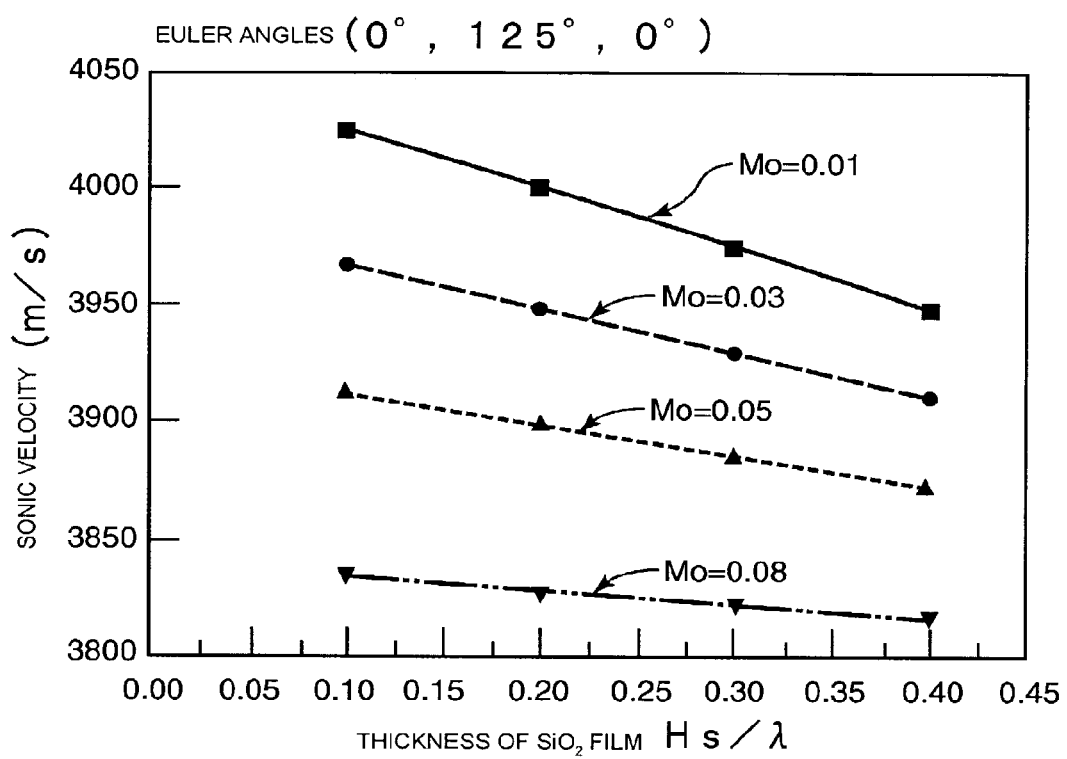
FIG. 101 illustrates the relationship between the acoustic velocity and the normalized thickness of SiO₂ films when molybdenum IDTs having various thickness values and the SiO₂ films were formed on a LiTaO₃ LiTaO₃ substrate having Euler angles (0°, 126°, 0°)

When manufacturing the SAW apparatus of this preferred embodiment, it is preferable that an IDT made of the above-described specific metal, such as nickel or molybdenum, is formed on a rotated Y-plate X-propagating LiTaO$_3$ substrate. Then, the frequency is adjusted. Then, a SiO$_2$ film having a thickness that can reduce the attenuation constant α is formed. This is explained below with reference to FIGS. 98 through 101. Nickel and molybdenum IDTs having different thickness values and SiO$_2$ films having different thickness values were formed on a rotated Y-plate X-propagating LiTaO$_3$ substrate (Euler angles (0°, 126°, 0°)). FIGS. 98 and 100 illustrate a change in the acoustic velocity of a leaky SAW with respect to the thickness of the nickel electrode and the thickness of the molybdenum electrode, respectively. FIGS. 99 and 101 illustrate a change in the acoustic velocity of a leaky SAW with respect to the thickness of the SiO$_2$ film. By comparing FIGS. 98 and 99, and FIGS. 100 and 101, it is seen that a change in the acoustic velocity of the SAW is much larger when the thickness of the electrode is varied than when the thickness of the SiO$_2$ film is varied. Accordingly, it is desirable that the frequency is adjusted before the formation of the SiO$_2$ film. It is desirable that the frequency is adjusted after a nickel or molybdenum IDT is formed by laser etching or ion etching.

In this embodiment, a 14°-50°-rotated Y-plate X-propagating LiTaO$_3$ substrate having Euler angles (0°, 104°-140°, 0°), an IDT made of a metal having the above-described density, the Young's modulus, and the transversal-wave acoustic velocity, such as nickel or molybdenum, having a normalized thickness H/λ of about 0.008 to about 0.06, and a SiO$_2$ film having a normalized thickness Hs/λ of about 0.10 to about 0.40 are preferably used. The number and the structure of IDTs are not particularly restricted. That is, the present invention can be applied to, not only the SAW apparatus shown in FIG. 15, but also various types of SAW resonators and SAW filters as long as the above-described conditions are satisfied.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A manufacturing method for a surface acoustic wave apparatus, comprising the steps of:
   preparing a piezoelectric substrate;
   forming a first insulating layer on the entirety of one surface of the piezoelectric substrate;
   forming a resist layer directly on said first insulation layer, said resist layer having a resist pattern for forming an electrode pattern including at least one electrode;
   removing, by using the resist pattern, at least a portion of the first insulating layer in an area in which said at least one electrode is to be formed directly on said piezoelectric substrate;
   maintaining a laminated structure of the first insulating layer and the resist pattern in an area other than the area in which said at least one electrode is to be formed;
   forming said at least one electrode by forming an electrode film directly on said piezoelectric substrate including at least one of a metal having a density higher than Aluminum and an alloy including a metal having a density higher than Aluminum in the area of the portion of the first insulating layer which was removed and said at least one electrode having a thickness substantially equal to a thickness of the first insulating layer while maintaining said laminated structure;
   removing the resist pattern on the first insulating layer; and
   forming a second insulating layer to cover and be in direct contact with the first insulating layer and said at least one electrode thereby producing said surface acoustic wave apparatus.

2. The manufacturing method according to claim 1, wherein the density of the metal or the alloy of said at least one electrode is about 1.5 times or greater than the density of the first insulating layer.

3. The manufacturing method according to claim 1, wherein the metal of said at least one electrode is selected from the group consisting of Au, Cu, Ag, W, Ta, Pt, Ni, Mo, the alloy primarily includes at least two metals from the group consisting of Au, Cu, Ag, W, Ta, Pt, Ni, Mo, and the first and second insulating layers include a layer of SiO2.

* * * * *

UNITED STATES PATENT AND TRADEMARK OFFICE
CERTIFICATE OF CORRECTION

PATENT NO.        : 7,418,772 B2                                              Page 1 of 1
APPLICATION NO.   : 11/743793
DATED             : September 2, 2008
INVENTOR(S)       : Kenji Nishiyama et al.

It is certified that error appears in the above-identified patent and that said Letters Patent is hereby corrected as shown below:

On the Title Page and in col. 1, line 1-2, in the Title section, the word --APPARATUS-- should be added to the end of the title.

Item (54) Title should read: --METHOD FOR MANFACTURING A SURFACE ACOUSTIC WAVE APPARATUS--

Signed and Sealed this

Fourth Day of November, 2008

JON W. DUDAS
*Director of the United States Patent and Trademark Office*